United States Patent
Nii et al.

(10) Patent No.: US 10,032,781 B2
(45) Date of Patent: Jul. 24, 2018

(54) STATIC RANDOM ACCESS MEMORY DEVICE WITH HALO REGIONS HAVING DIFFERENT IMPURITY CONCENTRATIONS

(75) Inventors: Koji Nii, Kanagawa (JP); Makoto Yabuuchi, Kanagawa (JP); Yasumasa Tsukamoto, Kanagawa (JP); Kengo Masuda, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 539 days.

(21) Appl. No.: 14/236,067

(22) PCT Filed: Jul. 29, 2011

(86) PCT No.: PCT/JP2011/067443
§ 371 (c)(1),
(2), (4) Date: Jan. 29, 2014

(87) PCT Pub. No.: WO2013/018156
PCT Pub. Date: Feb. 7, 2013

(65) Prior Publication Data
US 2014/0191338 A1  Jul. 10, 2014

(51) Int. Cl.
*H01L 27/088* (2006.01)
*H01L 27/11* (2006.01)
(Continued)

(52) U.S. Cl.
CPC ............ *H01L 27/11* (2013.01); *G11C 11/412* (2013.01); *H01L 21/26586* (2013.01);
(Continued)

(58) Field of Classification Search
CPC ................ H01L 27/11; H01L 29/1083; H01L 29/66659; H01L 21/26586; H01L 27/0207; H01L 27/1104; G11C 11/412
(Continued)

(56) References Cited

U.S. PATENT DOCUMENTS 6,466,489 B1 * 10/2002 Ieong .................... G11O 5/145
257/404
2001/0043487 A1  11/2001 Nii et al.
(Continued)

FOREIGN PATENT DOCUMENTS

JP         7-161841 A    6/1995
JP      2002-043441 A    2/2002
(Continued)

OTHER PUBLICATIONS

Koji Nii et al., "Challenging for an ultra low-voltage SRAM by innovative design circuits and device technologies," The Institute of Electronics, Information and Communication Engineers, IEICE Technical Report, vol. 110, No. 9, (ICD2010 1-20), pp. 7-12, Apr. 15, 2010.

(Continued)

*Primary Examiner* — Eva Y Montalvo
*Assistant Examiner* — Mohammad M Hoque
(74) *Attorney, Agent, or Firm* — McDermott Will & Emery LLP

(57) ABSTRACT

In a region just below an access gate electrode in an SRAM memory cell, a second halo region is formed adjacent to a source-drain region and a first halo region is formed adjacent to a first source-drain region. In a region just below a drive gate electrode, a third halo region is formed adjacent to the third source-drain region and a fourth halo region is formed adjacent to a fourth source-drain region. The second halo region is set to have an impurity concentration higher than the impurity concentration of the first halo region. The third halo region is set to have an impurity concentration higher than the impurity concentration of the fourth halo region. The impurity concentration of the first halo region and the impurity concentration of the fourth halo region are different from each other.

10 Claims, 124 Drawing Sheets

◯ HALO REGION INCLUDING IMPURITY AT RELATIVELY LOW CONCENTRATION
▨ HALO REGION INCLUDING IMPURITY AT RELATIVELY HIGH CONCENTRATION

(51) Int. Cl.
*H01L 27/02* (2006.01)
*H01L 21/265* (2006.01)
*H01L 29/66* (2006.01)
*H01L 29/10* (2006.01)
*G11C 11/412* (2006.01)

(52) U.S. Cl.
CPC ...... *H01L 27/0207* (2013.01); *H01L 27/1104* (2013.01); *H01L 29/1083* (2013.01); *H01L 29/66659* (2013.01)

(58) Field of Classification Search
USPC .......................................................... 257/401
See application file for complete search history.

(56) References Cited

U.S. PATENT DOCUMENTS

| 2002/0064080 | A1  | 5/2002  | Nii et al. |       |
|--------------|-----|---------|------------|-------|
| 2005/0073874 | A1* | 4/2005  | Chan ..................... G11C 11/412 | 365/154 |
| 2008/0012081 | A1  | 1/2008  | Kudo |       |
| 2009/0218631 | A1* | 9/2009  | Zhu ....................... G11C 11/412 | 257/369 |
| 2010/0039854 | A1* | 2/2010  | Anderson et al. ............ | 365/156 |
| 2010/0259971 | A1* | 10/2010 | Liaw ........................ G11C 8/16 | 365/154 |

FOREIGN PATENT DOCUMENTS

| JP | 2008-147570 A | 6/2008 |
| JP | 2009-152468 A | 7/2009 |
| WO | 2006/101068 A1 | 9/2006 |
| WO | 2007/063988 A1 | 6/2007 |
| WO | 2011/013322 A1 | 2/2011 |

OTHER PUBLICATIONS

Jae-Joon Kim, "Relaxing Conflict Between Read Stability and Writability in 6T SRAM Cell Using Asymmetric Transistors," IEEE Electron Device Letters, vol. 30, No. 8, pp. 852-854, Aug. 2009.

Koji Nii, et al., "A 0.5V 100MHz PD-SOI SRAM with Enhanced Read Stability and Write Margin by Asymmetric MOSFET and Forward Bod Bias," 2010 IEE International Solid-State Circuits Conference, Digest of Technical Papers, ISSCC 2010, pp. 356-358, Feb. 10, 2010.

Shigeki Ohbayashi et al., "A 65-nm SoC Embedded 6T-SRAM Designed for Manufacturability With Read and Write Operation Stabilizing Circuits," IEEE Journal of Solid-State Circuits, vol. 42, No. 4, pp. 820-828, Apr. 2007.

International Search Report issued in International Application No. PCT/JP2011/067443 dated Nov. 8, 2011, with English Translation.

* cited by examiner

◯ HALO REGION INCLUDING IMPURITY AT RELATIVELY LOW CONCENTRATION
▨ HALO REGION INCLUDING IMPURITY AT RELATIVELY HIGH CONCENTRATION

◯ HALO REGION INCLUDING IMPURITY AT RELATIVELY LOW CONCENTRATION
▨ HALO REGION INCLUDING IMPURITY AT RELATIVELY HIGH CONCENTRATION

◯ HALO REGION INCLUDING IMPURITY AT RELATIVELY LOW CONCENTRATION
▨ HALO REGION INCLUDING IMPURITY AT RELATIVELY HIGH CONCENTRATION

◯ HALO REGION INCLUDING IMPURITY AT RELATIVELY LOW CONCENTRATION
▨ HALO REGION INCLUDING IMPURITY AT RELATIVELY HIGH CONCENTRATION

◯ HALO REGION INCLUDING IMPURITY AT RELATIVELY LOW CONCENTRATION
▨ HALO REGION INCLUDING IMPURITY AT RELATIVELY HIGH CONCENTRATION

◯ HALO REGION INCLUDING IMPURITY AT RELATIVELY LOW CONCENTRATION
▨ HALO REGION INCLUDING IMPURITY AT RELATIVELY HIGH CONCENTRATION

◯ HALO REGION INCLUDING IMPURITY AT RELATIVELY LOW CONCENTRATION
▨ HALO REGION INCLUDING IMPURITY AT RELATIVELY HIGH CONCENTRATION

◯ HALO REGION INCLUDING IMPURITY AT RELATIVELY LOW CONCENTRATION
▨ HALO REGION INCLUDING IMPURITY AT RELATIVELY HIGH CONCENTRATION

◯ HALO REGION INCLUDING IMPURITY AT RELATIVELY LOW CONCENTRATION
▨ HALO REGION INCLUDING IMPURITY AT RELATIVELY HIGH CONCENTRATION

STATIC RANDOM ACCESS MEMORY DEVICE WITH HALO REGIONS HAVING DIFFERENT IMPURITY CONCENTRATIONS

RELATED APPLICATIONS

This application is the U.S. National Phase Application under 35 U.S.C. § 371 of International Application No. PCT/JP2011/067443, filed on Jul. 29, 2011, the disclosure of which Applications is incorporated by reference herein.

TECHNICAL FIELD

The present invention relates to a semiconductor device and a method for manufacturing the semiconductor device, in particular, a semiconductor device having an SRAM memory cell, and a method for manufacturing such a semiconductor device.

BACKGROUND ART

A semiconductor device called "SOC (System On Chip)" is one embodiment of semiconductor devices. In this type of semiconductor device, a plurality of logic circuits, memory cells, and the like are provided on one chip. The following describes a semiconductor device in which an SRAM (Static Random Access Memory) is applied as a memory cell of such a semiconductor device.

The SRAM memory cell includes: a flip flop with two inverters cross-coupled to each other; and two access transistors. In the flip flop, two storage nodes cross-coupled to each other are provided. The two storage nodes are in a bistable state such that one storage node is set to have a high-level potential and the other storage node is set to have a low-level potential. This state is maintained as long as a predetermined power supply potential is applied. The state is stored as "1" or "0" as information.

In a general SRAM memory cell having six transistors, a drive transistor is connected between a storage node and a ground potential, and a load transistor is connected between the storage node and a power supply potential. Further, an access transistor is connected between the storage node and a bit line. Data is written and read via the access transistor.

When reading data, it is required to increase a threshold voltage of the access transistor and attain a high ratio (β ratio) of a current of the drive transistor to a current of the access transistor in order to secure a read margin. On the other hand, when writing data, it is required to decrease the threshold voltage of the access transistor and attain a high ratio (γ ratio) of the current of the access transistor to a current of the load transistor in order to secure a write margin.

As an access transistor satisfying such requirements, there has been proposed an access transistor in which a pair of halo regions have asymmetric impurity concentrations in order to adjust the threshold voltage thereof in an SRAM memory cell described in Non-Patent Document 1 or Non-Patent Document 2. Specifically, the proposed access transistor is configured as follows. Of the pair of halo regions, a halo region connected to a storage node has an impurity concentration higher than the impurity concentration of a halo region connected to a bit line. It should be noted that the term "halo region" refers to an impurity region formed to suppress a short channel effect in a transistor having reduced size. It should be also noted that ion implantation for forming such a halo region is also referred to as "pocket implantation". Meanwhile, Non-Patent Document 3 has proposed a layout for suppressing fluctuations of a threshold voltage of a transistor included in an SRAM.

CITATION LIST

Non Patent Document

NPD 1: Jae-Joon Kim, Aditya Bansal, Rahul Rao, Shih-Hsien Lo, and Ching-Te Chuang, "Relaxing Conflict Between Read Stability and Writability in 6T SRAM Cell Using Asymmetric Transistors", IEEE ELECTRON DEVICE LETTERS, VOL. 30, No. 8, AUGUST 2009.

NPD 2: Koji Nii et al., "A 0.5V 100 MHz PD-SOI SRAM with Enhanced Read Stability and Write Margin by Asymmetric MOSFET and Forward Body Bias", Solid-State Circuits Conference Digest of Technical Papers (ISSCC), February 2010, pp. 356-357.

NPD 3: Shigeki Ohbayashi et al., "A 65-nm SoC Embedded 6T-SRAM Designed for Manufacturability With Read and Write Operation Stabilizing Circuits", IEEE JOURNAL OF SOLID-STATE CIRCUITS, VOL. 42, No. 4, APRIL 2007, pp. 820-829.

SUMMARY OF INVENTION

Technical Problem

Each of the SRAMs having the above-described access transistors has the following problem.

Halo regions are formed not only in the access transistor but also in a drive transistor and a load transistor. A pair of halo regions formed in each of the drive transistor and the load transistor has the same impurity concentration (symmetric impurity concentrations). As each of the access transistor and the drive transistor, an NMIS (N channel type metal Insulator Semiconductor) transistor is formed, and has halo regions formed as p type impurity regions. Meanwhile, as the load transistor, a PMIS (P channel type metal Insulator Semiconductor) transistor is formed, and has halo regions formed as n type impurity regions.

In the above-described SRAM (memory cell), in order to form a pair of halo regions having the same impurity concentration in each of the access transistor, the drive transistor, and the load transistor, three resist masks are formed as implantation masks. For the access transistor, another resist mask is formed as an implantation mask in order to attain a higher impurity concentration of one halo region of the pair than the impurity concentration of the other halo region. Thus, in the semiconductor device having the conventional SRAM, at least four implantation masks are required to form the halo regions in the transistors included in the SRAM memory cell.

The present invention proposes improvement for the semiconductor device having the conventional SRAM, has one object to provide a semiconductor device allowing for reduction in the number of implantation masks, and has another object to provide a method for manufacturing such a semiconductor device.

Solution to Problem

A semiconductor device according to one embodiment of the present invention is a semiconductor device having a static random access memory, including a storage node, a pair of bit lines, a ground interconnection, a first element formation region and a second element formation region, an access transistor, and a drive transistor. The storage node includes a first storage node and a second storage node storing data. The pair of bit lines sends/receives data. To the ground interconnection, a ground potential is applied. Each of the first element formation region and the second element formation region is defined by an element isolation insulation film in a predetermined region of a main surface of a semiconductor substrate. The access transistor is formed in the first element formation region, and includes a first source-drain region and a second source-drain region that are spaced away from each other and have first conductivity type, the access transistor including an access gate electrode positioned above a region interposed between the first source-drain region and the second source-drain region. The drive transistor is formed in the first element formation region, and includes a third source-drain region and a fourth source-drain region that are spaced away from each other and have the first conductivity type, the drive transistor including a drive gate electrode positioned above a region interposed between the third source-drain region and the fourth source-drain region. The access transistor includes a first halo region having a first impurity concentration and second conductivity type, and a second halo region having a second impurity concentration and the second conductivity type. The first halo region is formed in a region just below the access gate electrode so as to be adjacent to the first source-drain region electrically connected to a predetermined bit line of the pair of bit lines. The second halo region is formed in the region just below the access gate electrode so as to be adjacent to the second source-drain region electrically connected to the storage node. The drive transistor includes a third halo region having a third impurity concentration and the second conductivity type, and a fourth halo region having a fourth impurity concentration and the second conductivity type. The third halo region is formed in a region just below the drive gate electrode so as to be adjacent to the third source-drain region electrically connected to the storage node. The fourth halo region is formed in the region just below the drive gate electrode so as to be adjacent to the fourth source-drain region electrically connected to the ground interconnection. The second impurity concentration is set to be higher than the first impurity concentration. The third impurity concentration is set to be higher than the fourth impurity concentration. The first impurity concentration and the fourth impurity concentration are set to be different impurity concentrations.

A semiconductor device according to another embodiment of the present invention is a semiconductor device having a static random access memory, including a storage node, a first pair of bit lines and a second pair of bit lines, a ground interconnection, a first element formation region and a second element formation region, a first access transistor, a drive transistor, and a second access transistor. The storage node includes a first storage node and a second storage node storing data. The first pair of bit lines and the second pair of bit lines both send/receive data. To the ground interconnection, a ground potential is applied. Each of the first element formation region and the second element formation region is defined by an element isolation insulation film in a predetermined region of a main surface of a semiconductor substrate. The first access transistor is formed in the first element formation region, and includes a first source-drain region and a second source-drain region that are spaced away from each other and have first conductivity type, the first access transistor including a first access gate electrode positioned above a region interposed between the first source-drain region and the second source-drain region. The drive transistor is formed in the first element formation region, and includes a third source-drain region and a fourth source-drain region that are spaced away from each other and have the first conductivity type, the drive transistor including a drive gate electrode positioned above a region interposed between the third source-drain region and the fourth source-drain region. The second access transistor is formed in the first element formation region, and includes a fifth source-drain region and a sixth source-drain region that are spaced away from each other and have the first conductivity type, the second access transistor including a second access gate electrode positioned above a region interposed between the fifth source-drain region and the sixth source-drain region. The first access transistor includes a first halo region having a first impurity concentration and second conductivity type, and a second halo region having a second impurity concentration and the second conductivity type. The first halo region is formed in a region just below the first access gate electrode so as to be adjacent to the first source-drain region electrically connected to a predetermined bit line of the first pair of bit lines. The second halo region is formed in the region just below the first access gate electrode so as to be adjacent to the second source-drain region electrically connected to the storage node. The drive transistor includes a third halo region having a third impurity concentration and the second conductivity type, and a fourth halo region having a fourth impurity concentration and the second conductivity type. The third halo region is formed in a region just below the drive gate electrode so as to be adjacent to the third source-drain region electrically connected to the storage node. The fourth halo region is formed in the region just below the drive gate electrode so as to be adjacent to the fourth source-drain region electrically connected to the ground interconnection. The second access transistor includes a fifth halo region having a fifth impurity concentration and the second conductivity type, and a sixth halo region having a sixth impurity concentration and the second conductivity type. The fifth halo region is formed in a region just below the second access gate electrode so as to be adjacent to the fifth source-drain region electrically connected to a predetermined bit line of the second pair of bit lines. The sixth halo region is formed in the region just below the second access gate electrode so as to be adjacent to the sixth source-drain region electrically connected to the storage node. The second impurity concentration is set to be higher than the first impurity concentration. The third impurity concentration is set to be higher than the fourth impurity concentration. The first impurity concentration and the fourth impurity concentration are set to be different impurity concentrations. The fifth impurity concentration is set to be lower than the sixth impurity concentration.

A semiconductor device according to still another embodiment of the present invention is a semiconductor device having a static random access memory, including a storage node, a first pair of bit lines and a second pair of bit lines, a ground interconnection, a first element formation region and a second element formation region, a first access transistor, a first drive transistor, a second access transistor, and a second drive transistor. The storage node includes a first storage node and a second storage node storing data. The first pair of bit lines and the second pair of bit lines both send/receive data. To the ground interconnection, a ground potential is applied. Each of the first element formation region and the second element formation region is defined by an element isolation insulation film in a predetermined region of a main surface of a semiconductor substrate. The first access transistor is formed in the first element formation region, and includes a first source-drain region and a second source-drain region that are spaced away from each other and have first conductivity type, the first access transistor including a first access gate electrode positioned above a region interposed between the first source-drain region and the second source-drain region. The first drive transistor is formed in the first element formation region, and includes a third source-drain region and a fourth source-drain region that are spaced away from each other and have the first conductivity type, the first drive transistor including a first drive gate electrode positioned above a region interposed between the third source-drain region and the fourth source-drain region. The second access transistor is formed in the first element formation region, and includes a fifth source-drain region and a sixth source-drain region that are spaced away from each other and have the first conductivity type, the second access transistor including a second access gate electrode positioned above a region interposed between the fifth source-drain region and the sixth source-drain region. The second drive transistor is formed in the first element formation region, and includes a seventh source-drain region and an eighth source-drain region that are spaced away from each other and have the first conductivity type, the second drive transistor including a second drive gate electrode positioned above a region interposed between the seventh source-drain region and the eighth source-drain region. The first access transistor includes a first halo region having a first impurity concentration and second conductivity type, and a second halo region having a second impurity concentration and the second conductivity type. The first halo region is formed in a region just below the first access gate electrode so as to be adjacent to the first source-drain region electrically connected to a predetermined bit line of the first pair of bit lines. The second halo region is formed in the region just below the first access gate electrode so as to be adjacent to the second source-drain region electrically connected to the storage node. The first drive transistor includes a third halo region having a third impurity concentration and the second conductivity type, and a fourth halo region having a fourth impurity concentration and the second conductivity type. The third halo region is formed in a region just below the first drive gate electrode so as to be adjacent to the third source-drain region electrically connected to the storage node. The fourth halo region is formed in the region just below the first drive gate electrode so as to be adjacent to the fourth source-drain region electrically connected to the ground interconnection. The second access transistor includes a fifth halo region having a fifth impurity concentration and the second conductivity type, and a sixth halo region having a sixth impurity concentration and the second conductivity type. The fifth halo region is formed in a region just below the second access gate electrode so as to be adjacent to the fifth source-drain region electrically connected to a predetermined bit line of the second pair of bit lines. The sixth halo region is formed in the region just below the second access gate electrode so as to be adjacent to the sixth source-drain region electrically connected to the storage node. The second drive transistor includes a seventh halo region having a seventh impurity concentration and the second conductivity type, and an eighth halo region having an eighth impurity concentration and the second conductivity type. The seventh halo region is formed in a region just below the second drive gate electrode so as to be adjacent to the seventh source-drain region electrically connected to the storage node. The eighth halo region is formed in the region just below the second drive gate electrode so as to be adjacent to the eighth source-drain region electrically connected to the ground interconnection. The second impurity concentration is set to be higher than the first impurity concentration. The third impurity concentration is set to be higher than the fourth impurity concentration. The first impurity concentration and the fourth impurity concentration are set to be different impurity concentrations. The fifth impurity concentration is set to be lower than the sixth impurity concentration. The seventh impurity concentration is set to be higher than the eighth impurity concentration.

A semiconductor device according to yet another embodiment of the present invention is a semiconductor device having a static random access memory, including a storage node, a first pair of bit lines, a read bit line, a ground interconnection, a first element formation region and a second element formation region, a first access transistor, a first drive transistor, a second drive transistor, and a second access transistor. The storage node includes a first storage node and a second storage node storing data. The first pair of bit lines send/receive data. The read bit line sends data. To the ground interconnection, a ground potential is applied. Each of the first element formation region and the second element formation region is defined by an element isolation insulation film in a predetermined region of a main surface of a semiconductor substrate. The first access transistor is formed in the first element formation region, and includes a first source-drain region and a second source-drain region that are spaced away from each other and have first conductivity type, the first access transistor including a first access gate electrode positioned above a region interposed between the first source-drain region and the second source-drain region. The first drive transistor is formed in the first element formation region, and includes a third source-drain region and a fourth source-drain region that are spaced away from each other and have the first conductivity type, the first drive transistor including a first drive gate electrode positioned above a region interposed between the third source-drain region and the fourth source-drain region. The second drive transistor is formed in the first element formation region, and includes a fifth source-drain region and a sixth source-drain region that are spaced away from each other and have the first conductivity type, the second drive transistor including a second drive gate electrode positioned above a region interposed between the fifth source-drain region and the sixth source-drain region. The second access transistor is formed in the first element formation region, and includes a seventh source-drain region and an eighth source-drain region that are spaced away from each other and have the first conductivity type, the second access transistor including a second access gate electrode positioned above a region interposed between the seventh source-drain region and the eighth source-drain region. The first access transistor includes a first halo region having a first impurity concentration and second conductivity type, and a second halo region having a second impurity concentration and the second conductivity type. The first halo region is formed in a region just below the first access gate electrode so as to be adjacent to the first source-drain region electrically connected to a predetermined bit line of the first pair of bit lines. The second halo region is formed in the region just below the first access gate electrode so as to be adjacent to the second source-drain region electrically connected to the storage node. The first drive transistor includes a third halo region having a third impurity concentration and the second conductivity type, and a fourth halo region having a fourth impurity concentration and the second conductivity type. The third halo region is formed in a region just below the first drive gate electrode so as to be adjacent to the third source-drain region electrically connected to the storage node. The fourth halo region is formed in the region just below the first drive gate electrode so as to be adjacent to the fourth source-drain region electrically connected to the ground interconnection. The second drive transistor includes a fifth halo region having a fifth impurity concentration and the second conductivity type, and a sixth halo region having a sixth impurity concentration and the second conductivity type. The fifth halo region is formed in a region just below the second drive gate electrode so as to be adjacent to the fifth source-drain region electrically connected to the ground interconnection. The sixth halo region is formed in the region just below the second drive gate electrode so as to be adjacent to the sixth source-drain region electrically connected to the storage node. The second access transistor includes a seventh halo region having a seventh impurity concentration and the second conductivity type, and an eighth halo region having an eighth impurity concentration and the second conductivity type. The seventh halo region is formed in a region just below the second access gate electrode so as to be adjacent to the seventh source-drain region electrically connected to the storage node. The eighth halo region is formed in the region just below the second access gate electrode so as to be adjacent to the eighth source-drain region electrically connected to the read bit line. The second impurity concentration is set to be higher than the first impurity concentration. The third impurity concentration is set to be higher than the fourth impurity concentration. The first impurity concentration and the fourth impurity concentration are set to be different impurity concentrations. The fifth impurity concentration and the sixth impurity concentration are set to be the same impurity concentration. The seventh impurity concentration and the eighth impurity concentration are set to be the same impurity concentration.

A semiconductor device according to still another embodiment of the present invention is a semiconductor device having a static random access memory, including a storage node, a pair of bit lines, a ground interconnection, a first element formation region and a second element formation region, an access transistor, and a drive transistor. The storage node includes a first storage node and a second storage node storing data. The pair of bit lines send/receive data. To the ground interconnection, a ground potential is applied. Each of the first element formation region and the second element formation region is defined by an element isolation insulation film in a predetermined region of a main surface of a semiconductor substrate. The access transistor is formed in the first element formation region, and includes a first source-drain region and a second source-drain region that are spaced away from each other and have first conductivity type, the access transistor including an access gate electrode positioned in a first direction above a region interposed between the first source-drain region and the second source-drain region. The drive transistor is formed in the first element formation region, and includes a third source-drain region and a fourth source-drain region that are spaced away from each other and have the first conductivity type, the drive transistor including a drive gate electrode positioned in a second direction above a region interposed between the third source-drain region and the fourth source-drain region, the second direction crossing the first direction. The access transistor includes a first halo region having a first impurity concentration and second conductivity type, and a second halo region having a second impurity concentration and the second conductivity type. The first halo region is formed in a region just below the access gate electrode so as to be adjacent to the first source-drain region electrically connected to a predetermined bit line of the pair of bit lines. The second halo region is formed in the region just below the access gate electrode so as to be adjacent to the second source-drain region electrically connected to the storage node. The drive transistor includes a third halo region having a third impurity concentration and the second conductivity type, and a fourth halo region having a fourth impurity concentration and the second conductivity type. The third halo region is formed in a region just below the drive gate electrode so as to be adjacent to the third source-drain region electrically connected to the storage node. The fourth halo region is formed in the region just below the drive gate electrode so as to be adjacent to the fourth source-drain region electrically connected to the ground interconnection. The second impurity concentration is set to be higher than the first impurity concentration. The third impurity concentration and the fourth impurity concentration are set to be the same impurity concentration. The third impurity concentration and the fourth impurity concentration are set to be an impurity concentration equal to or lower than the first impurity concentration.

A method for manufacturing a semiconductor device according to yet another embodiment of the present invention is a method for manufacturing a semiconductor device having a static random access memory, including the following steps. A first element formation region and a second element formation region are defined by forming an element isolation insulation film on a main surface of a semiconductor substrate, a transistor of first conductivity type being to be formed in the first element formation region, a transistor of second conductivity type being to be formed in the second element formation region. In the first element formation region, an access gate structure is formed above a region interposed between a first region and a second region, a first source-drain region electrically connected to a predetermined bit line of a pair of bit lines being to be formed in the first region, a second source-drain region electrically connected to a storage node being to be formed in the second region, the first region and the second region being spaced away from each other. A drive gate structure is formed above a region interposed between a third region and a fourth region, a third source-drain region electrically connected to the storage node being to be formed in the third region, a fourth source-drain region electrically connected to a ground interconnection being to be formed in the fourth region, the third region and the fourth region being spaced away from each other. A first halo implantation mask is formed that exposes a first side surface of the access gate structure at a side of the second region, the second region, the drive gate structure, the third region, and the fourth region, and that covers a second side surface of the access gate structure at a side of the first region, the first region, and the second element formation region. A first impurity of second conductivity type is implanted into the exposed regions of the semiconductor substrate through the first halo implantation mask, at an angle oblique to a direction perpendicular to the main surface. A second halo implantation mask is formed that exposes a first side surface of the drive gate structure at a side of the third region, the third region, the access gate structure, the first region, and the second region, and that covers a second side surface of the drive gate structure at a side of the fourth region, the fourth region, and the second element formation region. A second impurity of the second conductivity type is implanted into the exposed regions of the semiconductor substrate through the second halo implantation mask, at an angle oblique to the direction perpendicular to the main surface. The first source-drain region, the second source-drain region, the third source-drain region, and the fourth source-drain region are formed by implanting an impurity of first conductivity type. By forming the first source-drain region to the fourth source-drain region by implanting the first impurity of the second conductivity type and implanting the second impurity of the second conductivity type, in a region just below the access gate structure, a first halo region having a first impurity concentration and the second conductivity type is formed adjacent to the first source-drain region, and a second halo region having a second impurity concentration higher than the first impurity concentration and the second conductivity type is formed adjacent to the second source-drain region. Also, in a region just below the drive gate structure, a third halo region having a third impurity concentration and the second conductivity type is formed adjacent to the third source-drain region, and a fourth halo region having a fourth impurity concentration and the second conductivity type is formed adjacent to the fourth source-drain region, the fourth impurity concentration being lower than the third impurity concentration and different from the first impurity concentration.

A method for manufacturing a semiconductor device according to still another embodiment of the present invention is a method for manufacturing a semiconductor device having a static random access memory, including the following steps. A first element formation region and a second element formation region are defined by forming an element isolation insulation film on a main surface of a semiconductor substrate, a transistor of first conductivity type being to be formed in the first element formation region, a transistor of second conductivity type being to be formed in the second element formation region. In the first element formation region, a first access gate structure is formed above a region interposed between a first region and a second region, a first source-drain region electrically connected to a predetermined bit line of a first pair of bit lines being to be formed in the first region, a second source-drain region electrically connected to a storage node being to be formed in the second region, the first region and the second region being spaced away from each other. A first drive gate structure is formed above a region interposed between a third region and a fourth region, a third source-drain region electrically connected to the storage node being to be formed in the third region, a fourth source-drain region electrically connected to a ground interconnection being to be formed in the fourth region, the third region and the fourth region being spaced away from each other. A second access gate structure is formed above a region interposed between a fifth region and a sixth region, a fifth source-drain region electrically connected to a predetermined bit line of a second pair of bit lines different from the first pair of bit lines being to be formed in the fifth region, a sixth source-drain region electrically connected to the storage node being to be formed in the sixth region, the fifth region and the sixth region being spaced away from each other. A first halo implantation mask is formed that exposes a first side surface of the first access gate structure at a side of the second region, the second region, the first drive gate structure, the third region, the fourth region, a first side surface of the second access gate structure at a side of the sixth region, and the sixth region, and that covers the second side surface of the first access gate structure at a side of the first region, the first region, a second side surface of the second access gate structure at a side of the fifth region, the fifth region, and the second element formation region. A first impurity of second conductivity type is implanted into the exposed regions of the semiconductor substrate through the first halo implantation mask, at an angle oblique to a direction perpendicular to the main surface. A second halo implantation mask is formed that exposes a first side surface of the first drive gate structure at a side of the third region, the third region, the first access gate structure, the first region, the second region, the second access gate structure, the fifth region, and the sixth region, and that covers a second side surface of the first drive gate structure at a side of the fourth region, the fourth region, and the second element formation region. A second impurity of the second conductivity type is implanted into the exposed regions of the semiconductor substrate through the second halo implantation mask, at an angle oblique to the direction perpendicular to the main surface. The first source-drain region, the second source-drain region, the third source-drain region, the fourth source-drain region, the fifth source-drain region, and the sixth source-drain region are formed by implanting an impurity of the first conductivity type. By forming the first source-drain region to the sixth source-drain region by implanting the first impurity of the second conductivity type and implanting the second impurity of the second conductivity type, in a region just below the first access gate structure, a first halo region having a first impurity concentration and the second conductivity type is formed adjacent to the first source-drain region, and a second halo region having a second impurity concentration higher than the first impurity concentration and the second conductivity type is formed adjacent to the second source-drain region. Also in a region just below the first drive gate structure, a third halo region having a third impurity concentration and the second conductivity type is formed adjacent to the third source-drain region, and a fourth halo region having a fourth impurity concentration and the second conductivity type is formed adjacent to the fourth source-drain region, the fourth impurity concentration being lower than the third impurity concentration and different from the first impurity concentration. Moreover, in a region just below the second access gate structure, a fifth halo region having a fifth impurity concentration and the second conductivity type is formed adjacent to the fifth source-drain region, and a sixth halo region having a sixth impurity concentration higher than the fifth impurity concentration and the second conductivity type is formed adjacent to the sixth source-drain region.

A method for manufacturing a semiconductor device according to yet another embodiment of the present invention is a method for manufacturing a semiconductor device having a static random access memory, including the following steps. A first element formation region and a second element formation region are defined by forming an element isolation insulation film on a main surface of a semiconductor substrate, a transistor of first conductivity type being to be formed in the first element formation region, a transistor of second conductivity type being to be formed in the second element formation region. In the first element formation region, an access gate structure is formed in a first direction above a region interposed between a first region and a second region, a first source-drain region electrically connected to a predetermined bit line of a pair of bit lines being to be formed in the first region, a second source-drain region electrically connected to a storage node being to be formed in the second region, the first region and the second region being spaced away from each other. A drive gate structure is formed in a second direction above a region interposed between a third region and a fourth region, the second direction crossing the first direction, a third source-drain region electrically connected to the storage node being to be formed in the third region, a fourth source-drain region electrically connected to a ground interconnection being to be formed in the fourth region, the third region and the fourth region being spaced away from each other. A first halo implantation mask is formed that has an opening exposing a first side surface of the access gate structure at a side of the second region, the second region, a first side surface of the drive gate structure at a side of the third region, and the third region, and that covers a second side surface of the access gate structure at a side of the first region, the first region, a second side surface of the drive gate structure at a side of the fourth region, the fourth region, and the second element formation region. A first impurity of second conductivity type is implanted from one side and another side of the first direction and one side and another side of the second direction into the exposed regions of the semiconductor substrate in the opening through the first halo implantation mask, at an angle oblique to a direction perpendicular to the main surface. A second halo implantation mask is formed that exposes the access gate structure, the first region, the second region, the drive gate structure, the third region, and the fourth region, and that covers the second element formation region. A second impurity of the second conductivity type is implanted from the one side and the another side of the first direction and the one side and the another side of the second direction into the exposed regions of the semiconductor substrate through the second halo implantation mask, at an angle oblique to the direction perpendicular to the main surface. The first source-drain region, the second source-drain region, the third source-drain region, and the fourth source-drain region are formed by implanting an impurity of the first conductivity type. By forming the first source-drain region to the fourth source-drain region by implanting the first impurity of the second conductivity type and implanting the second impurity of the second conductivity type, in a region just below the access gate structure, a first halo region having a first impurity concentration and the second conductivity type is formed adjacent to the first source-drain region, and a second halo region having a second impurity concentration higher than the first impurity concentration and the second conductivity type is formed adjacent to the second source-drain region. Also, in a region just below the drive gate structure, a third halo region having a third impurity concentration and the second conductivity type is formed adjacent to the third source-drain region, and a fourth halo region having a fourth impurity concentration and the second conductivity type is formed adjacent to the fourth source-drain region, the fourth impurity concentration being lower than the third impurity concentration.

Advantageous Effects of Invention

According to the semiconductor device in each of the embodiments of the present invention, the number of masks for forming halo regions, inclusive of the first to fourth halo regions, can be reduced. Moreover, both read margin and write margin can be improved.

According to the method for manufacturing the semiconductor device in each of the embodiments of the present invention, the number of masks for forming halo regions, inclusive of the first to fourth halo regions, can be reduced.

BRIEF DESCRIPTION OF DRAWINGS

FIG. 120 is a plan view showing a step performed after the step shown in FIG. 119 in the embodiment.

FIG. 121 is a cross sectional view showing a step performed after the step shown in FIG. 120 in the embodiment, and taken along a cross sectional line corresponding to a cross sectional line CXXI-CXXI shown in FIG. 120.

FIG. 122 is a cross sectional view showing a step performed after the step shown in FIG. 121 in the embodiment, and taken along a cross sectional line corresponding to cross sectional line CXXI-CXXI shown in FIG. 120.

FIG. 123 is a cross sectional view showing a step performed after the step shown in FIG. 122 in the embodiment, and taken along a cross sectional line corresponding to cross sectional line CXXI-CXXI shown in FIG. 120.

FIG. 124 is a cross sectional view showing a step performed after the step shown in FIG. 123 in the embodiment, and taken along a cross sectional line corresponding to a cross sectional line CXXI-CXXI shown in FIG. 120.

FIG. 125 is a plan view showing a step performed after the step shown in FIG. 124 in the embodiment.

FIG. 126 is a cross sectional view showing a step performed after the step shown in FIG. 125 in the embodiment, and taken along a cross sectional line corresponding to a cross sectional line CXXVI-CXXVI shown in FIG. 125.

FIG. 127 is a plan view showing a step performed after the step shown in FIG. 126 in the embodiment.

FIG. 128 is a cross sectional view showing a step performed after the step shown in FIG. 127 in the embodiment, and taken along a cross sectional line corresponding to a cross sectional line CXXVIII-CXXVIII shown in FIG. 127.

FIG. 129 is a cross sectional view showing a step performed after the step shown in FIG. 128 in the embodiment.

FIG. 130 is a cross sectional view showing a step performed after the step shown in FIG. 129 in the embodiment.

FIG. 131 is a cross sectional view showing a step performed after the step shown in FIG. 130 in the embodiment.

Figure 132:
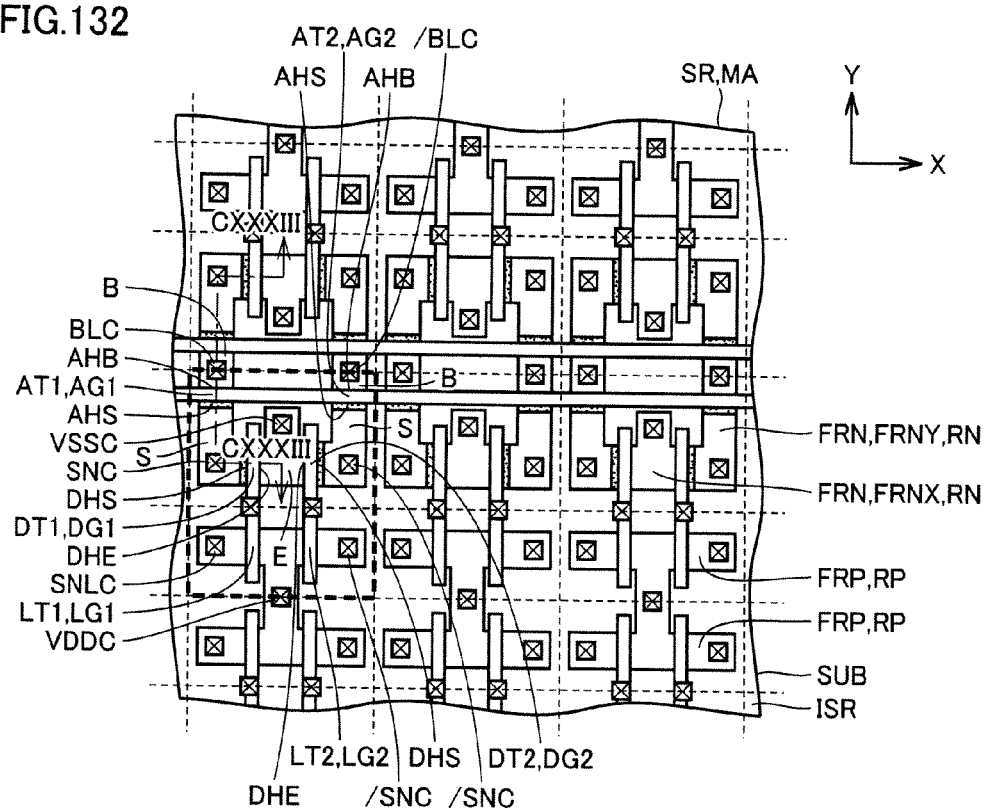

FIG. 132 is a plan view showing an arrangement pattern of SRAM memory cells in a semiconductor device according to a tenth embodiment of the present invention.

Figure 133:
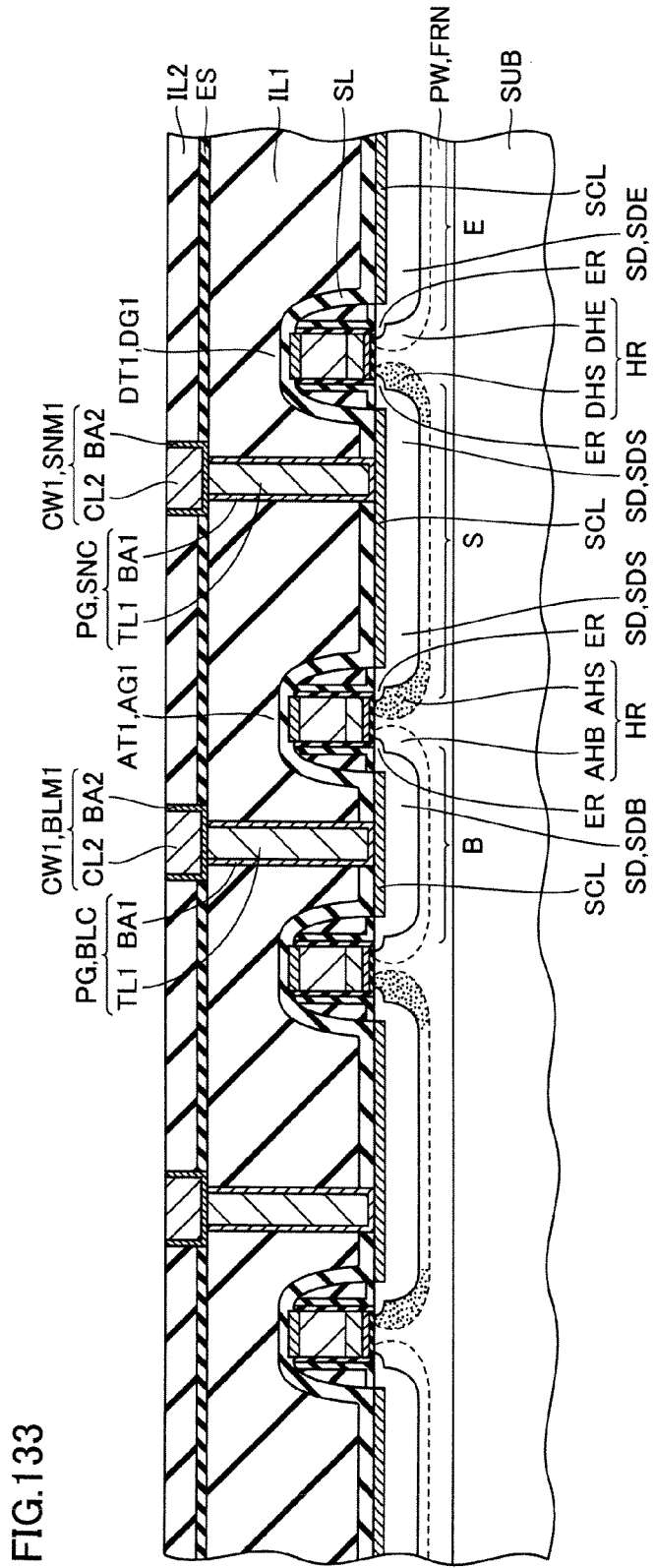

FIG. 133 is a cross sectional view taken along a cross sectional line CXXXIII-CXXXIII of FIG. 132 in the embodiment.

Figure 134:
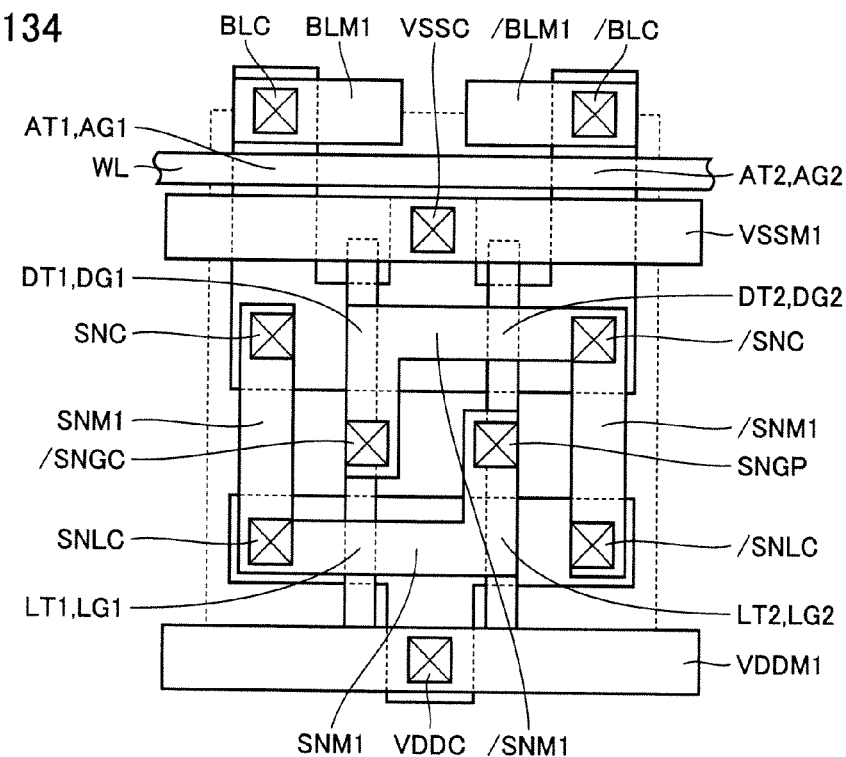

FIG. 134 is a plan view showing a structure of connection between each transistor and a first metal interconnection in the embodiment.

Figure 135:
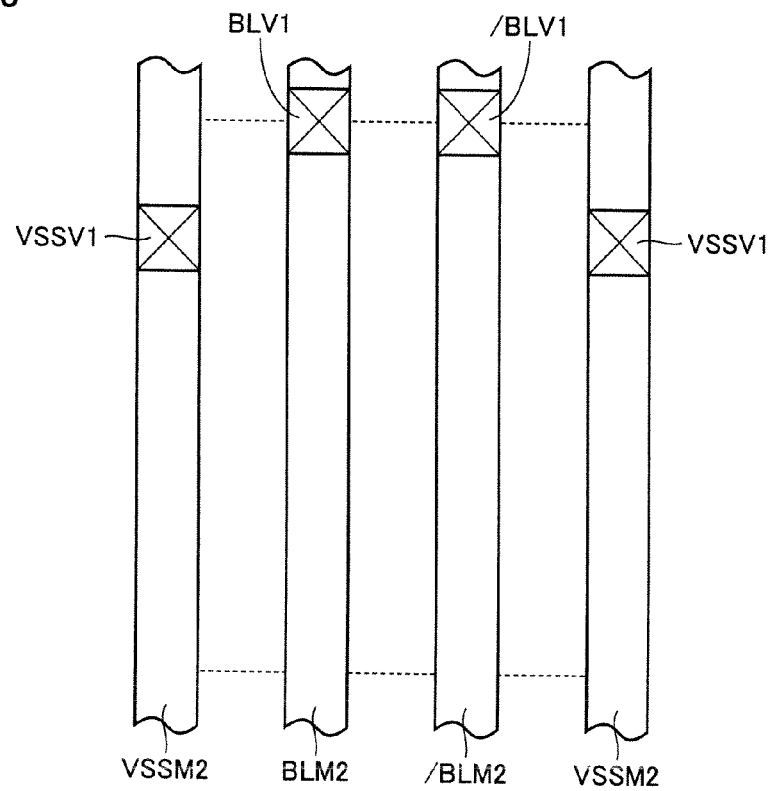

FIG. 135 is a plan view showing a structure of connection between the first metal interconnection and a second metal interconnection in the embodiment.

Figure 136:
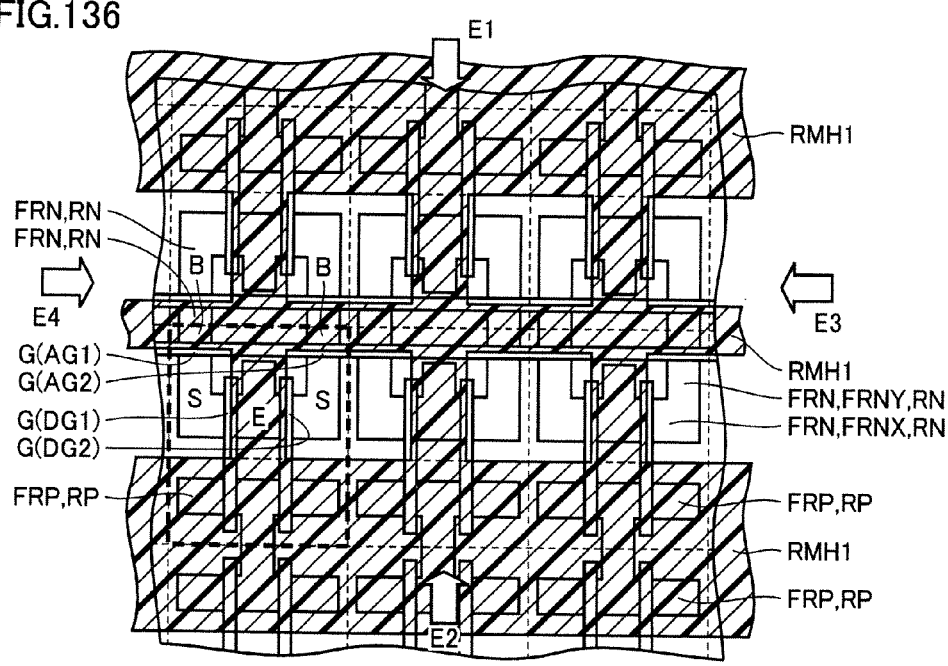

FIG. 136 is a plan view showing one step in a method for manufacturing the semiconductor device in the embodiment.

Figure 137:
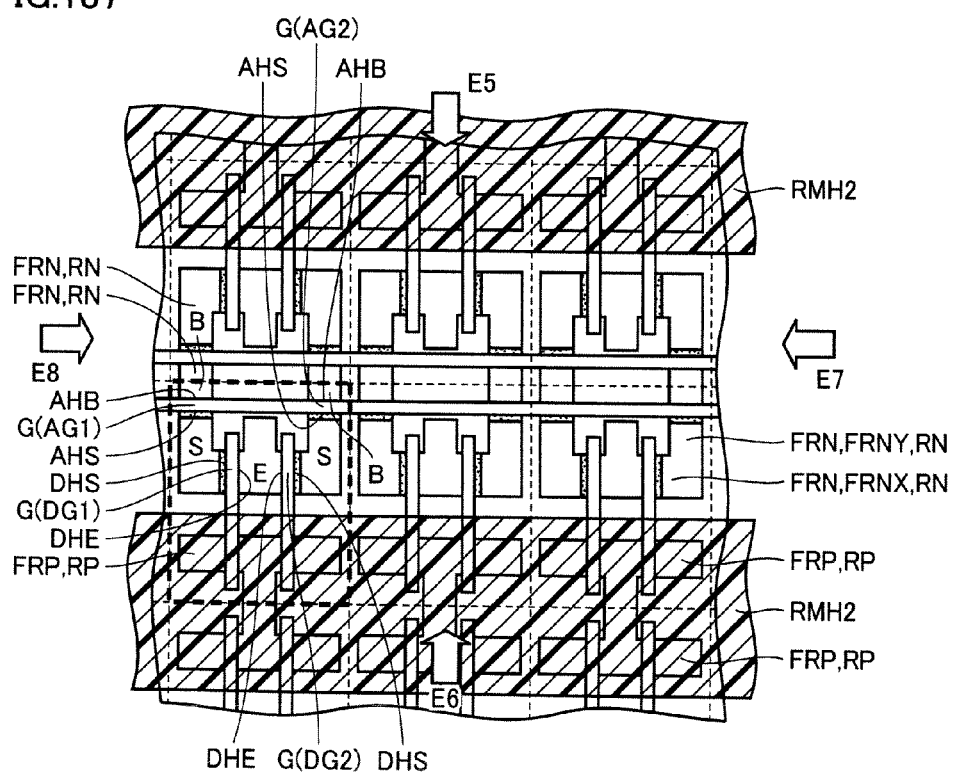

FIG. 137 is a plan view showing a step performed after the step shown in FIG. 136 in the embodiment.

Figure 138:
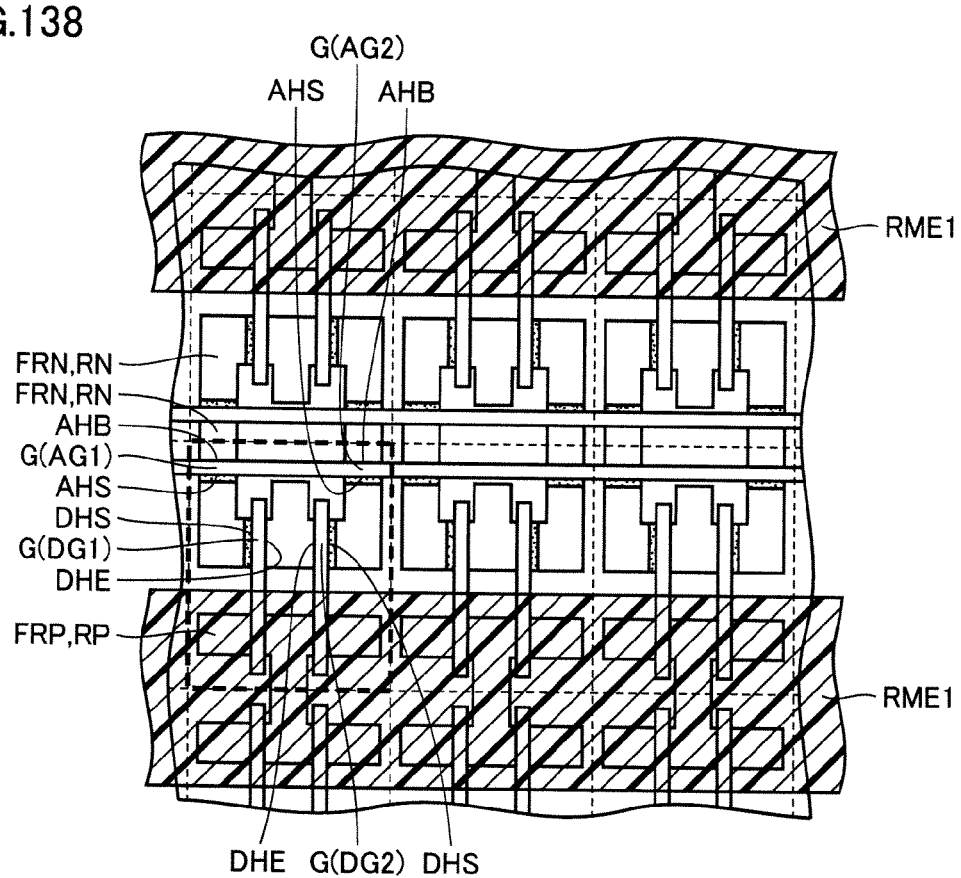

FIG. 138 is a plan view showing a step performed after the step shown in FIG. 137 in the embodiment.

Figure 139:
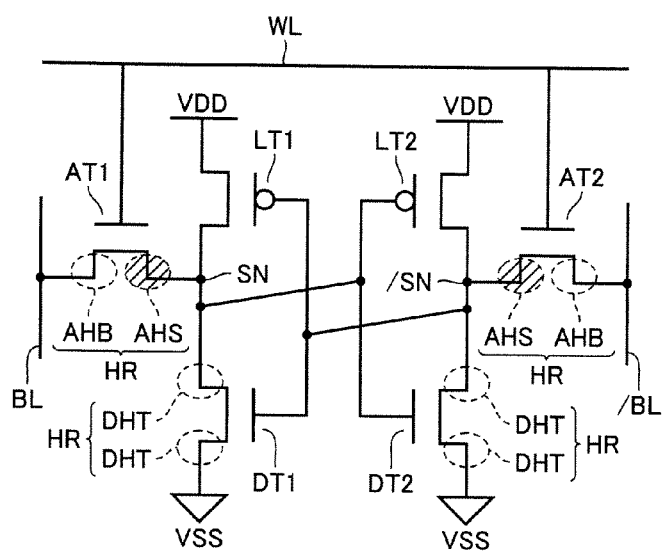

FIG. 139 shows an equivalent circuit of each SRAM memory cell of a semiconductor device in an eleventh embodiment of the present invention.

Figure 140:
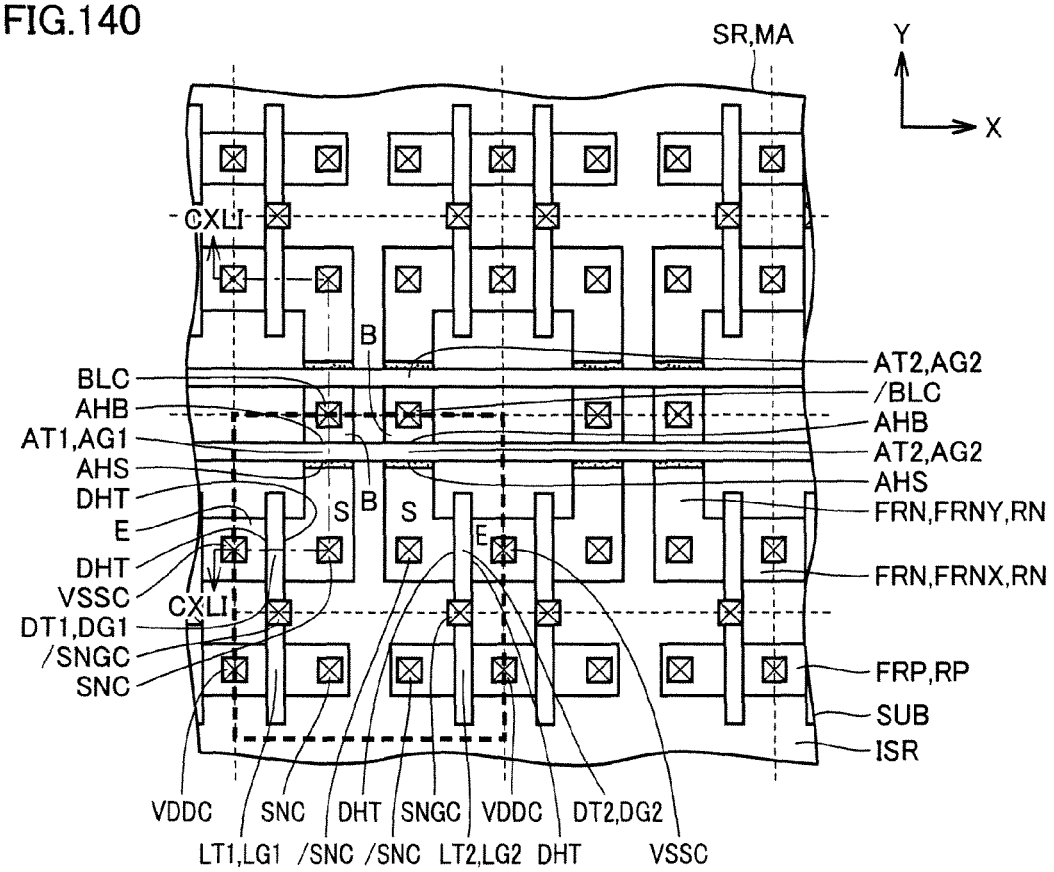

FIG. 140 is a plan view showing an arrangement pattern of the SRAM memory cells in the embodiment.

Figure 141:
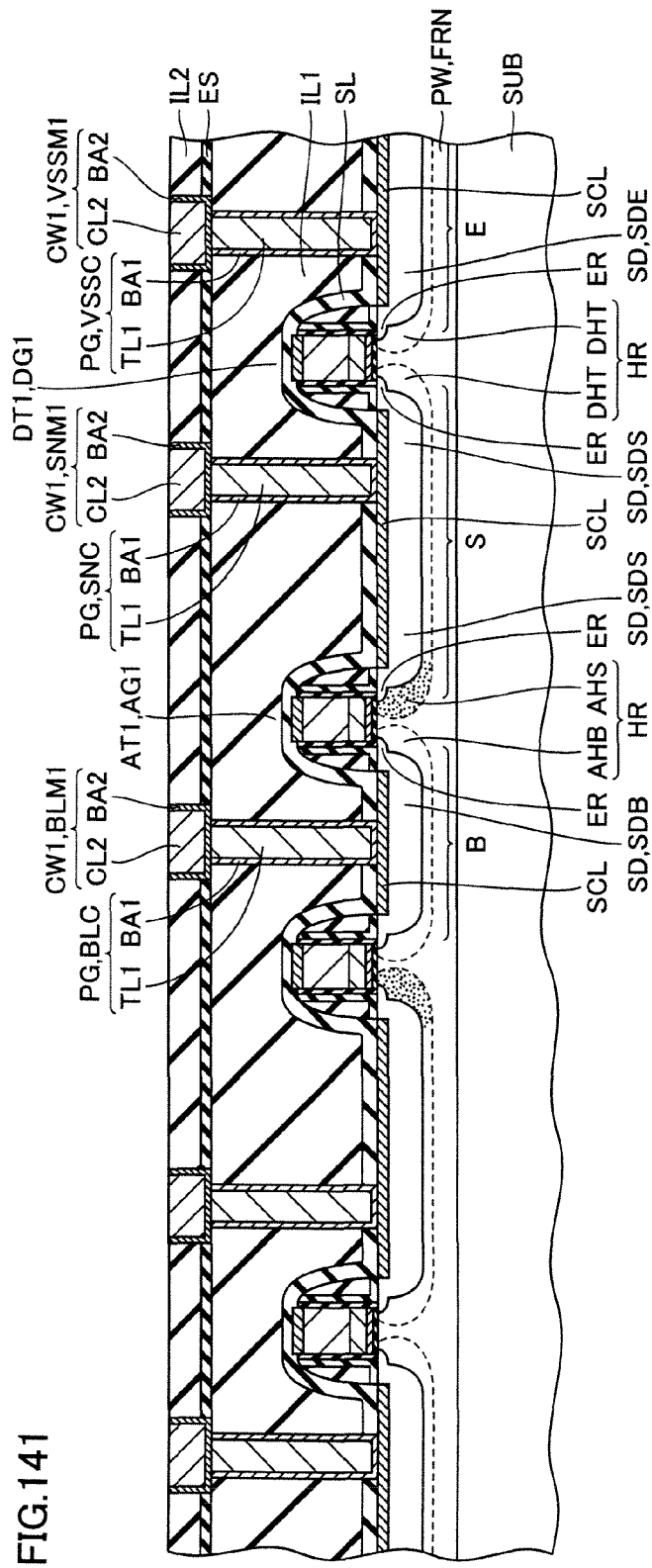

FIG. 141 is a cross sectional view taken along a cross sectional line CXLI-CXLI of FIG. 140 in the embodiment.

Figure 142:
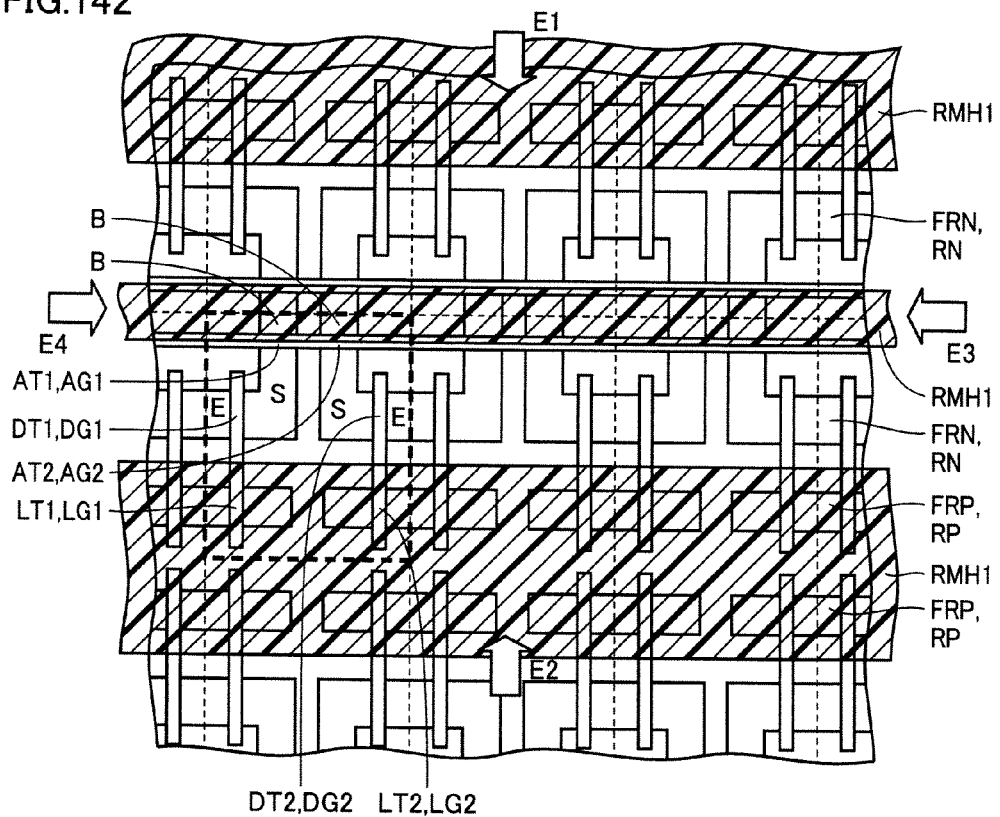

FIG. 142 is a plan view showing one step in a method for manufacturing the semiconductor device in the embodiment.

Figure 143:
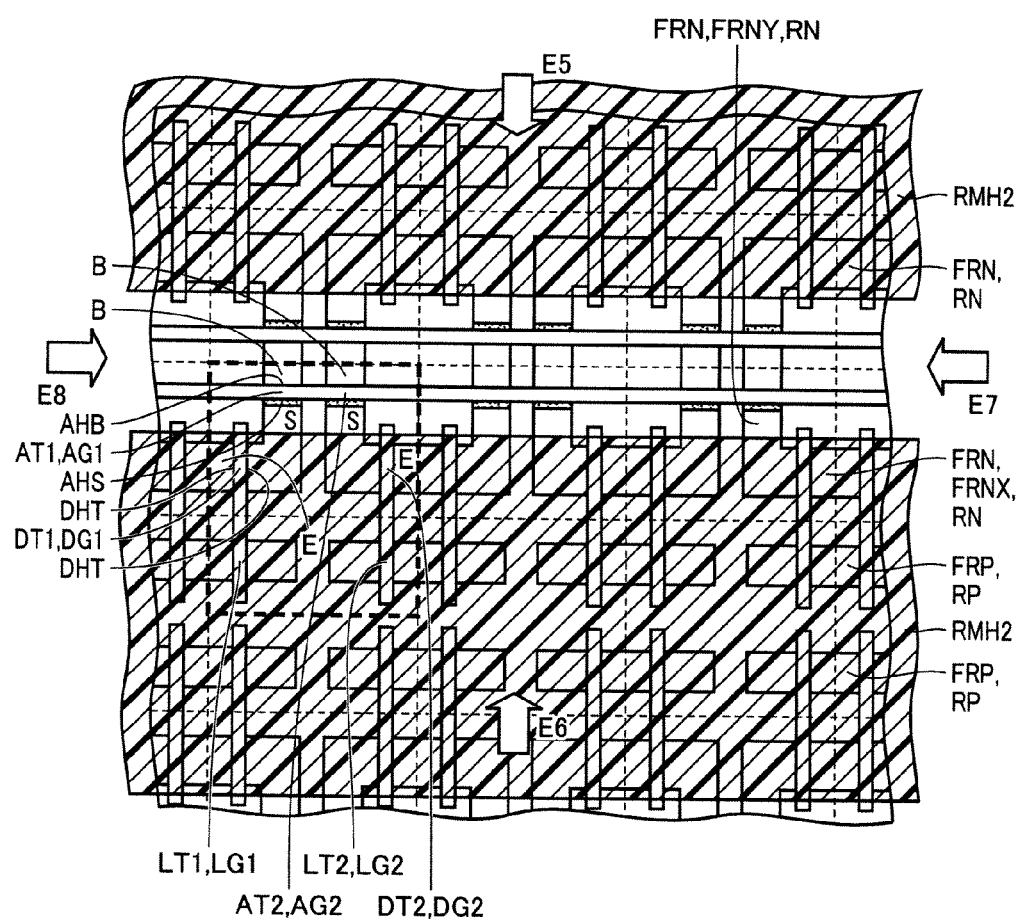

FIG. 143 is a plan view showing a step performed after the step shown in FIG. 142 in the embodiment.

Figure 144:
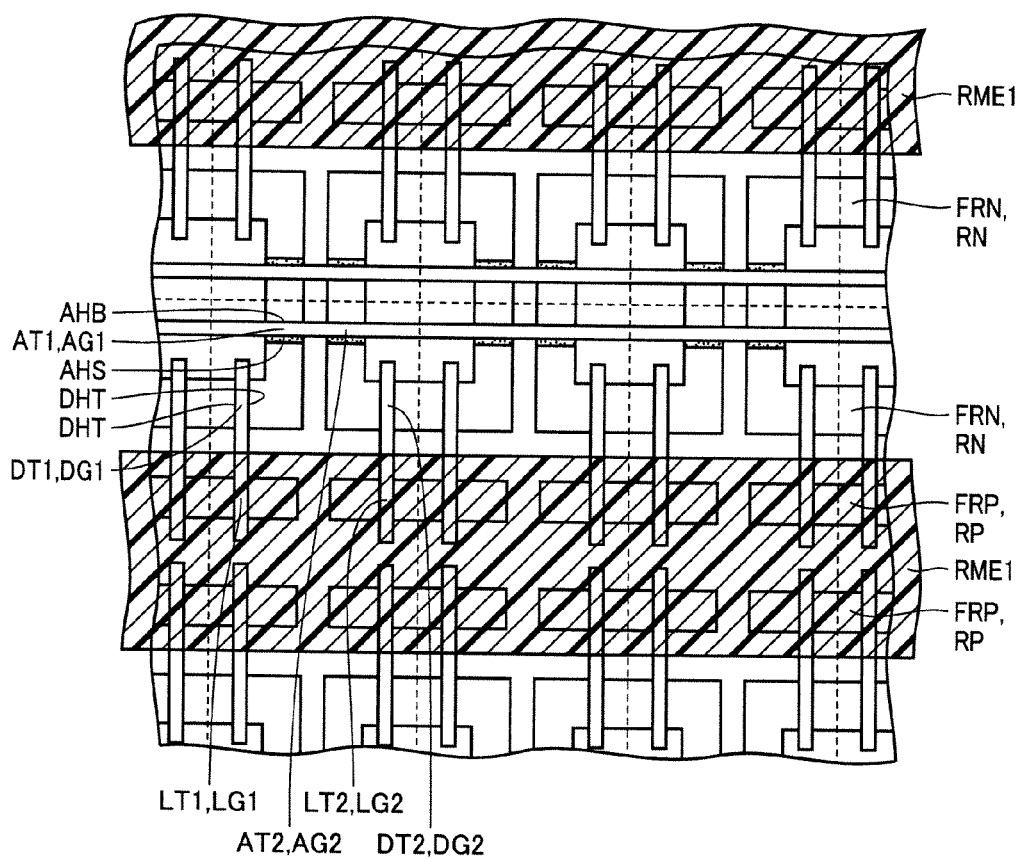

FIG. 144 is a plan view showing a step performed after the step shown in FIG. 143 in the embodiment.

Figure 145:
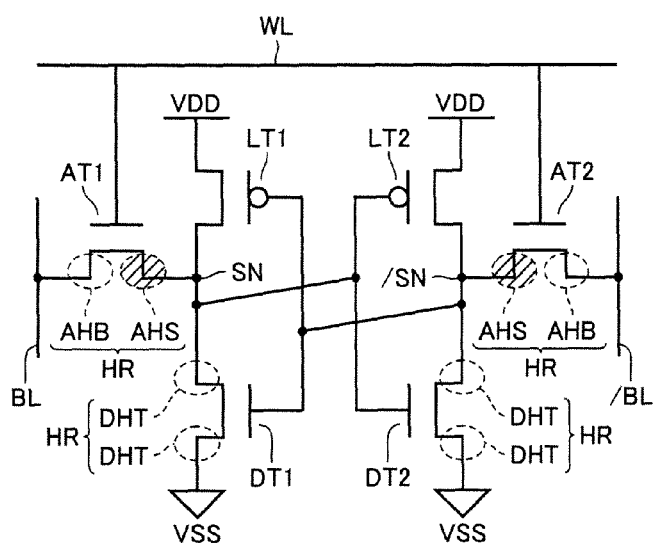

FIG. 145 shows an equivalent circuit of each SRAM memory cell of a semiconductor device in a twelfth embodiment of the present invention.

Figure 146:
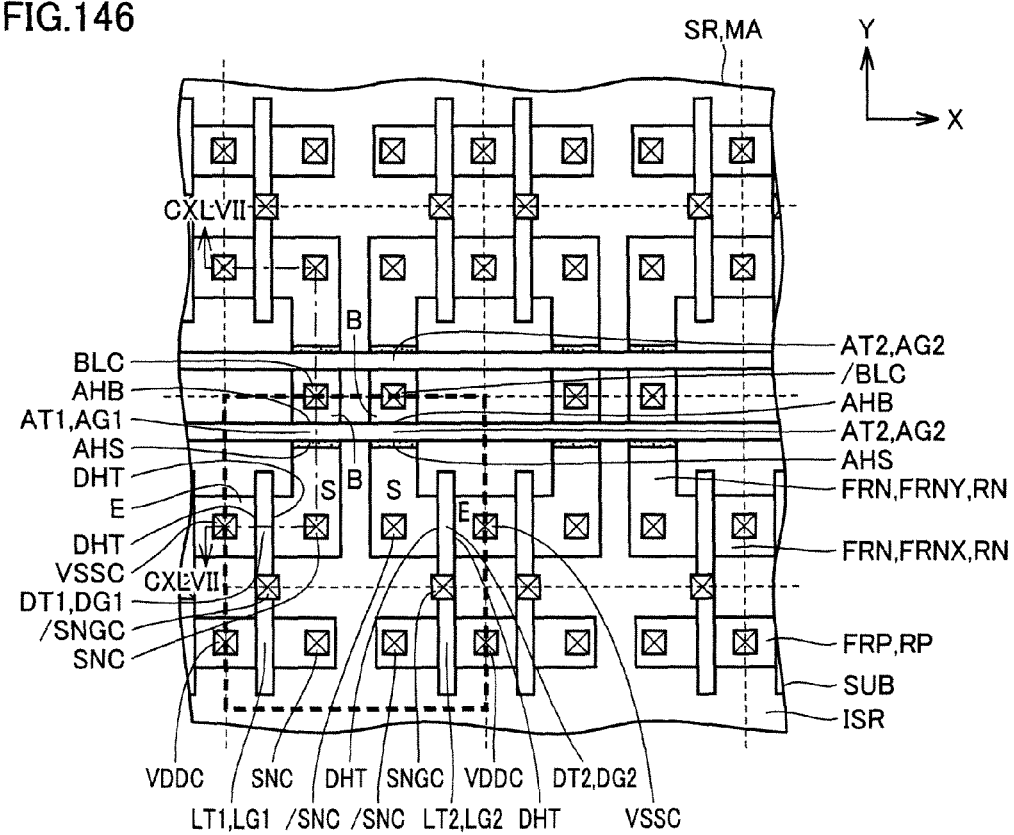

FIG. 146 is a plan view showing an arrangement pattern of the SRAM memory cells in the embodiment.

Figure 147:
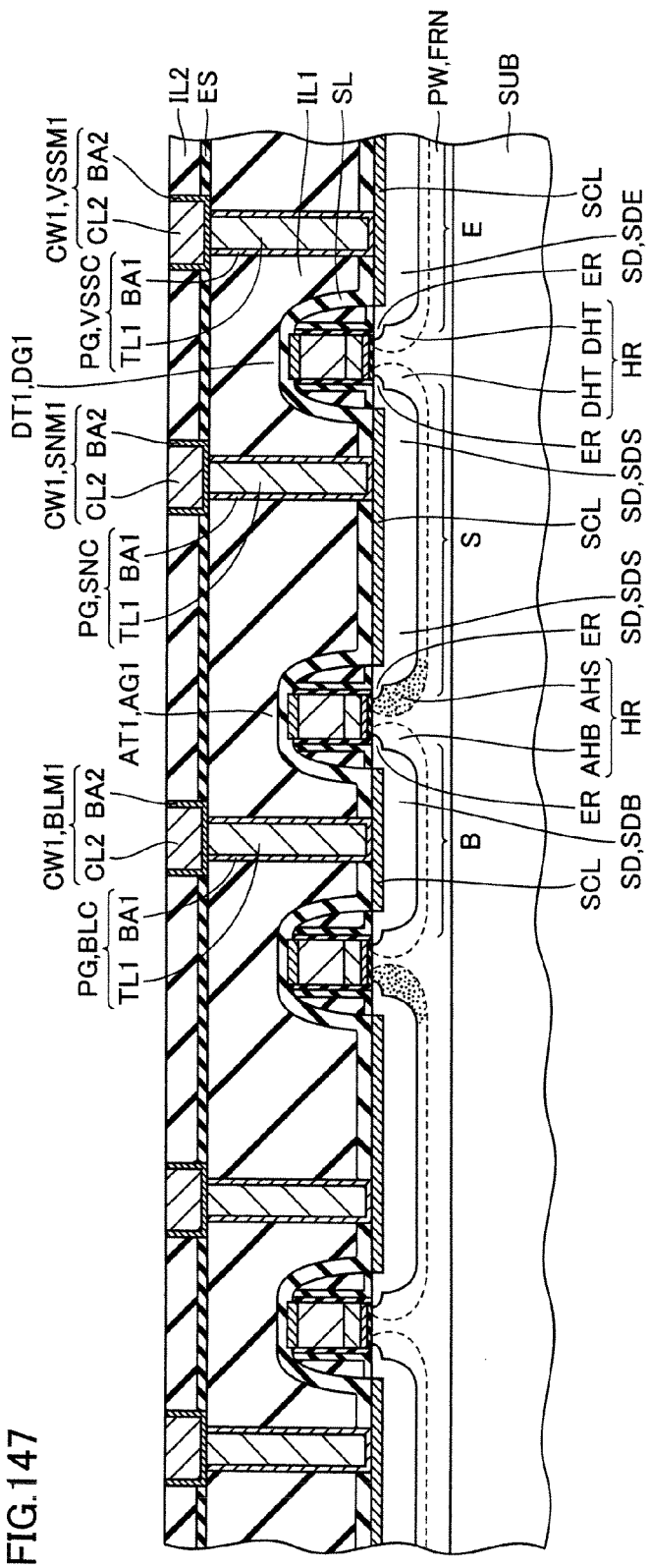

FIG. 147 is a cross sectional view taken along a cross sectional line CXLVII-CXLVII of FIG. 146 in the embodiment.

Figure 148:
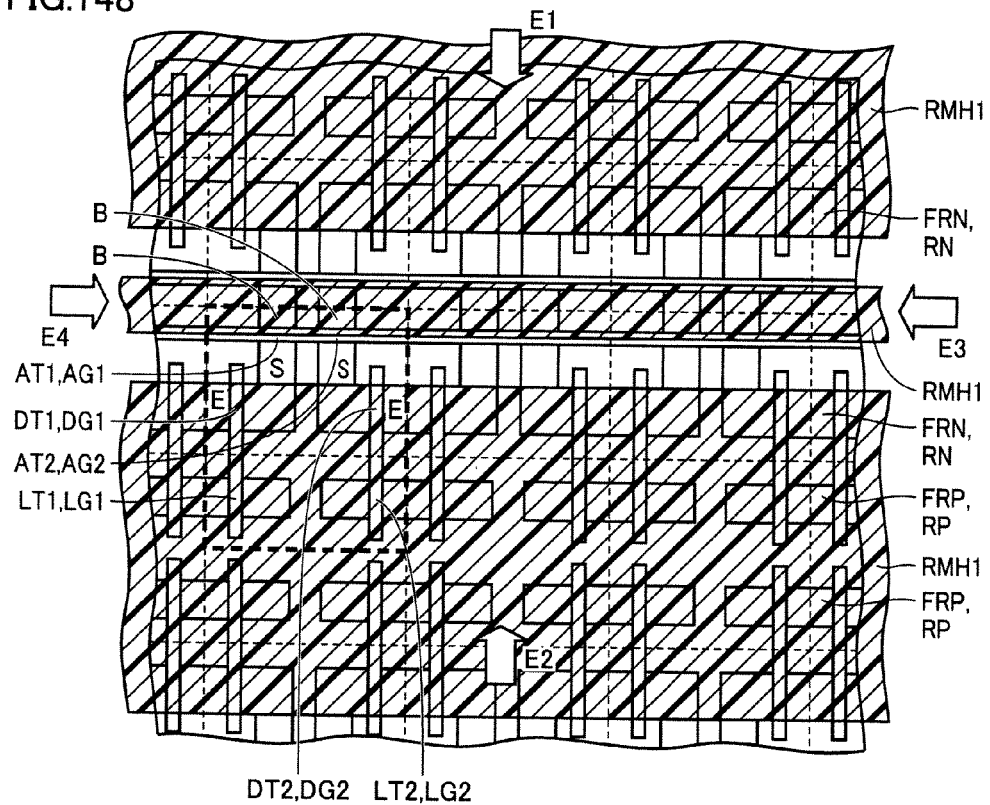

FIG. 148 is a plan view showing one step in a method for manufacturing the semiconductor device in the embodiment.

Figure 149:
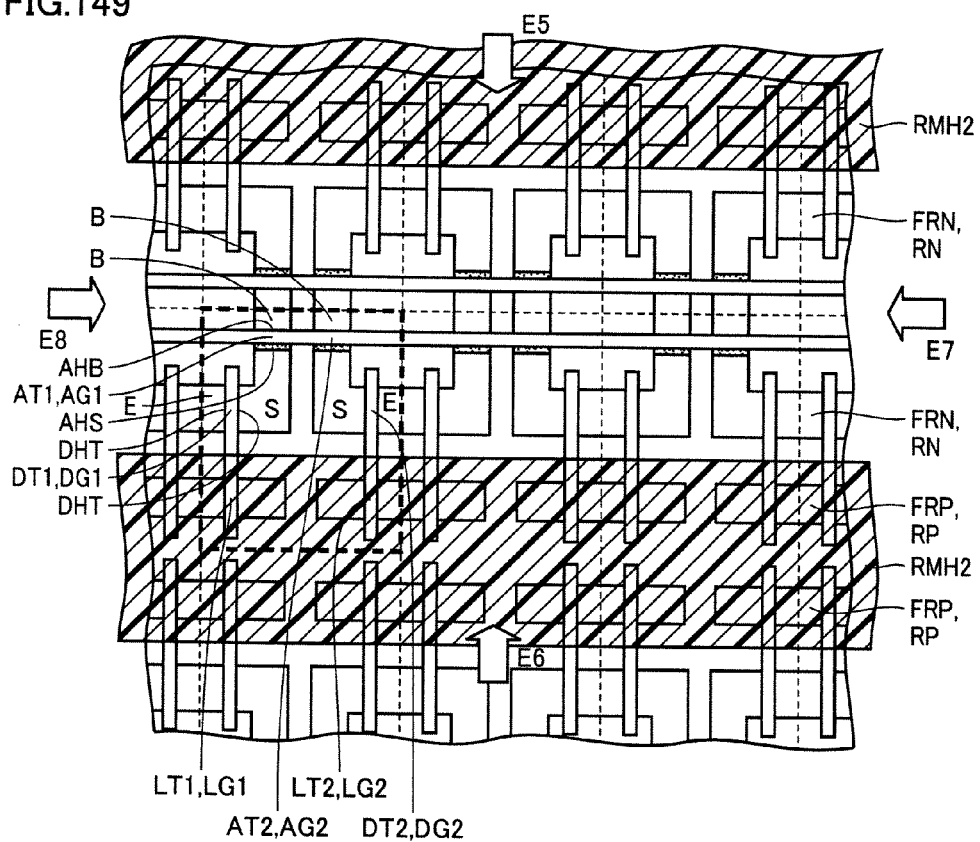

FIG. 149 is a plan view showing a step performed after the step shown in FIG. 148 in the embodiment.

Figure 150:
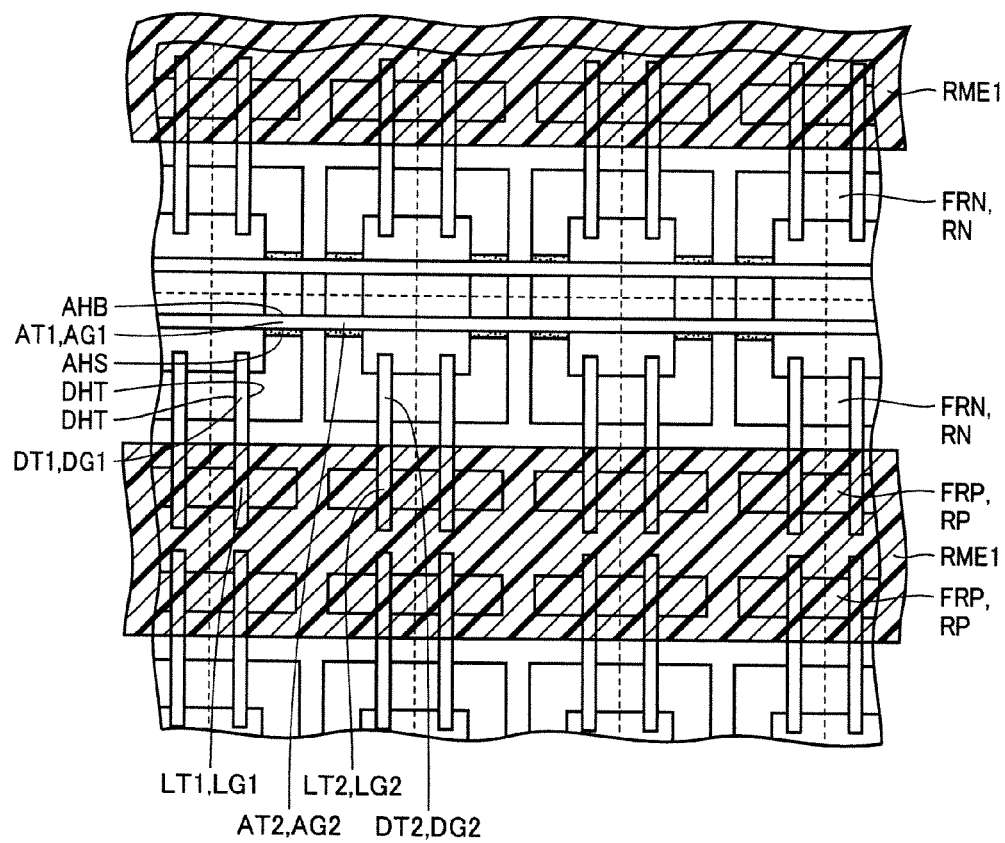

FIG. 150 is a plan view showing a step performed after the step shown in FIG. 149 in the embodiment.

DESCRIPTION OF EMBODIMENTS

First Embodiment

Figure 1:
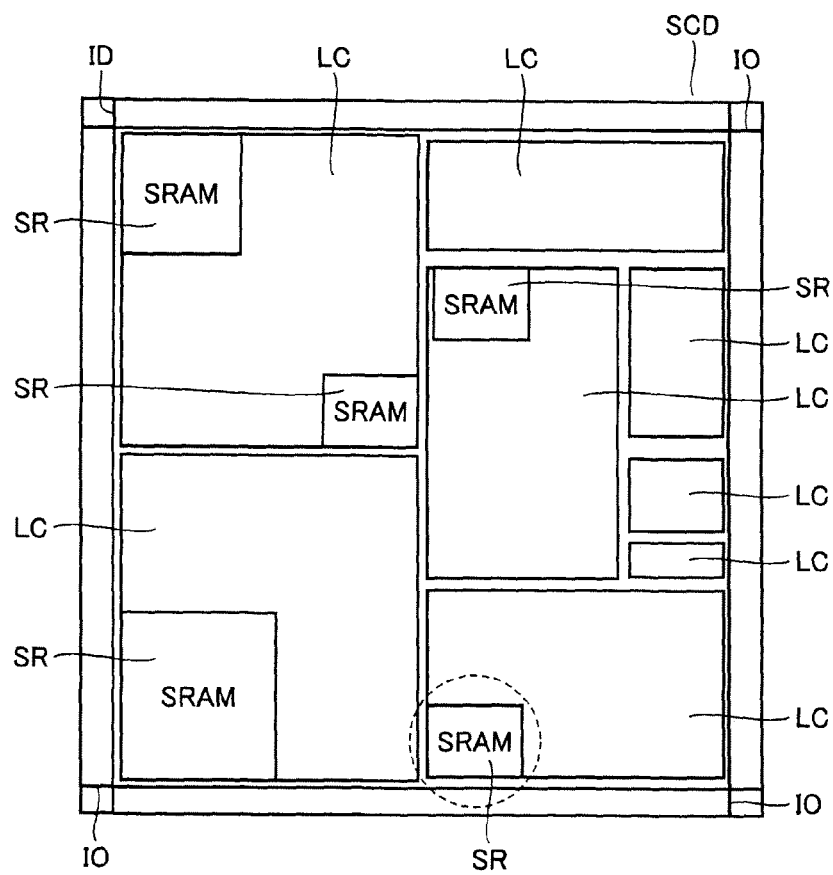
FIG. 1 is a plan view showing an exemplary arrangement relation in a semiconductor device including SRAMs according to a first embodiment of the present invention.
Figure 2:
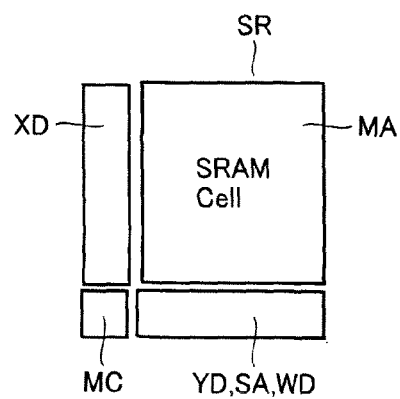
FIG. 2 is a plan view showing a configuration of an SRAM memory cell within a dotted-line frame shown in FIG. 1 in the embodiment.

Described first is one exemplary semiconductor device called "SOC" to which an SRAM is applied as a memory cell. As shown in FIG. 1, in a semiconductor device SCD, a plurality of logic circuits LC and SRAM units SR are provided on one chip. The plurality of logic circuits LC implement specific functions such as a micro control unit, an analog/digital converter, a digital/analog converter, a bus controller, and the like. SRAM units SR are connected to some of the logic circuits and temporarily store data. An IO region IO is formed to surround logic circuits LC and SRAM units SR. As shown in FIG. 2, each of SRAM units SR includes: a SRAM memory cell array MA having a plurality of memory cells arranged in the form of a matrix; an X decoder XD; a Y decoder YD; a sense amplifier SA; a write driver WD; and a main control circuit MC.

Figure 3:
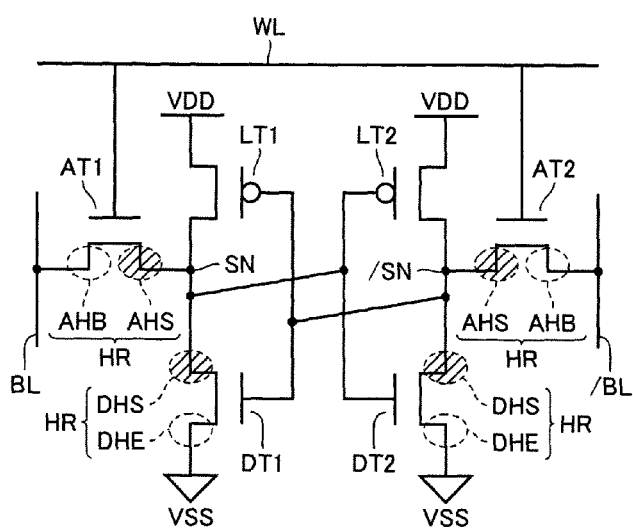
FIG. 3 shows an equivalent circuit of the SRAM memory cell in the embodiment.

The following describes an equivalent circuit of each of the SRAM memory cells. As shown in FIG. 3, the SRAM memory cell includes: a flip flop with two inverters cross-coupled to each other; and two access transistors AT1, AT2. In the flip flop, two storage nodes SN, /SN cross-coupled to each other are provided. Access transistor AT1 is connected between storage node SN and a bit line BL, and access transistor AT2 is connected between storage node /SN and a bit line /BL. Each of access transistors AT1, AT2 has a gate connected to a word line WL.

In the flip flop, a drive transistor DT1 is connected between storage node SN and a ground interconnection (VSS) and a drive transistor DT2 is connected between storage node /SN and the ground interconnection (VSS). Further, a load transistor LT1 is connected between storage node SN and a power supply interconnection (VDD), and a load transistor LT2 is connected between storage node /SN and the power supply interconnection (VDD). The gate of drive transistor DT1, the gate of load transistor LT1, and storage node /SN are electrically connected to one another. The gate of drive transistor DT2, the gate of load transistor LT2, and storage node SN are electrically connected to one another.

Before reading and writing data, bit lines BL, /BL are precharged to the H level. For example, when reading data in the memory cell in which H level and L level are respectively stored in storage nodes SN, /SN, drive transistor DT2 in ON state draws electric charges from bit line /BL via access transistor AT2, thereby decreasing potential of bit line /BL. The sense amplifier not shown in the figure detects the voltage decrease in bit line /BL. Meanwhile, when rewriting data in the memory cell, the write driver not shown in the figure operates to draw electric charges from storage node N1 via bit line BL, which has been charged to the H level, and access transistor AT1.

In each of the plurality of SRAM memory cells of the present semiconductor device, a pair of halo regions HR are formed in each of access transistors AT1, AT2. Of the pair of halo regions HR, a halo region AHS, which is adjacent to a source-drain region connected to storage node SN or /SN, is set to have an impurity concentration higher than that of a halo region AHB, which is adjacent to a source-drain region connected to bit line BL or /BL. Likewise, a pair of halo regions HR are formed in each of drive transistors DT1, DT2. Of the pair of halo regions HR, a halo region DHS, which is adjacent to the source-drain region connected to storage node SN or /SN, is set to have an impurity concentration higher than that of a halo region DHE, which is adjacent to the source-drain region connected to the ground interconnection (VSS). Further, the impurity concentration of halo region AHB and the impurity concentration of halo region DHE are set to be different from each other. Here, the impurity concentration of halo region DHE is set to be lower than the impurity concentration of halo region AHB.

Figure 4:
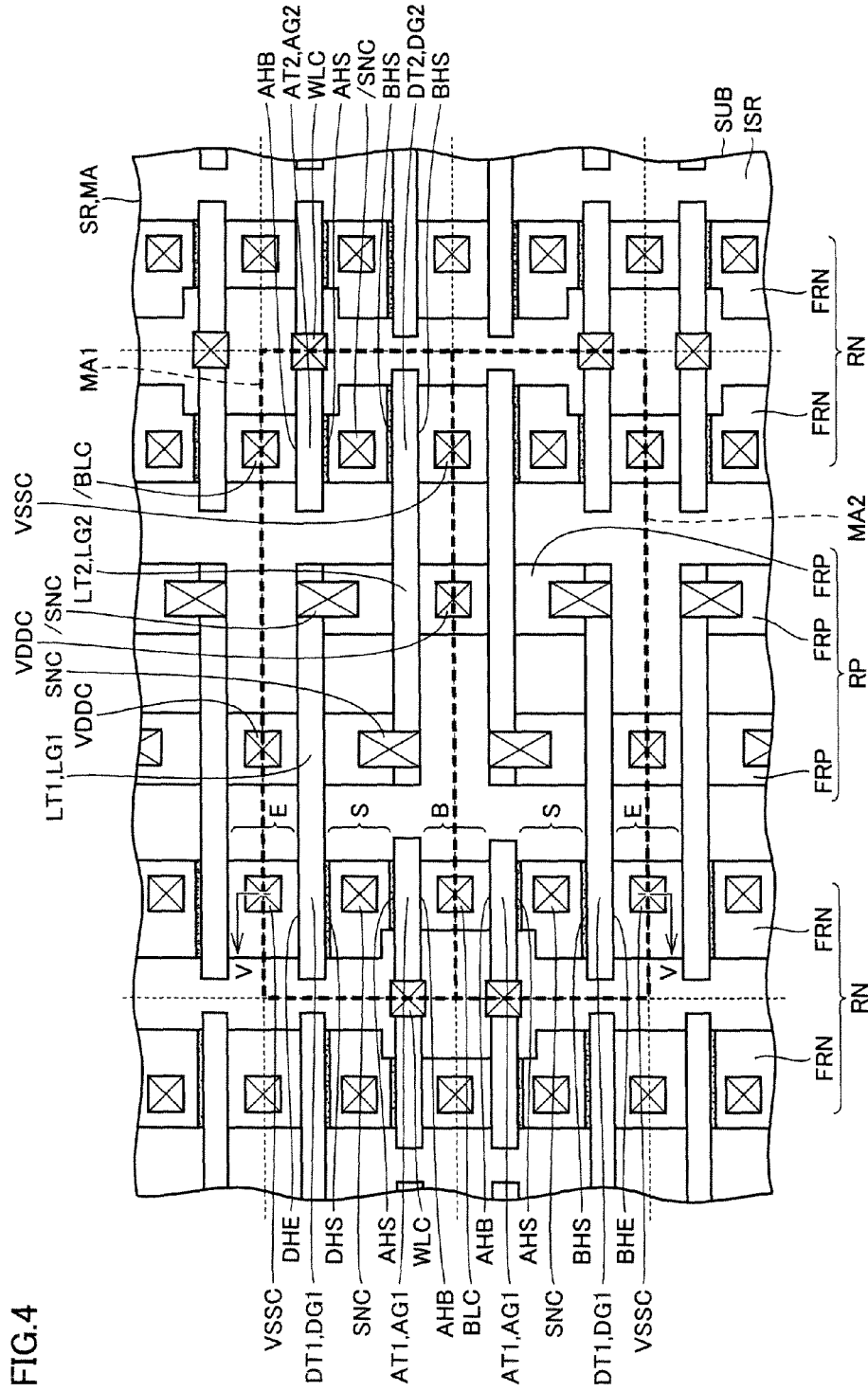
FIG. 4 is a plan view showing an arrangement pattern of the SRAM memory cells in the embodiment.

The following describes a structure of the SRAM memory cell. FIG. 4 is a plan view showing a layout of the transistors of the memory cells of the SRAM cell array, and contacts connected to the transistors. In this plan view, one SRAM memory cell is constituted of a region surrounded by a dotted line. The transistors and contacts of each of the SRAM memory cells are disposed in mirror symmetry to those of an adjacent memory cell. Representatively, SRAM memory cell MA1 has access transistors AT1, AT2, drive transistors DT1, DT2, and load transistors LT1, LT2.

On a main surface of a semiconductor substrate SUB, an element isolation region ISR is formed by an element isolation insulation film, thereby defining element formation regions FRN, FRP electrically disconnected from each other. Element formation regions FRN are formed in an NMIS region RN. In element formation regions FRN, access transistors AT1, AT2 and drive transistors DT1, DT2 are formed as n channel type MIS transistors. Element formation regions FRP are formed in a PMIS region RP. In element formation regions FRP, load transistors LT1, LT1 are formed as p channel type MIS transistors.

Access gate electrodes AG1, AG2 of access transistors AT1, AT2 and drive gate electrodes DG1, DG2 of drive transistors DT1, DT2 are formed across element formation regions FRN. Load gate electrodes LG1, LG2 of load transistors LT1, LT2 are formed across element formation regions FRP. Further, each of access gate electrodes AG1, AG2, drive gate electrodes DG1, DG2, and load gate electrodes LG1, LG2 is formed to extend in one direction.

Figure 5:
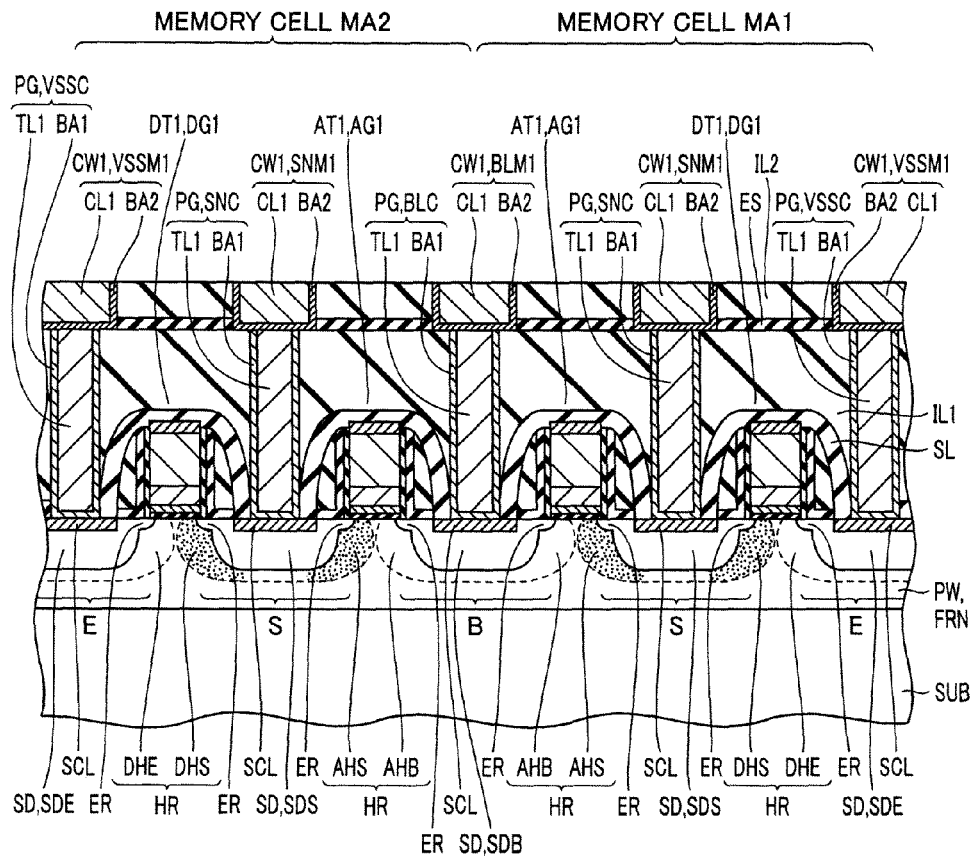
FIG. 5 is a cross sectional view taken along a cross sectional line V-V of FIG. 4 in the embodiment.

FIG. 5 is a cross sectional view taken along a cross sectional line V-V extending through drive transistors DT1 and access transistors AT1 of SRAM memory cells MA1, MA2 adjacent to each other in FIG. 4. As shown in FIG. 5, access gate electrode AG1 of access transistor AT1 is formed above a region interposed between a region S and a region B. In region S, an n type source-drain region SDS, which is electrically connected to the storage node (contact SNC), is formed. In region B, an n type source-drain region SDB, which is electrically connected to the bit line (contact BLC), is formed. In a region just below access gate electrode AG1, as p type halo regions HR, halo region AHS is formed adjacent to source-drain region SDS and halo region AHB is formed adjacent to source-drain region SDB.

On the other hand, drive gate electrode DG1 of drive transistor DT1 is formed above a region interposed between a region E and region S. In region E, an n type source-drain region SDE, which is electrically connected to the ground interconnection (contact VSSC), is formed. In region S, n type source-drain region SDS, which is electrically connected to the storage node (contact SNC), is formed. In a region just below drive gate electrode DG1, as p type halo regions HR, halo region DHS is formed adjacent to source-drain region SDS and halo region DHE is formed adjacent to source-drain region SDE.

An extension region ER is formed up to a predetermined depth from the surface of each of source-drain regions SD. Moreover, a metal silicide film SCL is formed in source-drain region SD. In order to cover each of access gate electrode AG1, drive gate electrode DG1, and the like, a stress liner film SL such as a silicon nitride film is formed. In order to cover stress liner film SL, an interlayer insulating film IL1 such as a silicon oxide film (for example, a TEOS (Tetra Ethyl Ortho Silicate) film) is formed. A plug PG is formed to extend through interlayer insulating film IL1 and stress liner film SL and be electrically connected to metal silicide film SCL (source-drain region SD). Plug PG includes a barrier metal film BA1 such as a TiN film, and a tungsten film TL1.

Plug PG electrically connected to metal silicide film SCL disposed in source-drain region SDE forms contact VSSC. Likewise, plug PG electrically connected to metal silicide film SCL disposed in source-drain region SDS forms contact SNC (or the storage node). In addition, plug PG electrically connected to metal silicide film SCL disposed in source-drain region SDB forms contact BLC.

In order to cover each of plugs PG, an etching stopper film ES such as a silicon nitride film is formed on interlayer insulating film IL1. On etching stopper film ES, an interlayer insulating film IL2 such as a silicon oxide film is formed. A copper interconnection CW1 is formed to extend through interlayer insulating film IL2 and etching stopper film ES and to be electrically connected to plug PG. Copper interconnection CW1 includes a barrier metal film BA2 such as a TaN film and a copper film CL1, and forms a first metal interconnection. Although not shown in FIG. 5, a multilayer metal interconnection is formed above the first metal interconnection.

Figure 6:
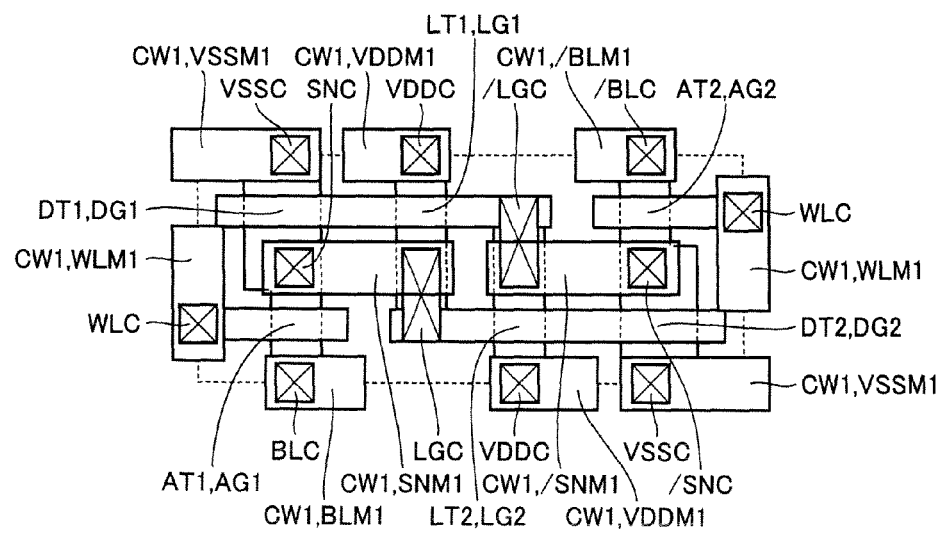
FIG. 6 is a plan view showing a structure of connection between each transistor and a first metal interconnection in the embodiment.
Figure 7:
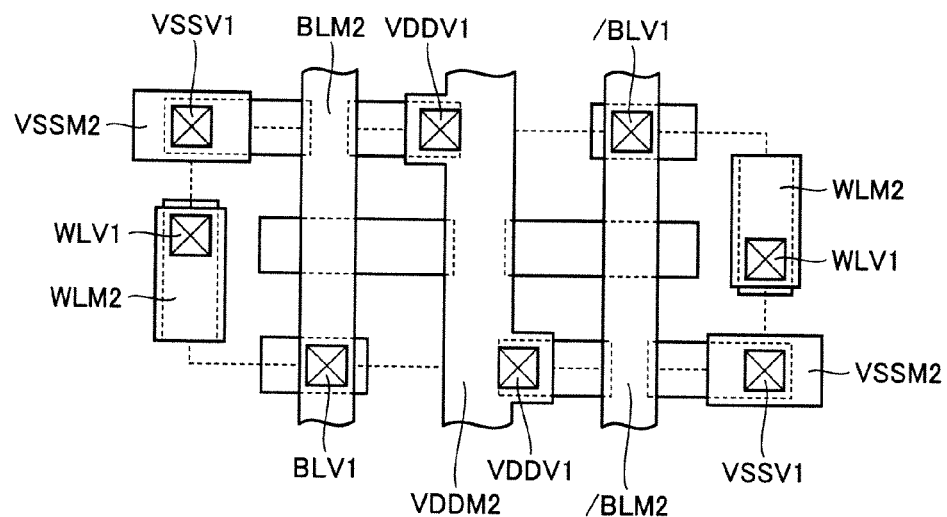
FIG. 7 is a plan view showing a structure of connection between the first metal interconnection and a second metal interconnection in the embodiment.
Figure 8:
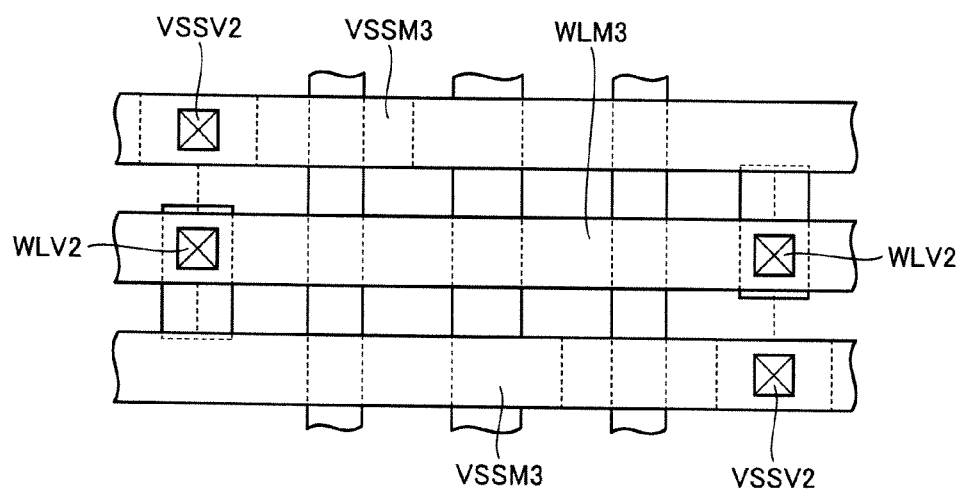
FIG. 8 is a plan view showing a structure of connection between the second metal interconnection and a third metal interconnection in the embodiment.

The following describes the multilayer interconnection structure that electrically connects the transistors. FIG. 6 is a plan view showing a structure of connection between each of the transistors and the first metal interconnection. FIG. 7 is a plan view showing a structure of connection between the first metal interconnection and a second metal interconnection. FIG. 8 is a plan view showing a structure of connection between the second metal interconnection and a third metal interconnection. Each of FIG. 6 to FIG. 8 shows a multilayer interconnection structure for one memory cell. A multilayer interconnection structure for an adjacent SRAM memory cell is formed to have an interconnection pattern formed in a manner mirror-symmetric to that of each of FIG. 6 to FIG. 8. Hence, the following mainly describes SRAM memory cell MA1.

One (source-drain region SDB) of the pair of source-drain regions SD of access transistor AT1 is electrically connected to a second metal interconnection BLM2 serving as bit line BL, through contact BLC (plug PG), a first metal interconnection BLM1 (copper interconnection CW1), and a via BLV1. The other (source-drain region SDS) of the pair of source-drain regions SD of access transistor AT1 is electrically connected to one of the pair of the source-drain regions of load transistor LT1, load gate electrode LG2 of load transistor LT2, and drive gate electrode DG2 of drive transistor DT2 through contact SNC (plug PG), a first metal interconnection SNM1 (copper interconnection CW1), and a contact LGC.

Further, the other (source-drain region SDS) of the pair of source-drain regions of access transistor AT1 is electrically connected to one (source-drain region SDS) of the pair of source-drain regions of drive transistor DT1. Access gate electrode AG1 of access transistor AT1 is electrically connected to a third metal interconnection WLM3 serving as word line WL, through a contact WLC (plug PG), first metal interconnection WLM1 (copper interconnection CW1), via BLV1, a second metal interconnection WLM2, and a via WLV2.

The other (source-drain region SDE) of the pair of source-drain regions of drive transistor DT1 is electrically connected to a third metal interconnection VSSM3 serving as ground interconnection VSS fed with a ground potential, through a contact VSSC (plug PG), a first metal interconnection VSSM1 (copper interconnection CW1), a via VSSV1, a second metal interconnection VSSM2, and a via VSSV2. The other of the pair of source-drain regions of load transistor LT1 is electrically connected to a second metal interconnection VDDM2 serving as power supply interconnection VDD, through a contact VDDC, a first metal interconnection VDDM1 (copper interconnection CW1), and a via VDDV1.

One of the pair of source-drain regions of access transistor AT2 is electrically connected to second metal interconnection /BLM2 serving as bit line /BL, through a contact /BLC (plug PG), a first metal interconnection /BLM1 (copper interconnection CW1), and a via /BLV1. The other of the pair of source-drain regions of access transistor AT2 is electrically connected to one of the pair of source-drain regions of load transistor LT2, load gate electrode LG1 of load transistor LT1, and drive gate electrode DG1 of drive transistor DT1 through a contact /SCN (plug PG), a first metal interconnection /SNM1, and a contact /LGC. Further, the other of the pair of source-drain regions of access transistor AT2 is electrically connected to one of the pair of source-drain regions of drive transistor DT2.

Access gate electrode AG2 of access transistor AT2 is electrically connected to third metal interconnection WLM3 serving as word line WL, through contact WLC, first metal interconnection WLM1 (copper interconnection CW1), via WLV1, second metal interconnection WLM2, and via WLV2. The other of the pair of source-drain regions of drive transistor DT2 is electrically connected to third metal interconnection VSSM3 serving as ground interconnection VSS fed with a ground potential, through contact VSSC (plug PG), first interconnection VSSM1 (copper interconnection CW1), via VSSV1, second metal interconnection VSSM2, and via VSSV2. The other of the pair of source-drain regions of load transistor LT2 is electrically connected to second metal interconnection VDDM2 serving as power supply interconnection Vdd fed with a power supply potential, through contact VDDC, first metal interconnection VDDM1 (copper interconnection CW1), and via VDDV1.

Thus, in SRAM memory cell MA1, word line WL is connected to contact WLC. Ground interconnection VSS is connected to contact VSSC. Power supply interconnection VDD is connected to contact VDDC. Bit line BL is connected to contact BLC, and bit line /BL is connected to contact /BLC. Further, contact SNC forms storage node SN, and contact /SNC forms storage node /SN.

Meanwhile, in SRAM memory cell MA2 adjacent to SRAM memory cell MA1, contact SNC forms storage node SN of SRAM memory cell MA2. Ground interconnection VSS is connected to contact VSSC. Contact BLC connected to bit line BL is common between SRAM memory cell MA1 and SRAM memory cell MA2.

Figure 9:
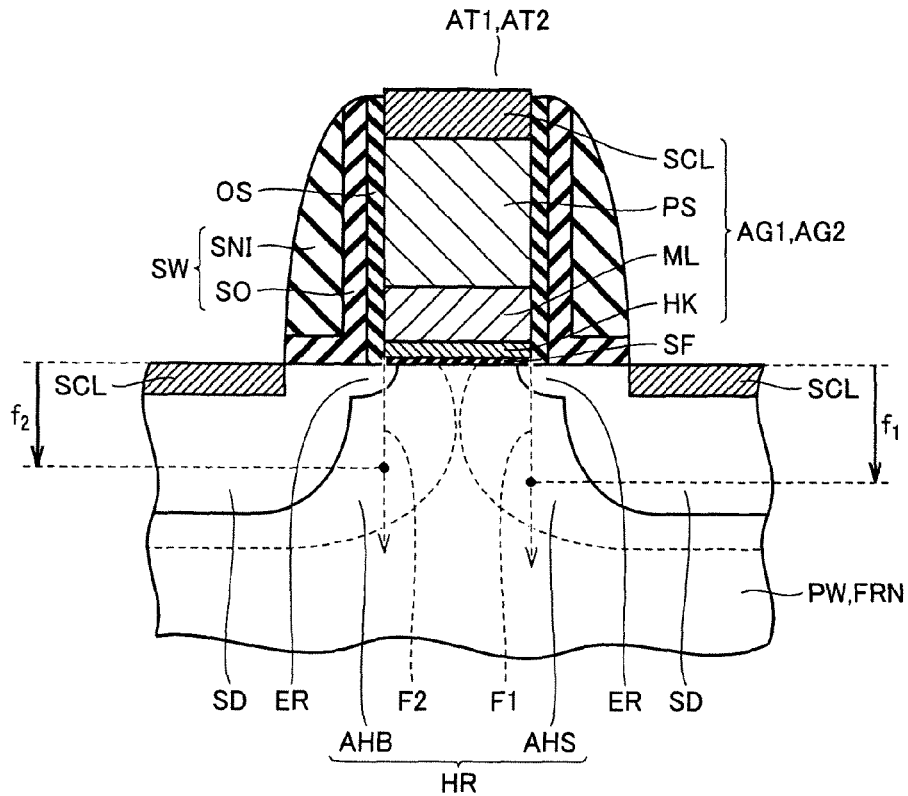
FIG. 9 is a partial enlarged cross sectional view showing an access transistor in the embodiment.

The following describes the structure of the access transistor in detail. It should be noted that a cross sectional structure taken along a cross sectional line corresponding to cross sectional line V-V shown in FIG. 4 will be illustrated as the cross sectional structure thereof. As shown in FIG. 9, access gate electrode AG1 of access transistor AT1 (AT2) formed across element formation region FRN (FIG. 4) is formed by laminating a High-k film HK such as $HfO_2$ or HfSiON, a metal film ML such as TiN, and a polysilicon film PS on an interlayer SF such as SiON. High-k film HK has a predetermined dielectric constant and contains La. Metal film ML has a predetermined work function. On the surface of polysilicon film PS, metal silicide film SCL such as nickel silicide is formed.

On both side surfaces of access gate electrode AG1 (AG2), offset spacers OS such as silicon nitride films are formed, for example. On each of offset spacers OS, a side wall spacer SW including a silicon oxide film SO and a silicon nitride film SNI is formed.

In a portion of one element formation region positioned relative to access gate electrode AG1 (AG2) and orthogonal (gate length direction) to the direction in which access gate electrode AG1 (AG2) extends, halo region AHS, extension region ER, source-drain region SD, and metal silicide film SCL are formed. In a portion of the other element formation region positioned orthogonal to the direction in which access gate electrode AG1 (AG2) extends, halo region AHB, extension region ER, source-drain region SD, and metal silicide film SCL are formed.

As shown in FIG. 9, halo regions AHS, AHB are positioned in regions adjacent to facing portions of the pair of source-drain regions SD, and are formed to extend from regions just below side wall spacers SW to a region just below access gate electrode AG1 (AG2). Each of halo regions HR has an impurity concentration of on the order of $1\times10^{18}/cm^3$ to $1\times10^{19}/cm^3$, but in the present semiconductor device, halo region AHS is set to have an impurity concentration higher than the impurity concentration of halo region AHB.

Figure 10:
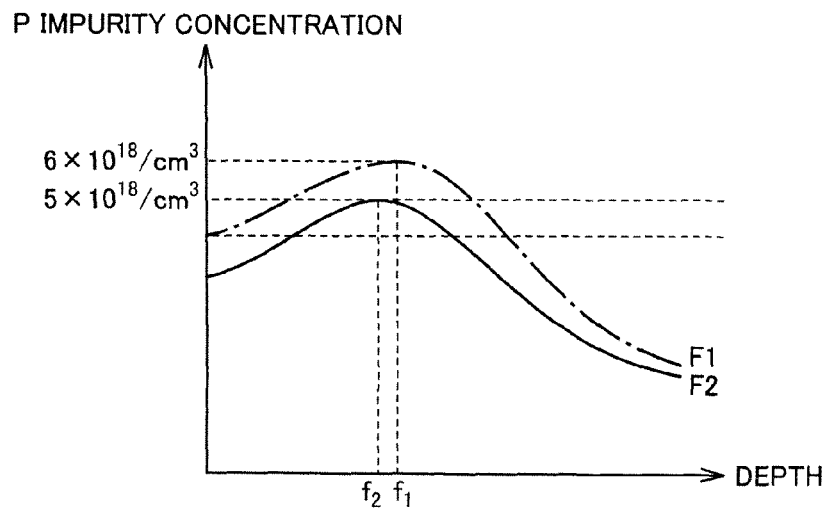
FIG. 10 is a graph showing impurity concentration profiles of halo regions of the access transistor in the embodiment.

FIG. 10 shows impurity concentration profiles of the halo regions. The horizontal axis represents a depth (arrows F1, F2 in FIG. 9)) from a portion of the surface of the semiconductor substrate at the lower end portion of the side surface of access gate electrode AG1 (AG2), whereas the vertical axis represents an impurity concentration of the p type impurity. In the portion of the surface of the semiconductor substrate at the lower end portion of the side surface of access gate electrode AG1 (AG2), halo region AHS has an impurity concentration higher than the impurity concentration of halo region AHB. Further, halo regions AHS, AHB respectively have peaks (maximum values) of the impurity concentrations first at predetermined depths f1, f2 from the surface. The peak of the impurity concentration of halo region AHS is higher than the peak of the impurity concentration of halo region AHB, specifically, the peak of the impurity concentration of halo region AHS is about $6\times10^{18}/cm^3$, and the peak of the impurity concentration of halo region AHB is about $5\times10^{18}/cm^3$. It should be noted that extension region ER (see FIG. 5 and FIG. 9) of the SRAM memory cell has an impurity concentration of $5\times10^{20}/cm^3$ to $1\times10^{21}/cm^3$, and source-drain region SD (see FIG. 5 and FIG. 9) has an impurity concentration of about $5\times10^{21}/cm^3$.

As described above, the halo regions in the present semiconductor device are not only halo regions AHS, AHB formed in the regions just below access gate electrodes AG1, AG2, but also halo regions DHS, DHE formed in the region just below drive gate electrode DG1 (FIG. 5). Halo region DHS is set to have an impurity concentration higher than the impurity concentration of halo region DHE. Further, the impurity concentration of halo region DHS is set to be higher than the impurity concentration of halo region AHB, and the impurity concentration of halo region DHE is set to be lower than the impurity concentration of halo region AHB. As described below, because the impurity concentrations of halo regions AHS, AHB, DHS, DHE are in such a high/low relation in the present semiconductor device, both read margin and write margin can be increased.

The following describes a method for manufacturing the above-described semiconductor device. The semiconductor device includes the logic circuits in addition to the SRAM circuits, but description here is mainly directed to a method for forming the access transistors and the drive transistors in the SRAM memory cell.

Figure 11:
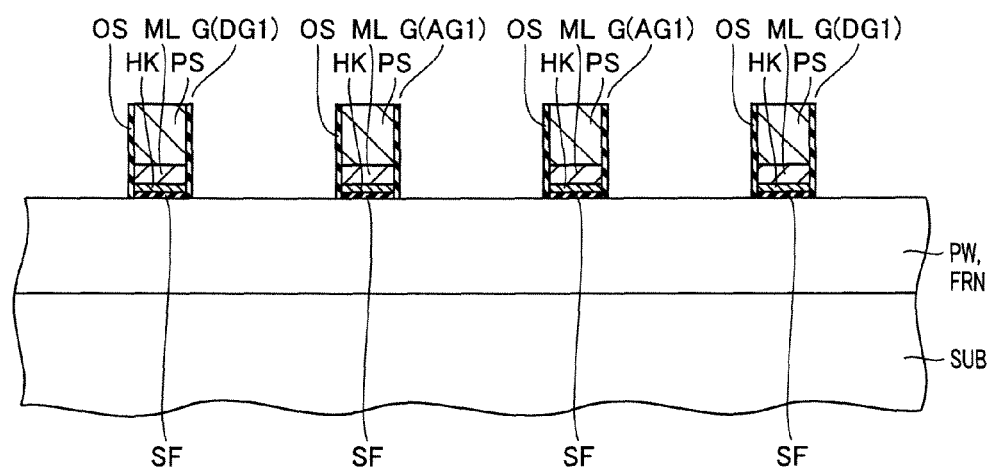
FIG. 11 is a cross sectional view showing one step in a method for manufacturing the semiconductor device in the embodiment.

First, element isolation region ISR is formed on the main surface of semiconductor substrate SUB by an element isolation insulation film, thereby defining element formation regions FRN, FRP electrically disconnected from each other (see FIG. 4). Next, as shown in FIG. 11, a p well PW is formed in element formation region FRN. Next, High-k film HK having a predetermined dielectric constant, metal film ML having a predetermined work function, and polysilicon film PS are laminated on the surface of semiconductor substrate SUB with interlayer SF being interposed therebetween, thereby forming a gate structure G to serve as access gate electrode AG1 and a gate structure G to serve as drive gate electrode DG1. Next, a silicon nitride film (not shown) is formed on semiconductor substrate SUB to cover each of gate structures G, for example. Next, the silicon nitride film is anisotropically etched to form offset spacers OS on both the side surfaces of gate structure G.

Figure 12:
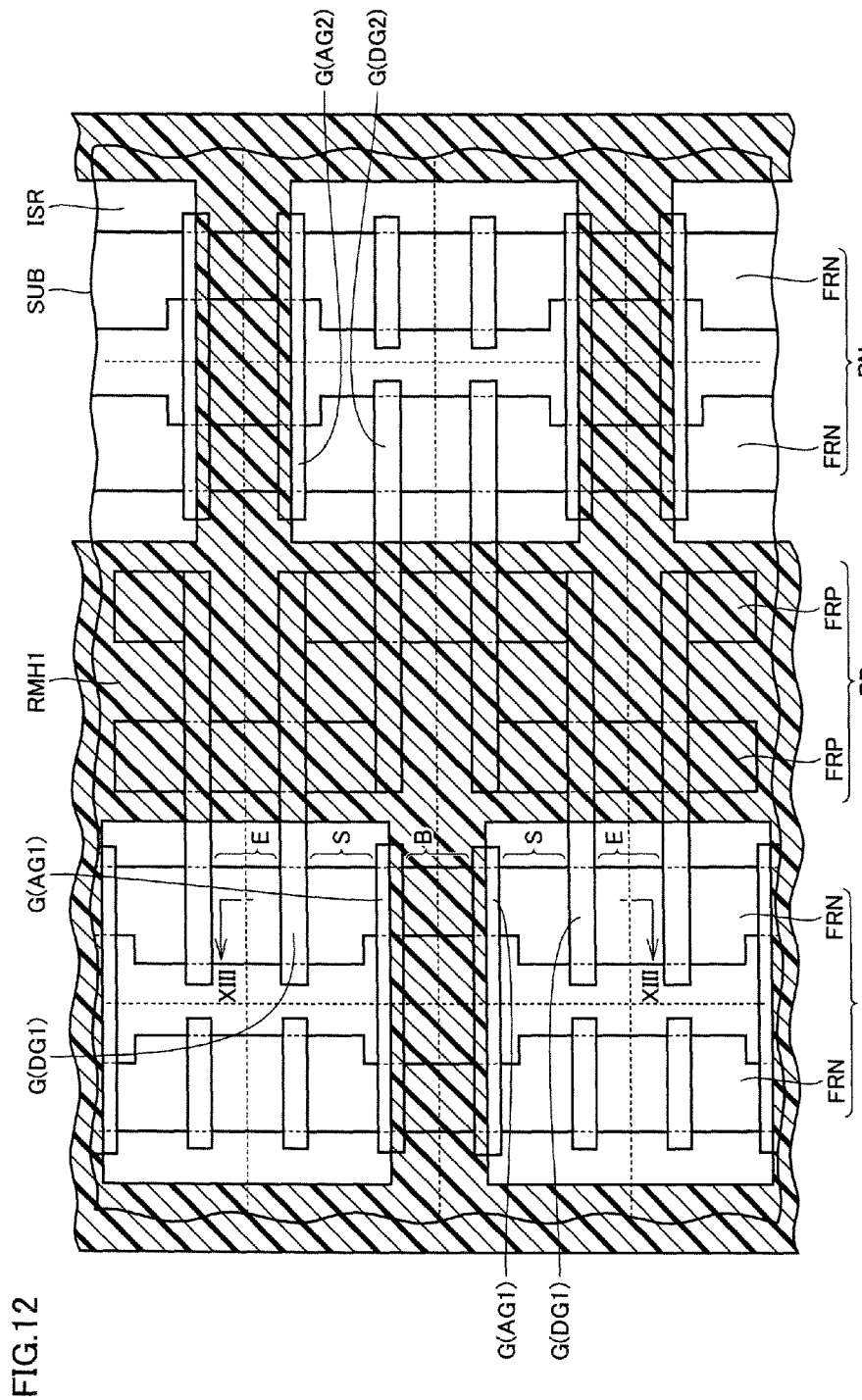
FIG. 12 is a plan view showing a step performed after the step shown in FIG. 11 in the embodiment.
Figure 13:
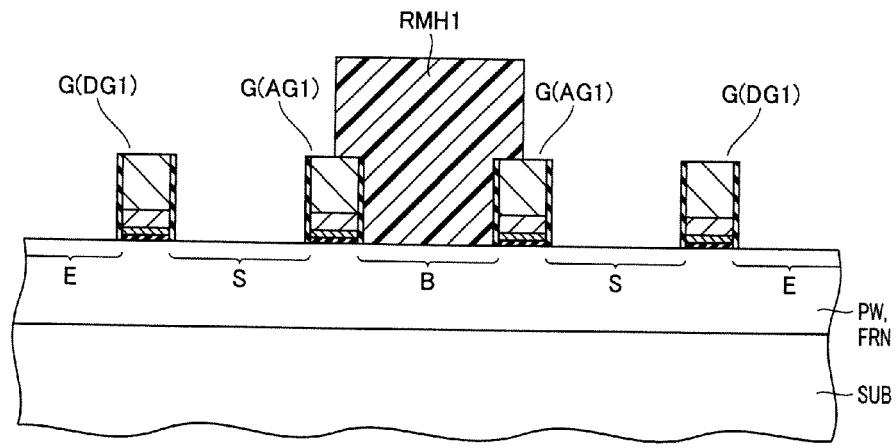
FIG. 13 is a cross sectional view taken along a cross sectional line XIII-XIII of FIG. 12 in the embodiment.

Next, as shown in FIG. 12 and FIG. 13, a predetermined photolithography process is performed to form a resist mask RMH1 that is to serve as an implantation mask for forming the halo regions (implantation mask A). In SRAM memory cell region MA1 (see FIG. 4), resist mask RMH1 is formed to have an opening pattern exposing: the side surface of gate structure G that is to serve as access gate electrode AG1 (AG2), the side surface being positioned at the side of region S in which the source-drain region electrically connected to the storage node is to be formed; region S; gate structure G that is to serve as drive gate electrode DG1 (DG2); and region E in which the source-drain region electrically connected to the ground interconnection is to be formed.

On the other hand, resist mask RMH1 is formed to cover: the side surface of gate structure G that is to serve as access gate electrode AG1, the side surface being positioned at the side of region B in which the source-drain region electrically connected to the bit line is to be formed; and region B.

In SRAM memory cell MA2 (see FIG. 4), resist mask RMH1 is formed to have an opening pattern exposing: the side surface of gate structure G that is to serve as access gate electrode AG1 (AG2), the side surface being positioned at the side of region S in which the source-drain region electrically connected to the storage node is to be formed; region S; gate structure G that is to serve as drive gate electrode DG1 (DG2); and region E in which the source-drain region electrically connected to the ground interconnection is to be formed.

In other words, resist mask RMH1 has openings formed across two SRAM memory cells MA1, MA2 adjacent to each other, and continuously exposes a region from the side surface, positioned at the region S side, of gate structure G that is to serve as the access gate electrode of one SRAM memory cell MA1 to the side surface, positioned at the region S side, of gate structure G that is to serve as the access gate electrode of the other SRAM memory cell MA2.

Meanwhile, resist mask RMH1 is formed to cover PMIS region RP and a region from the side surface, positioned at the region B side, of gate structure G that is to serve as the access gate electrode of SRAM memory cell MA1 to the side surface, positioned at the region B side, of the gate structure that is to serve as the access gate electrode of SRAM memory cell MA2.

Figure 14:
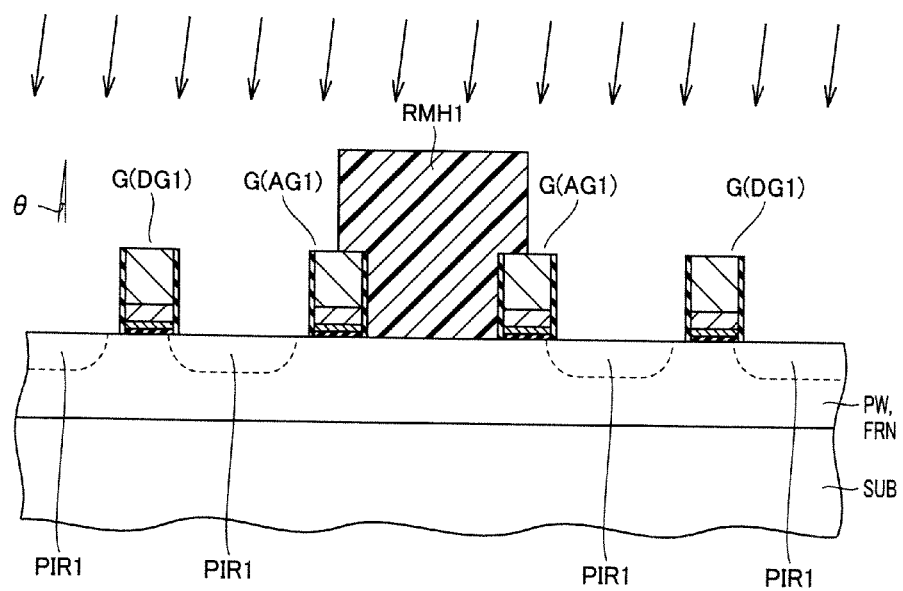
FIG. 14 is a cross sectional view showing a step performed after the step shown in FIG. 13 in the embodiment.
Figure 15:
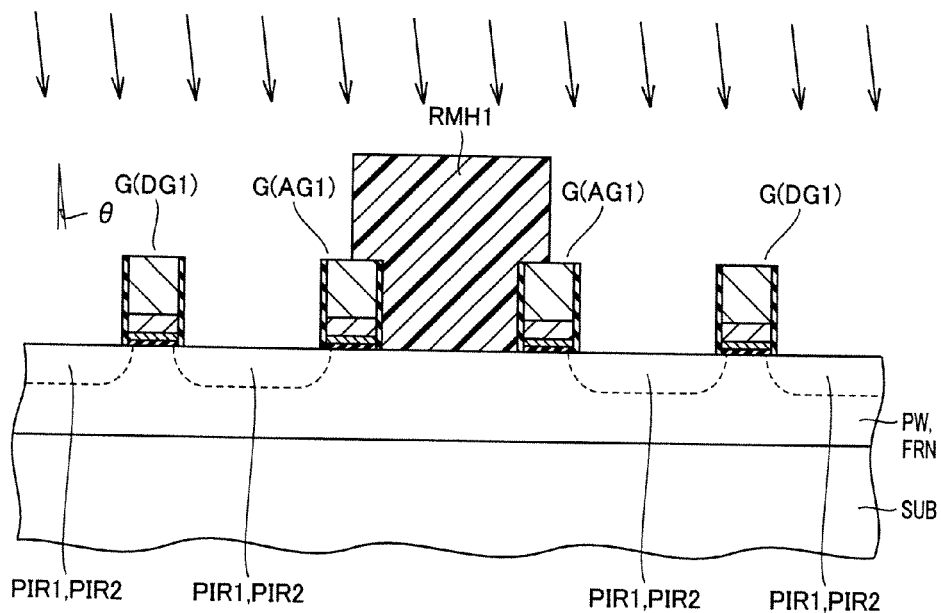
FIG. 15 is a cross sectional view showing a step performed after the step shown in FIG. 14 in the embodiment.

Next, as shown in FIG. 14, resist mask RMH1 is employed as an implantation mask to implant, for example, boron thereinto at an angle oblique ($\theta$=about 7°) to the direction perpendicular to the main surface of semiconductor substrate SUB, from one side substantially orthogonal to the direction in which gate structure G extends. In this way, p type impurity regions PIR1 are formed in the exposed regions of p well PW. Next, as shown in FIG. 15, the same resist mask RMH1 is employed as an implantation mask to implant boron thereinto at an angle oblique ($\theta$=about 7°) to the direction perpendicular to the main surface of semiconductor substrate SUB, from the other side opposite in direction to the one side substantially orthogonal to the direction in which gate structure G extends. In this way, p type impurity regions PIR2 are formed in exposed regions of p well PW (halo implantation A). It should be noted that in the implantation of the step shown in FIG. 14 and the implantation of the step shown in FIG. 15, the same amount of boron is implanted with the same implantation energy.

Figure 16:
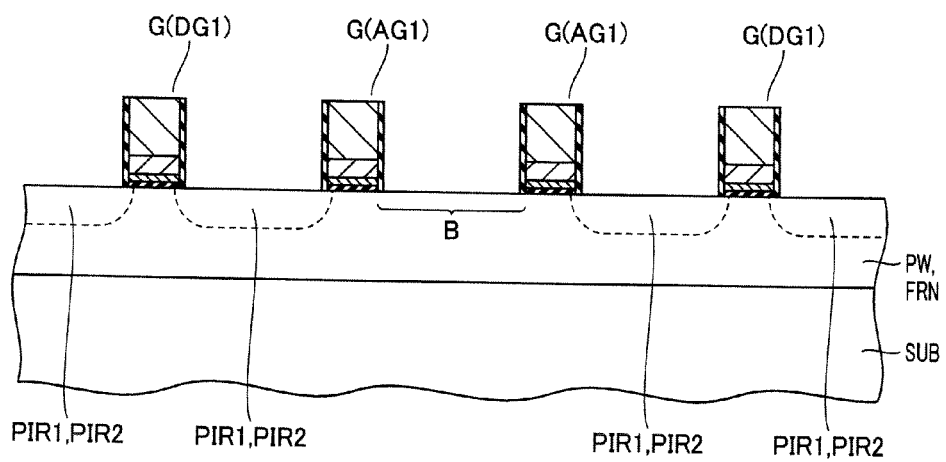
FIG. 16 is a cross sectional view showing a step performed after the step shown in FIG. 15 in the embodiment.
Figure 17:
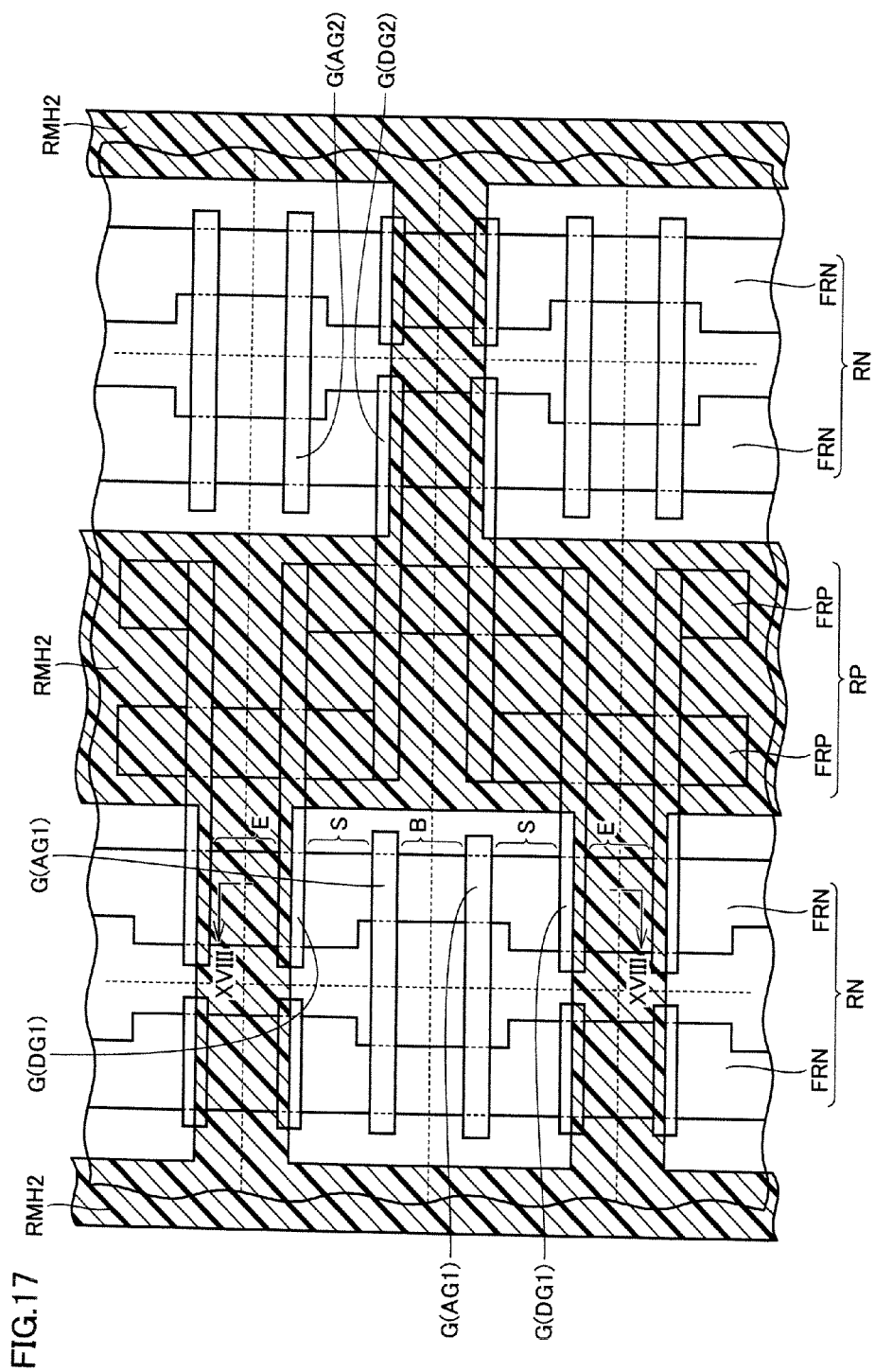
FIG. 17 is a plan view showing a step performed after the step shown in FIG. 16 in the embodiment.

Next, as shown in FIG. 16, resist mask RMH1 is removed. On this occasion, no impurity region is formed in region B within element formation region FRN. Next, as shown in FIG. 17, a predetermined photolithography process is performed to form a resist mask RMH2 that is to serve as an implantation mask for forming the halo regions (implantation mask B).

In one SRAM memory cell region, resist mask RMH2 is formed to have an opening pattern exposing: the side surface of gate structure G that is to serve as drive gate electrode DG1 (DG2), the side surface being positioned at the side of region S in which the source-drain region electrically connected to the storage node is to be formed; region S; gate structure G that is to serve as access gate electrode AG1 (AG2); and region B in which the source-drain region electrically connected to the bit line is to be formed.

On the other hand, resist mask RMH2 is formed to cover: the side surface of gate structure G that is to serve as drive gate electrode DG1, the side surface being positioned at the side of region E in which the source-drain region electrically connected to the ground interconnection is to be formed; region E; and element formation region FRP.

Figure 18:
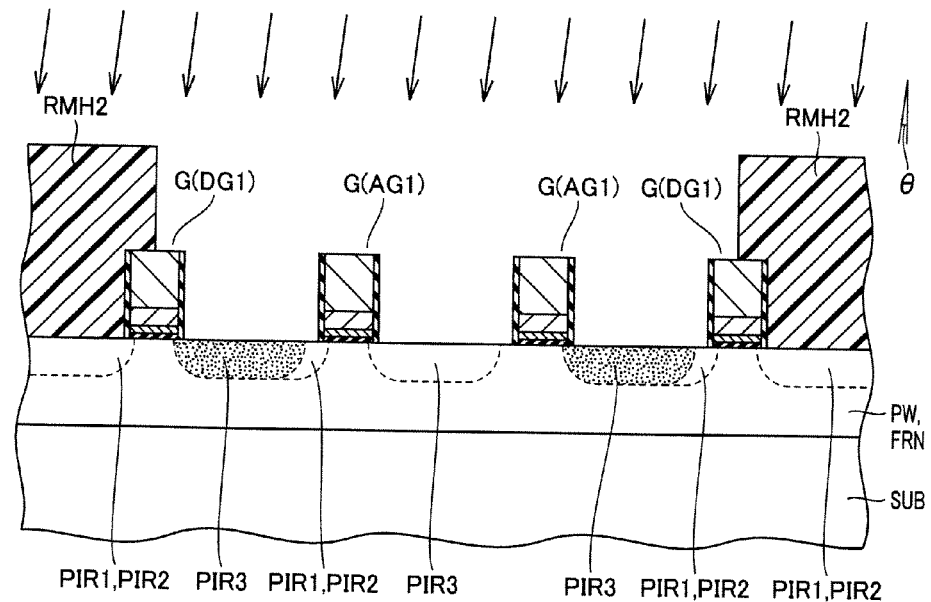
FIG. 18 is a cross sectional view showing a step performed after the step shown in FIG. 17 in the embodiment, and taken along a cross sectional line corresponding to a cross sectional line XVIII-XVIII shown in FIG. 17.
Figure 19:
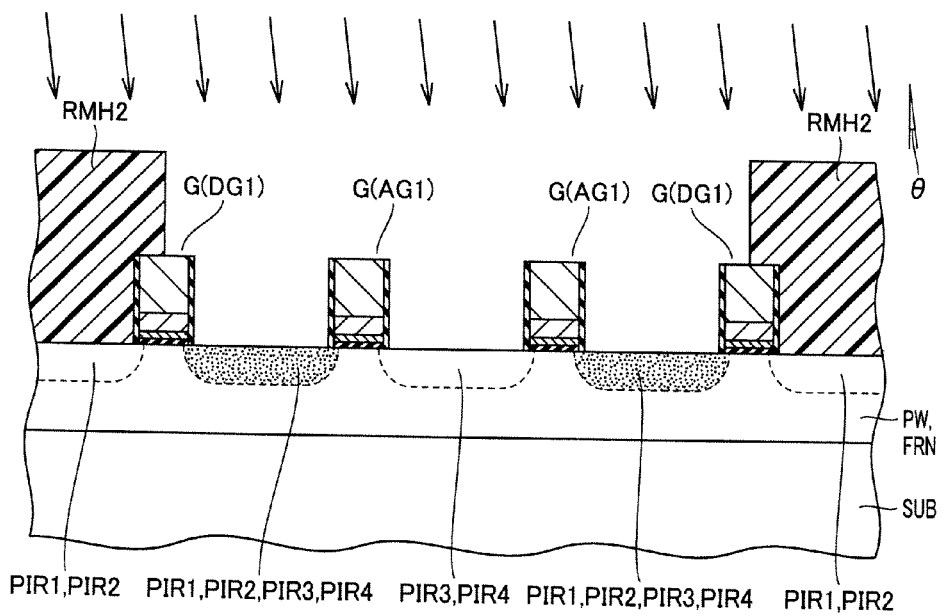
FIG. 19 is a cross sectional view showing a step performed after the step shown in FIG. 18 in the embodiment.

Next, as shown in FIG. 18, resist mask RMH2 is employed as an implantation mask to implant, for example, boron thereinto at an angle oblique ($\theta$=about 7°) to the direction perpendicular to the main surface of semiconductor substrate SUB, from one side substantially orthogonal to the direction in which gate structure G extends. In this way, p type impurity regions PIR3 are formed in the exposed regions of p well PW. Next, as shown in FIG. 19, the same resist mask RMH2 is employed as an implantation mask to implant boron thereinto at an angle oblique ($\theta$=about 7°) to the direction perpendicular to the main surface of semiconductor substrate SUB, from the other side opposite in direction to the one side substantially orthogonal to the direction in which gate structure G extends. In this way, p type impurity regions PIR4 are formed in the exposed regions of p well PW (halo implantation B). It should be noted that in the implantation of the step shown in FIG. 18 and the implantation of the step shown in FIG. 19, the same amount of boron is implanted with the same implantation energy.

Here, for halo implantation A (FIG. 14 and FIG. 15) and halo implantation B (FIG. 18 and FIG. 19), implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Figure 20:
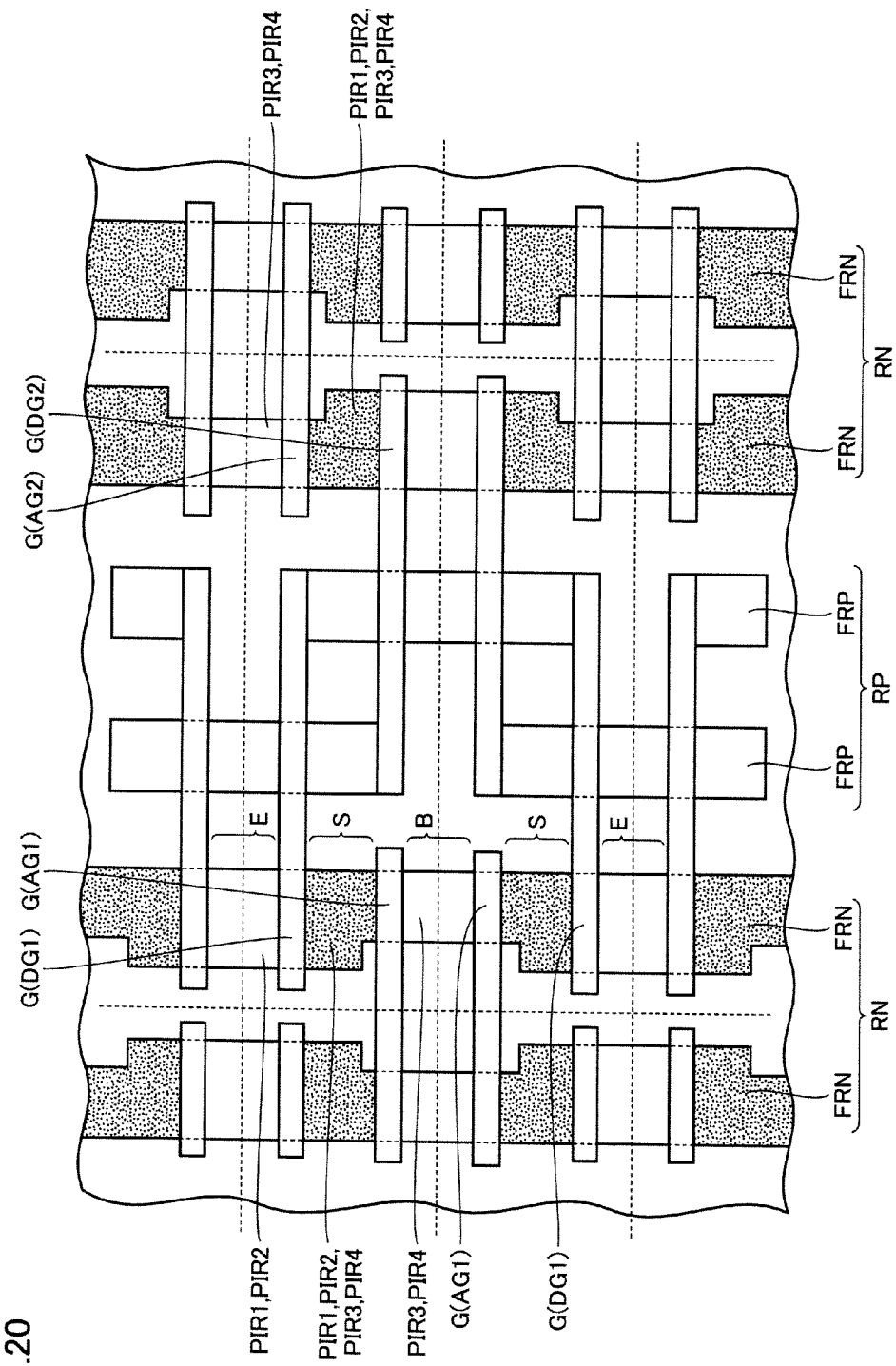
FIG. 20 is a plan view showing implantation of boron when the step shown in FIG. 19 is completed in the embodiment.

Thus, as shown in FIG. 20, p type impurity regions PIR3, PIR4 are formed in region B, p type impurity regions PIR1, PIR2 are formed in region E, and p type impurity regions PIR1, PIR2, PIR3, PIR4 are formed in region S. Portions of p type impurity regions PIR1, PIR2, PIR3, PIR4 will become the halo regions.

Figure 21:
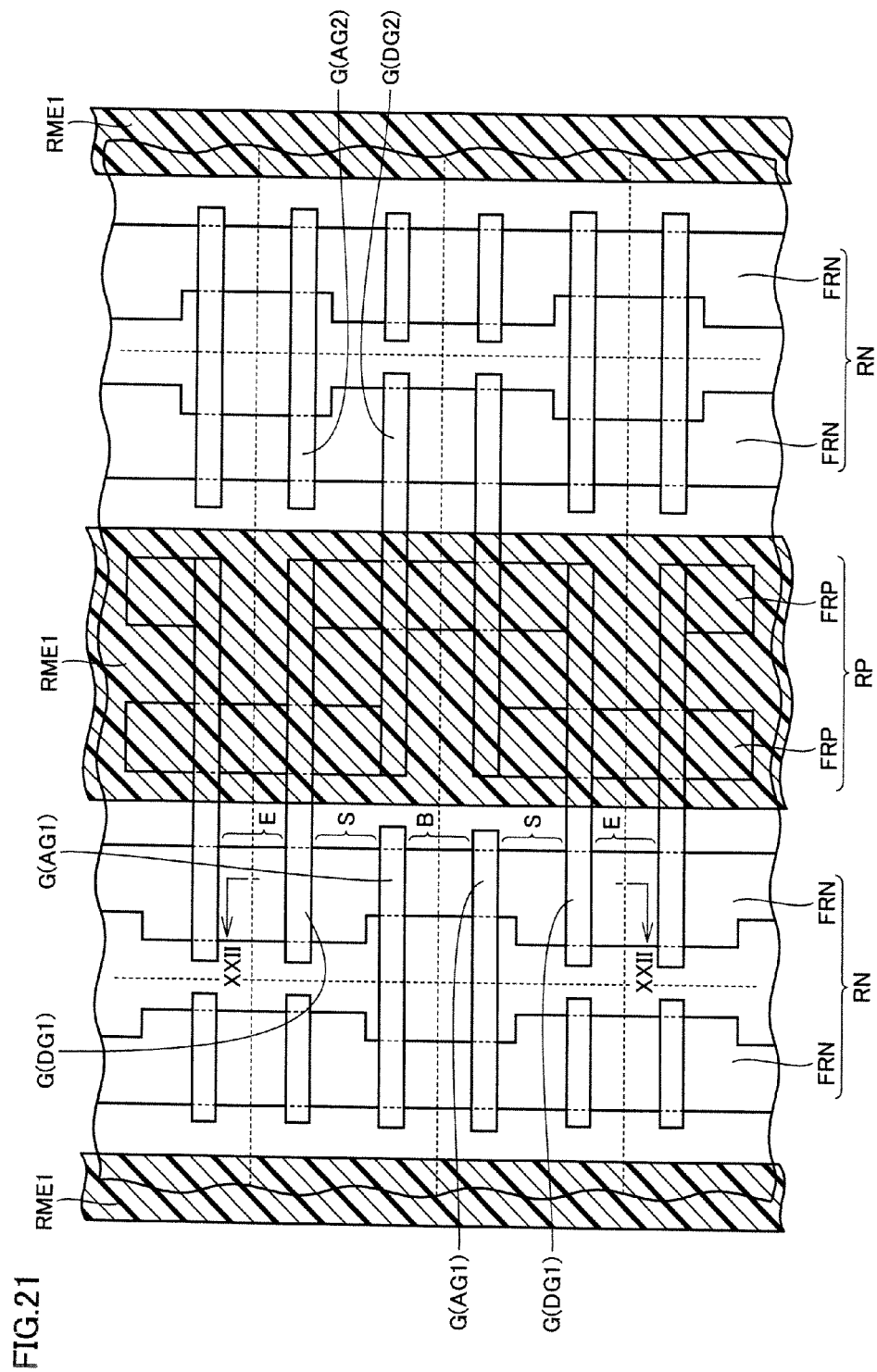
FIG. 21 is a plan view showing a step performed after the step shown in FIG. 19 in the embodiment.
Figure 22:
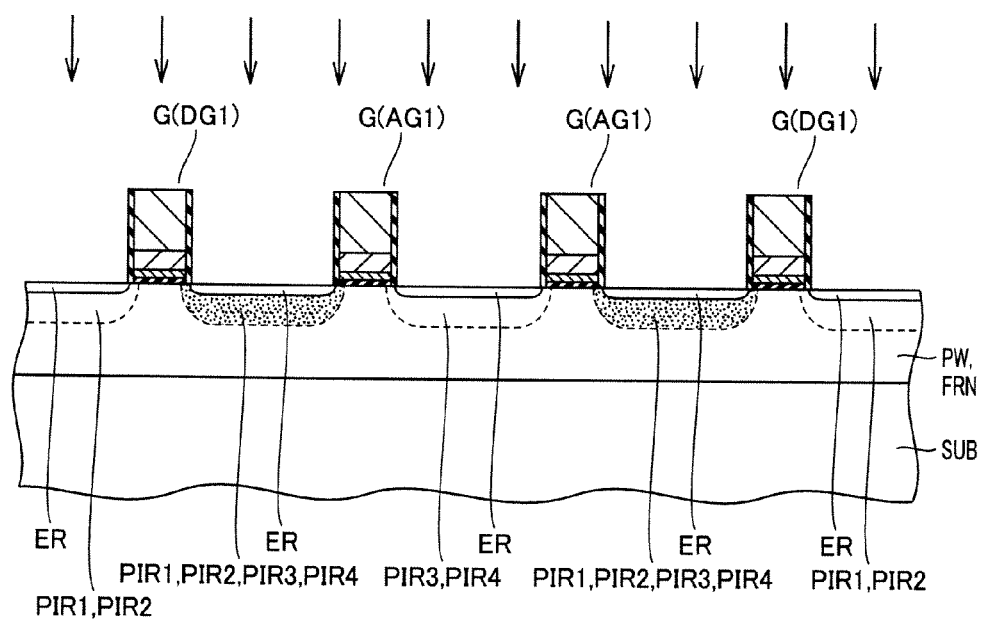
FIG. 22 is a cross sectional view showing a step performed after the step shown in FIG. 21 in the embodiment, and taken along a cross sectional line corresponding to a cross sectional line XXII-XXII shown in FIG. 21.

Next, as shown in FIG. 21, a resist mask RME1 is formed to expose NMIS region RN and cover PMIS region RP (implantation mask C). Next, as shown in FIG. 22, resist mask RME1 is employed as an implantation mask to implant, for example, phosphorus or arsenic into semiconductor substrate SUB in a direction substantially perpendicular to the main surface of semiconductor substrate SUB, thereby forming extension region ER up to a predetermined depth from the surface of the exposed region of p well PW (extension implantation). Thereafter, resist mask RME1 is removed. It should be noted that the extension implantation can be performed before halo implantation A and halo implantation B.

Figure 23:
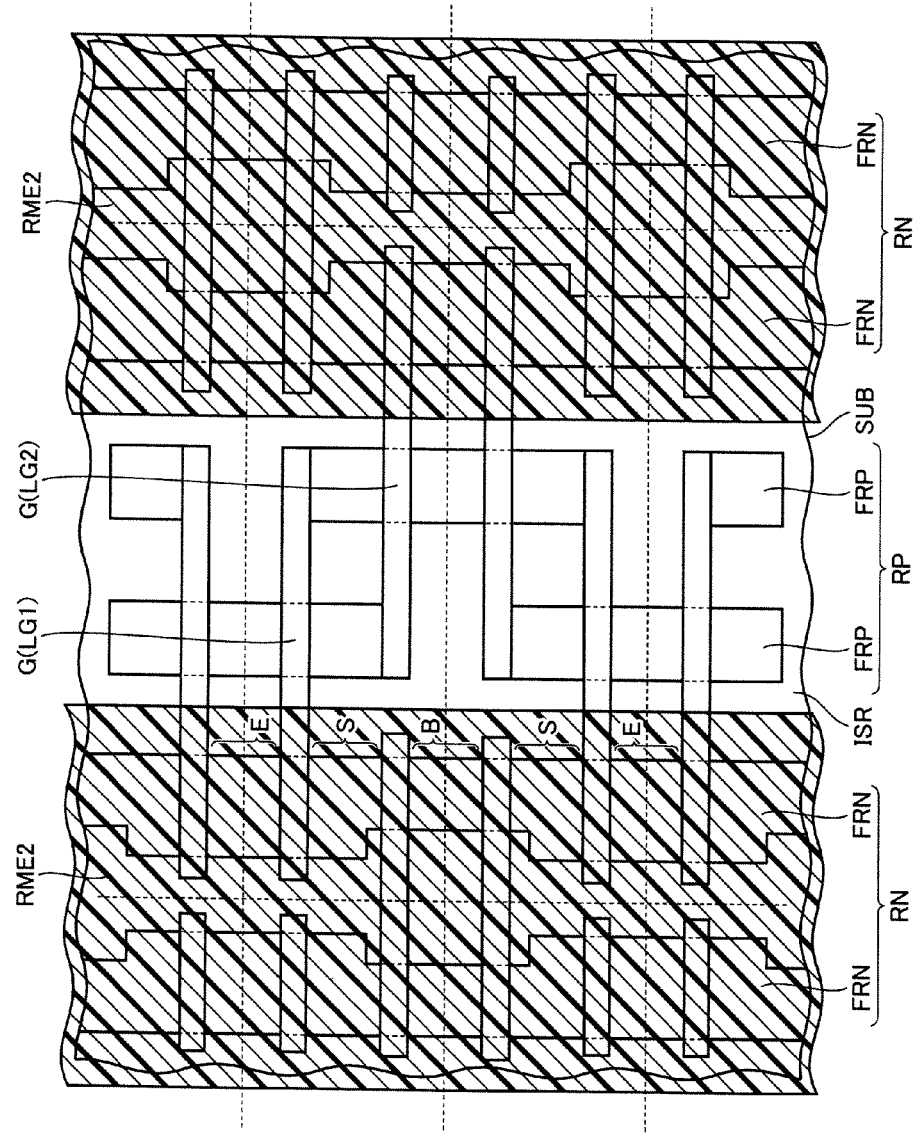
FIG. 23 is a plan view showing a step performed after the step shown in FIG. 22 in the embodiment.

Next, as shown in FIG. 23, a resist mask RME2 is formed to cover NMIS region RN and expose PMIS region RP (implantation mask D). Next, in the same manner as the step of forming p type impurity regions PIR1, PIR2, PIR3, PIR4, which are to serve as the halo regions, in element formation region FRN, resist mask RME2 is employed as an implantation mask to implant phosphorus or arsenic into exposed semiconductor substrate SUB in the direction perpendicular to the main surface of semiconductor substrate SUB, thereby forming the halo regions (not shown) in element formation region PRP. Next, boron is implanted into semiconductor substrate SUB in the direction perpendicular to the main surface of semiconductor substrate SUB, thereby forming the extension region (not shown). Thereafter, resist mask RME2 is removed.

Figure 24:
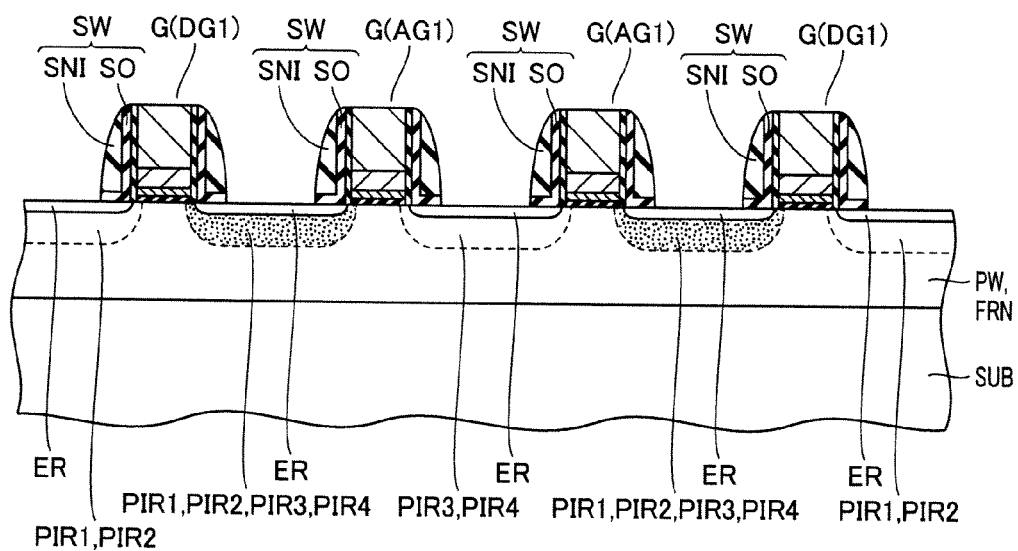
FIG. 24 is a cross sectional view showing a step performed after the step shown in FIG. 23 in the embodiment, and taken along a cross sectional line corresponding to cross sectional line XXII-XXII shown in FIG. 21.

Next, in order to cover each of gate structures G (access gate electrodes AG1, AG2, drive gate electrodes DG1, DG2, and the like), a silicon oxide film and a silicon nitride film (not shown) are sequentially formed, for example. Next, the silicon oxide film and the silicon nitride film are anisotropically etched, thereby forming side wall spacers SW on the side surfaces of gate structure G as shown in FIG. 24. Each of side wall spacers SW includes a silicon oxide film SO and a silicon nitride film SNI.

Figure 25:
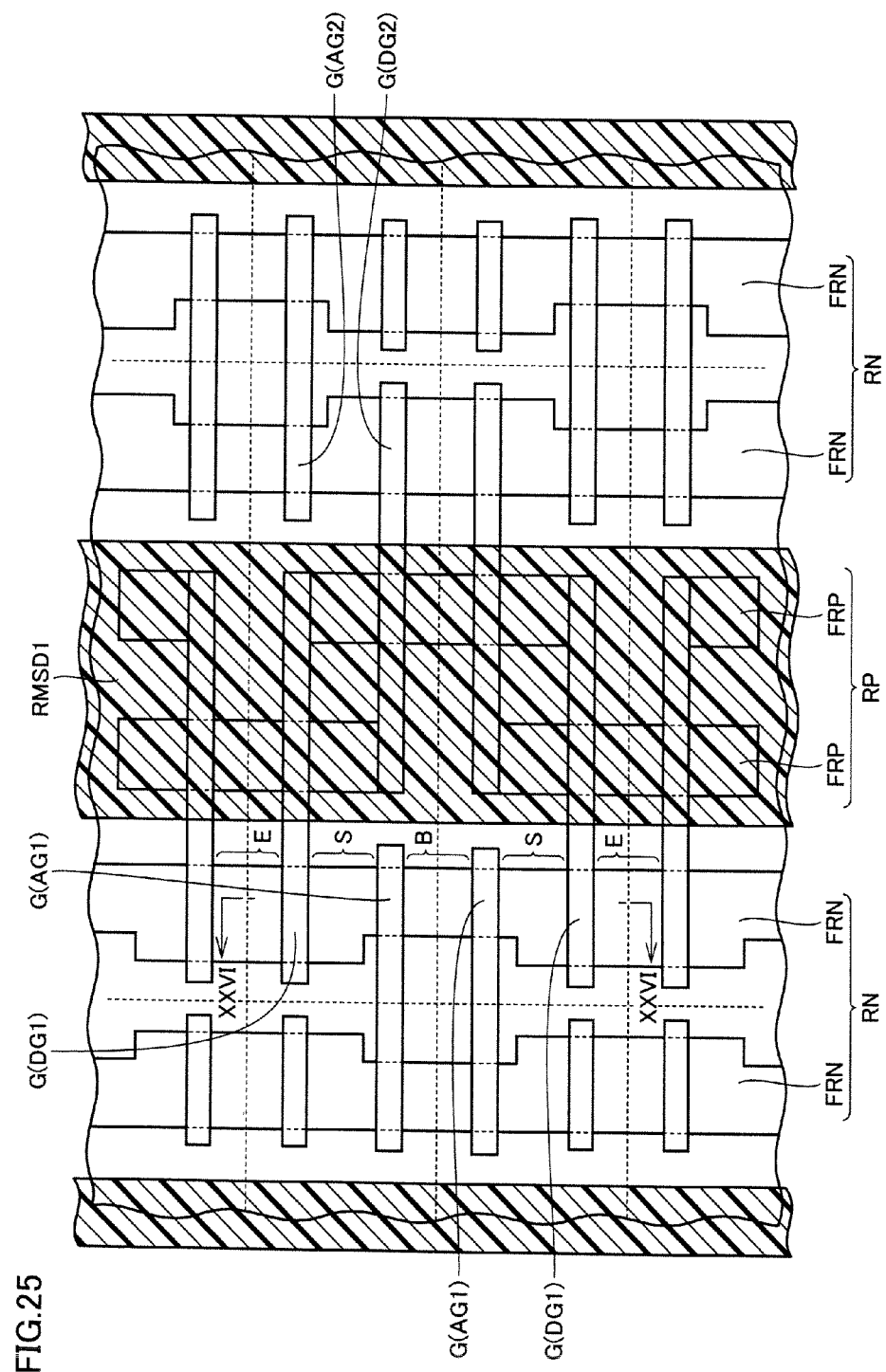
FIG. 25 is a plan view showing a step performed after the step shown in FIG. 24 in the embodiment.
Figure 26:
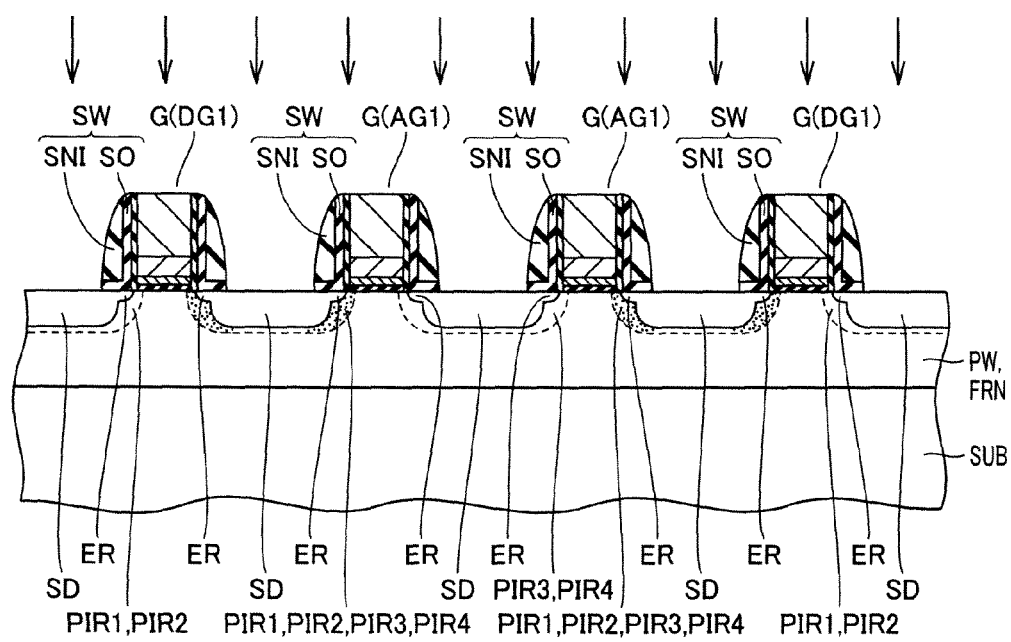
FIG. 26 is a cross sectional view showing a step performed after the step shown in FIG. 25 in the embodiment, and taken along a cross sectional line corresponding to a cross sectional line XXVI-XXVI shown in FIG. 25.

Next, as shown in FIG. 25, a resist mask RMSD1 is formed to expose NMIS region RN and cover PMIS region RP. Next, as shown in FIG. 26, resist mask RMSD1 (FIG. 25) and side wall spacers SW are employed as an implantation mask to implant phosphorus or arsenic into semiconductor substrate SUB in the direction perpendicular to the main surface of semiconductor substrate SUB, thereby forming source-drain region SD up to a predetermined depth from the surface of the exposed region of p well PW. Thereafter, resist mask RMSD1 is removed.

Figure 27:
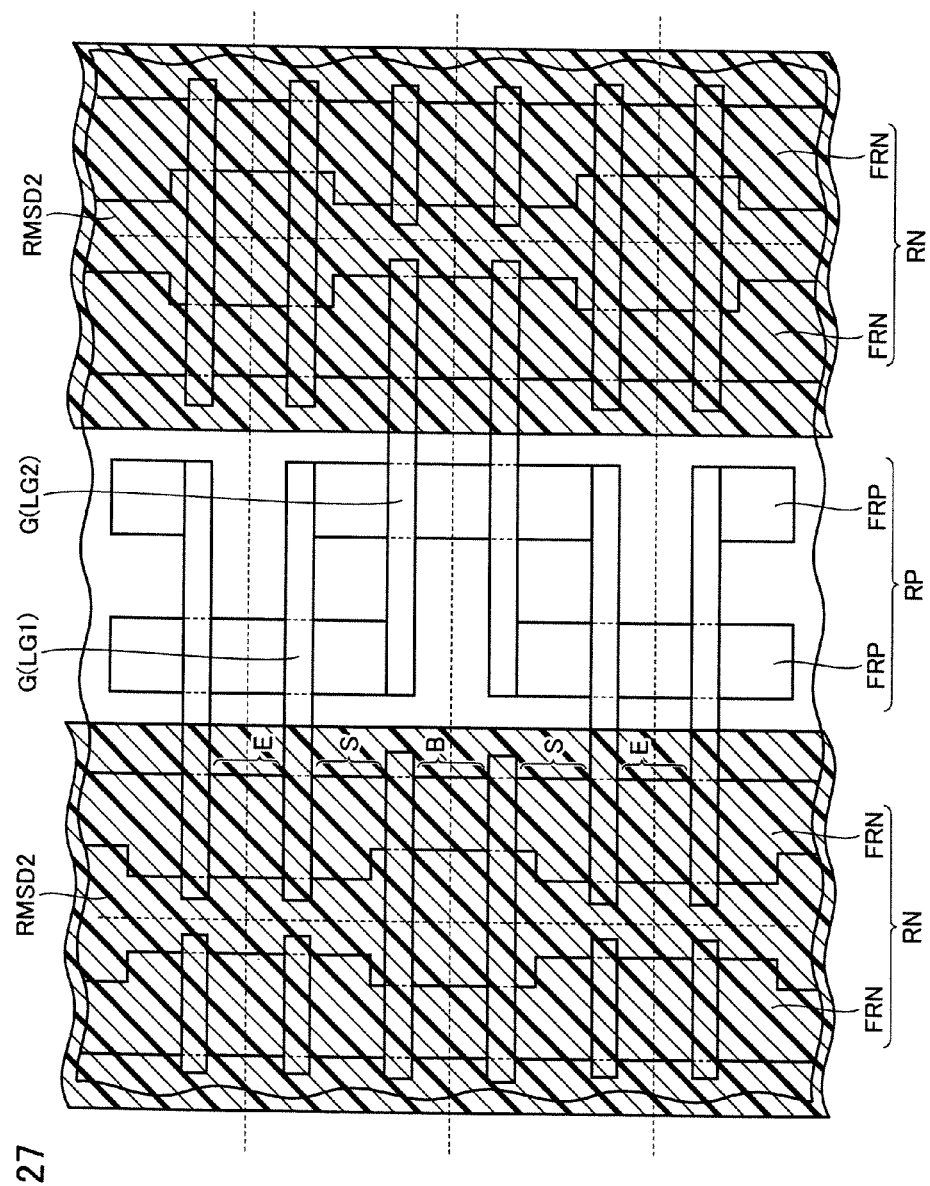
FIG. 27 is a plan view showing a step performed after the step shown in FIG. 26 in the embodiment.

Next, as shown in FIG. 27, a resist mask RMSD2 is formed to cover NMIS region RN and expose PMIS region RP. Next, resist mask RMSD2 and side wall spacer SW are employed as an implantation mask to implant boron into semiconductor substrate SUB in the direction perpendicular to the main surface of semiconductor substrate SUB, thereby forming the source-drain region (not shown) up to a predetermined depth from the exposed surface of element formation region FRP. Thereafter, resist mask RMSD2 is removed.

Figure 28:
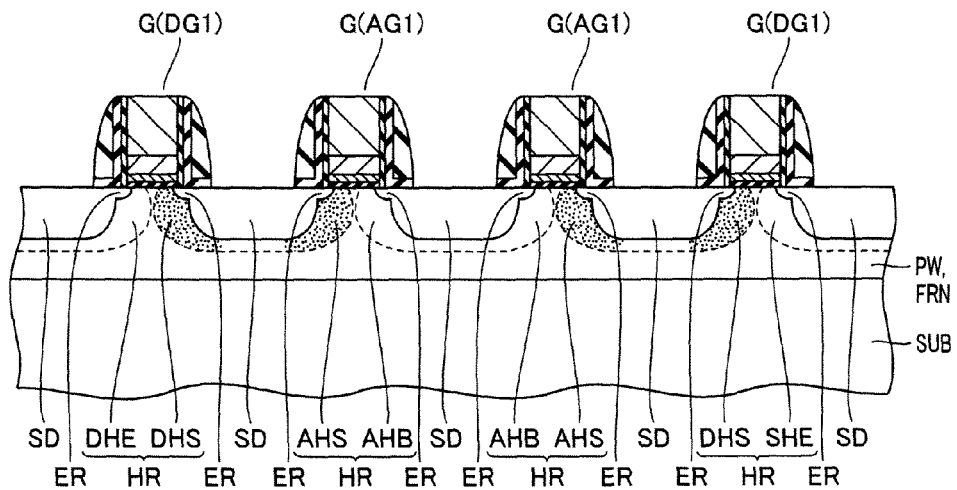
FIG. 28 is a cross sectional view showing a step performed after the step shown in FIG. 27 in the embodiment.

Next, as shown in FIG. 28, a predetermined annealing treatment is provided to thermally diffuse the implanted impurities, thereby activating source-drain regions SD, extension regions ER, and halo regions HR. On this occasion, with the thermal diffusion of the impurities, source-drain regions SD, extension regions ER, and halo regions HR are expanded in the lateral direction and longitudinal (depth) direction.

Figure 29:
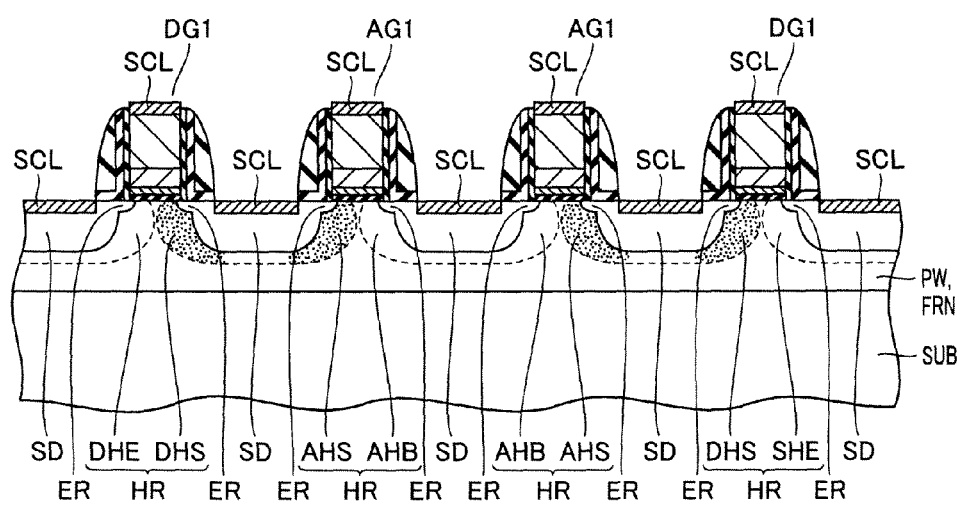
FIG. 29 is a cross sectional view showing a step performed after the step shown in FIG. 28 in the embodiment, and taken along a cross sectional line corresponding to cross sectional line XXVI-XXVI shown in FIG. 25.
Figure 30:
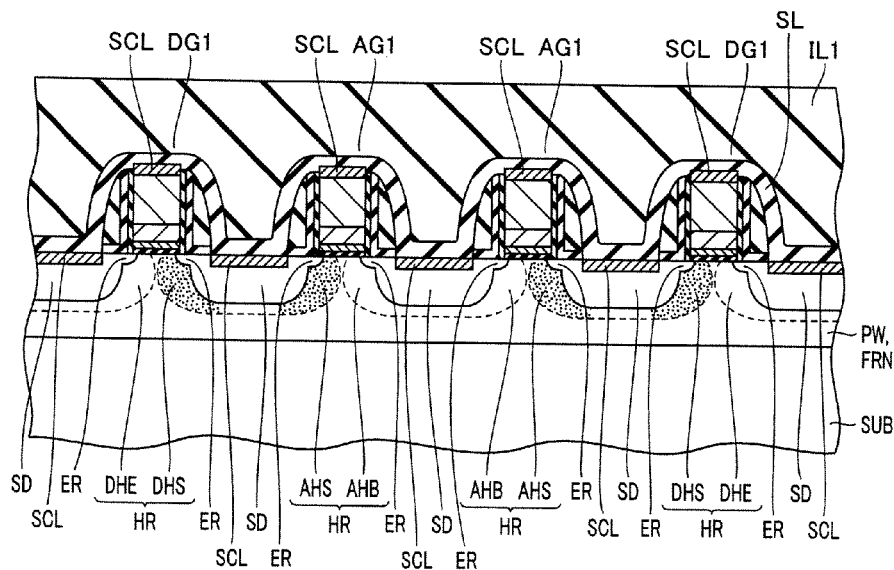
FIG. 30 is a cross sectional view showing a step performed after the step shown in FIG. 29 in the embodiment.

Next, as shown in FIG. 29, a salicide process is performed to form metal silicide film SCL such as nickel silicide on the surface of each of the polysilicon films such as exposed source-drain region SD, access gate electrode AG1, drive gate electrode DG1, and the like. Next, as shown in FIG. 30, in order to cover access gate electrode AG1, drive gate electrode DG1, and the like, stress liner film SL such as a silicon nitride film is formed, for example. In order to cover stress liner film SL, interlayer insulating film IL1 such as a silicon oxide film (such as a TEOS film) is formed.

Figure 31:
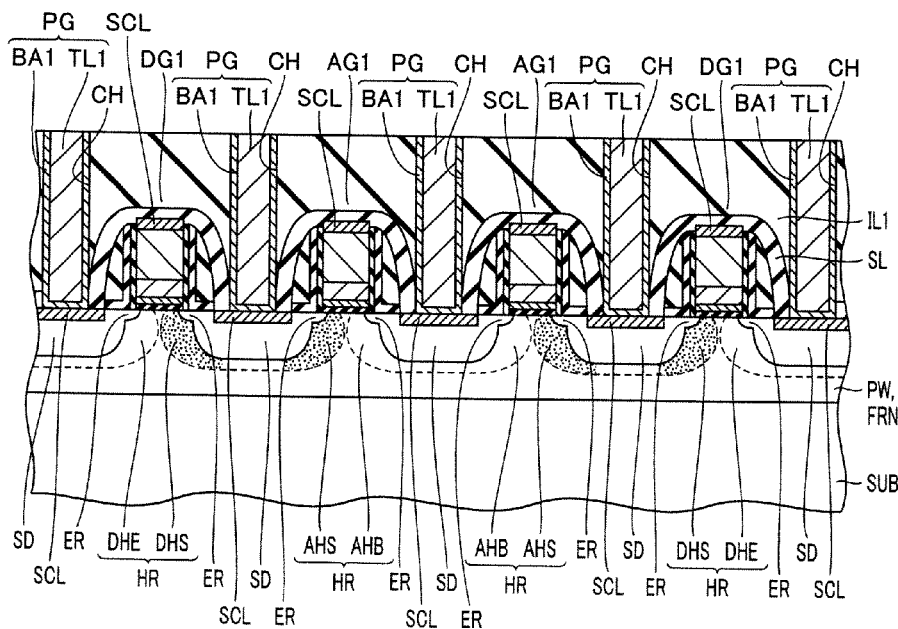
FIG. 31 is a cross sectional view showing a step performed after the step shown in FIG. 30 in the embodiment.

Next, interlayer insulating film IL1 is anisotropically etched, thereby forming a contact hole CH (see FIG. 31) exposing metal silicide film SCL. Next, in order to cover the inner wall of contact hole CH, barrier metal film BA1 (see FIG. 31) such as titanium nitride (TiN) is formed. On barrier metal film BA1, tungsten film TL1 (see FIG. 31) is formed to fill contact hole CH. Next, chemical mechanical polishing (CMP) is provided to remove portions of the bather metal film and tungsten film from the upper surface of interlayer insulating film IL1, thereby forming plug PG including barrier metal film BA1 and tungsten film TL1 in contact hole CH as shown in FIG. 31.

Next, as shown in FIG. 5, in order to cover plug PG, etching stopper film ES such as a silicon nitride film is formed. On etching stopper film ES, interlayer insulating film IL2 such as a silicon oxide film is formed. Next, a trench is formed to expose the surface of plug PG. Next, in order to cover the inner wall of the trench, barrier metal film BA2 such as tantalum nitride (TaN) is formed, for example. Moreover, copper film CL1 is formed on barrier metal film BA2 to fill the trench. Next, chemical mechanical polishing is provided to remove portions of the barrier metal film and copper film from the upper surface of interlayer insulating film IL2, whereby copper interconnection CW1 including barrier metal film BA2 and copper film CL1 is formed in the trench. Copper interconnection CW1 corresponds to the first metal interconnection.

Thereafter, an interlayer insulating film (not shown) is formed to cover copper interconnection CW1. In the interlayer insulating film, vias VSSV1, WLV1, BLV1, VDDV1, /BLV1 (see FIG. 7) are formed using a method similar to the method of forming plug PG. Next, in order to cover vias VSSV1, WLV1, BLV1, VDDV1, /BLV1, an interlayer insulating film (not shown) is formed. In the interlayer insulating film, second metal interconnections VSSM2, WLM2, BLM2, VDDM2, /BLM2 (see FIG. 7) are formed using a method similar to the method of forming copper interconnection CW1.

Next, in order to cover second metal interconnections VSSM2, WLM2, BLM2, VDDM2, /BLM2, an interlayer insulating film (not shown) is formed. In the interlayer insulating film, vias VSSV2, WLV2 (see FIG. 8) are formed using a method similar to the method of forming plug PG. Next, in order to cover vias VSSV2, WLV2, an interlayer insulating film (not shown) is formed. In the interlayer insulating film, third metal interconnections VSSM3, WLM3 (see FIG. 8) are formed using a method similar to the method of forming copper interconnection CW1. In this way, the main portion of the SRAM memory cell is formed.

Figure 32:
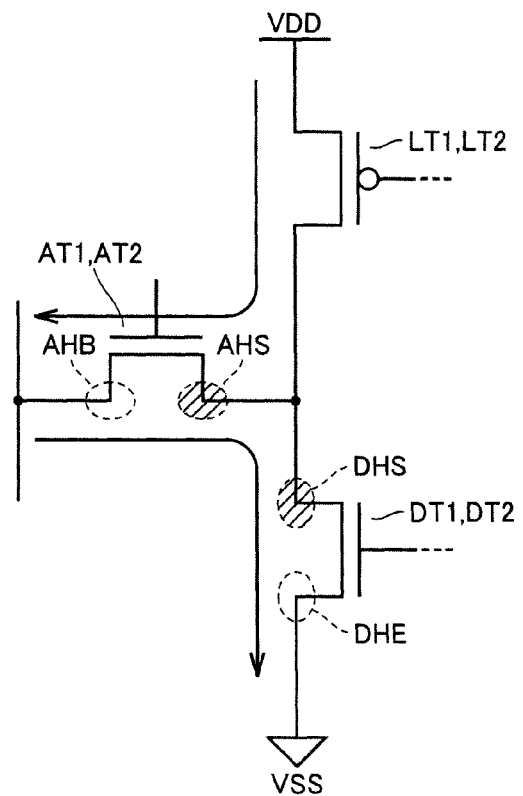
FIG. 32 shows a flow of current during a read operation and a flow of current during a write operation in the SRAM memory cell in the embodiment.

In general, it is known that the $\beta$ ratio is desirably made high so as to secure the read margin of the SRAM memory cell and the $\gamma$ ratio is desirably made high so as to secure the write margin. As shown in FIG. 32, in the read operation, current flows from bit line BL (/BL) to the ground interconnection via access transistor AT1 (AT2) and drive transistor DT1 (DT2). On the other hand, in the write operation, a current flows from the power supply interconnection to bit line BL (/BL) via load transistor LT1 (LT2) and access transistor AT1 (AT2).

Here, the $\beta$ ratio is expressed by a ratio of current of drive transistor DT1 (DT2) to current of access transistor AT1 (AT2) (it should be noted that the source-to-gate voltage and the source-to-drain voltage are the same between the access transistor and the drive transistor). The γ ratio is expressed by a ratio of current of access transistor AT1 (AT2) to current of load transistor LT1 (LT2) (the source-to-gate voltage and the source-to-drain voltage are the same between the access transistor and the load transistor).

Figure 33:
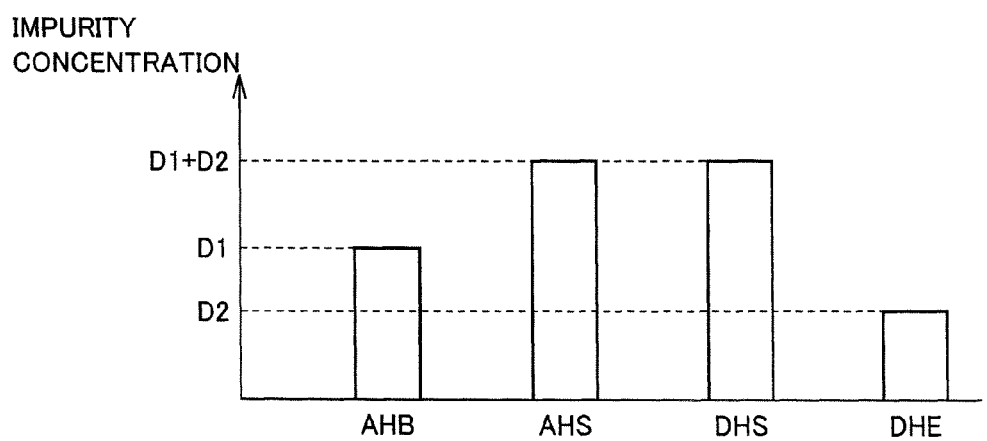
FIG. 33 is a graph showing one exemplary high/low relation between an impurity concentration of a halo region of an access transistor and an impurity concentration of a halo region of each drive transistor in the embodiment.

As means for securing both the read margin and the write margin, it is effective to use the following transistors for the access and drive transistors: transistors having asymmetric properties such that current properties differ depending on a direction of flow of current. As shown in FIG. 33, in the present semiconductor device, in access transistors AT1, AT2 each having the pair of halo regions AHS, AHB, the impurity concentration of halo region AHS is set to be higher than the impurity concentration of halo region AHB. Further, in drive transistors DT1, DT2 each having the pair of halo regions DHS, DHE, the impurity concentration of halo region DHS is set to be higher than the impurity concentration of halo region DHE. Further, in the present semiconductor device, the impurity concentration of halo region DHE of each of drive transistors DT1, DT2 is set to be lower than the impurity concentration of halo region AHB of each of access transistors AT1, AT2.

Figure 34:
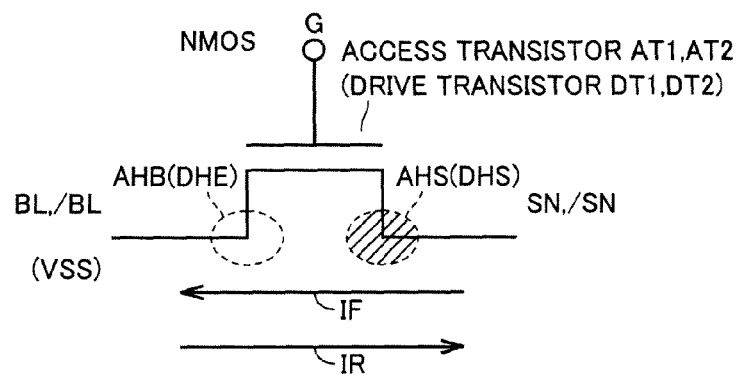
FIG. 34 shows current flowing in the access transistor or the drive transistor in the embodiment.
Figure 35:
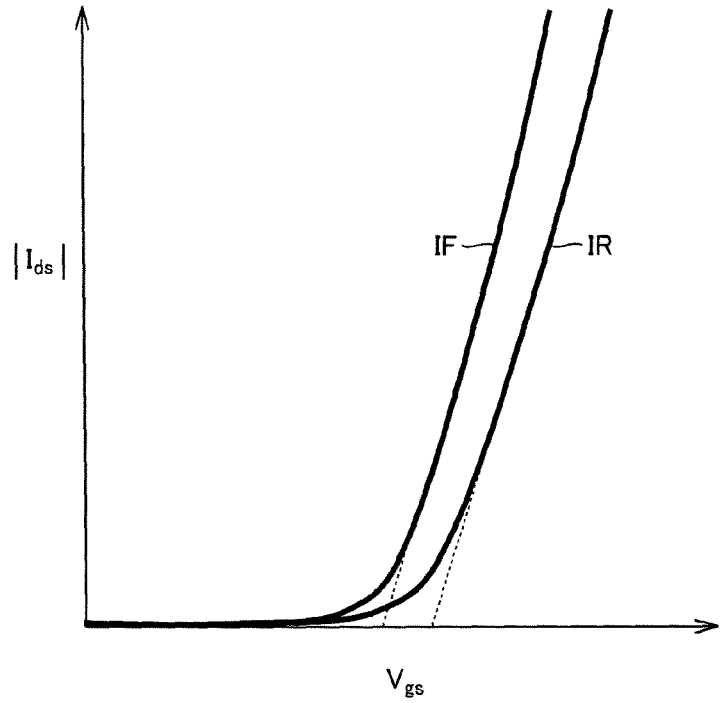
FIG. 35 is a graph showing a current characteristic relative to a gate voltage in the access transistor or the drive transistor in the embodiment.

As shown in FIG. 34, in access transistors AT1, AT2 (drive transistors DT1, DT2), current IF is represented as current flowing from the source-drain region positioned at the halo region AHS (DHS) side having a relatively high impurity concentration to the source-drain region positioned at the halo region AHB (DHE) side having a relatively low impurity concentration. Current IR is represented as current flowing in a direction opposite thereto. FIG. 35 shows a relation between each of currents IF, IR and source-to-gate voltage Vgs under the same source-to-drain voltage.

As shown in FIG. 35, the threshold voltage of the transistor, when current flows from the source-drain region at the halo region AHS (DHS) side to the source-drain region at the halo region AHB (DHE) side, is lower than the threshold voltage of the transistor when current flows in the opposite direction, i.e., flows from the source-drain region positioned at the halo region AHB (DHE) side to the source-drain region at the halo region AHS (DHS) side.

As shown in FIG. 32 and FIG. 33, in access transistor AT1 (AT2) of the above-described semiconductor device, halo region AHS having a relatively high impurity concentration is formed at the storage node SN (/SN) side, whereas halo region AHB having a relatively low impurity concentration is formed at the bit line BL (/BL) side. Further, in drive transistor DT1 (DT2), halo region DHS having a relatively high impurity concentration is formed at the storage node SN (/SN) side, whereas halo region DHE having a relatively low impurity concentration is formed at the ground interconnection VSS side.

Figure 36:
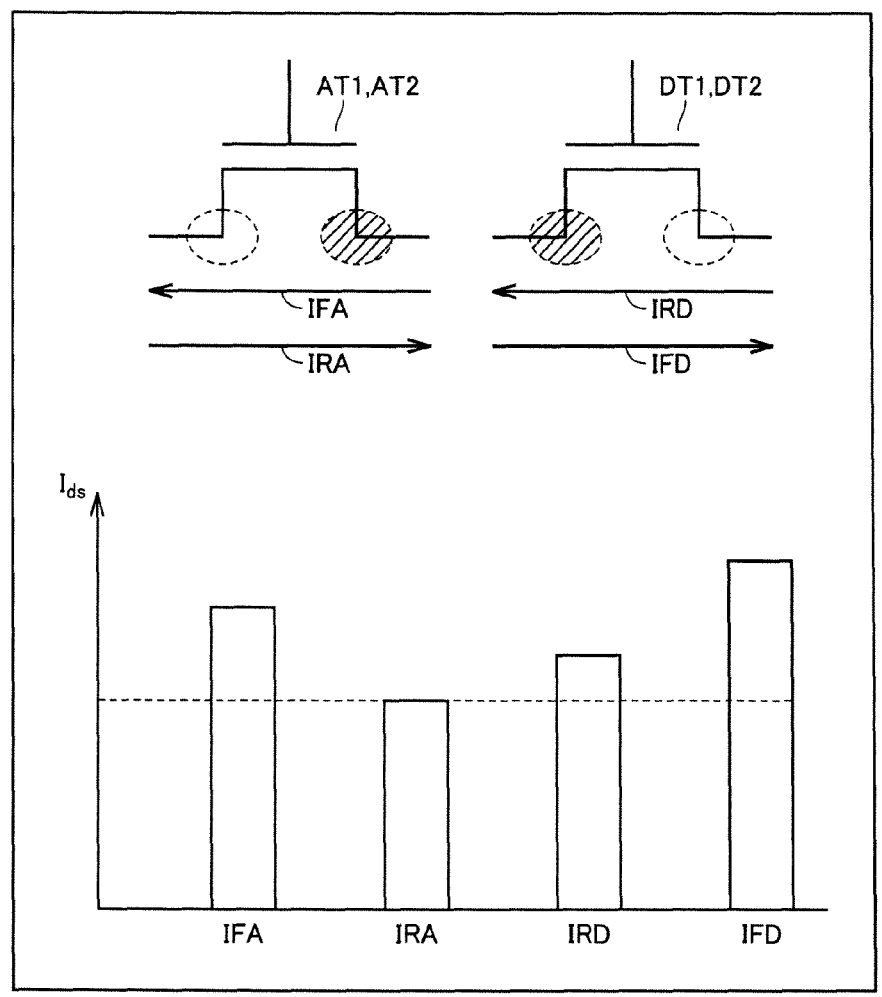
FIG. 36 is a graph showing a relation of magnitude between the current flowing in the access transistor and the current flowing in the drive transistor in the embodiment.

Hence, as shown in FIG. 36, in the read operation, the current (current IRA) flowing in the access transistor from the bit line side to the storage node side can be readily suppressed, whereby the current (current IFD) flowing in the drive transistor from the storage node side to the ground interconnection side can be readily increased. Accordingly, the β ratio (IFD/IRA) can be made high, thereby increasing the read margin.

Meanwhile, in the write operation, the current (current IFA) flowing in the access transistor from the storage node side to the bit line side can be readily increased. Accordingly, the γ ratio (IFA/current flowing in the load transistor) can be made high, thereby increasing the write margin. In this way, in the above-described semiconductor device, both the read margin and the write margin can be increased.

Further, the current flowing in each of drive transistors DT1, DT2 is only the current flowing from the storage node side to the ground interconnection side in the read operation. Thus, halo region DHS having a relatively high impurity concentration is formed at the storage node SN (/SN) side and halo region DHE having a relatively low impurity concentration is formed at the ground interconnection (VSS) side, whereby the threshold voltage of each of drive transistors DT1, DT2 can be made relatively low and high-speed operation can be achieved during reading.

It has been illustrated that in the present semiconductor device, the impurity concentration of halo region DHE of each of drive transistors DT1, DT2 is set to be lower than the impurity concentration of halo region AHB of each of access transistors AT1, AT2. However, in the case where the impurity concentration of halo region DHE of each of drive transistors DT1, DT2 is set to be higher than the impurity concentration of halo region AHB of each of access transistors AT1, AT2, leakage current from each of drive transistors DT1, DT2 can be suppressed in the read operation.

In addition, in the present semiconductor device, the number of the resist masks serving as implantation masks for forming the halo regions of the transistors, inclusive of access transistors AT1, AT2 and drive transistors DT1, DT2, can be reduced. This will be described with reference to a comparative example.

Figure 37:
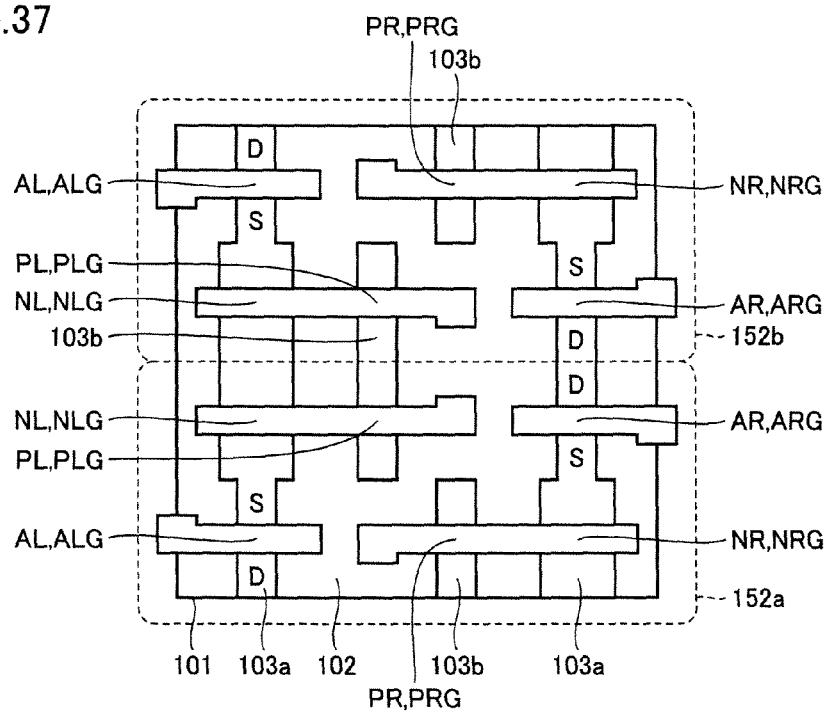
FIG. 37 is a plan view showing an arrangement pattern of SRAM memory cells in a semiconductor device according to a comparative example.

In a semiconductor device according to the comparative example, as shown in FIG. 37, an element isolation insulation film 102 is first formed on a main surface of a semiconductor substrate 101, thereby defining element formation regions 103a, 103b electrically disconnected from each other. Next, access gate electrode ALG of access transistor AL, access gate electrode ARG of access transistor AR, drive gate electrode NLG of drive transistor NL, and drive gate electrode NRG of drive transistor NR are formed at respective predetermined positions across element formation region 103a. Further, load gate electrode PLG of load transistor PL and load gate electrode PRG of load transistor PR are formed at respective predetermined positions across element formation region 103b. It should be noted that FIG. 37 shows two SRAM memory cells (dotted-line frames 152a, 152b).

Figure 38:
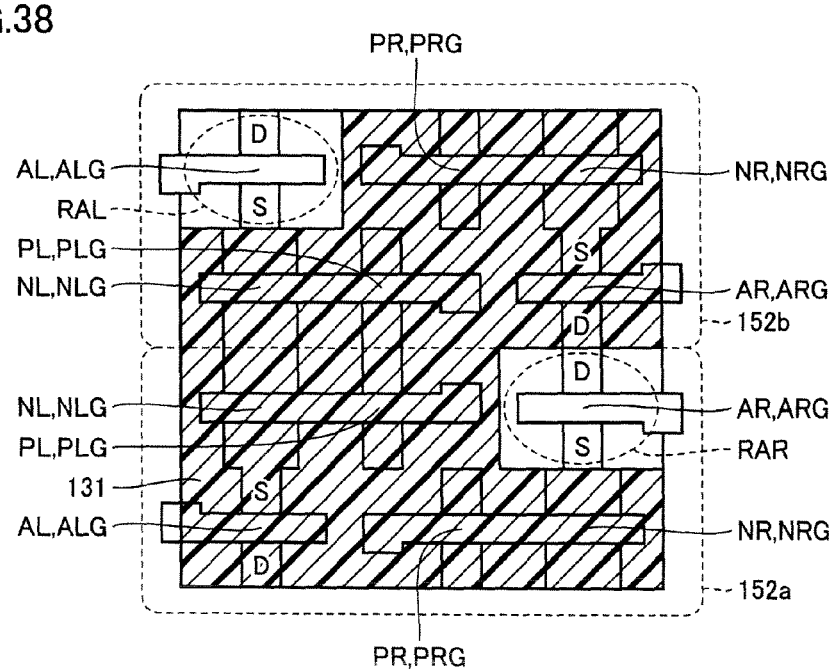
FIG. 38 is a plan view showing one step in a method for manufacturing the semiconductor device according to the comparative example.

Next, the step of forming halo regions will be described. As shown in FIG. 38, first, a resist mask 131 is formed to form halo regions of access transistors AL, AR. Resist mask 131 is formed to expose a region RAR in which access transistor AR of the SRAM memory cell within dotted-line frame 152a is formed, and a region RAL in which access transistor AL of the SRAM memory cell within dotted-line frame 152b is formed, and cover the other region.

Next, resist mask 131 is employed as an implantation mask to obliquely implant ions of a p type impurity into exposed element formation region 103a, thereby forming halo regions. On this occasion, in region RAL, a larger amount of the p type impurity is implanted in a portion of element formation region 103a at a side closer to drive transistor NL relative to access transistor AL. Likewise, in region RAR, a larger amount of the p type impurity is implanted in a portion of element formation region 103a at a side closer to drive transistor NR relative to access transistor AR. In this way, halo regions having asymmetric impurity concentrations are formed in access transistors AL, AR. Thereafter, resist mask 131 is removed.

Figure 39:
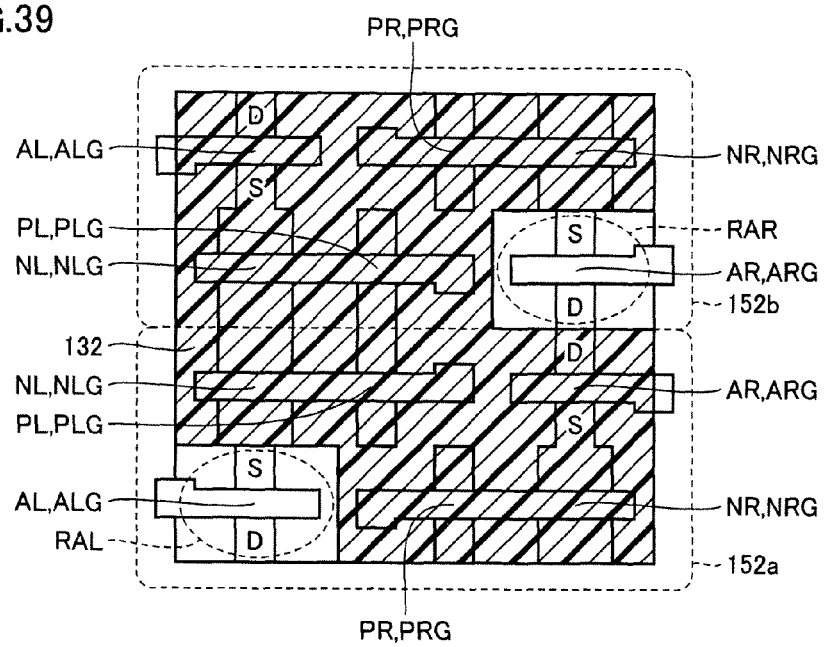
FIG. 39 is a plan view showing a step performed after the step shown in FIG. 38.

Next, as shown in FIG. 39, a resist mask 132 for forming other halo regions of access transistors AL, AR is formed. Resist mask 132 is formed to expose a region RAL in which access transistor AL of the SRAM memory cell within dotted-line frame 152a is formed, and a region RAR in which access transistor AR of the SRAM memory cell within dotted-line frame 152b is formed, and cover the other region.

Next, resist mask 132 is employed as an implantation mask to obliquely implant ions of a p type impurity into exposed element formation region 103a, thereby forming halo regions. On this occasion, in region RAL, a larger amount of the p type impurity is implanted in a portion of element formation region 103a at a side closer to drive transistor NL relative to access transistor AL. Meanwhile, in region RAR, a larger amount of the p type impurity is implanted in a portion of element formation region 103a at a side closer to drive transistor NR relative to access transistor AR. In this way, halo regions having asymmetric impurity concentrations are formed in access transistors AL, AR. Thereafter, resist mask 132 is removed.

Figure 40:
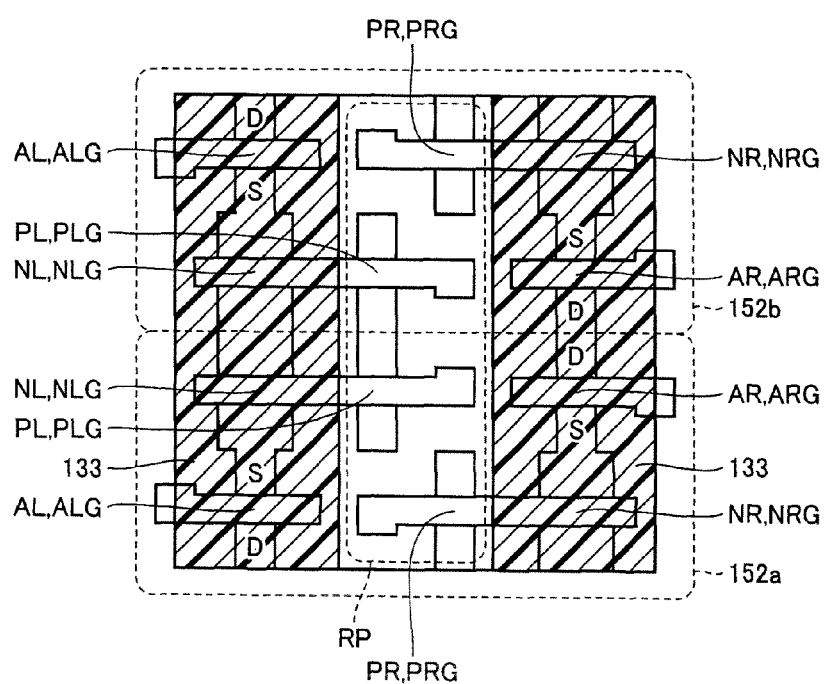
FIG. 40 is a plan view showing a step performed after the step shown in FIG. 39.

Next, as shown in FIG. 40, a resist mask 133 for forming halo regions of load transistors PL, PR and extension regions is formed. Resist mask 133 is formed to expose a region in which load transistors PL, PR of the SRAM memory cell within dotted-line frame 152a are formed, and a region in which load transistors PL, PR of the SRAM memory cell within dotted-line frame 152b are formed, and cover a region in which access transistors AL, AR and drive transistors NL, NR are formed.

Next, resist mask 133 is employed as an implantation mask to obliquely implant ions of an n type impurity into exposed element formation region 103b, thereby forming halo regions. Further, resist mask 133 is employed as an implantation mask to implant a p type impurity into exposed element formation region 103b, thereby forming extension regions. Thereafter, resist mask 133 is removed.

Figure 41:
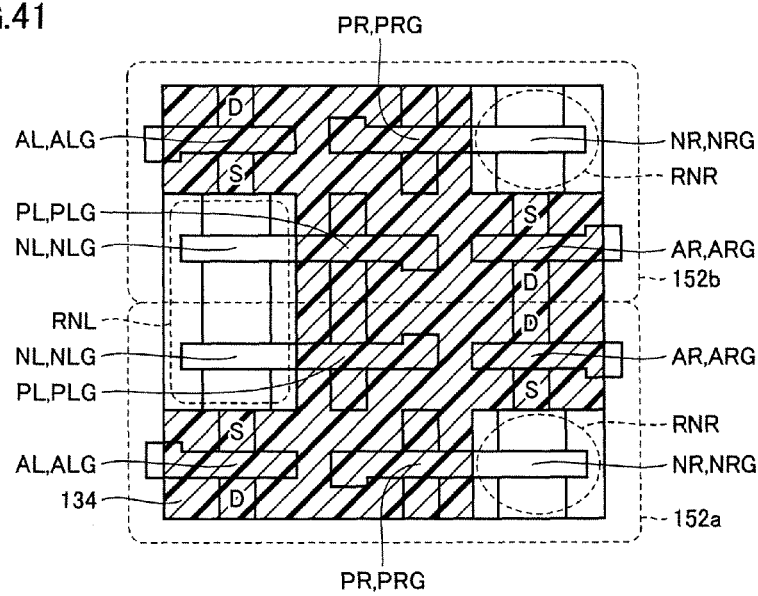
FIG. 41 is a plan view showing a step performed after the step shown in FIG. 40.

Next, as shown in FIG. 41, a resist mask 134 is formed to form halo regions of drive transistors NL, NR. Resist mask 134 is formed to expose regions RNL, RNR in which drive transistors NL, NR of the SRAM memory cell within dotted-line frame 152a are formed, and regions RNL, RNR in which drive transistors NL, NR of the SRAM memory cell within dotted-line frame 152b are formed, and cover the other region. Next, resist mask 134 is employed as an implantation mask to obliquely implant ions of a p type impurity into exposed element formation region 103a, thereby forming halo regions. Thereafter, resist mask 134 is removed.

In this way, in the semiconductor device according to the comparative example, the SRAM memory cell including the asymmetric halo regions is formed. In this SRAM memory cell, at least four resist masks, i.e., resist mask 131, resist mask 132, resist mask 133, and resist mask 134, are required as implantation masks for forming halo regions inclusive of the asymmetric halo regions.

As compared with the semiconductor device according to the comparative example, in the above-described semiconductor device, the asymmetric halo regions of access transistors AT1, AT2 and the asymmetric halo regions of drive transistors DT1, DT2 are formed using resist mask RMH1 (implantation mask A) and resist mask RMH2 (implantation mask B). Further, the halo regions of load transistors LT1, LT2 are formed using resist mask RME2 (implantation mask D).

Thus, while at least four implantation masks (resist masks) are required in the semiconductor device according to the comparative example so as to form the halo regions of the transistors included in the SRAM memory cell, the halo regions of the transistors can be formed using three implantation masks (resist masks) in the above-described semiconductor device. Accordingly, the number of photolithography masks for patterning the resist masks can be reduced by at least one, thereby contributing to reduction of manufacturing cost.

It has been illustrated that in the access transistors and the drive transistors of the above-described semiconductor device, implantation mask A and implantation mask B are employed to perform halo implantation A and halo implantation B, and thereafter implantation mask C is employed to perform the extension implantation, but the halo implantations may be performed after the extension implantation. In this case, first, the extension implantation is performed using implantation mask C, and then halo implantation A may be performed using implantation mask A and halo implantation B may be performed using implantation mask B.

Further, resist masks RMH1, RMH2 formed as implantation masks A, B are provided with openings (pattern with cavities) sufficiently larger than an interval between adjacent access (drive) gate electrodes. In this way, even though boron (p type impurity) is implanted obliquely, the resist masks do not block the boron and the boron can be securely implanted into a target region.

Second Embodiment

First Example

The foregoing semiconductor device illustrated above includes the pair of access transistors AT1, AT2 for writing and reading of the SRAM memory cell. Here, the following describes a first example of a semiconductor device including a dual-port SRAM memory cell, which includes another pair of access transistors as write and read ports.

Figure 42:
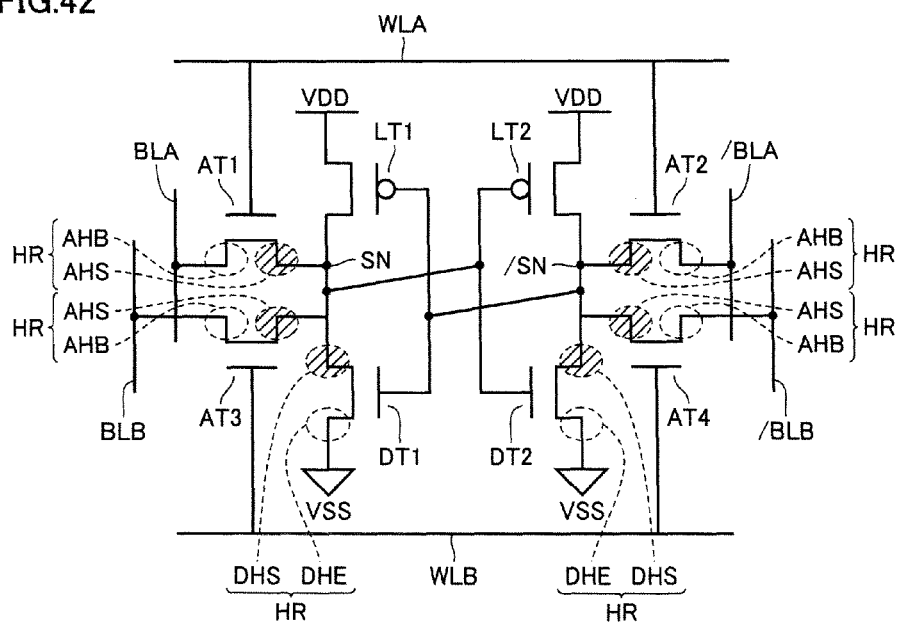
FIG. 42 shows an equivalent circuit of each SRAM memory cell of a semiconductor device in a first example of a second embodiment of the present invention.

Described first is an equivalent circuit of the SRAM memory cell. As shown in FIG. 42, in the dual-port SRAM memory cell, a word line WLA and a word line WLB are provided as the word line. Further, a pair of bit lines BLA, /BLA and a pair of bit lines BLB, /BLB are provided as the pair of bit lines.

The pair of access transistors AT1, AT2 are arranged such that access transistor AT1 is connected between storage node SN and bit line BLA, and access transistor AT2 is connected between storage node /SN and bit line /BLA. Each of access transistors AT1, AT2 has a gate connected to word line WLA. The pair of access transistors AT3, AT4 are arranged such that access transistor AT3 is connected between storage node SN and bit line BLB, and access transistor AT4 is connected between storage node /SN and bit line /BLB. Each of access transistors AT3, AT4 has a gate connected to word line WLB.

A pair of halo regions HR are formed in each of access transistors AT1, AT2. Of the pair of halo regions HR, a halo region AHS, which is adjacent to the source-drain region connected to storage node SN or /SN, is set to have an impurity concentration higher than that of a halo region AHB, which is adjacent to the source-drain region connected to bit line BLA or /BLA. Likewise, a pair of halo regions HR are formed in each of drive transistors DT1, DT2. Of the pair of halo regions HR, a halo region DHS, which is adjacent to the source-drain region connected to storage node SN or /SN, is set to have an impurity concentration higher than that of a halo region DHE, which is adjacent to the source-drain region connected to the ground interconnection (VSS).

A pair of halo regions HR are formed in each of access transistors AT3, AT4. Of the pair of halo regions HR, a halo region AHS, which is adjacent to the source-drain region connected to storage node SN or /SN, is set to have an impurity concentration higher than that of a halo region AHB, which is adjacent to the source-drain region connected to bit line BLB or /BLB. It should be noted that configurations apart from this are the same as those of the equivalent circuit of FIG. 3, and therefore the same members are given the same reference characters and are not described repeatedly.

Figure 43:
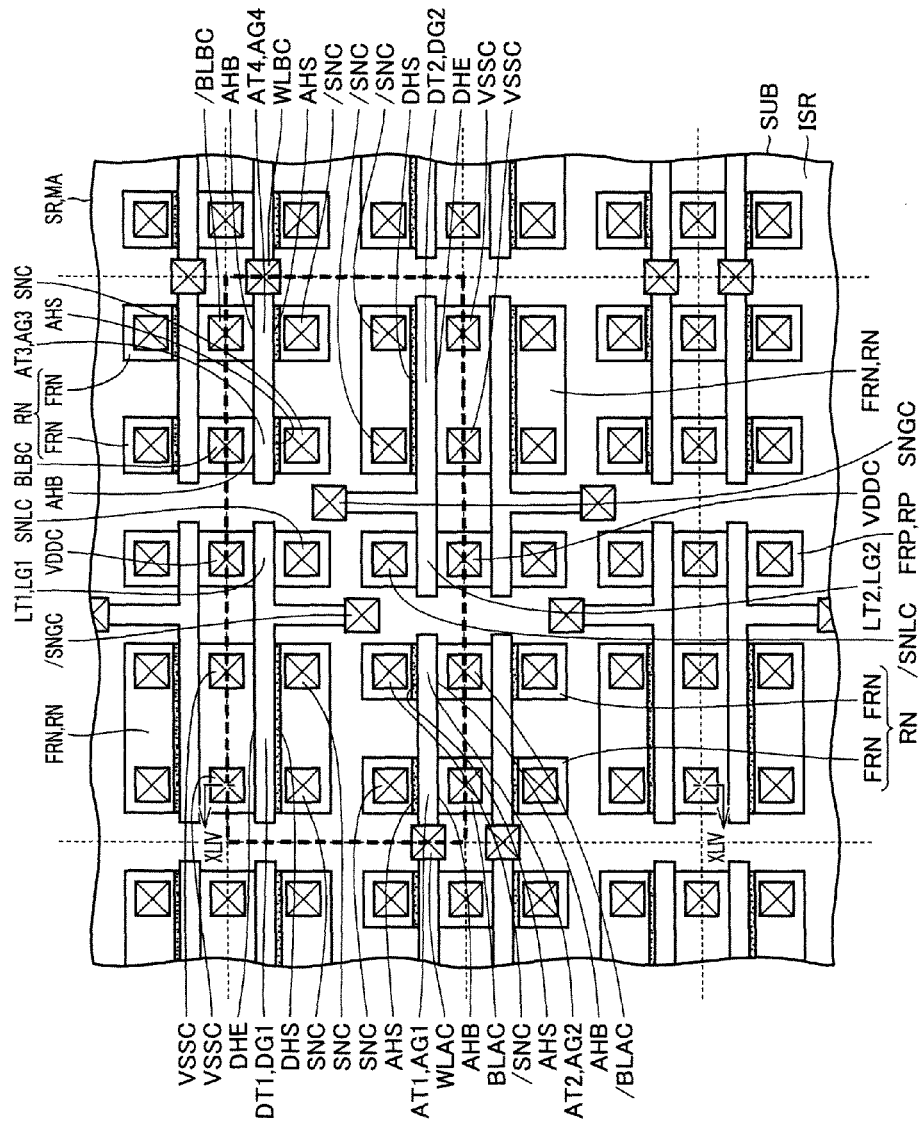
FIG. 43 is a plan view showing an arrangement pattern of the SRAM memory cells in the embodiment.

The following describes a structure of the SRAM memory cell. FIG. 43 is a plan view showing a layout of the transistors of the memory cells of the SRAM cell array, and contacts connected to the transistors. In this plan view, one SRAM memory cell is constituted of a region surrounded by a dotted line.

On a main surface of a semiconductor substrate SUB, an element isolation region ISR is formed using an element isolation insulation film, thereby defining element formation regions FRN, FRP electrically disconnected from each other. Element formation regions FRN are formed in an NMIS region RN.

In element formation regions FRN, access transistors AT1, AT3, AT2, AT4 and drive transistors DT1, DT2 are formed as n channel type MIS transistors. Meanwhile, in element formation regions FRP, load transistors LT1, LT2 are formed as p channel type MIS transistors.

Element formation region FRN having access transistor AT1 formed therein, element formation region FRN having access transistor AT2 formed therein, and element formation region FRN having drive transistor DT1 formed therein are electrically disconnected from each other by element isolation region ISR. Likewise, element formation region FRN having access transistor AT3 formed therein, element formation region FRN having access transistor AT4 formed therein, and element formation region FRN having drive transistor DT2 formed therein are electrically disconnected from one another by element isolation region ISR.

Access gate electrodes AG1, AG2 of access transistors AT1, AT2 are formed across element formation regions FRN as a common electrode. Likewise, access gate electrodes AG3, AG4 of access transistors AT3, AT4 are formed across element formation regions FRN as a common electrode. Drive gate electrodes DG1, DG2 of drive transistors DT1, DT2 are formed across element formation regions FRN. Further, element formation regions FNR having drive gate electrodes DG1, DG2 formed therein are formed such that drive gate electrodes DG1, DG2 have gate widths longer than the gate widths of access transistors AT1, AT2 (AT3, AT4), for example.

Meanwhile, load gate electrodes LG1, LG2 of load transistors LT1, LT2 are formed across element formation regions FRP. Further, each of access gate electrodes AG1, AG2, AG3, AG4, drive gate electrodes DG1, DG2, and load gate electrodes LG1, LG2 is formed to extend in one direction.

Figure 44:
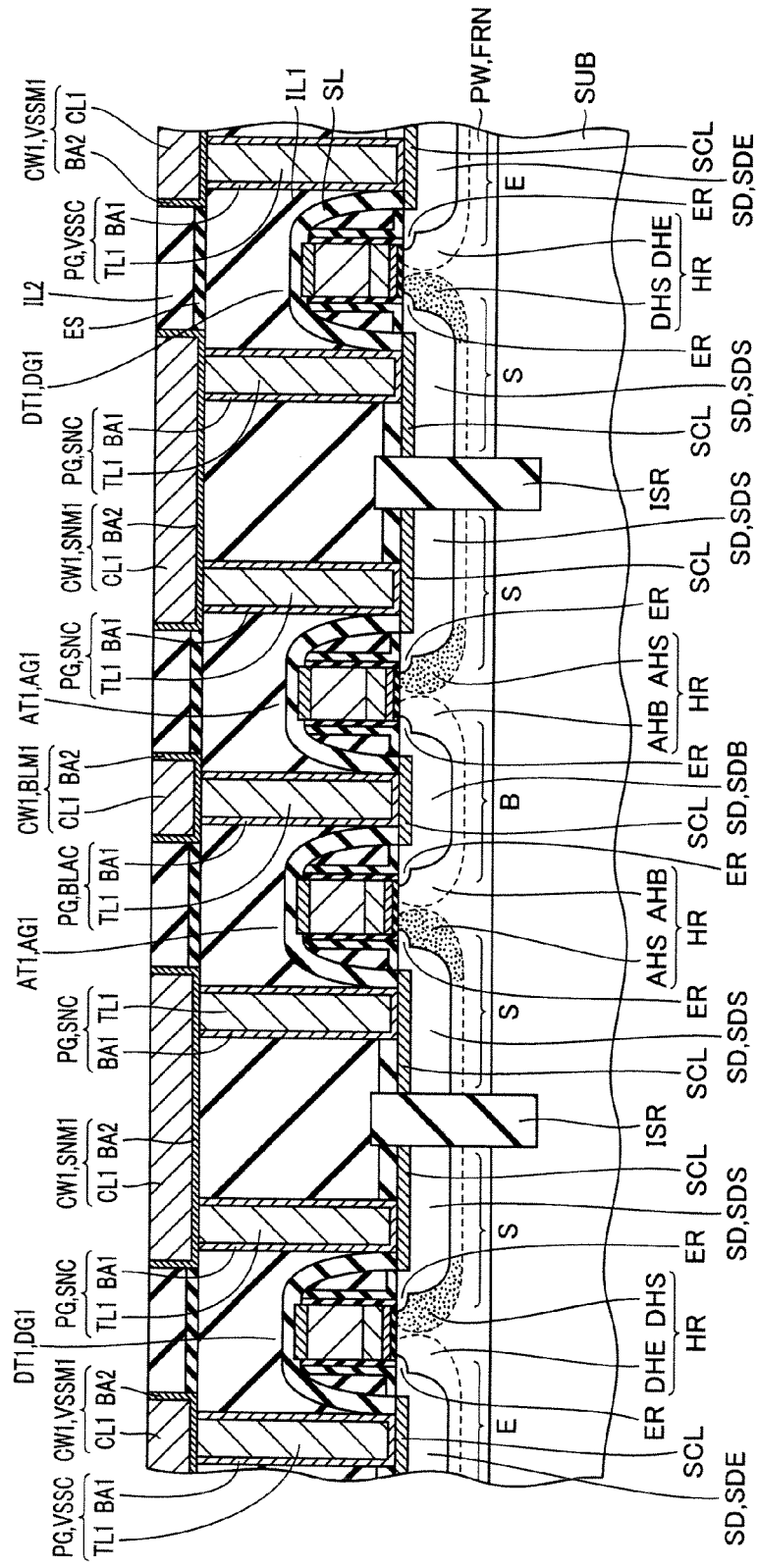
FIG. 44 is a cross sectional view taken along a cross sectional line XLIV-XLIV of FIG. 43 in the embodiment.

FIG. 44 is a cross sectional view taken along a cross sectional line XLIV-XLIV extending through drive transistor DT1 and access transistor AT1 of the SRAM memory cell in FIG. 43. As shown in FIG. 44, access gate electrode AG1 of access transistor AT1 is formed above a region interposed between a region S and a region B. In region S, n type source-drain region SDS, which is electrically connected to the storage node (contact SNC), is formed. In region B, n type source-drain region SDB, which is electrically connected to the bit line (contact BLAC), is formed. In a region just below access gate electrode AG1, as p type halo regions HR, halo region AHS is formed adjacent to source-drain region SDS and halo region AHB is formed adjacent to source-drain region SDB.

On the other hand, drive gate electrode DG1 of drive transistor DT1 is formed above a region interposed between a region E and region S. In region E, n type source-drain region SDE, which is electrically connected to the ground interconnection (contact VSSC), is formed. In region S, n type source-drain region SDS, which is electrically connected to the storage node (contact SNC), is formed. In a region just below drive gate electrode DG1, as p type halo regions HR, halo region DHS is formed adjacent to source-drain region SDS and halo region DHE is formed adjacent to source-drain region SDE. It should be noted that the same members as those in the semiconductor device illustrated in FIG. 5 (first embodiment) are given the same reference characters and are not described repeatedly.

Figure 45:
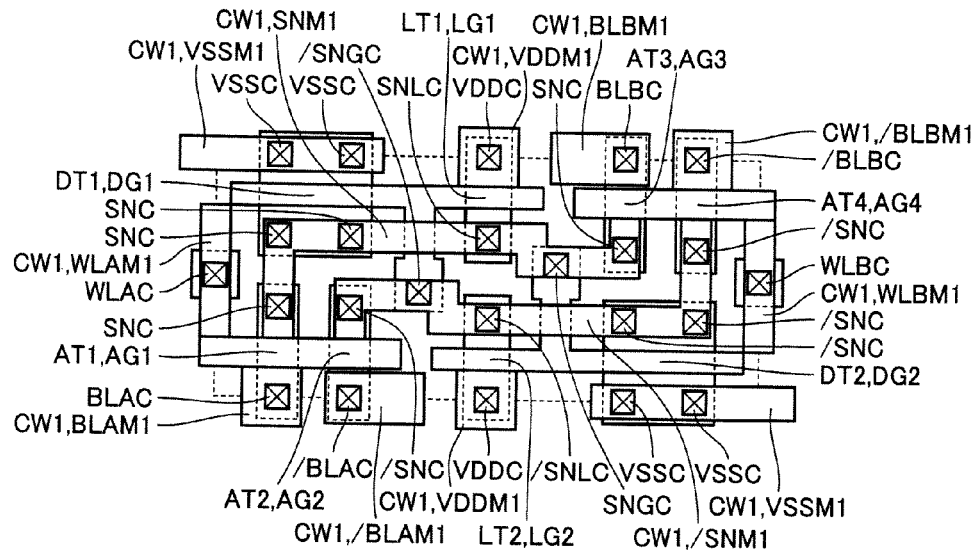
FIG. 45 is a plan view showing a structure of connection between each transistor and a first metal interconnection in the embodiment.
Figure 46:
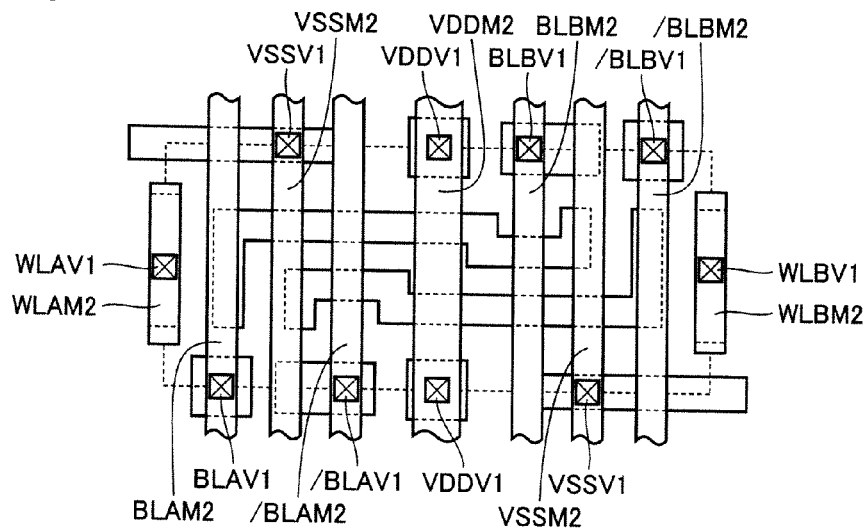
FIG. 46 is a plan view showing a structure of connection between the first metal interconnection and a second metal interconnection in the embodiment.
Figure 47:
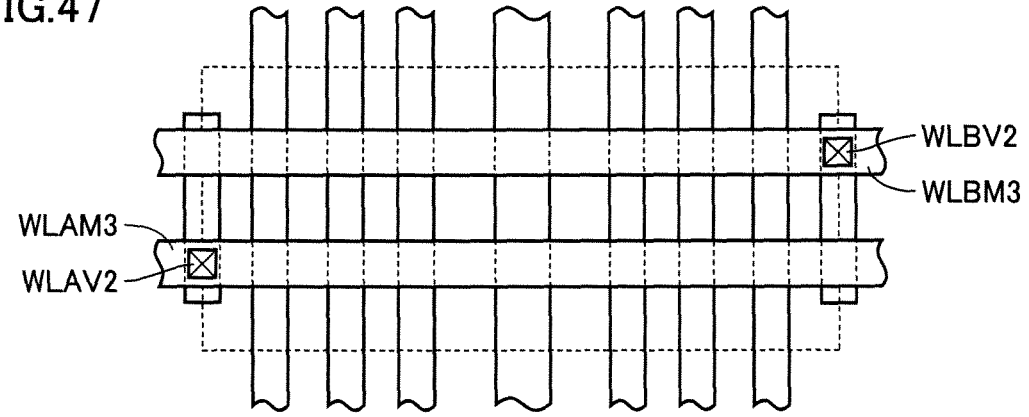
FIG. 47 is a plan view showing a structure of connection between the second metal interconnection and a third metal interconnection in the embodiment.

Although not shown in FIG. 44, a multilayer metal interconnection is formed above the first metal interconnection. The following describes the multilayer interconnection structure that electrically connects the transistors. FIG. 45 is a plan view showing a structure of connection between each of the transistors and the first metal interconnection in one memory cell. FIG. 46 is a plan view showing a structure of connection between the first metal interconnection and a second metal interconnection. FIG. 47 is a plan view showing a structure of connection between the second metal interconnection and a third metal interconnection.

One of the pair of source-drain regions of access transistor AT1 (AT2) is electrically connected to second metal interconnection BLAM2 (/BLAM2) serving as bit line BLA (/BLA), through a contact BLAC (/BLAC), a first metal interconnection BLAM1 (/BLAM1), and a via BLAV1 (/BLAV1).

Gate electrode AG1 (AG2) of access transistor AT1 (AT2) is electrically connected to a third metal interconnection WLAM3 serving as word line WLA, through a contact WLAC, a first metal interconnection WLAM1, a via WLAV1, a second metal interconnection WLAM2, and a via WLAV2.

One of the pair of source-drain regions of access transistor AT3 (AT4) is electrically connected to a second metal interconnection BLBM2 (/BLBM2) serving as bit line BLB (/BLB), through a contact BLBC (/BLBC), a first metal interconnection BLBM1 (/BLBM1), and a via BLBV1 (/BLBV1).

Gate electrode AG3 (AG4) of access transistor AT3 (AT4) is electrically connected to a third metal interconnection WLBM3 serving as word line WLB, through a contact WLBC, a first metal interconnection WLBM1, a via WLBV1, a second metal interconnection WLBM2, and a via WLBV2.

The other of the pair of source-drain regions of access transistor AT1 (AT3) is electrically connected to load gate electrode LG2 of load transistor LT2 and drive gate electrode DG2 of drive transistor DT2 through contact SNC, a first metal interconnection SNM1, and a contact SNGC.

The other of the pair of source-drain regions of access transistor AT2 (AT4) is electrically connected to load gate electrode LG1 of load transistor LT1 and drive gate electrode DG1 of drive transistor DT1 through a contact /SNC, a first metal interconnection /SNM1, and a contact /SNGC.

The other of the pair of source-drain regions of access transistor AT1 (AT3) is electrically connected to one of the pair of source-drain regions of drive transistor DT1 through contact SNC, first metal interconnection SNM1, and contact SNC.

The other of the pair of source-drain regions of access transistor AT2 (AT4) is electrically connected to one of the pair of source-drain regions of drive transistor DT2 through contact /SNC, first metal interconnection /SNM1, and contact /SNC.

Further, the other of the pair of source-drain regions of access transistor AT1 (AT3) is electrically connected to one of the pair of source-drain regions of load transistor LT1 through contact SNC, first metal interconnection SNM1, and contact SNLC.

The other of the pair of source-drain regions of access transistor AT2 (AT4) is electrically connected to one of the pair of the source-drain regions of load transistor LT2 through contact /SNC, first metal interconnection /SNM1, and contact /SNLC.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from one another (see FIG. 43). Next, a step similar to the above-described step shown in FIG. 11 is performed, thereby forming gate structures G to serve as access gate electrodes AG1, AG2, AG3, AG4, drive gate electrodes DG1, DG2, and load gate electrodes LG1, LG2, respectively (see FIG. 48). Next, offset spacers (not shown) are formed on both side surfaces of each gate structure G.

Figure 48:
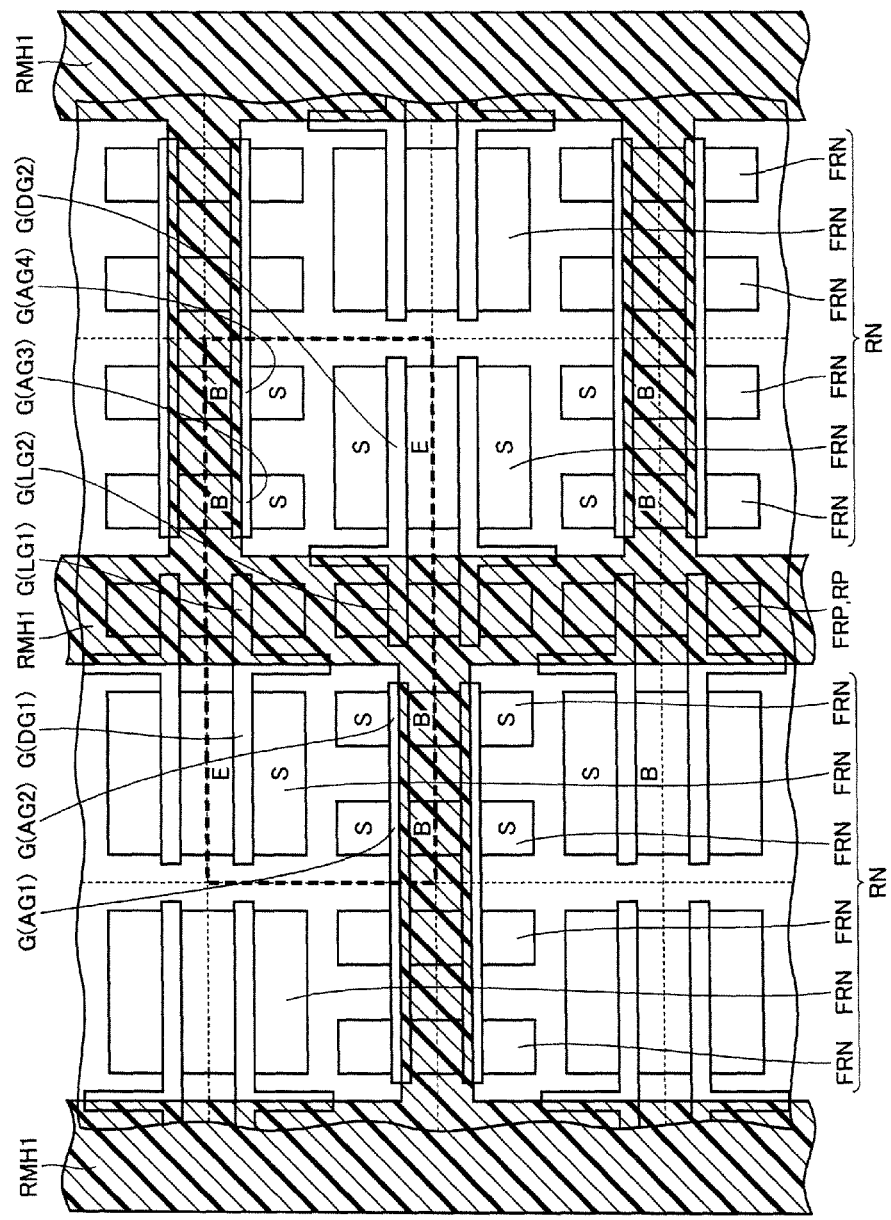
FIG. 48 is a plan view showing one step in a method for manufacturing the semiconductor device in the first example of the embodiment.

Next, as shown in FIG. 48, a predetermined photolithography process is performed to form a resist mask RMH1 that is to serve as an implantation mask for forming the halo regions (implantation mask A). Resist mask RMH1 is formed to have an opening pattern exposing: the side surface of gate structure G that is to serve as each of access gate electrodes AG1, AG2 (AG3, AG4), the side surface being positioned at the side of region S in which the source-drain region electrically connected to the storage node is to be formed; region S; gate structure G that is to serve as drive gate electrode DG1 (DG2); and region E in which the source-drain region electrically connected to the ground interconnection is to be formed.

On the other hand, resist mask RMH1 is formed to cover: the side surface of gate structure G that is to serve as each of access gate electrodes AG1, AG2 (AG3, AG4), the side surface being positioned at the side of region B in which the source-drain region electrically connected to the bit line is to be formed; and region B. Also, resist mask RMH1 is formed to cover PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in exposed regions of the p well (halo implantation A). It should be noted that in this halo implantation A, the same amount of boron is implanted with the same implantation energy. Thereafter, resist mask RMH1 is removed.

Figure 49:
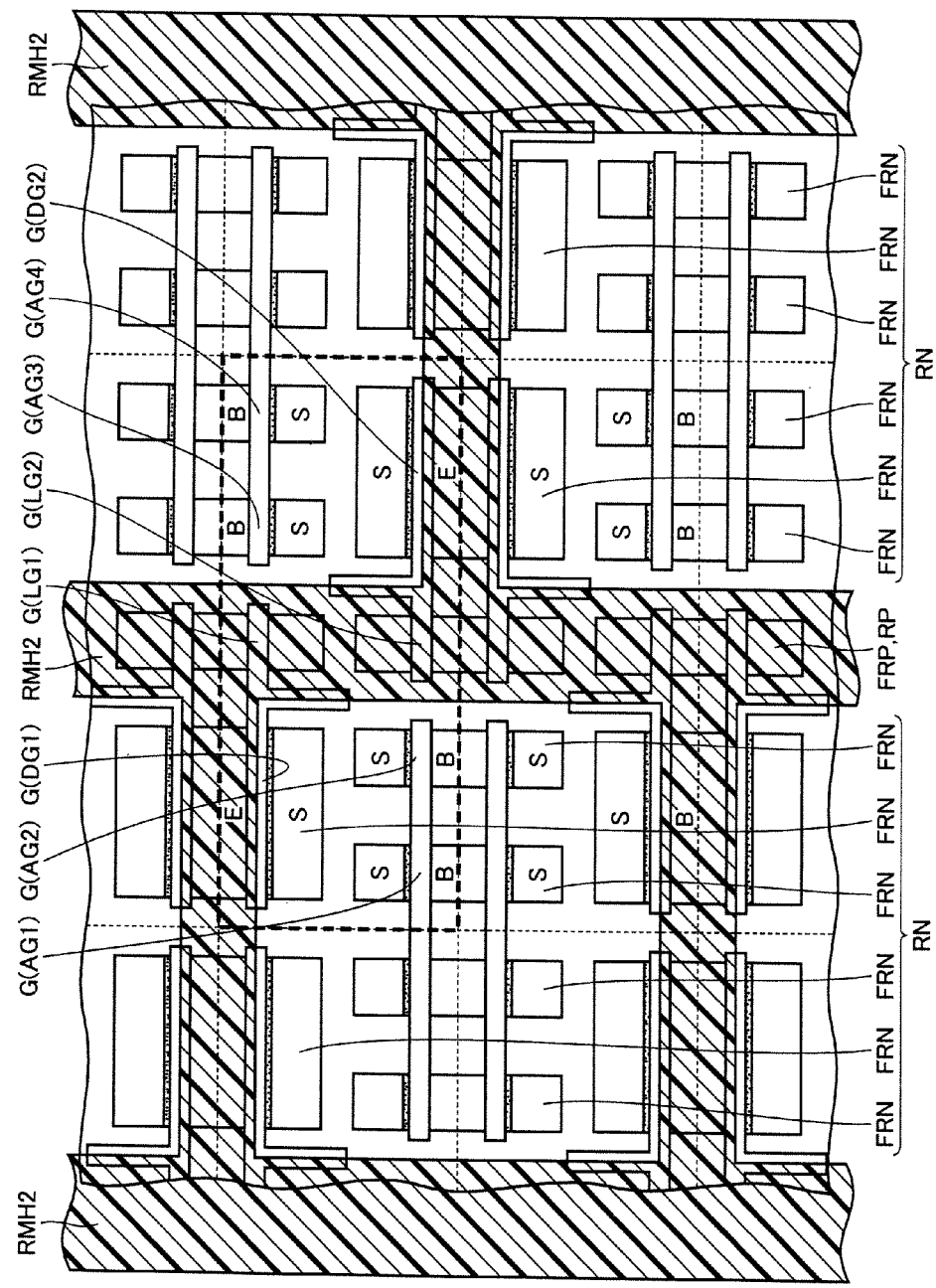
FIG. 49 is a plan view showing a step performed after the step shown in FIG. 48 in the embodiment.

Next, as shown in FIG. 49, a predetermined photolithography process is performed to form a resist mask RMH2 that is to serve as an implantation mask for forming the halo regions (implantation mask B). Resist mask RMH2 is formed to have an opening pattern exposing: the side surface of gate structure G that is to serve as drive gate electrode DG1 (DG2), the side surface being positioned at the side of region S in which the source-drain region electrically connected to the storage node is to be formed; region S; gate structure G that is to serve as each of access gate electrodes AG1, AG2 (AG3, AG4); and region B in which the source-drain region electrically connected to the bit line is to be formed.

On the other hand, resist mask RMH2 is formed to cover: the side surface of gate structure G that is to serve as drive gate electrode DG1 (DG2), the side surface being positioned at the side of region E in which the source-drain region electrically connected to the ground interconnection is to be formed; region E; and element formation region FRP.

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Figure 50:
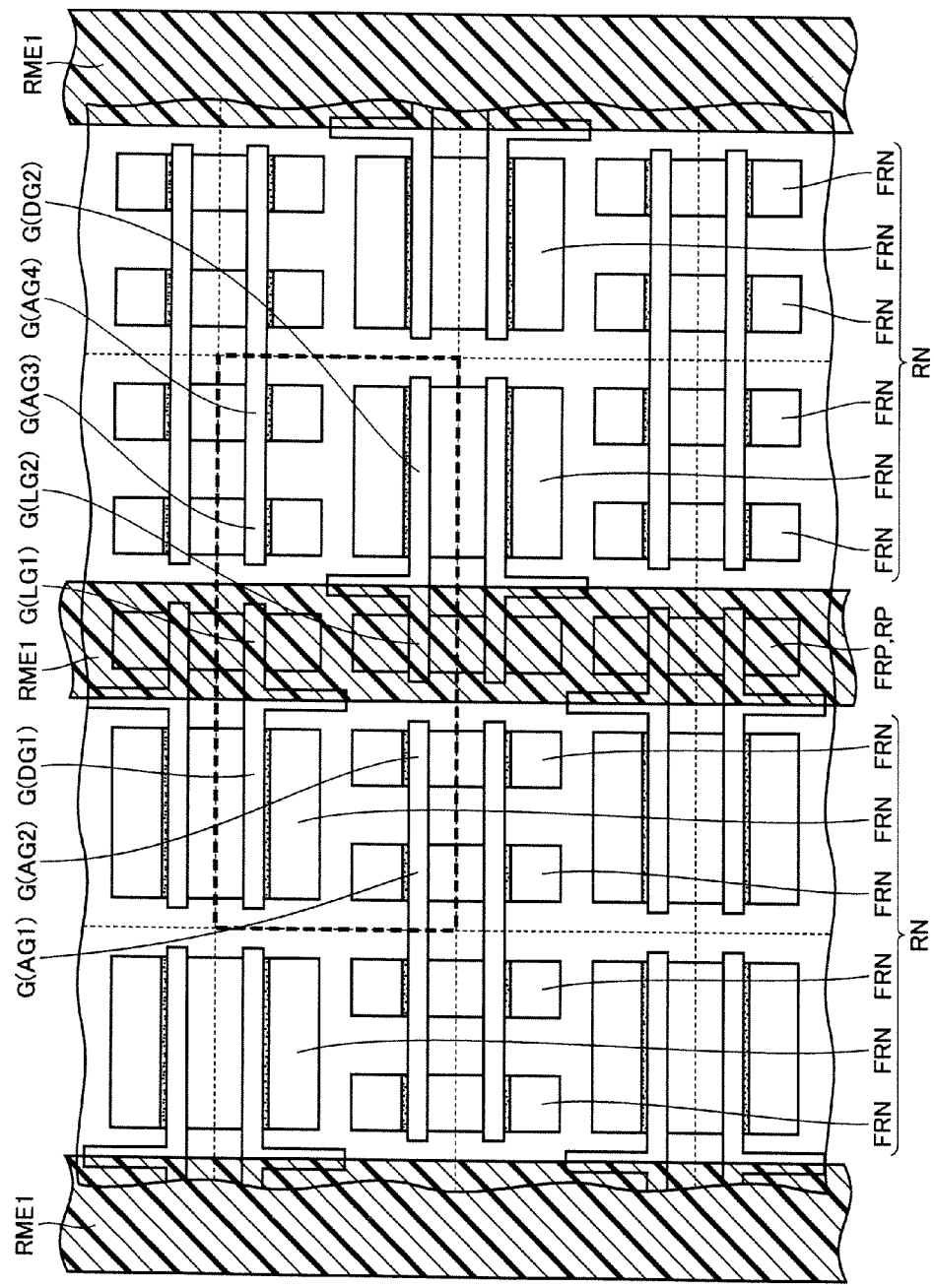
FIG. 50 is a plan view showing a step performed after the step shown in FIG. 49 in the embodiment.

Next, as shown in FIG. 50, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region ER (see FIG. 44) up to a predetermined depth from the surface of the exposed region of p well PW (extension implantation). Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation region FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the above-described steps shown in FIG. 28 to FIG. 31 are performed, thereby forming copper interconnection CW1 serving as the first metal interconnection as shown in FIG. 44. Thereafter, the multilayer interconnection structure shown in FIG. 46 and FIG. 47 is formed on copper interconnection CW1, thus forming the main portion of the SRAM memory cell.

In the present semiconductor device including the dual-port SRAM memory cell, halo regions AHS, AHB are formed in each of access transistors AT1, AT2, AT4, AT3. In access transistor AT1 (AT2), halo region AHS having a relatively high impurity concentration is formed at the storage node SN (/SN) side, whereas halo region AHB having a relatively low impurity concentration is formed at the bit line BLA (/BLA) side. In access transistor AT3 (AT4), halo region AHS having a relatively high impurity concentration is formed at the storage node SN (/SN) side, whereas halo region AHB having a relatively low impurity concentration is formed at the bit line BLB (/BLB) side.

Likewise, halo regions DHS, DHB are formed in each of drive transistors DT1, DT2. Halo region DHS having a relatively high impurity concentration is formed at the storage node SN (/SN) side, whereas halo region DHE having a relatively low impurity concentration is formed at the ground interconnection VSS side. Further, drive transistors DT1, DT2 are set to have gate widths longer than the gate widths of access transistors AT1, AT2 (AT3, AT4).

Hence, as described in the first embodiment, in the read operation, current flowing in the access transistor (AT1 (AT2), AT3 (AT4)) from the bit line (BLA (/BLA), BLB (/BLB)) side to the storage node (SN (/SN)) side can be readily suppressed, and current flowing in drive transistor DT1 (DT2) from the storage node (SN (/SN)) side to the ground interconnection (VSS) side can be readily further increased. Accordingly, the β ratio can be made high, thereby further increasing the read margin.

Further, in the write operation, current (current IFA) flowing in the access transistor (AT1 (AT2), AT3 (AT4)) from the storage node (SN (/SN)) side to the bit line (BLA (/BLA), BLB (/BLB)) side can be readily increased. Accordingly, the γ ratio can be made high, thereby increasing the write margin. In this way, in the semiconductor device according to the first example, both the read margin and the write margin can be increased.

Further, as described in the first embodiment, the current flowing in each of drive transistors DT1, DT2 is only the current flowing from the storage node side to the ground interconnection side in the read operation. Thus, halo region DHS having a relatively high impurity concentration is formed at the storage node SN (/SN) side and halo region DHE having a relatively low impurity concentration is formed at the ground interconnection (VSS) side, whereby the threshold voltage of each of drive transistors DT1, DT2 can be made relatively low and high-speed operation can be achieved during reading.

Meanwhile, as described in the first embodiment, in the case where the impurity concentration of halo region DHE in each of drive transistors DT1, DT2 is set to be higher than the impurity concentration of halo region AHB of each of access transistors AT1, AT2, leakage current from each of drive transistors DT1, DT2 can be suppressed during the read operation.

In the above-described semiconductor device, halo regions AHB, AHS of access transistors AT1, AT2, AT3, AT4 and halo regions DHE, DHS of drive transistors DT1, DT2 are formed using resist mask RMH1 (implantation mask A) and resist mask RMH2 (implantation mask B). Further, the halo regions of load transistors LT1, LT2 are formed using the resist mask (implantation mask D). Thus, as compared with the semiconductor device according to the comparative example, the number of photolithography masks for forming halo regions can be reduced by one.

Second Example

Here, the following describes a second example of the semiconductor device including the dual-port SRAM memory cell. First, the circuit diagram of an equivalent circuit of the SRAM memory cell is the same as that of the equivalent circuit (see FIG. 42) of the SRAM memory cell in the semiconductor device according to the first example. Hence, description thereof is not repeated.

Figure 51:
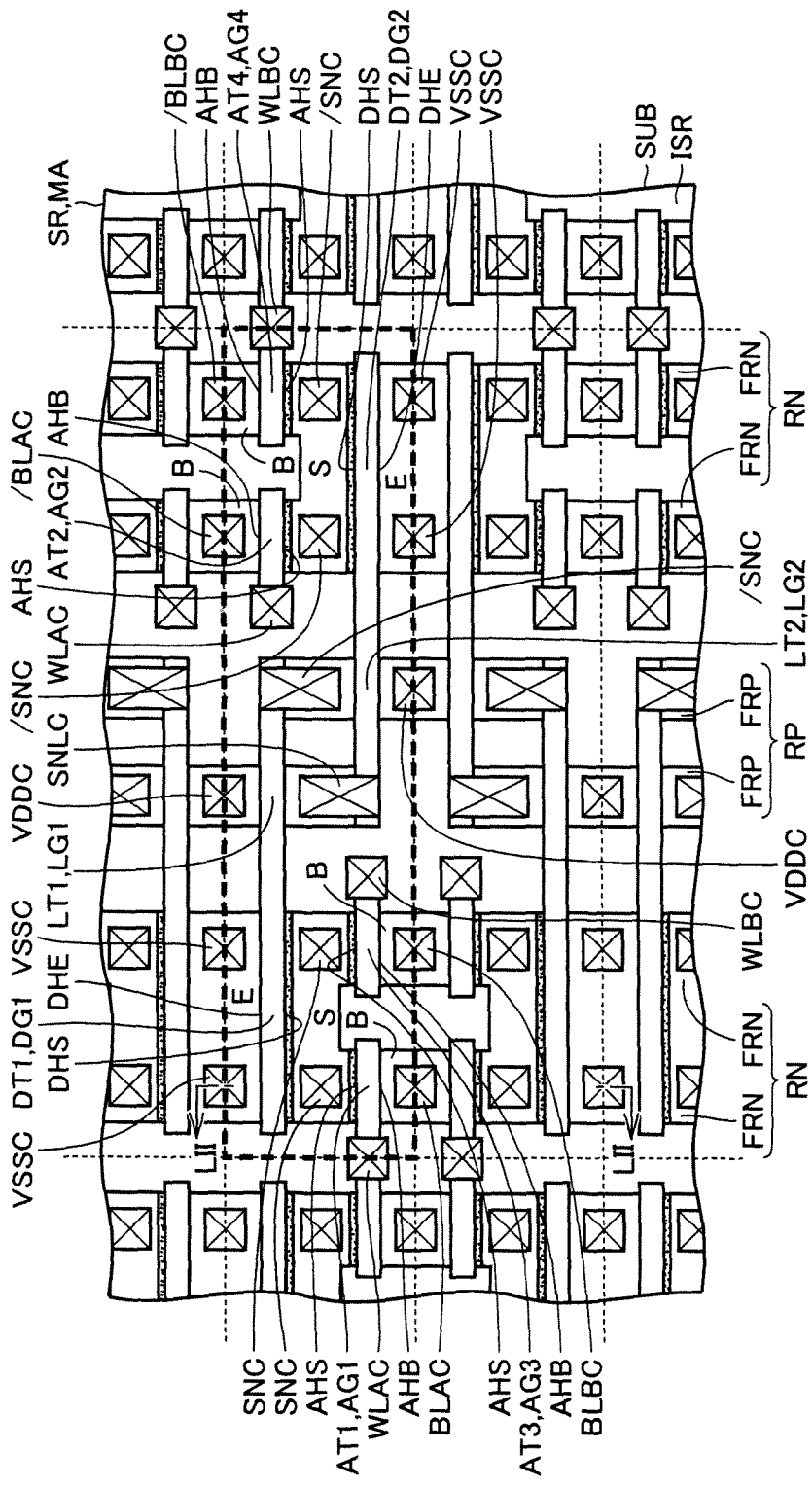
FIG. 51 shows an arrangement pattern of SRAM memory cells of a semiconductor device in a second example of the second embodiment of the present invention.

The following describes a structure of the SRAM memory cell. FIG. 51 is a plan view showing a layout of the transistors of the memory cells of the SRAM cell array, and contacts connected to the transistors. In this plan view, one SRAM memory cell is constituted of a region surrounded by a dotted line.

On a main surface of a semiconductor substrate SUB, an element isolation region ISR is formed using an element isolation insulation film, thereby defining element formation regions FRN, FRP electrically disconnected from each other. Element formation regions FRN are formed in an NMIS region RN.

In element formation regions FRN, access transistors AT1, AT3, AT2, AT4 and drive transistors DT1, DT2 are formed as n channel type MIS transistors. Meanwhile, in element formation regions FRP, load transistors LT1, LT2 are formed as p channel type MIS transistors.

Element formation region FRN having access transistor AT1 formed therein, element formation region FRN having access transistor AT3 formed therein, and element formation region FRN having drive transistor DT1 formed therein are connected to one another. Element formation region FRN having access transistor AT2 formed therein, element formation region FRN having access transistor AT4 formed therein, and element formation region FRN having drive transistor DT2 formed therein are connected to one another. Further, element formation regions FNR having drive gate electrodes DG1, DG2 formed therein are formed such that drive gate electrodes DG1, DG2 have gate widths longer than the gate widths of access transistors AT1, AT2 (AT3, AT4), for example.

Meanwhile, load gate electrodes LG1, LG2 of load transistors LT1, LT2 are formed across element formation regions FRP. Further, each of access gate electrodes AG1, AG2, AG3, AG4, drive gate electrodes DG1, DG2, and load gate electrodes LG1, LG2 is formed to extend in one direction.

Figure 52:
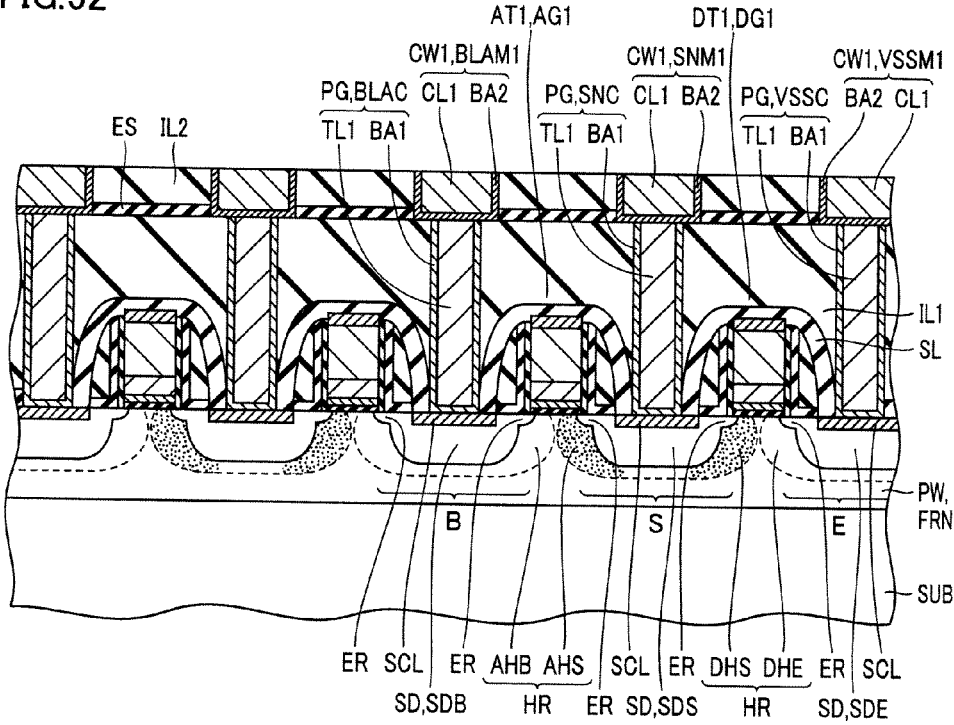
FIG. 52 is a cross sectional view taken along a cross sectional line LII-LII of FIG. 51 in the embodiment.

FIG. 52 is a cross sectional view taken along a cross sectional line LII-LII extending through drive transistor DT1 and access transistor AT1 of the SRAM memory cell in FIG. 51. As shown in FIG. 52, access gate electrode AG1 of access transistor AT1 is formed above a region interposed between a region S and a region B. In region S, n type source-drain region SDS, which is electrically connected to the storage node (contact SNC), is formed. In region B, n type source-drain region SDB, which is electrically connected to the bit line (contact BLAC), is formed. In a region just below access gate electrode AG1, as p type halo regions HR, halo region AHS is formed adjacent to source-drain region SDS and halo region AHB is formed adjacent to source-drain region SDB.

On the other hand, drive gate electrode DG1 of drive transistor DT1 is formed above a region interposed between a region E and a region S. In region E, n type source-drain region SDE, which is electrically connected to the ground interconnection (contact VSSC), is formed. In region S, n type source-drain region SDS, which is electrically connected to the storage node (contact SNC), is formed. In a region just below drive gate electrode DG1, as p type halo regions HR, halo region DHS is formed adjacent to source-drain region SDS and halo region DHE is formed adjacent to source-drain region SDE. It should be noted that the same members as those in the semiconductor device according to the first example are given the same reference characters and are not described repeatedly.

Figure 53:
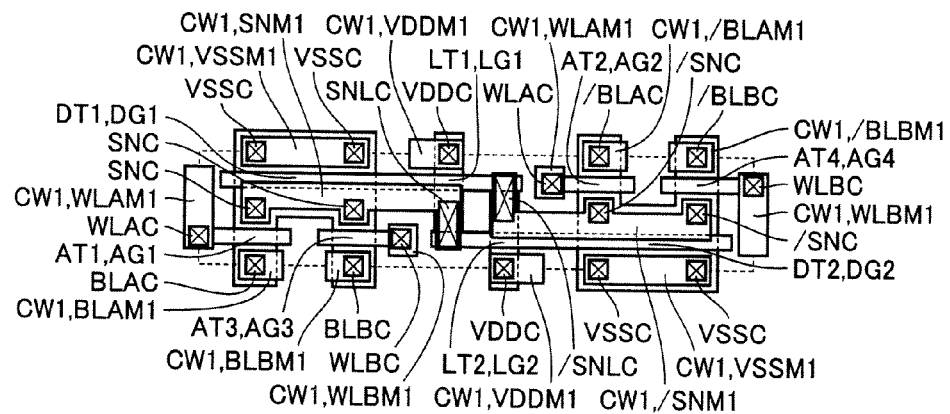
FIG. 53 is a plan view showing a structure of connection between each transistor and a first metal interconnection in the embodiment.
Figure 54:
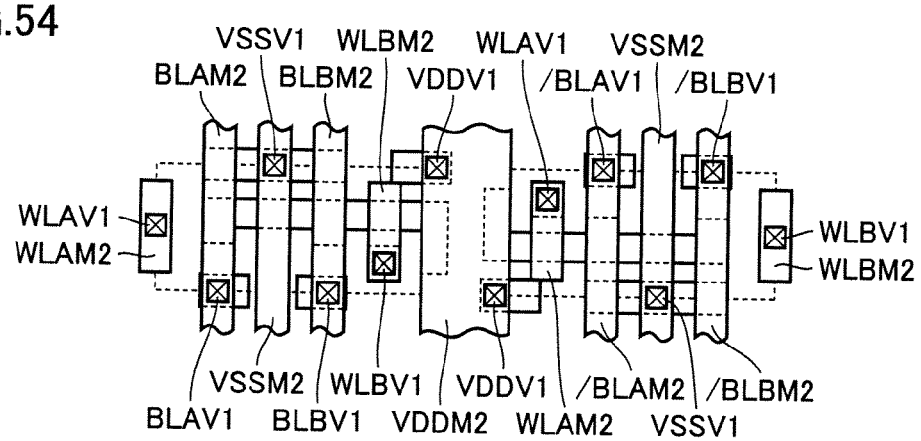
FIG. 54 is a plan view showing a structure of connection between the first metal interconnection and a second metal interconnection in the embodiment.
Figure 55:
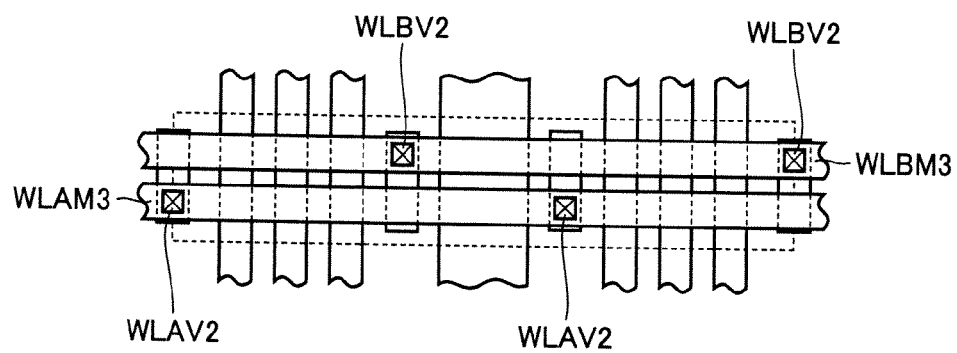
FIG. 55 is a plan view showing a structure of connection between the second metal interconnection and a third metal interconnection in the embodiment.

The following describes a multilayer interconnection structure that electrically connects the transistors. FIG. 53 is a plan view showing a structure of connection between each of the transistors and the first metal interconnection in one memory cell. FIG. 54 is a plan view showing a structure of connection between the first metal interconnection and a second metal interconnection. FIG. 55 is a plan view showing a structure of connection between the second metal interconnection and a third metal interconnection.

One of the pair of source-drain regions of access transistor AT1 (AT2) is electrically connected to a second metal interconnection BLAM2 (/BLAM2) serving as bit line BLA (/BLA), through a contact BLAC (/BLAC), a first metal interconnection BLAM1 (/BLAM1), and a via BLAV1 (/BLAV1).

Gate electrode AG1 (AG2) of access transistor AT1 (AT2) is electrically connected to a third metal interconnection WLAM3 serving as word line WLA, through a contact WLAC, a first metal interconnection WLAM1, a via WLAV1, a second metal interconnection WLAM2, and a via WLAV2.

One of the pair of source-drain regions of access transistor AT3 (AT4) is electrically connected to a second metal interconnection BLBM2 (/BLBM2) serving as bit line BLB (/BLB), through a contact BLBC (/BLBC), a first metal interconnection BLBM1 (/BLBM1), and a via BLBV1 (/BLBV1).

Gate electrode AG3 (AG4) of access transistor AT3 (AT4) is electrically connected to a third metal interconnection WLBM3 serving as word line WLB, through a contact WLBC, first metal interconnection WLBM1, via WLBV1, second metal interconnection WLBM2, and via WLBV2.

The other of the pair of source-drain regions of access transistor AT1 (AT3) is electrically connected to load gate electrode LG2 of load transistor LT2 and drive gate electrode DG2 of drive transistor DT2, through contact SNC, first metal interconnection SNM1, and contact SNLC.

The other of the pair of source-drain regions of access transistor AT2 (AT4) is electrically connected to load gate electrode LG1 of load transistor LT1 and drive gate electrode DG1 of drive transistor DT1 through contact /SNC, first metal interconnection /SNM1, and contact /SNLC.

Further, the other of the pair of source-drain regions of access transistor AT1 (AT3) is electrically connected to one of the pair of source-drain regions of drive transistor DT1. The other of the pair of source-drain regions of access transistor AT2 (AT4) is electrically connected to one of the pair of source-drain regions of drive transistor DT2.

Further, the other of the pair of source-drain regions of access transistor AT1 (AT3) is electrically connected to one of the pair of source-drain regions of load transistor LT1 through contact SNC, first metal interconnection SNM1, and contact SNLC. The other of the pair of source-drain regions of access transistor AT2 (AT4) is electrically connected to one of the pair of the source-drain regions of load transistor LT2 through contact /SNC, first metal interconnection /SNM1, and contact /SNLC.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from each other (see FIG. 52). Next, a step similar to the step shown in FIG. 11 is performed, thereby forming gate structures G to serve as access gate electrodes AG1, AG2, AG3, AG4, drive gate electrodes DG1, DG2, and load gate electrodes LG1, LG2, respectively (see FIG. 56). Next, offset spacers (not shown) are formed on both side surfaces of each gate structure G.

Figure 56:
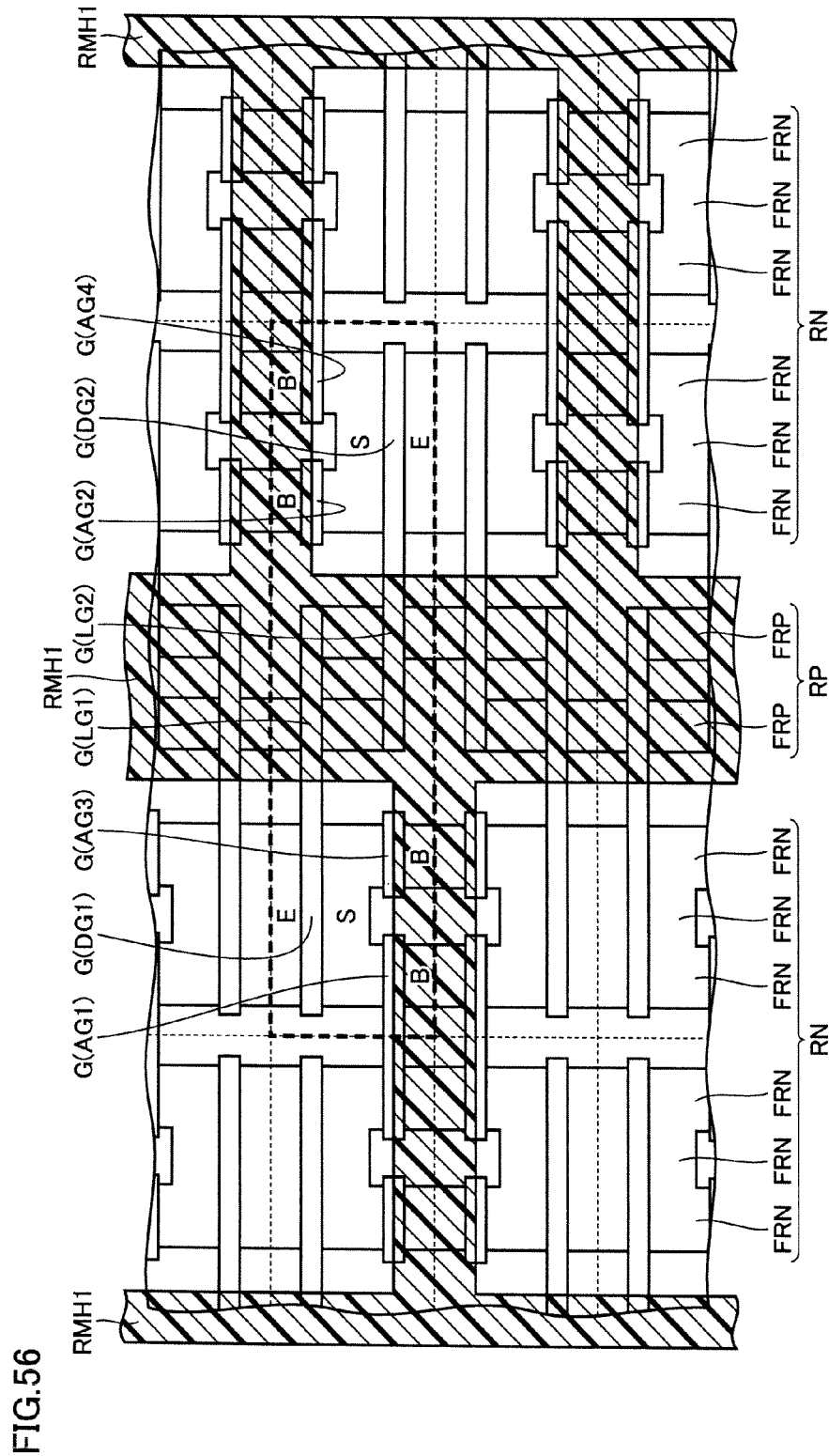
FIG. 56 is a plan view showing one step in a method for manufacturing the semiconductor device in the second example of the embodiment.

Next, as shown in FIG. 56, a predetermined photolithography process is performed to form a resist mask RMH1 that is to serve as an implantation mask for forming the halo regions (implantation mask A). Resist mask RMH1 is formed to have an opening pattern exposing: the side surface of gate structure G that is to serve as each of access gate electrodes AG1, AG3 (AG2, AG4), the side surface being positioned at the side of region S in which the source-drain region electrically connected to the storage node is to be formed; region S; gate structure G that is to serve as drive gate electrode DG1 (DG2); and region E in which the source-drain region electrically connected to the ground interconnection is to be formed.

On the other hand, resist mask RMH1 is formed to cover: the side surface of gate structure G that is to serve as each of access gate electrodes AG1, AG3 (AG2, AG4), the side surface being positioned at the side of region B in which the source-drain region electrically connected to the bit line is to be formed; and region B. Also, resist mask RMH1 is formed to cover PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation A). It should be noted that in this halo implantation A, the same amount of boron is implanted with the same implantation energy. Thereafter, resist mask RMH1 is removed.

Figure 57:
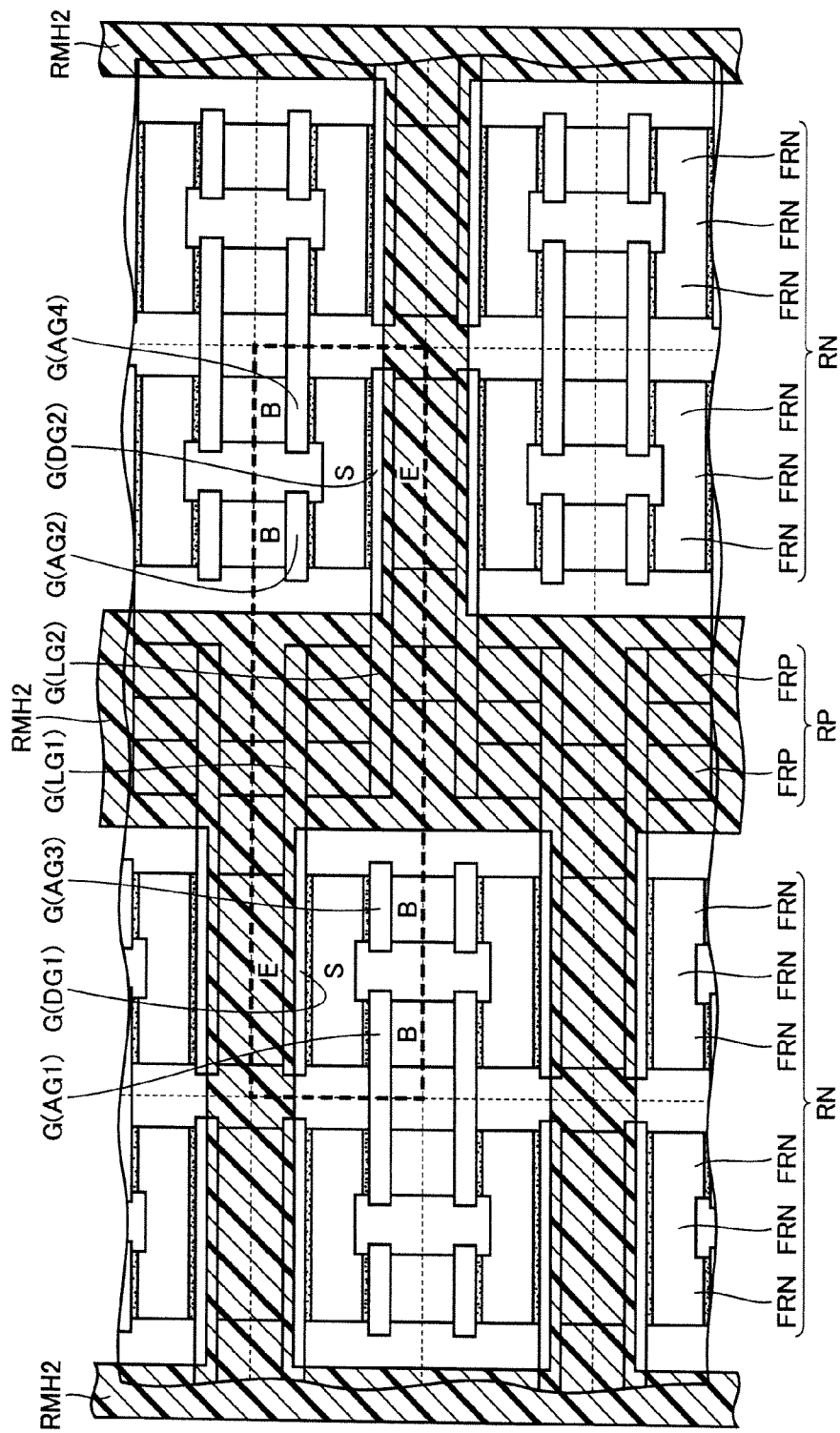
FIG. 57 is a plan view showing a step performed after the step shown in FIG. 56 in the embodiment.

Next, as shown in FIG. 57, a predetermined photolithography process is performed to form a resist mask RMH2 that is to serve as an implantation mask for forming the halo regions (implantation mask B). Resist mask RMH2 is formed to have an opening pattern exposing: the side surface of gate structure G that is to serve as drive gate electrode DG1 (DG2), the side surface being positioned at the side of region S in which the source-drain region electrically connected to the storage node is to be formed; region S; gate structure G that is to serve as each of access gate electrodes AG1, AG3 (AG2, AG4); and region B in which the source-drain region electrically connected to the bit line is to be formed.

On the other hand, resist mask RMH2 is formed to cover: the side surface of gate structure G that is to serve as drive gate electrode DG1 (DG2), the side surface being positioned at the side of region E in which the source-drain region electrically connected to the ground interconnection is to be formed; region E; and PMIS region RP.

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Figure 58:
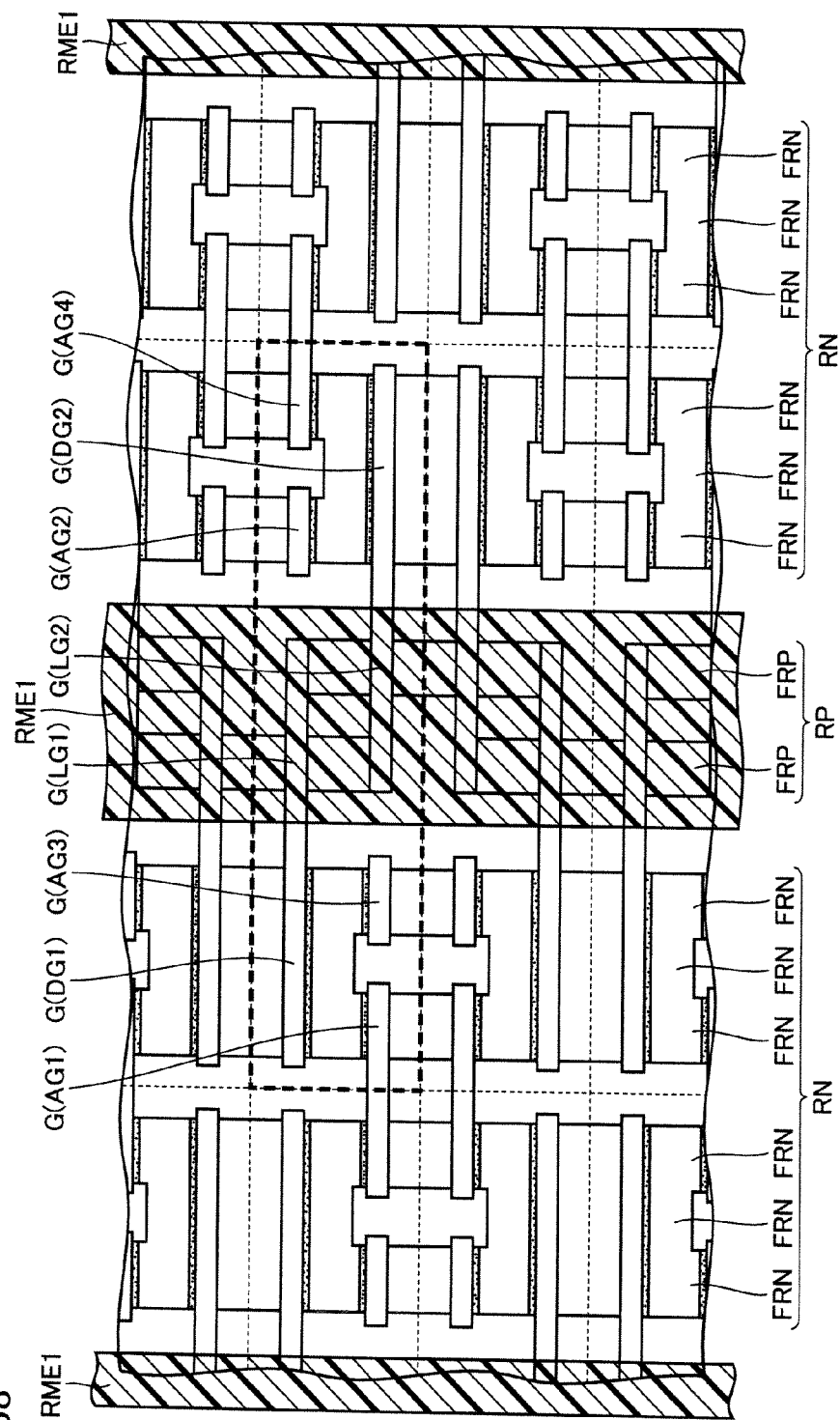
FIG. 58 is a plan view showing a step performed after the step shown in FIG. 57 in the embodiment.

Next, as shown in FIG. 58, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region ER (see FIG. 52) up to a predetermined depth from the surface of the exposed region of p well PW (extension implantation). Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation regions FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection as shown in FIG. 52. Thereafter, the multilayer interconnection structure shown in FIG. 54 and FIG. 55 is formed on copper interconnection CW1, thus forming the main portion of the SRAM memory cell.

In access transistor AT1 (AT2) of the present semiconductor device including the dual-port SRAM memory cell, halo region AHS having a relatively high impurity concentration is formed at the storage node SN (/SN) side, whereas halo region AHB having a relatively low impurity concentration is formed at the bit line BLA (/BLA) side. In access transistor AT3 (AT4), halo region AHS having a relatively high impurity concentration is formed at the storage node SN (/SN) side, whereas halo region AHB having a relatively low impurity concentration is formed at the bit line BLB (/BLB) side.

Further, in each of drive transistors DT1, DT2, halo region DHS having a relatively high impurity concentration is formed at the storage node SN (/SN) side, whereas halo region DHE having a relatively low impurity concentration is formed at the ground interconnection VSS side. Further, drive transistors DT1, DT2 are set to have gate widths longer than the gate widths of access transistors AT1, AT2 (AT3, AT4).

Hence, as described in the first embodiment, in the read operation, current flowing in the access transistor (AT1 (AT2), AT3 (AT4)) from the bit line (BLA (/BLA), BLB (/BLB)) side to the storage node (SN (/SN)) side can be readily suppressed, and current flowing in drive transistor DT1 (DT2) from the storage node (SN (/SN)) side to the ground interconnection (VSS) side can be readily further increased. Accordingly, the β ratio can be made high, thereby further increasing the read margin.

Further, in the write operation, current (current IFA) flowing in the access transistor (AT1 (AT2), AT3 (AT4)) from the storage node (SN (/SN)) side to the bit line (BLA (/BLA), BLB (/BLB)) side can be readily increased. Accordingly, the γ ratio can be made high, thereby increasing the write margin. In this way, in the semiconductor device according to the second example, both the read margin and the write margin can be increased.

Further, as described in the first embodiment, the current flowing in each of drive transistors DT1, DT2 is only the current flowing from the storage node side to the ground interconnection side in the read operation. Thus, halo region DHS having a relatively high impurity concentration is formed at the storage node SN (/SN) side and halo region DHE having a relatively low impurity concentration is formed at the ground interconnection (VSS) side, whereby the threshold voltage of each of drive transistors DT1, DT2 can be made relatively low and high-speed operation can be achieved during reading.

Meanwhile, as described in the first embodiment, in the case where the impurity concentration of halo region DHE in each of drive transistors DT1, DT2 is set to be higher than the impurity concentration of halo region AHB of each of access transistors AT1, AT2, leakage current from each of drive transistors DT1, DT2 can be suppressed during the read operation.

Further, in the above-described semiconductor device, halo regions AHB, AHS of access transistors AT1, AT2, AT3, AT4 and halo regions DHE, DHS of drive transistors DT1, DT2 are formed using resist mask RMH1 (implantation mask A) and resist mask RMH2 (implantation mask B). Further, the halo regions of load transistors LT1, LT2 are formed using the resist mask (implantation mask D). Thus, as compared with the semiconductor device according to the comparative example, the number of photolithography masks for forming halo regions can be reduced by one.

Third Example

Here, the following describes a third example of the semiconductor device including the dual-port SRAM memory cell.

Figure 59:
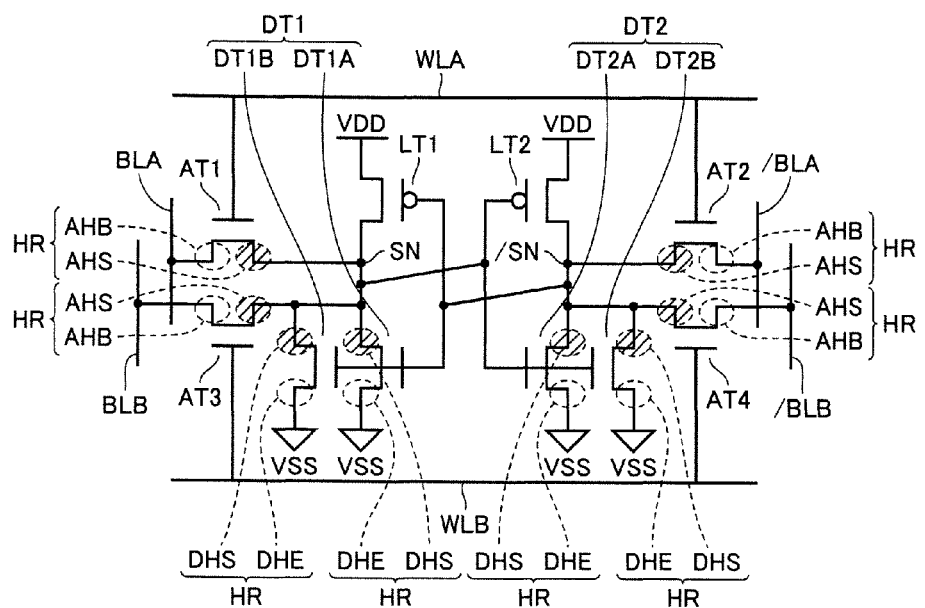
FIG. 59 shows an equivalent circuit of each SRAM memory cell of a semiconductor device in a third example of the second embodiment of the present invention.

Described first is an equivalent circuit of the SRAM memory cell. As shown in FIG. 59, this dual-port SRAM memory cell includes four drive transistors DT1A, DT1B, DT2A, DT2B as the drive transistors. Drive transistors DT1A, DT1B are obtained by dividing drive transistor DT1 of the first example or second example into two drive transistors. Likewise, drive transistors DT2A, DT2B are obtained by dividing drive transistor DT2 of the first example or second example into two drive transistors.

A pair of halo regions HR are formed in each of drive transistors DT1A, DT1B. Of the pair of halo regions HR, a halo region DHS, which is adjacent to the source-drain region connected to storage node SN, is set to have an impurity concentration higher than that of a halo region DHE, which is adjacent to the source-drain region connected to the ground interconnection (VSS). Likewise, a pair of halo regions HR are formed in each of drive transistors DT2A, DT2B. Of the pair of halo regions HR, a halo region DHS, which is adjacent to the source-drain region connected to storage node /SN, is set to have an impurity concentration higher than that of a halo region DHE, which is adjacent to the source-drain region connected to the ground interconnection (VSS). It should be noted that configurations apart from this are the same as those of the equivalent circuit of FIG. 42, and therefore the same members are given the same reference characters and are not described repeatedly.

Figure 60:
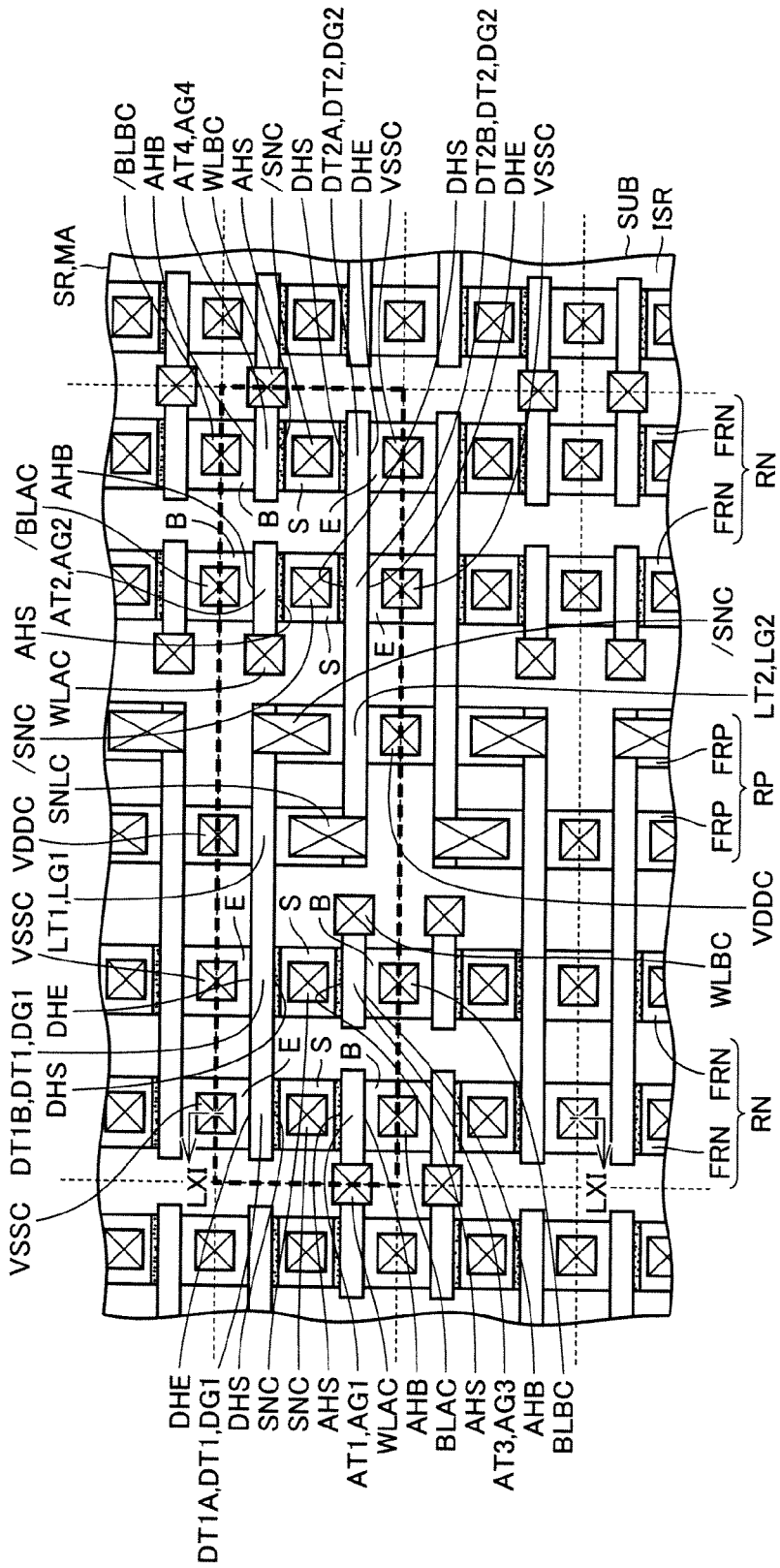
FIG. 60 is a plan view showing an arrangement pattern of the SRAM memory cells in the embodiment.

The following describes a structure of the SRAM memory cell. FIG. 60 is a plan view showing a layout of the transistors of the memory cells of the SRAM cell array, and contacts connected to the transistors. In this plan view, one SRAM memory cell is constituted of a region surrounded by a dotted line.

On a main surface of a semiconductor substrate SUB, an element isolation region ISR is formed using an element isolation insulation film, thereby defining element formation regions FRN, FRP electrically disconnected from each other. Element formation regions FRN are formed in an NMIS region RN.

In element formation regions FRN, access transistors AT1, AT3, AT2, AT4 and drive transistors DT1, DT2 are formed as n channel type MIS transistors. Drive transistor DT1 is obtained by connecting drive transistor DT1A and drive transistor DT1B to each other in parallel. Drive transistor DT2 is obtained by connecting drive transistor DT2A and drive transistor DT2B to each other in parallel. Meanwhile, in element formation regions FRP, load transistors LT1, LT2 are formed as p channel type MIS transistors.

Element formation region FRN having access transistor AT1 formed therein and element formation region FRN having drive transistor DT1A formed therein are connected to each other. Element formation region FRN having access transistor AT3 formed therein and element formation region FRN having drive transistor DT1B formed therein are connected to each other. Element formation regions FRN having drive transistor DT1A and the like formed therein and element formation region FRN having drive transistor DT1B and the like formed therein are electrically disconnected from each other by element isolation region ISR.

Element formation region FRN having access transistor AT2 formed therein and element formation region FRN having drive transistor DT2A formed therein are connected to each other. Element formation region FRN having access transistor AT2 formed therein and element formation region FRN having drive transistor DT2B formed therein are connected to each other. Element formation region FRN having drive transistor DT2A and the like formed therein and element formation region FRN having drive transistor DT2B and the like formed therein are electrically disconnected from each other by element isolation region ISR.

Drive gate electrode DG1 of drive transistors DT1A, DT1B is formed across two element formation regions FRN separated by element isolation region ISR, as a common drive gate electrode of drive transistor DT1. Likewise, drive gate electrode DG2 of drive transistors DT2A, DT2B is formed across two element formation regions FRN separated by element isolation region ISR, as a common drive gate electrode of drive transistor DT2.

Meanwhile, load gate electrodes LG1, LG2 of load transistors LT1, LT2 are formed across element formation regions FRP. Further, each of access gate electrodes AG1, AG2, AG3, AG4, drive gate electrodes DG1, DG2, and load gate electrodes LG1, LG2 is formed to extend in one direction.

Figure 61:
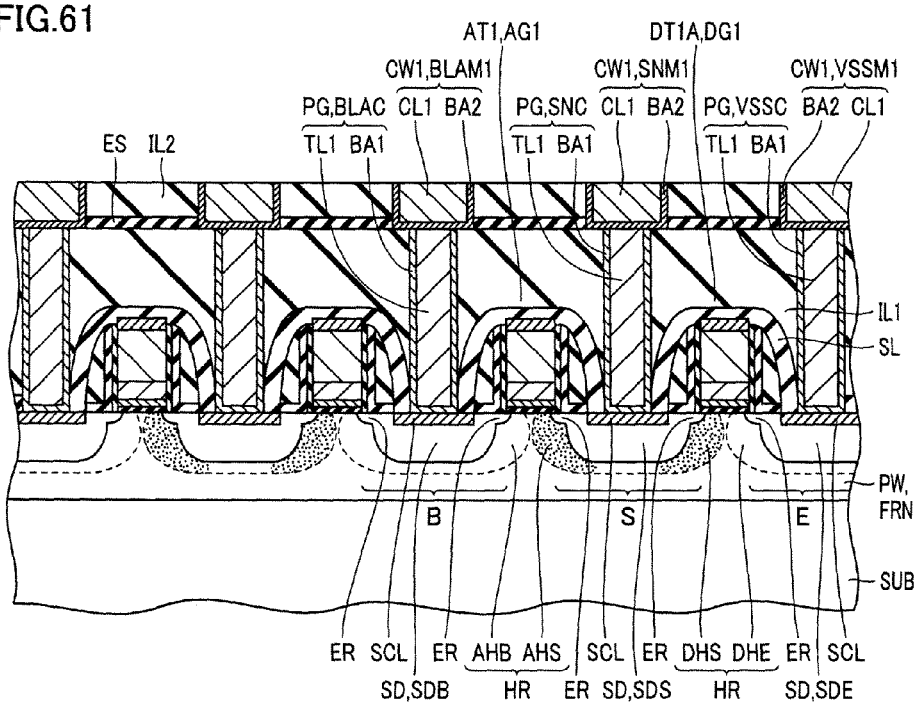
FIG. 61 is a cross sectional view taken along a cross sectional line LXI-LXI of FIG. 60 in the embodiment.

FIG. 61 is a cross sectional view taken along a cross sectional line LXI-LXI extending through drive transistor DT1A and access transistor AT1 of the SRAM memory cell in FIG. 60. As shown in FIG. 61, access gate electrode AG1 of access transistor AT1 is formed above a region interposed between a region S and a region B. In region S, n type source-drain region SDS, which is electrically connected to the storage node (contact SNC), is formed. In region B, n type source-drain region SDB, which is electrically connected to the bit line (contact BLAC), is formed. In a region just below access gate electrode AG1, as p type halo regions HR, halo region AHS is formed adjacent to source-drain region SDS and halo region AHB is formed adjacent to source-drain region SDB.

On the other hand, drive gate electrode DG1 of drive transistor DT1A is formed above a region interposed between a region E and region S. In region E, n type source-drain region SDE, which is electrically connected to the ground interconnection (contact VSSC), is formed. In region S, n type source-drain region SDS, which is electrically connected to the storage node (contact SNC), is formed. In a region just below drive gate electrode DG1, as p type halo regions HR, halo region DHS is formed adjacent to source-drain region SDS and halo region DHE is formed adjacent to source-drain region SDE. It should be noted that the same members as those in the semiconductor device according to the first example are given the same reference characters and are not described repeatedly.

Figure 62:
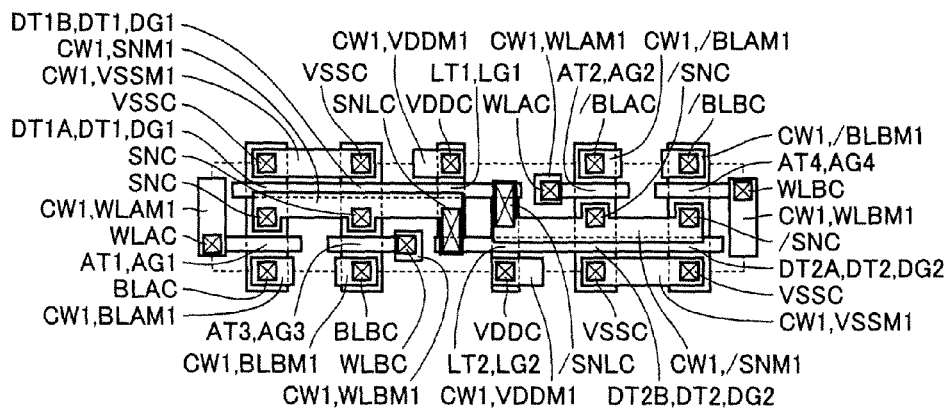
FIG. 62 is a plan view showing a structure of connection between each transistor and a first metal interconnection in the embodiment.
Figure 63:
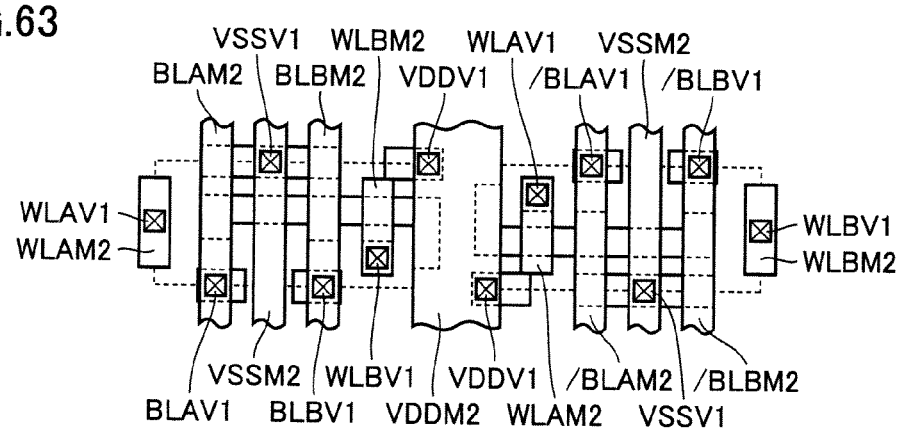
FIG. 63 is a plan view showing a structure of connection between the first metal interconnection and a second metal interconnection in the embodiment.
Figure 64:
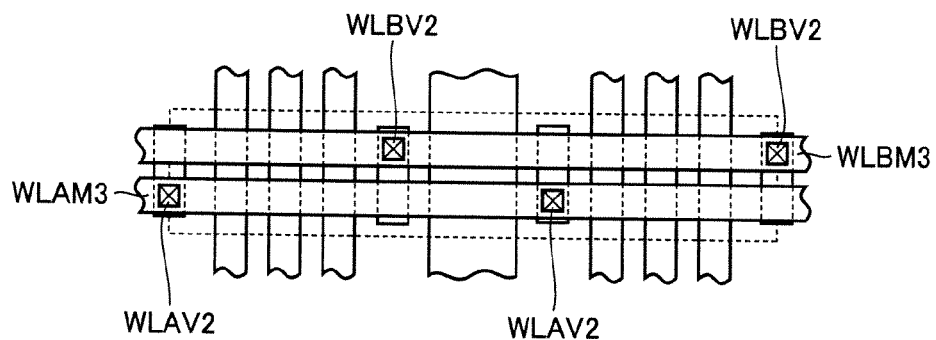
FIG. 64 is a plan view showing a structure of connection between the second metal interconnection and a third metal interconnection in the embodiment.

The following describes a multilayer interconnection structure that electrically connects the transistors. FIG. 62 is a plan view showing a structure of connection between each of the transistors and the first metal interconnection in one memory cell. FIG. 63 is a plan view showing a structure of connection between the first metal interconnection and a second metal interconnection. FIG. 64 is a plan view showing a structure of connection between the second metal interconnection and a third metal interconnection.

One of the pair of source-drain regions of access transistor AT1 (AT2) is electrically connected to second metal interconnection BLAM2 (/BLAM2) serving as bit line BLA (/BLA), through a contact BLAC (/BLAC), a first metal interconnection BLAM1 (/BLAM1), and a via BLAV1 (/BLAV1).

Gate electrode AG1 (AG2) of access transistor AT1 (AT2) is electrically connected to a third metal interconnection WLAM3 serving as word line WLA, through a contact WLAC, a first metal interconnection WLAM1, a via WLAV1, a second metal interconnection WLAM2, and a via WLAV2.

One of the pair of source-drain regions of access transistor AT3 (AT4) is electrically connected to a second metal interconnection BLBM2 (/BLBM2) serving as bit line BLB (/BLB), through a contact BLBC (/BLBC), a first metal interconnection BLBM1 (/BLBM1), and a via BLBV1 (/BLBV1).

Gate electrode AG3 (AG4) of access transistor AT3 (AT4) is electrically connected to a third metal interconnection WLBM3 serving as word line WLB, through a contact WLBC, a first metal interconnection WLBM1, a via WLBV1, a second metal interconnection WLBM2, and a via WLBV2.

The other of the pair of source-drain regions of access transistor AT1 (AT3) is electrically connected to load gate electrode LG2 of load transistor LT2, drive gate electrode DG2 of drive transistor DT2B, and drive gate electrode DG2 of drive gate transistor DT2A through contact SNC, first metal interconnection SNM1, and contact SNLC.

The other of the pair of source-drain regions of access transistor AT2 (AT4) is electrically connected to load gate electrode LG1 of load transistor LT1, drive gate electrode DG1 of drive transistor DT1A, and drive gate electrode DG1 of drive transistor DT1B through contact /SNC, first metal interconnection /SNM1, and contact /SNLC.

The other of the pair of source-drain regions of access transistor AT1 (AT3) is electrically connected to one of the pair of source-drain regions of drive transistor DT1A (DT1B). The other of the pair of source-drain regions of access transistor AT2 (AT4) is electrically connected to one of the pair of source-drain regions of drive transistor DT2A (DT2B).

Further, the other of the pair of source-drain regions of access transistor AT1 (AT3) is electrically connected to one of the pair of source-drain regions of load transistor LT1 through contact SNC, first metal interconnection SNM1, and contact SNLC. The other of the pair of source-drain regions of access transistor AT2 (AT4) is electrically connected to one of the pair of the source-drain regions of load transistor LT2 through contact /SNC, first metal interconnection /SNM1, and contact /SNLC.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from each other (see FIG. 60). Next, a step similar to the step shown in FIG. 11 is performed, thereby forming gate structures G to serve as access gate electrodes AG1, AG2, AG3, AG4, drive gate electrodes DG1, DG2, and load gate electrodes LG1, LG2, respectively (see FIG. 65). Next, offset spacers (not shown) are formed on both side surfaces of each gate structure G.

Figure 65:
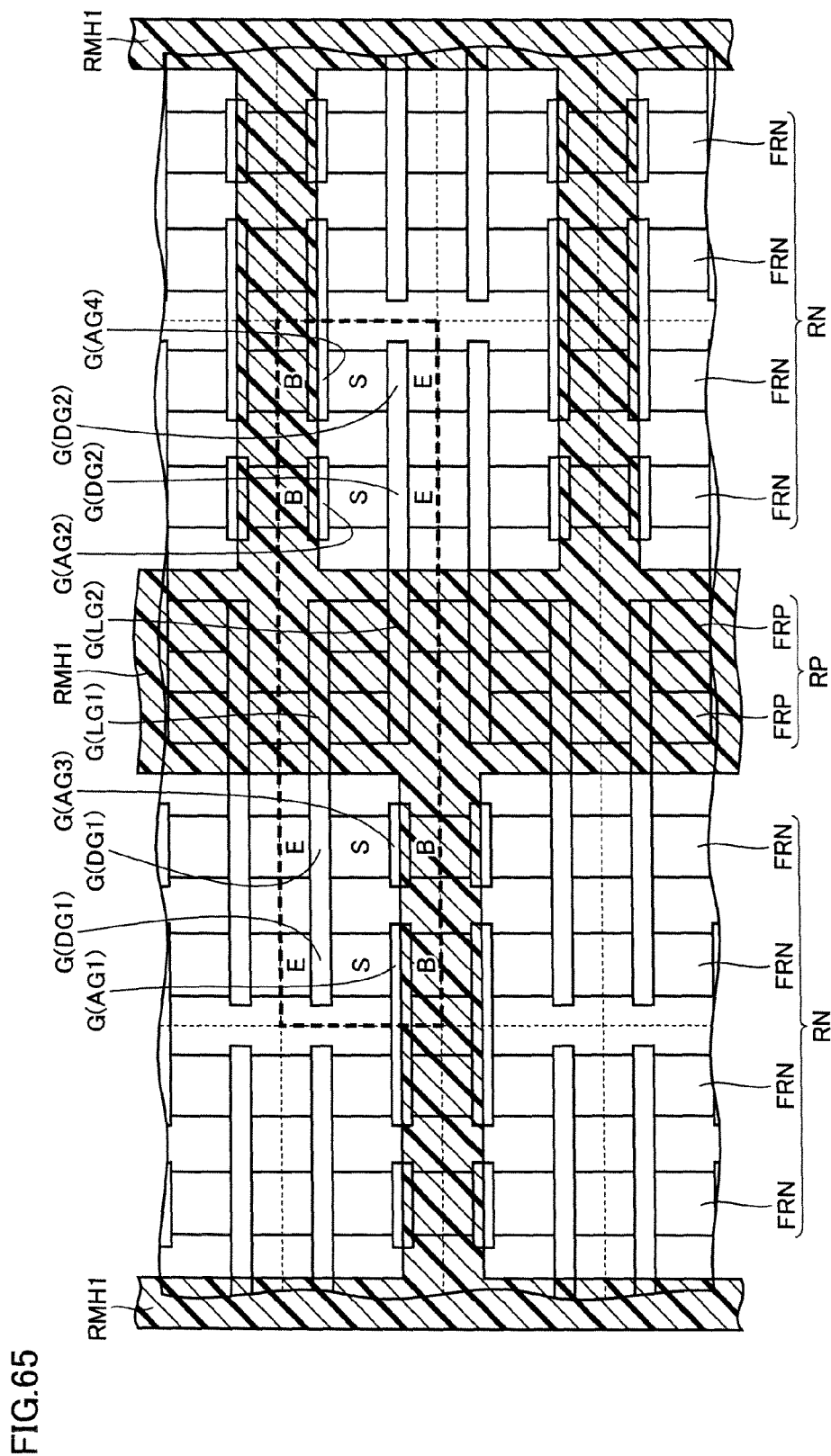
FIG. 65 is a plan view showing one step in a method for manufacturing the semiconductor device in the third example of the embodiment.

Next, as shown in FIG. 65, a predetermined photolithography process is performed to form a resist mask RMH1 that is to serve as an implantation mask for forming the halo regions (implantation mask A). Resist mask RMH1 is formed to have an opening pattern exposing: the side surface of gate structure G that is to serve as each of access gate electrodes AG1, AG3 (AG2, AG4), the side surface being positioned at the side of region S in which the source-drain region electrically connected to the storage node is to be formed; region S; gate structure G that is to serve as drive gate electrode DG1 (DG2); and region E in which the source-drain region electrically connected to the ground interconnection is to be formed.

On the other hand, resist mask RMH1 is formed to cover: the side surface of gate structure G that is to serve as each of access gate electrodes AG1, AG3 (AG2, AG4), the side surface being positioned at the side of region B in which the source-drain region electrically connected to the bit line is to be formed; and region B. Also, resist mask RMH1 is formed to cover PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation A). It should be noted that in this halo implantation A, the same amount of boron is implanted with the same implantation energy. Thereafter, resist mask RMH1 is removed.

Figure 66:
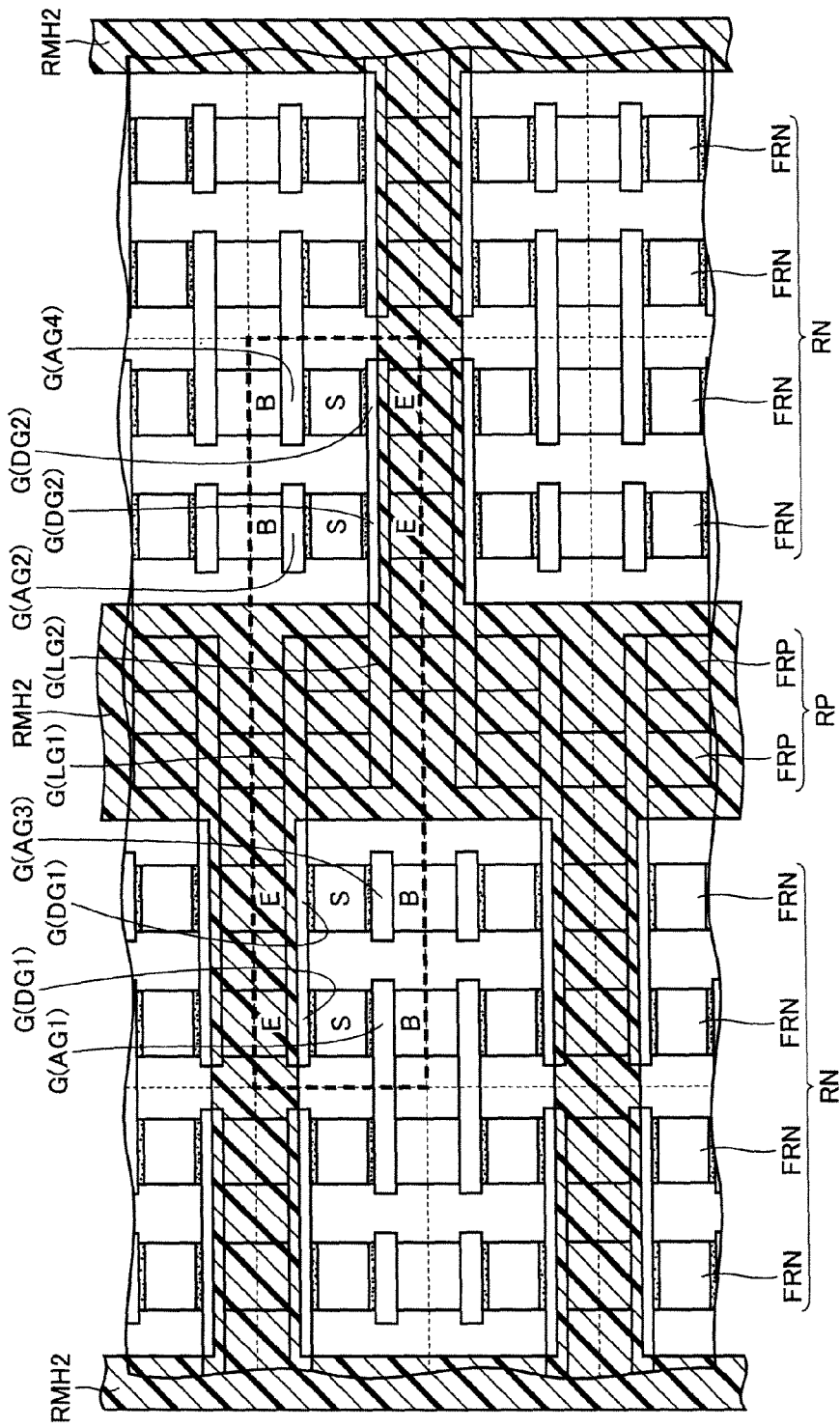
FIG. 66 is a plan view showing a step performed after the step shown in FIG. 65 in the embodiment.

Next, as shown in FIG. 66, a predetermined photolithography process is performed to form a resist mask RMH2 that is to serve as an implantation mask for forming the halo regions (implantation mask B). Resist mask RMH2 is formed to have an opening pattern exposing: the side surface of gate structure G that is to serve as drive gate electrode DG1 (DG2), the side surface being positioned at the side of region S in which the source-drain region electrically connected to the storage node is to be formed; region S; gate structure G that is to serve as each of access gate electrodes AG1, AG3 (AG2, AG4); and region B in which the source-drain region electrically connected to the bit line is to be formed.

On the other hand, resist mask RMH2 is formed to cover: the side surface of gate structure G that is to serve as drive gate electrode DG1 (DG2), the side surface being positioned at the side of region E in which the source-drain region electrically connected to the ground interconnection is to be formed; region E; and PMIS region RP.

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Figure 67:
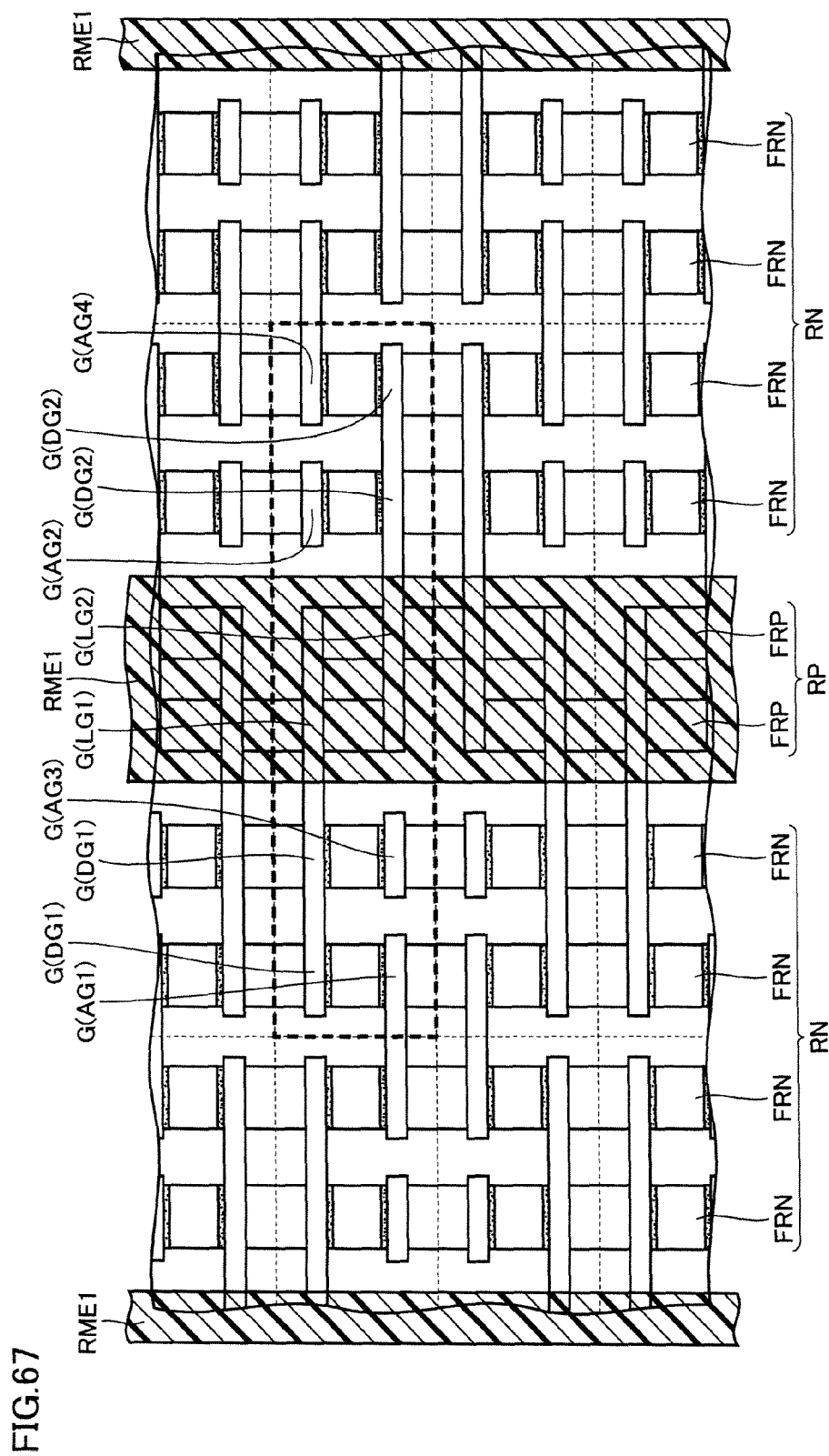
FIG. 67 is a plan view showing a step performed after the step shown in FIG. 66 in the embodiment.

Next, as shown in FIG. 67, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region ER (see FIG. 61) up to a predetermined depth from the surface of the exposed region of p well PW (extension implantation). Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation region FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection as shown in FIG. 61. Thereafter, the multilayer interconnection structure shown in FIG. 63 and FIG. 64 is formed on copper interconnection CW1, thus forming the main portion of the SRAM memory cell.

In each of access transistors AT1, AT3 (AT2, AT4) of the present semiconductor device including the dual-port SRAM memory cell, halo region AHS having a relatively high impurity concentration is formed at the storage node SN (/SN) side, whereas halo region AHB having a relatively low impurity concentration is formed at the bit line BLA or /BLA (BLB or /BLB) side. Further, in each of drive transistors DT1, DT2, halo region DHS having a relatively high impurity concentration is formed at the storage node SN (/SN) side, whereas halo region DHE having a relatively low impurity concentration is formed at the ground interconnection VSS side. Further, as compared with the semiconductor device according to the second example, each of element formation region FRN having drive transistor DT1 formed therein and element formation region FRN having drive transistors DT2 formed therein is divided into two in the present semiconductor device.

In the semiconductor device according to the second example, as shown in FIG. 51, element formation region FRN having drive transistor DT1 (DT2) formed therein, element formation region FRN having access transistor AT1 (AT2) formed therein, and element formation region FRN having access transistor AT3 (AT4) formed therein are connected to one another. In a pattern of these element formation regions FRN, there is a bent portion (bent pattern). As a design of semiconductor device becomes finer, patterning through a photolithography process becomes more difficult, so that such a bent pattern will result in curved finished pattern (shape).

In the semiconductor device according to the third example, each of element formation region FRN having drive transistor DT1 formed therein and element formation region FRN having drive transistor DT2 formed therein is divided into two, thereby eliminating the above-described bent pattern. Hence, the finished pattern has no curved portion, thereby suppressing properties from being fluctuated due to displacement of a mask or the like.

The gate width of each of drive transistors DT1, DT2 becomes shorter than that in the semiconductor device according to the second example because each of the element formation region FRN having drive transistor DT1 formed therein and element formation region FRN having drive transistor DT2 formed therein is divided into two. Still, the gate width of drive transistor DT1 (DT2) is longer than the gate width of each of access transistors AT1, AT3 (AT2, AT4).

Hence, as described in the first embodiment, in the read operation, current flowing in the access transistor (AT1 (AT2), AT3 (AT4)) from the bit line (BLA (/BLA), BLB (/BLB)) side to the storage node (SN (/SN)) side can be readily suppressed, and current flowing in drive transistor DT1 (DT2) from the storage node (SN (/SN)) side to the ground interconnection (VSS) side can be readily increased. Accordingly, the $\beta$ ratio can be made high, thereby increasing the read margin.

Further, in the write operation, current (current IFA) flowing in the access transistor (AT1 (AT2), AT3 (AT4)) from the storage node (SN (/SN)) side to the bit line (BLA (/BLA), BLB (/BLB)) side can be readily increased. Accordingly, the $\gamma$ ratio can be made high, thereby increasing the write margin. In this way, in the semiconductor device according to the third example, both the read margin and the write margin can be increased.

Further, as described in the first embodiment, the current flowing in each of drive transistors DT1, DT2 is only the current flowing from the storage node side to the ground interconnection side in the read operation. Thus, halo region DHS having a relatively high impurity concentration is formed at the storage node SN (/SN) side and halo region DHE having a relatively low impurity concentration is formed at the ground interconnection (VSS) side, whereby the threshold voltage of each of drive transistors DT1, DT2 can be made relatively low and high-speed operation can be achieved during reading.

Meanwhile, as described in the first embodiment, in the case where the impurity concentration of halo region DHE in each of drive transistors DT1, DT2 is set to be higher than the impurity concentration of halo region AHB of each of access transistors AT1, AT2, leakage current from each of drive transistors DT1, DT2 can be suppressed during the read operation.

In the above-described semiconductor device, halo regions AHB, AHS of access transistors AT1, AT2, AT3, AT4 and halo regions DHE, DHS of drive transistors DT1, DT2 are formed using resist mask RMH1 (implantation mask A) and resist mask RMH2 (implantation mask B). Further, the halo regions of load transistors LT1, LT2 are formed using the resist mask (implantation mask D). Thus, as compared with the semiconductor device according to the comparative example, the number of photolithography masks for forming halo regions can be reduced by one.

Third Embodiment

Here, the following describes another exemplary semiconductor device including a dual-port SRAM memory cell. First, an equivalent circuit of the SRAM memory cell is the same as the equivalent circuit shown in FIG. 42. Hence, description thereof is not repeated.

Figure 68:
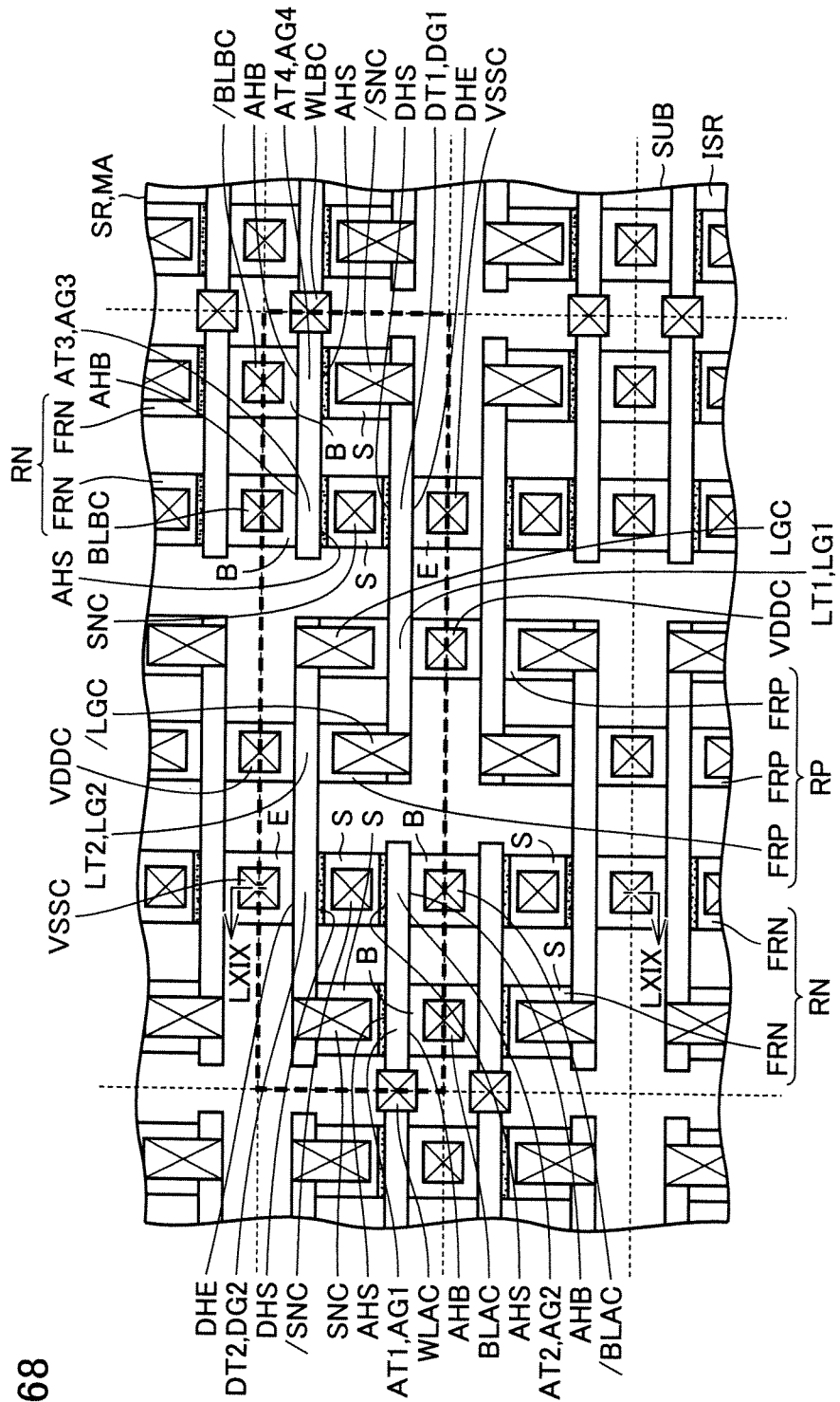
FIG. 68 is a plan view showing an arrangement pattern of SRAM memory cells in a semiconductor device according to a third embodiment of the present invention.

The following describes a structure of the SRAM memory cell. FIG. 68 is a plan view showing a layout of the transistors of the memory cells of the SRAM cell array, and contacts connected to the transistors. In this plan view, one SRAM memory cell is constituted of a region surrounded by a dotted line.

On a main surface of a semiconductor substrate SUB, an element isolation region ISR is formed using an element isolation insulation film, thereby defining element formation regions FRN, FRP electrically disconnected from each other. Element formation regions FRN are formed in an NMIS region RN.

In element formation regions FRN, access transistors AT1, AT2, AT3, AT4 and drive transistors DT1, DT2 are formed as n channel type MIS transistors. Meanwhile, in element formation regions FRP, load transistors LT1, LT2 are formed asp channel type MIS transistors.

Element formation region FRN having access transistor AT1 formed therein and element formation region FRN having each of access transistor AT2 and drive transistor DT2 formed therein are electrically disconnected from each other by element isolation region ISR. Element formation region FRN having access transistor AT4 formed therein and element formation region FRN having each of access transistor AT3 and drive transistor DT1 formed therein are electrically disconnected from each other by element isolation region ISR.

Access gate electrodes AG1, AG2 of access transistors AT1, AT2 are formed across element formation regions FRN as a common electrode. Likewise, access gate electrodes AG3, AG4 of access transistors AT3, AT4 are formed across element formation regions FRN as a common electrode. Drive gate electrode DG1 of drive transistor DT1 is formed across element formation region FRN having access transistor AT3 formed therein. Drive gate electrode DG2 of drive transistor DT2 is formed across element formation region FRN having access transistor AT2 formed therein.

Meanwhile, load gate electrodes LG1, LG2 of load transistors LT1, LT2 are formed across element formation regions FRP. Further, each of access gate electrodes AG1, AG2, AG3, AG4, drive gate electrodes DG1, DG2, and load gate electrodes LG1, LG2 is formed to extend in one direction.

Figure 69:
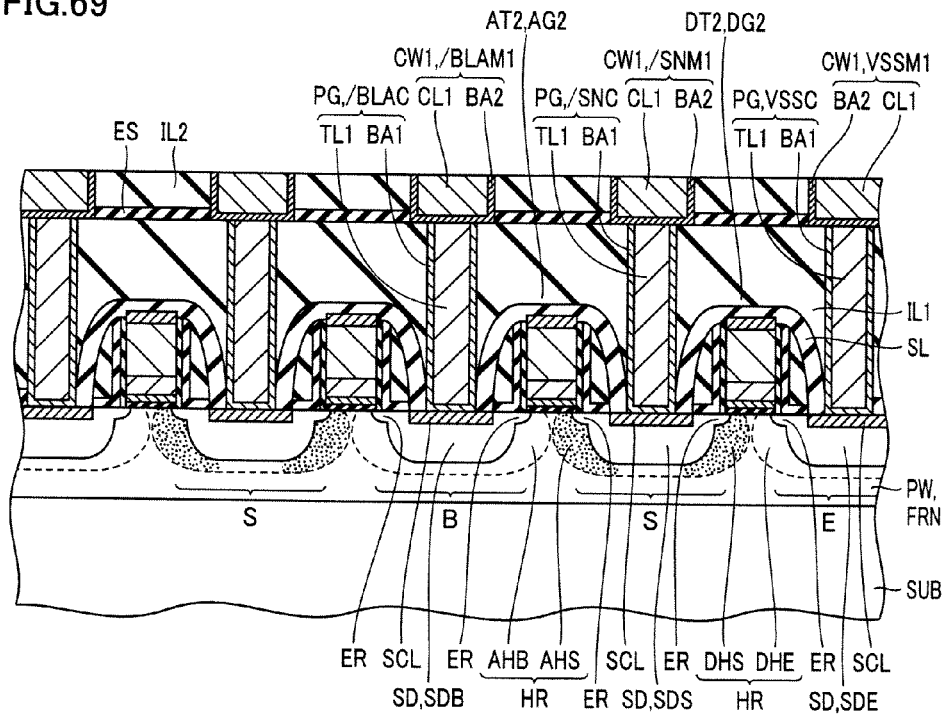
FIG. 69 is a cross sectional view taken along a cross sectional line LXIX-LXIX of FIG. 68 in the embodiment.

FIG. 69 is a cross sectional view taken along a cross sectional line LXIX-LXIX extending through drive transistor DT2 and access transistor AT2 of the SRAM memory cell in FIG. 68. As shown in FIG. 69, access gate electrode AG2 of access transistor AT2 is formed above a region interposed between a region S and a region B. In region S, n type source-drain region SDS, which is electrically connected to the storage node (contact /SNC), is formed. In region B, n type source-drain region SDB, which is electrically connected to the bit line (contact /BLAC), is formed. In a region just below access gate electrode AG2, as p type halo regions HR, halo region AHS is formed adjacent to source-drain region SDS and halo region AHB is formed adjacent to source-drain region SDB.

On the other hand, drive gate electrode DG2 of drive transistor DT2 is formed above a region interposed between a region E and region S. In region E, n type source-drain region SDE, which is electrically connected to the ground interconnection (contact VSSC), is formed. In region S, n type source-drain region SDS, which is electrically connected to the storage node (contact /SNC), is formed. In a region just below drive gate electrode DG2, as p type halo regions HR, halo region DHS is formed adjacent to source-drain region SDS and halo region DHE is formed adjacent to source-drain region SDE. It should be noted that the same members as those in the semiconductor device illustrated in FIG. 5 (first embodiment) are given the same reference characters and are not described repeatedly.

Figure 70:
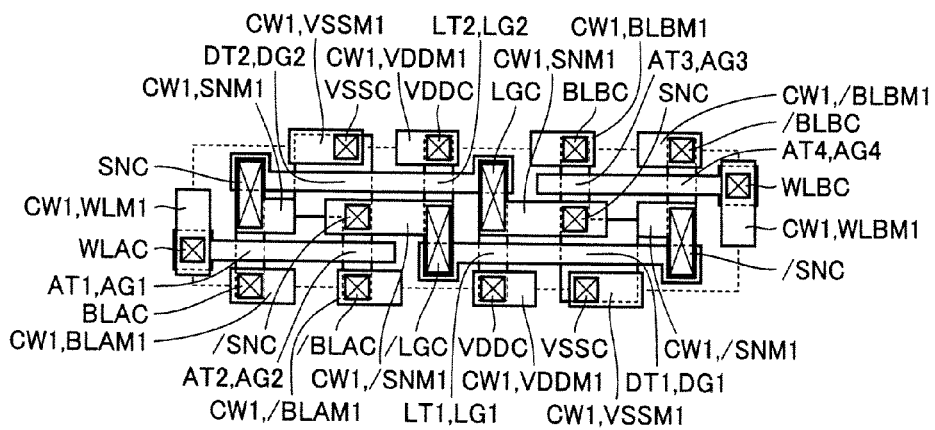
FIG. 70 is a plan view showing a structure of connection between each transistor and a first metal interconnection in the embodiment.
Figure 71:
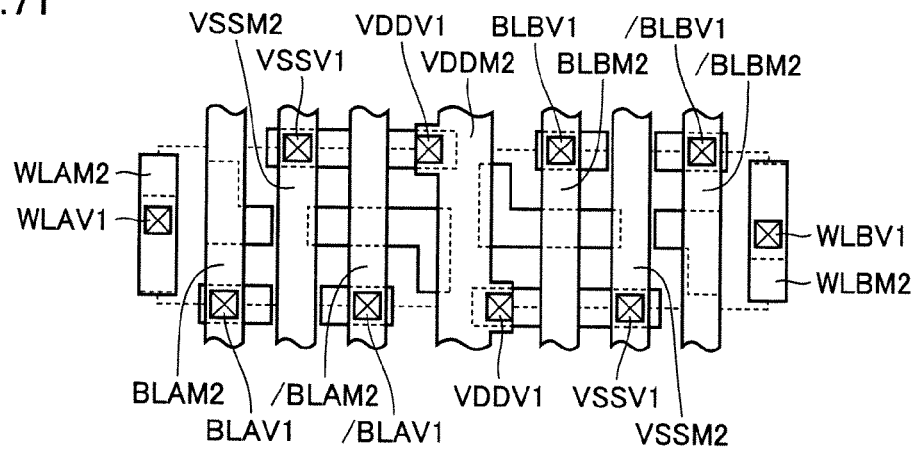
FIG. 71 is a plan view showing a structure of connection between the first metal interconnection and a second metal interconnection in the embodiment.
Figure 72:
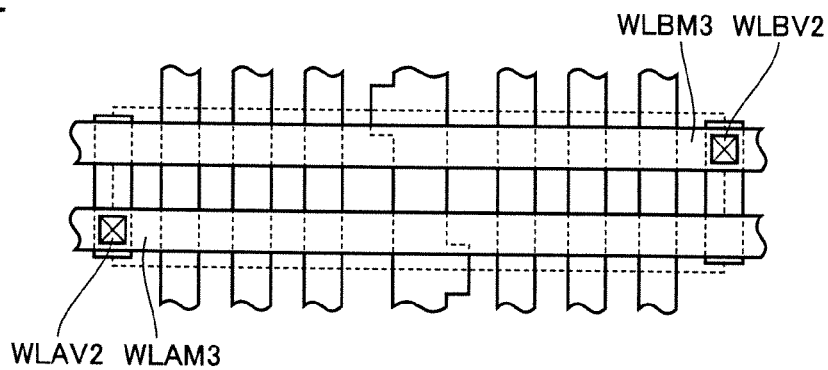
FIG. 72 is a plan view showing a structure of connection between the second metal interconnection and a third metal interconnection in the embodiment.

The following describes a multilayer interconnection structure that electrically connects the transistors. FIG. 70 is a plan view showing a structure of connection between each of the transistors and the first metal interconnection in one memory cell. FIG. 71 is a plan view showing a structure of connection between the first metal interconnection and a second metal interconnection. FIG. 72 is a plan view showing a structure of connection between the second metal interconnection and a third metal interconnection.

One of the pair of source-drain regions of access transistor AT1 (AT2) is electrically connected to a second metal interconnection BLAM2 (/BLAM2) serving as bit line BLA (/BLA), through a contact BLAC (/BLAC), a first metal interconnection BLAM1 (/BLAM1), and a via BLAV1 (/BLAV1).

Gate electrode AG1 (AG2) of access transistor AT1 (AT2) is electrically connected to a third metal interconnection WLAM3 serving as word line WLA, through a contact WLAC, a first metal interconnection WLAM1, a via WLAV1, a second metal interconnection WLAM2, and a via WLAV2.

One of the pair of source-drain regions of access transistor AT3 (AT4) is electrically connected to a second metal interconnection BLBM2 (/BLBM2) serving as bit line BLB (/BLB), through a contact BLBC (/BLBC), a first metal interconnection BLBM1 (/BLBM1), and a via BLBV1 (/BLBV1).

Gate electrode AG3 (AG4) of access transistor AT3 (AT4) is electrically connected to a third metal interconnection WLBM3 serving as word line WLB, through a contact WLBC, a first metal interconnection WLBM1, a via WLBV1, a second metal interconnection WLBM2, and a via WLBV2.

The other of the pair of source-drain regions of access transistor AT1 is electrically connected to load gate electrode LG2 of load transistor LT2 and drive gate electrode DG2 of drive transistor DT2 through contact SNC.

The other of the pair of source-drain regions of access transistor AT3 is electrically connected to load gate electrode LG2 of load transistor LT2 and drive gate electrode DG2 of drive transistor DT2, through contact SNC, first metal interconnection SNM1, and contact LGC.

The other of the pair of source-drain regions of access transistor AT2 is electrically connected to load gate electrode LG1 of load transistor LT1 and drive gate electrode DG1 of drive transistor DT1 through contact /SNC, first metal interconnection /SNM1, and contact /LGC.

The other of the pair of source-drain regions of access transistor AT4 is electrically connected to load gate electrode LG1 of load transistor LT1 and drive gate electrode DG1 of drive transistor DT1 through contact /SNC.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from one another (see FIG. 68). Next, a step similar to the step shown in FIG. 11 is performed, thereby forming gate structures G to serve as access gate electrodes AG1, AG2, AG3, AG4, drive gate electrodes DG1, DG2, and load gate electrodes LG1, LG2, respectively (see FIG. 73). Next, offset spacers (not shown) are formed on both side surfaces of each gate structure G.

Figure 73:
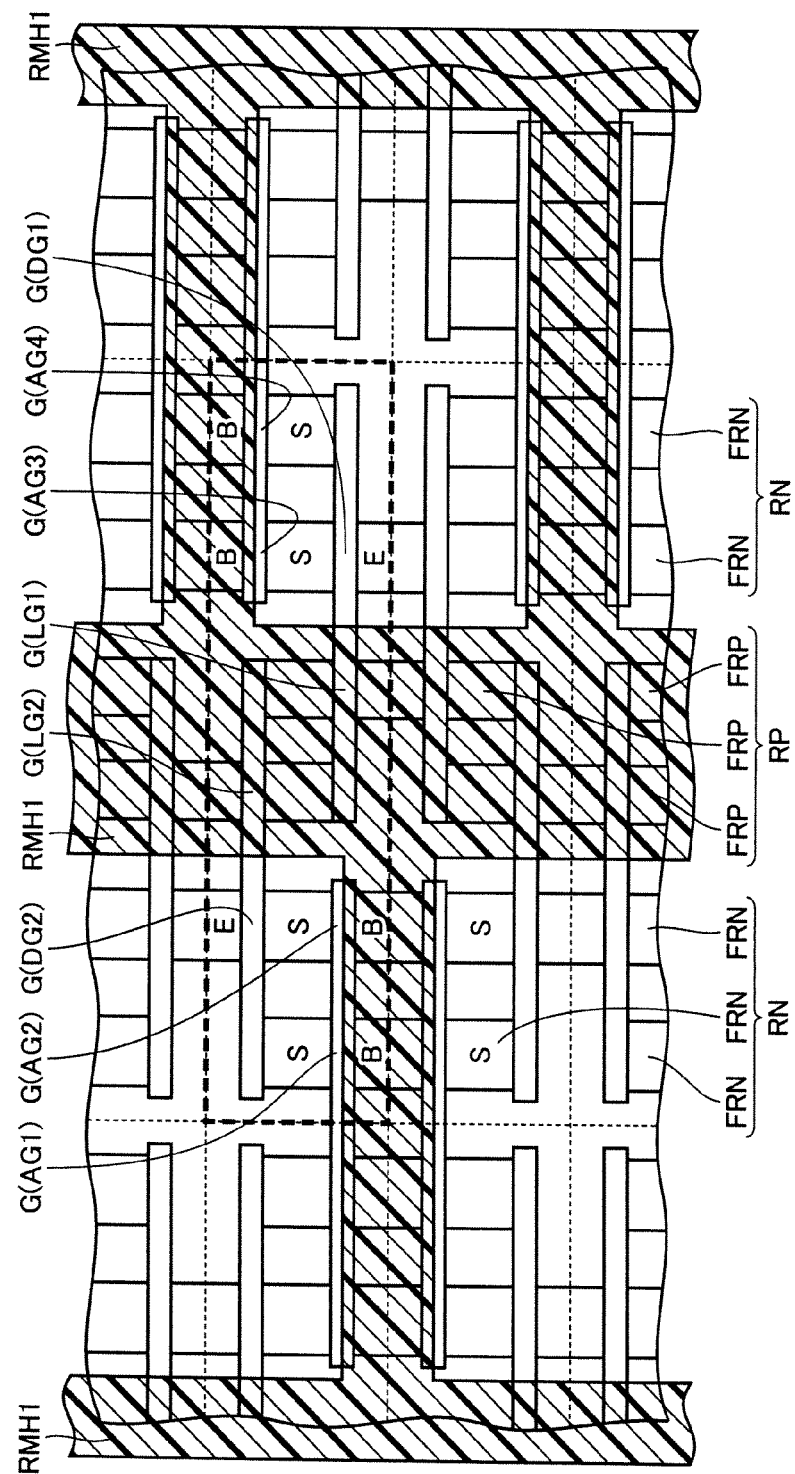
FIG. 73 is a plan view showing one step in a method for manufacturing the semiconductor device in the embodiment.

Next, as shown in FIG. 73, a predetermined photolithography process is performed to form a resist mask RMH1 that is to serve as an implantation mask for forming the halo regions (implantation mask A). Resist mask RMH1 is formed to have an opening pattern exposing: the side surface of gate structure G that is to serve as each of access gate electrodes AG1, AG2 (AG3, AG4), the side surface being positioned at the side of region S in which the source-drain region electrically connected to the storage node is to be formed; region S; gate structure G that is to serve as drive gate electrode DG2 (DG1); and region E in which the source-drain region electrically connected to the ground interconnection is to be formed.

On the other hand, resist mask RMH1 is formed to cover: the side surface of gate structure G that is to serve as each of access gate electrodes AG1, AG2 (AG3, AG4), the side surface being positioned at the side of region B in which the source-drain region electrically connected to the bit line is to be formed; and region B. Also, resist mask RMH1 is formed to cover PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation A). It should be noted that in this halo implantation A, the same amount of boron is implanted with the same implantation energy. Thereafter, resist mask RMH1 is removed.

Figure 74:
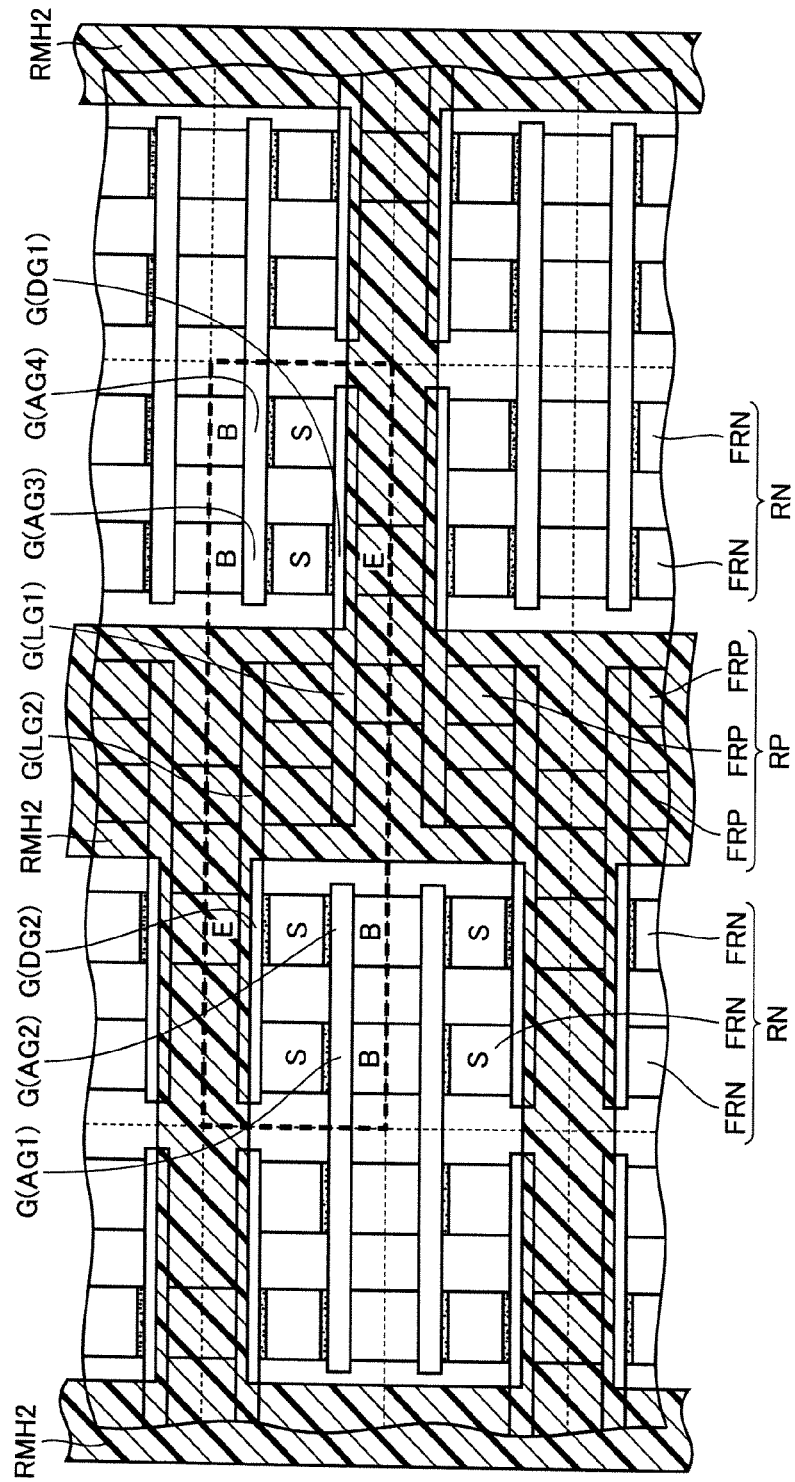
FIG. 74 is a plan view showing a step performed after the step shown in FIG. 73 in the embodiment.

Next, as shown in FIG. 74, a predetermined photolithography process is performed to form a resist mask RMH2 that is to serve as an implantation mask for forming the halo regions (implantation mask B). Resist mask RMH2 is formed to have an opening pattern exposing: the side surface of gate structure G that is to serve as drive gate electrode DG1 (DG2), the side surface being positioned at the side of region S in which the source-drain region electrically connected to the storage node is to be formed; region S; gate structure G that is to serve as each of access gate electrodes AG1, AG2 (AG3, AG4); and region B in which the source-drain region electrically connected to the bit line is to be formed.

On the other hand, resist mask RMH2 is formed to cover: the side surface of gate structure G that is to serve as drive gate electrode DG1 (DG2), the side surface being positioned at the side of region E in which the source-drain region electrically connected to the ground interconnection is to be formed; region E; and element formation region FRP.

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Figure 75:
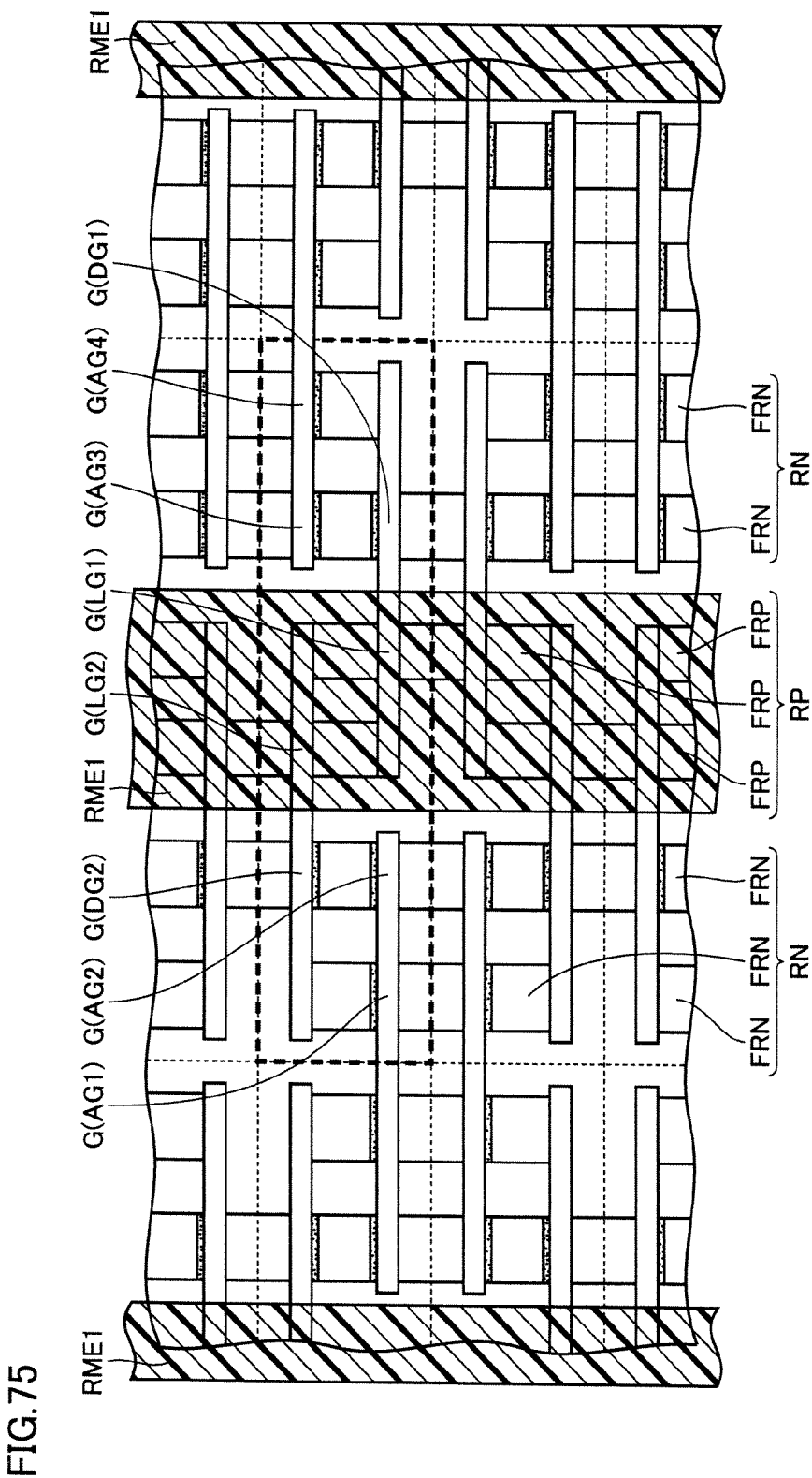
FIG. 75 is a plan view showing a step performed after the step shown in FIG. 74 in the embodiment.

Next, as shown in FIG. 75, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region ER (see FIG. 69) up to a predetermined depth from the surface of the exposed region of p well PW (extension implantation). Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation regions FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection as shown in FIG. 69. Thereafter, the multilayer interconnection structure shown in FIG. 71 and FIG. 72 is formed on copper interconnection CW1, thus forming the main portion of the SRAM memory cell.

In the present semiconductor device including the dual-port SRAM memory cell, halo regions AHS, AHB are formed in each of access transistors AT1, AT2, AT4, AT3. In access transistor AT1 (AT2), halo region AHS having a relatively high impurity concentration is formed at the storage node SN (/SN) side, whereas halo region AHB having a relatively low impurity concentration is formed at the bit line BLA (/BLA) side. In access transistor AT3 (AT4), halo region AHS having a relatively high impurity concentration is formed at the storage node SN (/SN) side, whereas halo region AHB having a relatively low impurity concentration is formed at the bit line BLB (/BLB) side.

Likewise, halo regions DHS, DHB are formed in each of drive transistors DT1, DT2. Halo region DHS having a relatively high impurity concentration is formed at the storage node SN (/SN) side, whereas halo region DHE having a relatively low impurity concentration is formed at the ground interconnection VSS side.

Hence, as described in the first embodiment, in the read operation, current flowing in the access transistor (AT1 (AT2), AT3 (AT4)) from the bit line (BLA (/BLA), BLB (/BLB)) side to the storage node (SN (/SN)) side can be readily suppressed, and current flowing in drive transistor DT1 (DT2) from the storage node (SN (/SN)) side to the ground interconnection (VSS) side can be readily increased. Accordingly, the β ratio can be made high, thereby increasing the read margin.

Further, in the write operation, current (current IFA) flowing in the access transistor (AT1 (AT2), AT3 (AT4)) from the storage node (SN (/SN)) side to the bit line (BLA (/BLA), BLB (/BLB)) side can be readily increased. Accordingly, the γ ratio can be made high, thereby increasing the write margin. In this way, in the present semiconductor device, both the read margin and the write margin can be increased.

Further, as described in the first embodiment, the current flowing in each of drive transistors DT1, DT2 is only the current flowing from the storage node side to the ground interconnection side in the read operation. Thus, halo region DHS having a relatively high impurity concentration is formed at the storage node SN (/SN) side and halo region DHE having a relatively low impurity concentration is formed at the ground interconnection (VSS) side, whereby the threshold voltage of each of drive transistors DT1, DT2 can be made relatively low and high-speed operation can be achieved during reading.

Meanwhile, as described in the first embodiment, in the case where the impurity concentration of halo region DHE in each of drive transistors DT1, DT2 is set to be higher than the impurity concentration of halo region AHB of each of access transistors AT1, AT2, leakage current from each of drive transistors DT1, DT2 can be suppressed during the read operation.

Further, in the above-described semiconductor device, halo regions AHB, AHS of access transistors AT1, AT2, AT3, AT4 and halo regions DHE, DHS of drive transistors DT1, DT2 are formed using resist mask RMH1 (implantation mask A) and resist mask RMH2 (implantation mask B). Further, the halo regions of load transistors LT1, LT2 are formed using the resist mask (implantation mask D). Thus, as compared with the semiconductor device according to the comparative example, the number of photolithography masks for forming halo regions can be reduced by one.

Fourth Embodiment

Here, as a semiconductor device including a dual-port SRAM memory cell, the following describes a semiconductor device including four access transistors, four drive transistors, and two load transistors.

Figure 76:
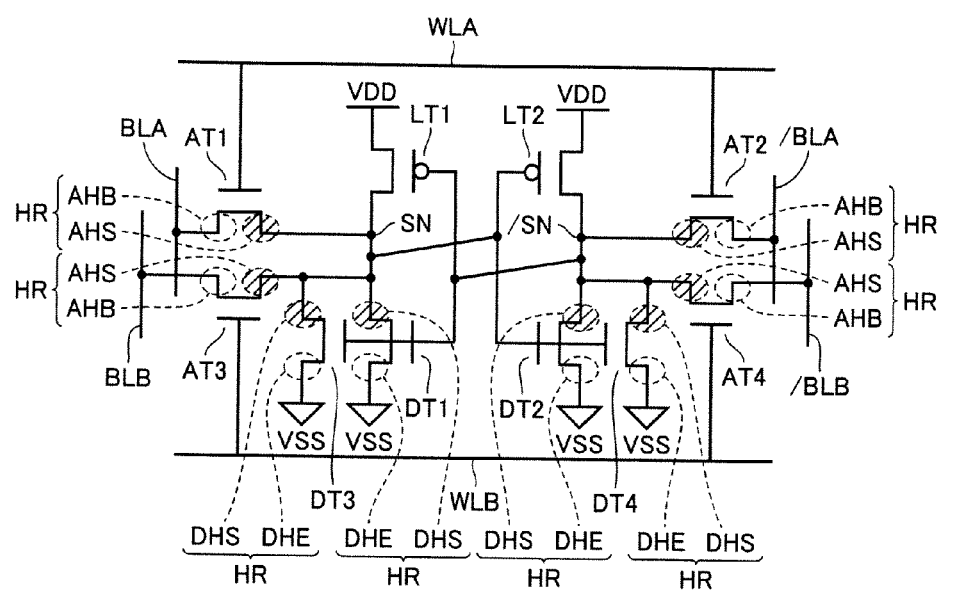
FIG. 76 shows an equivalent circuit of each SRAM memory cell of a semiconductor device in a fourth embodiment of the present invention.

First, an equivalent circuit of the SRAM memory cell is basically the same as the equivalent circuit shown in FIG. 59 (the third example of the second embodiment). As shown in FIG. 76, in the dual-port SRAM memory cell, drive transistor DT1 and drive transistor DT3 are connected between storage node SN and the ground interconnection (VSS) in parallel. Drive transistor DT2 and drive transistor DT4 are connected between storage node /SN and the ground interconnection (VS S) in parallel.

A pair of halo regions HR are formed in each of drive transistors DT1, DT3 (DT2, DT4). Of the pair of halo regions HR, a halo region DHS, which is adjacent to the source-drain region connected to storage node SN (/SN), is set to have an impurity concentration higher than that of a halo region DHE, which is adjacent to the source-drain region connected to the ground interconnection (VSS). It should be noted that configurations apart from this are the same as those of the equivalent circuit of FIG. 59, and therefore the same members are given the same reference characters and are not described repeatedly.

Figure 77:
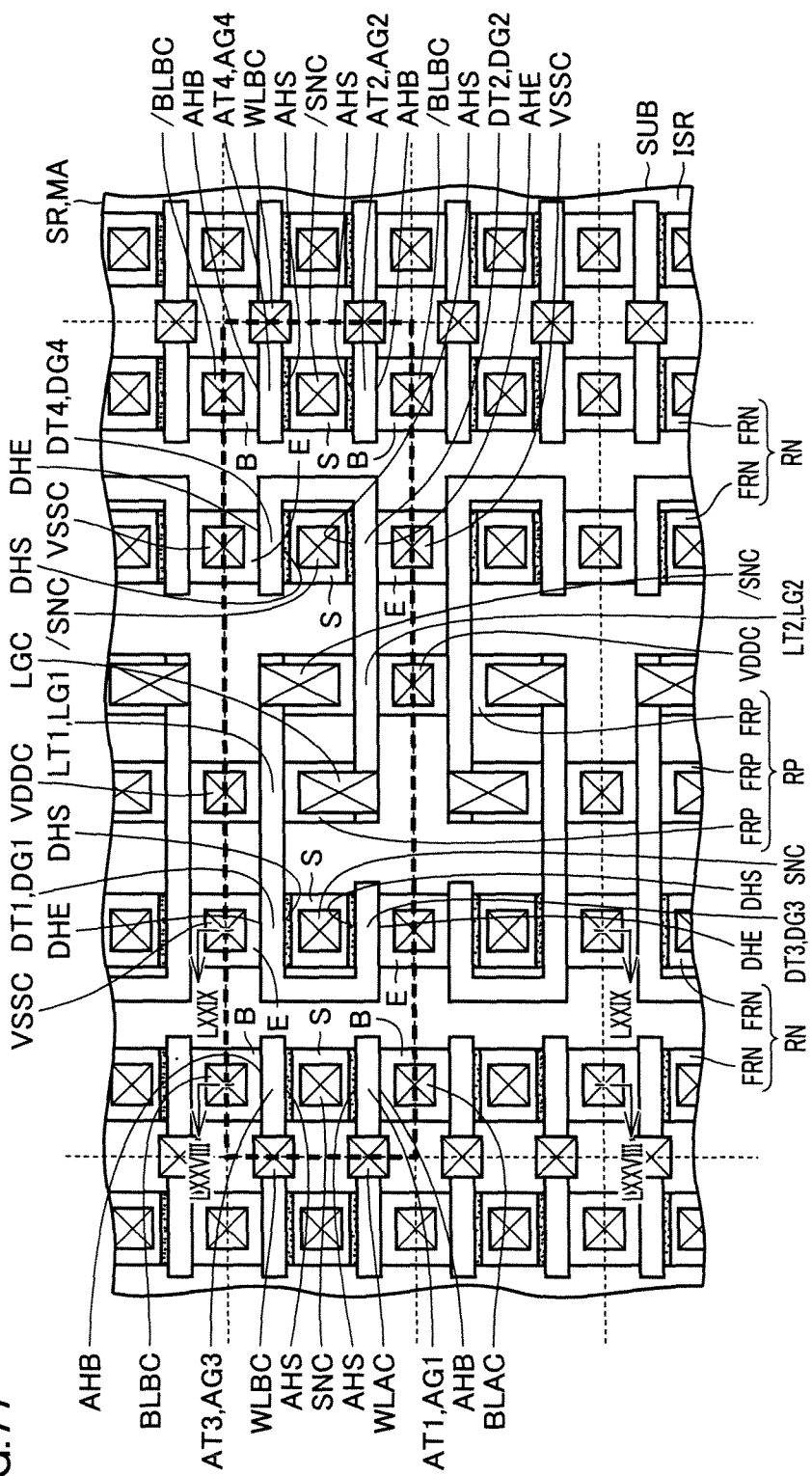
FIG. 77 is a plan view showing an arrangement pattern of the SRAM memory cells in the embodiment.

The following describes a structure of the SRAM memory cell. FIG. 77 is a plan view showing a layout of the transistors of the memory cells of the SRAM cell array, and contacts connected to the transistors. In this plan view, one SRAM memory cell is constituted of a region surrounded by a dotted line.

On a main surface of a semiconductor substrate SUB, an element isolation region ISR is formed using an element isolation insulation film, thereby defining element formation regions FRN, FRP electrically disconnected from each other. Element formation regions FRN are formed in an NMIS region RN. Element formation regions FRP are formed in a PMIS region RP.

In element formation regions FRN, access transistors AT1, AT3, AT2, AT4 and drive transistors DT1, DT2, DT3, DT4 are formed as n channel type MIS transistors. Meanwhile, in element formation regions FRP, load transistors LT1, LT2 are formed as p channel type MIS transistors.

Element formation region FRN having access transistor AT1 formed therein and element formation region FRN having access transistor AT3 formed therein are connected to each other. Element formation region FRN having drive transistor DT1 formed therein and element formation region FRN having drive transistor DT3 formed therein are connected to each other. Element formation regions FRN having access transistors AT1, AT3 formed therein and element formation regions FRN having drive transistors DT1, DT3 formed therein are electrically disconnected from each other by element isolation region ISR.

Element formation region FRN having access transistor AT2 formed therein and element formation region FRN having access transistor AT4 formed therein are connected to each other. Element formation region FRN having drive transistor DT2 formed therein and element formation region FRN having drive transistor DT4 formed therein are connected to each other. Element formation regions FRN having access transistors AT2, AT4 formed therein, and element formation regions FRN having drive transistor DT2, DT4 formed therein are electrically disconnected from each other by element isolation region ISR.

Drive gate electrodes DG1, DG3 of drive transistors DT1, DT3 are formed across element formation regions FRN by bending a common gate electrode (gate structure). Likewise, drive gate electrodes DG2, DG4 of drive transistors DT2, DT4 are formed across element formation regions FRN by bending a common gate electrode (gate structure).

Figure 78:
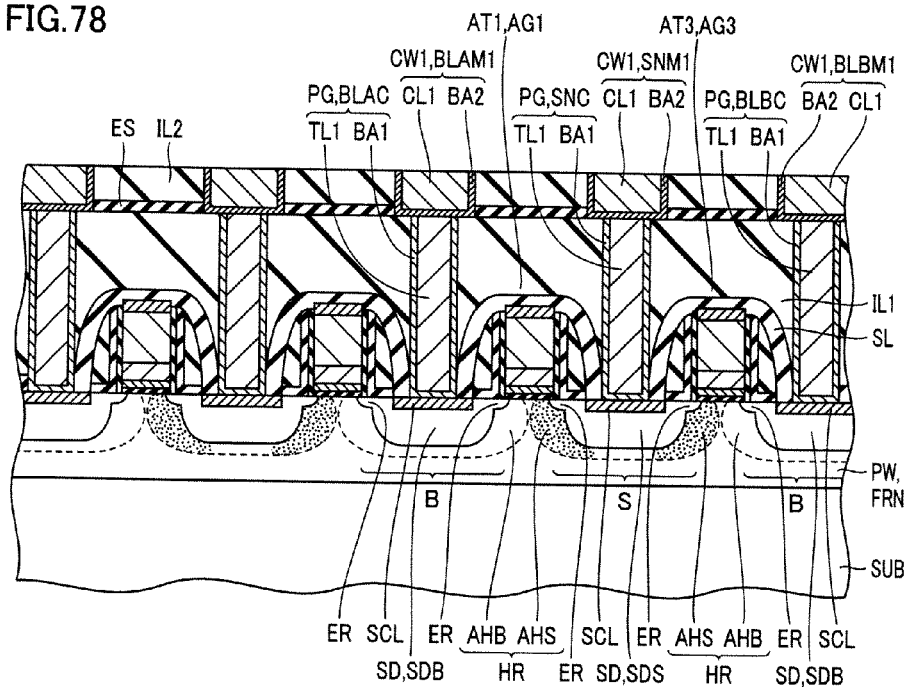
FIG. 78 is a cross sectional view taken along a cross sectional line LXXVIII-LXXVIII of FIG. 77 in the embodiment.
Figure 79:
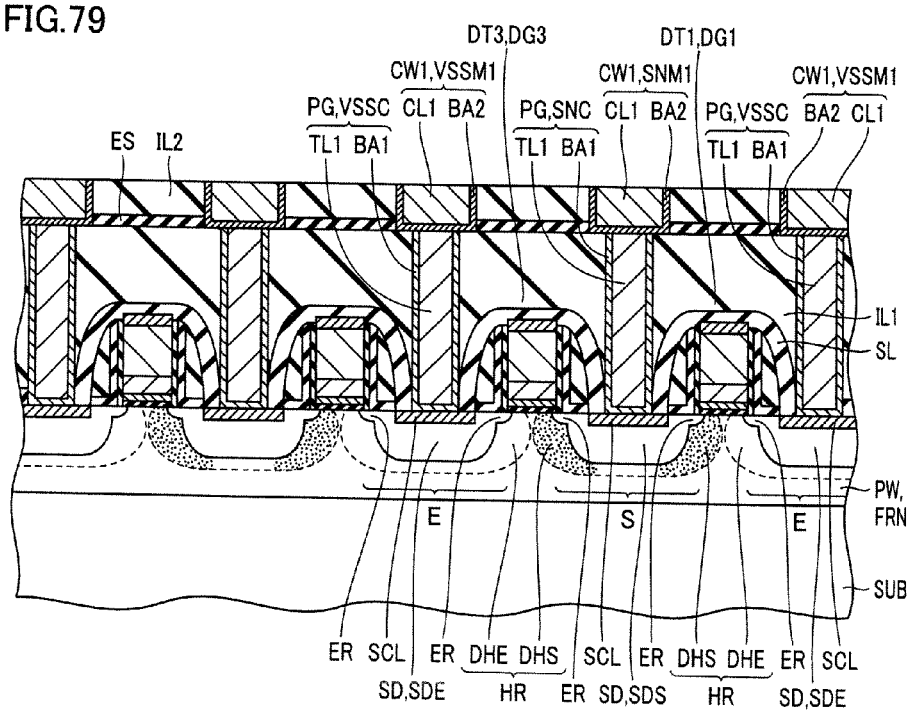
FIG. 79 is a cross sectional view taken along a cross sectional line LXXIX-LXXIX of FIG. 77 in the embodiment.

FIG. 78 is a cross sectional view taken along a cross sectional line LXXVIII-LXXVIII extending through access transistor AT1 and access transistor AT3 of the SRAM memory cell in FIG. 77. FIG. 79 is a cross sectional view taken along a cross sectional line LXXIX-LXXIX extending through drive transistor DT1 and drive transistor DT3 in FIG. 77.

As shown in FIG. 78, access gate electrode AG1 of access transistor AT1 is formed above a region interposed between a region S and a region B. In region S, n type source-drain region SDS, which is electrically connected to the storage node (contact SNC), is formed. In region B, n type source-drain region SDB, which is electrically connected to the bit line (contact BLAC), is formed. In a region just below access gate electrode AG1, as p type halo regions HR, halo region AHS is formed adjacent to source-drain region SDS and halo region AHB is formed adjacent to source-drain region SDB.

Access gate electrode AG3 of access transistor AT3 is formed above a region interposed between region S and a region B. In region S, n type source-drain region SDS, which is electrically connected to the storage node (contact SNC), is formed. In region B, n type source-drain region SDB, which is electrically connected to the bit line (contact BLBC), is formed. In a region just below access gate electrode AG3, as p type halo regions HR, halo region AHS is formed adjacent to source-drain region SDS and halo region AHB is formed adjacent to source-drain region SDB.

As shown in FIG. 79, drive gate electrode DG1 of drive transistor DT1 is formed above a region interposed between a region S and a region E. In region S, n type source-drain region SDS, which is electrically connected to the storage node (contact SNC), is formed. In region E, n type source-drain region SDE, which is electrically connected to the ground interconnection (contact VSSC), is formed. In a region just below drive gate electrode DG1, as p type halo regions HR, halo region DHS is formed adjacent to source-drain region SDS and halo region DHE is formed adjacent to source-drain region SDE.

On the other hand, drive gate electrode DG3 of drive transistor DT3 is formed above a region interposed between region S and a region E. In region S, n type source-drain region SDS, which is electrically connected to the storage node (contact SNC), is formed. In region E, n type source-drain region SDE, which is electrically connected to the ground interconnection (contact VSSC), is formed. In a region just below drive gate electrode DG3, as p type halo regions HR, halo region DHS is formed adjacent to source-drain region SDS and halo region DHE is formed adjacent to source-drain region SDE.

It should be noted that configurations apart from this are the same as those of the structure shown in FIG. 61 and the like, and therefore the same members are given the same reference characters and are not described repeatedly. Above the first metal interconnection shown in FIG. 78 and FIG. 79, a multilayer interconnection structure (not shown) corresponding to the equivalent circuit of the SRAM memory cell shown in FIG. 76 is formed by a multilayer metal interconnection and the like.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from each other (see FIG. 77).

Figure 80:
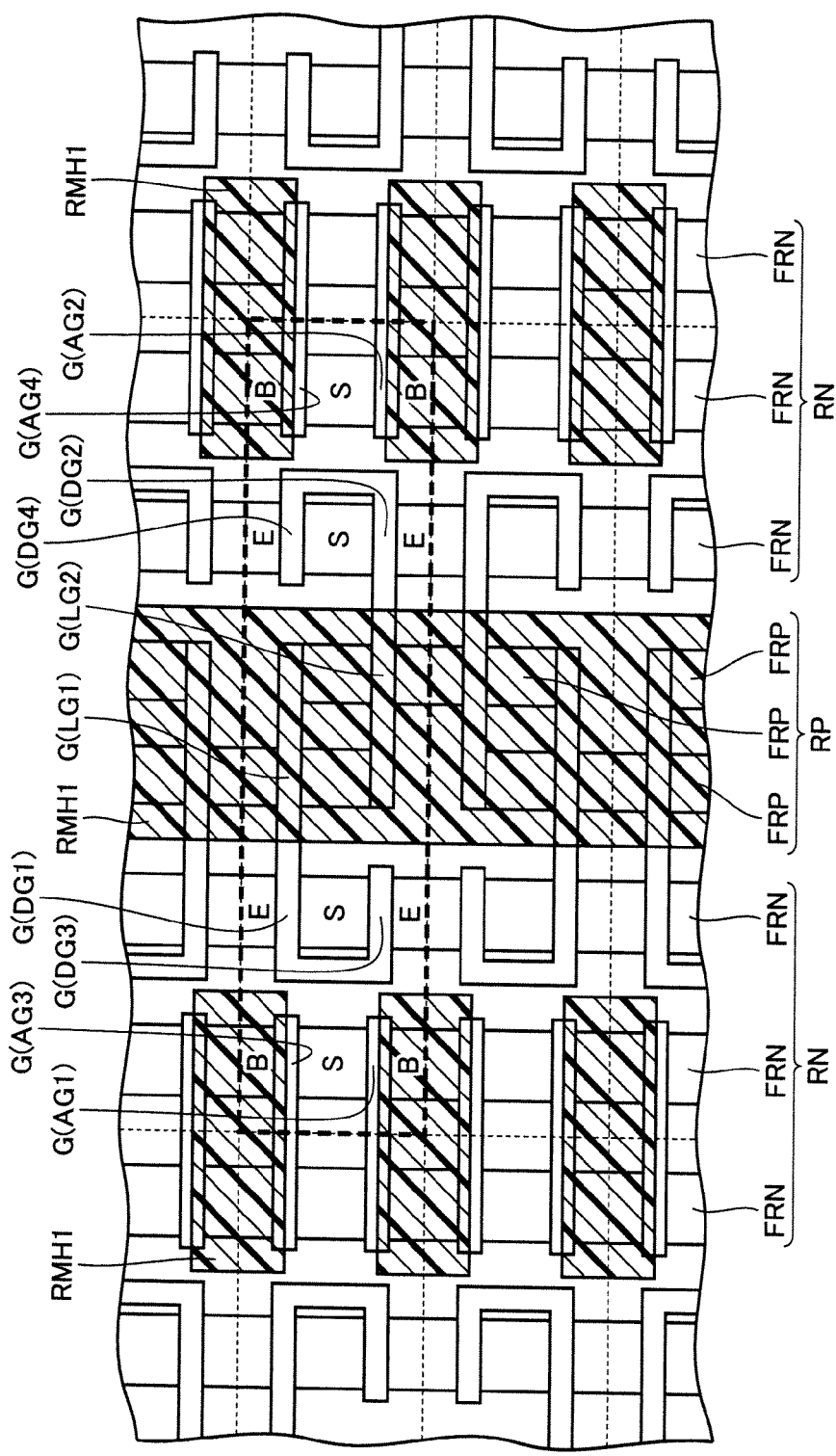
FIG. 80 is a plan view showing one step in a method for manufacturing the semiconductor device in the embodiment.

Next, a step similar to the step shown in FIG. 11 is performed, thereby forming gate structures G to serve as access gate electrodes AG1, AG2, AG3, AG4, drive gate electrodes DG1, DG2, DG3, DG4 and load gate electrodes LG1, LG2, respectively (see FIG. 80). Next, offset spacers are formed on both side surfaces of each gate structure G.

Next, as shown in FIG. 80, a predetermined photolithography process is performed to form a resist mask RMH1 that is to serve as an implantation mask for forming the halo regions (implantation mask A). Resist mask RMH1 is formed to expose: the side surface of gate structure G that is to serve as each of access gate electrodes AG1, AG3 (AG2, AG4), the side surface being positioned at the side of region S in which the source-drain region electrically connected to the storage node is to be formed; region S; gate structure G that is to serve as each of drive gate electrodes DG1, DG3 (DG2, DG4); region E in which the source-drain region electrically connected to the ground interconnection is to be formed; and region S in which the source-drain region electrically connected to the storage node is to be formed.

On the other hand, resist mask RMH1 is formed to cover: the side surface of gate structure G that is to serve as each of access gate electrodes AG1, AG3 (AG2, AG4), the side surface being positioned at the side of region B in which the source-drain region electrically connected to the bit line is to be formed; and region B. Also, resist mask RMH1 is formed to cover PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation A). It should be noted that in this halo implantation A, the same amount of boron is implanted with the same implantation energy. Thereafter, resist mask RMH1 is removed.

Figure 81:
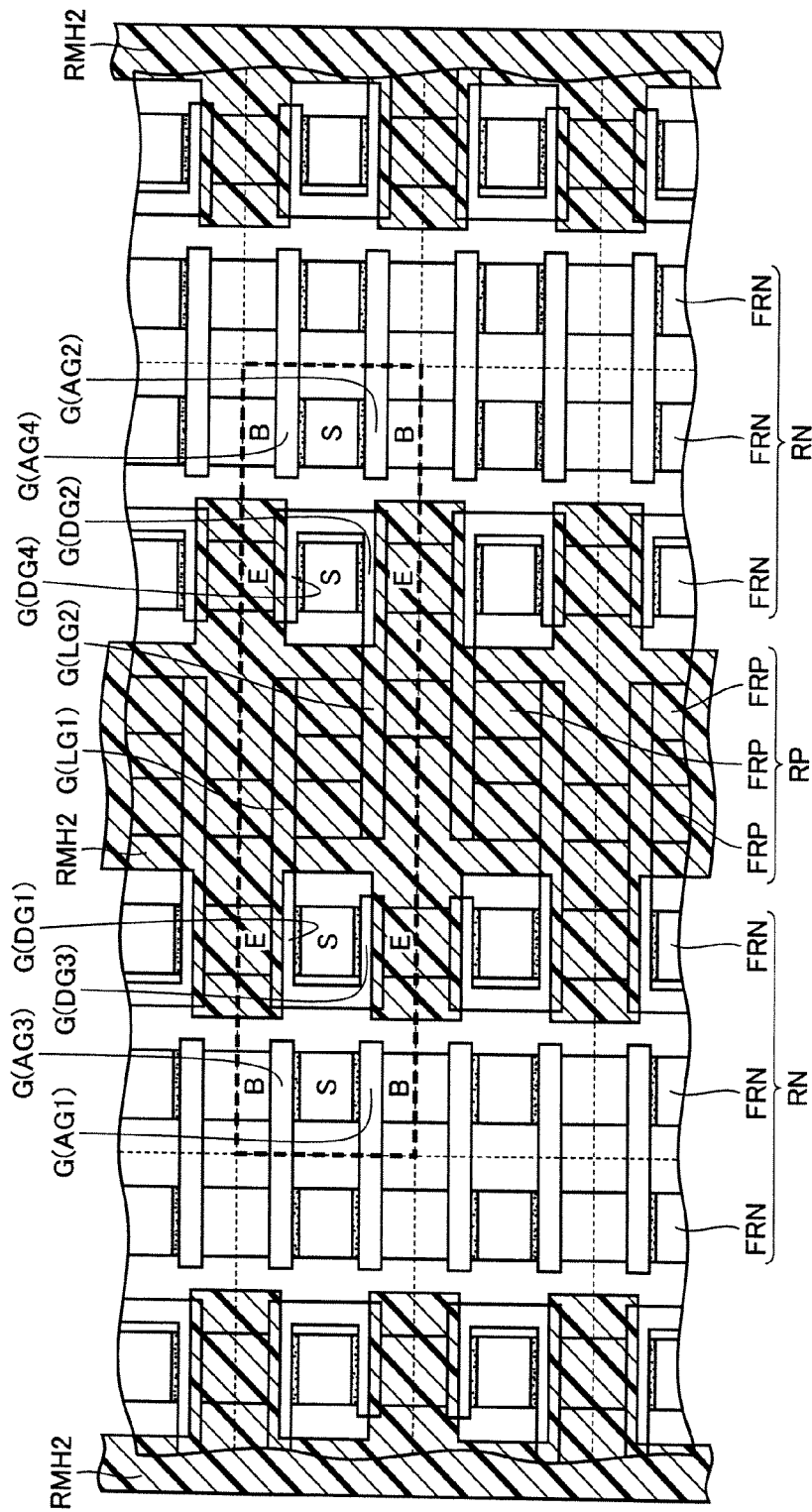
FIG. 81 is a plan view showing a step performed after the step shown in FIG. 80 in the embodiment.

Next, as shown in FIG. 81, a predetermined photolithography process is performed to form a resist mask RMH2 that is to serve as an implantation mask for forming the halo regions (implantation mask B). Resist mask RMH2 is formed to expose: gate structure G that is to serve as each of access gate electrodes AG1, AG3 (AG2, AG4); region S in which the source-drain region electrically connected to the storage node is to be formed; region B in which the source-drain region electrically connected to the bit line is to be formed; the side surface of gate structure G that is to serve as each of drive gate electrodes DG1, DG3 (DG2, DG4), the side surface being positioned at the side of region S in which the source-drain region electrically connected to the storage node is to be formed; and region S.

On the other hand, resist mask RMH2 is formed to cover: the side surface of gate structure G that is to serve as each of drive gate electrodes DG1, DG3 (DG2, DG4), the side surface being positioned at the side of region E in which the source-drain region electrically connected to the ground interconnection is to be formed; region E; and element formation region FRP.

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Figure 82:
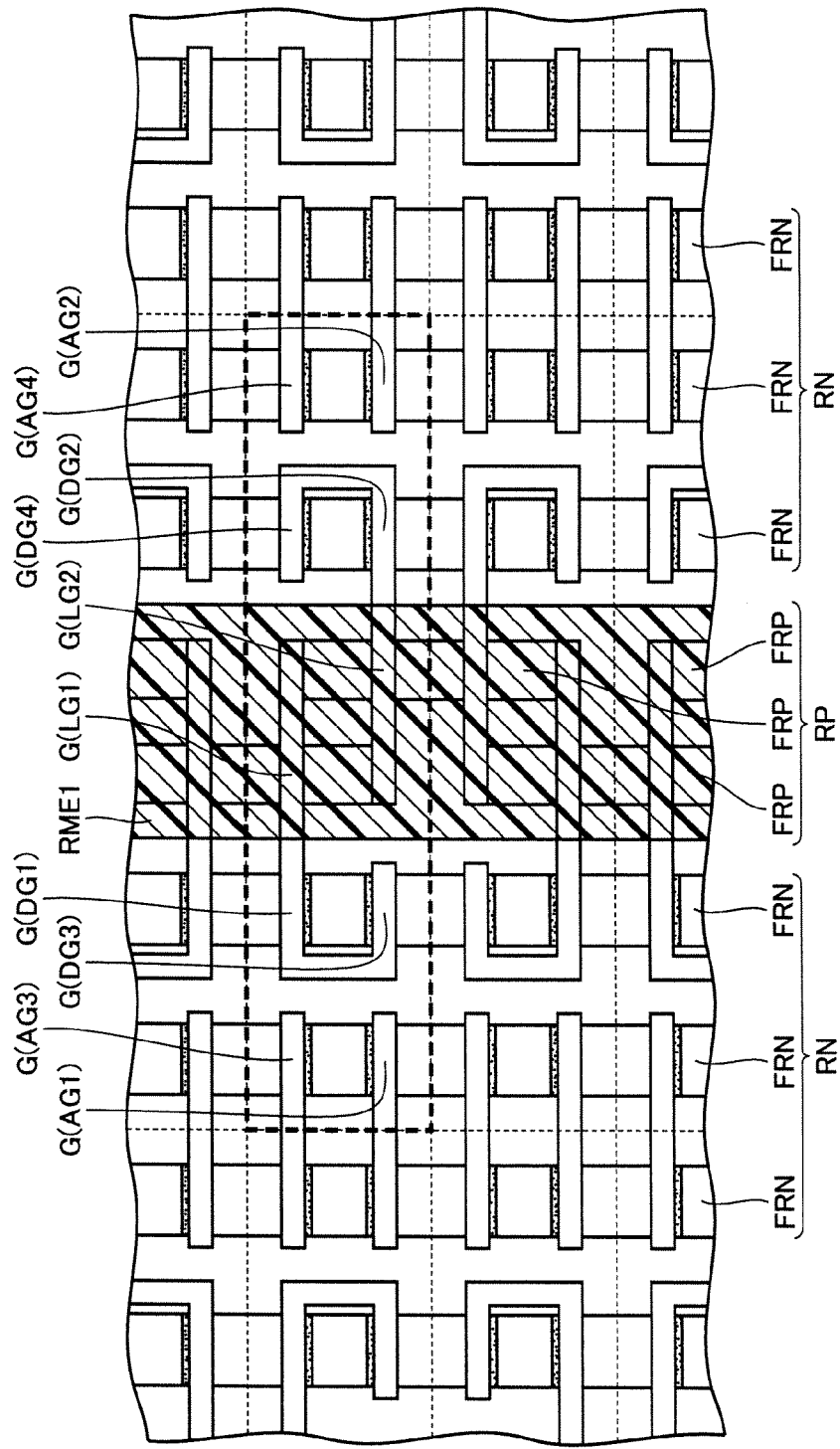
FIG. 82 is a plan view showing a step performed after the step shown in FIG. 81 in the embodiment.

Next, as shown in FIG. 82, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region ER (see FIG. 78 and FIG. 79) up to a predetermined depth from the surface of the exposed region of p well PW (extension implantation). Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation region FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection as shown in FIG. 78 or FIG. 79. Thereafter, the multilayer interconnection structure is formed on copper interconnection CW1, thus forming the main portion of the SRAM memory cell.

In access transistor AT1 (AT2) of the present semiconductor device including the dual-port SRAM memory cell, halo region AHS having a relatively high impurity concentration is formed at the storage node SN (/SN) side, whereas halo region AHB having a relatively low impurity concentration is formed at the bit line BLA (/BLA) side. In access transistor AT3 (AT4), halo region AHS having a relatively high impurity concentration is formed at the storage node SN (/SN) side, whereas halo region AHB having a relatively low impurity concentration is formed at the bit line BLB (/BLB) side.

Further, in each of drive transistors DT1, DT3 (DT2, DT4), halo region DHS having a relatively high impurity concentration is formed at the storage node SN (/SN) side, whereas halo region DHE having a relatively low impurity concentration is formed at the ground interconnection VSS side. Moreover, drive transistor DT1 and drive transistor DT3 are connected in parallel, and drive transistor DT2 and drive transistor DT4 are connected in parallel.

Hence, as described in the first embodiment, in the read operation, current flowing in the access transistor (AT1 (AT2), AT3 (AT4)) from the bit line (BLA (/BLA), BLB (/BLB)) side to the storage node (SN (/SN)) side can be readily suppressed, and current flowing in each of drive transistors DT1, DT3 (DT2, DT4) from the storage node (SN (/SN)) side to the ground interconnection (VSS) side can be readily further increased. Accordingly, the β ratio can be made high, thereby further increasing the read margin.

Further, in the write operation, current (current IFA) flowing in the access transistor (AT1 (AT2), AT3 (AT4)) from the storage node (SN (/SN)) side to the bit line (BLA (/BLA), BLB (/BLB)) side can be readily increased. Accordingly, the γ ratio can be made high, thereby increasing the write margin. In this way, in the semiconductor device according to the fourth embodiment, both the read margin and the write margin can be increased.

Further, as described in the first embodiment, the current flowing in each of drive transistors DT1, DT3 (DT2, DT4) is only the current flowing from the storage node side to the ground interconnection side in the read operation. Thus, halo region DHS having a relatively high impurity concentration is formed at the storage node SN (/SN) side and halo region DHE having a relatively low impurity concentration is formed at the ground interconnection (VSS) side, whereby the threshold voltage of each of drive transistors DT1, DT3 (DT2, DT4) can be made relatively low and high-speed operation can be achieved during reading.

Meanwhile, as described in the first embodiment, in the case where the impurity concentration of halo region DHE in each of drive transistors DT1, DT3, DT2, DT4 is set to be higher than the impurity concentration of halo region AHB of each of access transistors AT1 (AT3), AT2 (AT4), leakage current from each of drive transistors DT1, DT3, DT2, DT4 can be suppressed during the read operation.

Further, in the above-described semiconductor device, halo regions AHB, AHS of access transistors AT1, AT2, AT3, AT4 and halo regions DHE, DHS of drive transistors DT1, DT3, DT2, DT4 are formed using resist mask RMH1 (implantation mask A) and resist mask RMH2 (implantation mask B). Further, the halo regions of load transistors LT1, LT2 are formed using the resist mask (implantation mask D). Thus, as compared with the semiconductor device according to the comparative example, the number of photolithography masks for forming halo regions can be reduced by one.

Fifth Embodiment

Here, as a semiconductor device including a dual-port SRAM memory cell, the following describes another exemplary semiconductor device including four access transistors, four drive transistors, and two load transistors.

First, an equivalent circuit of the SRAM memory cell is the same as that of the equivalent circuit shown in FIG. 76 (fourth embodiment). Hence, description thereof is not repeated.

Figure 83:
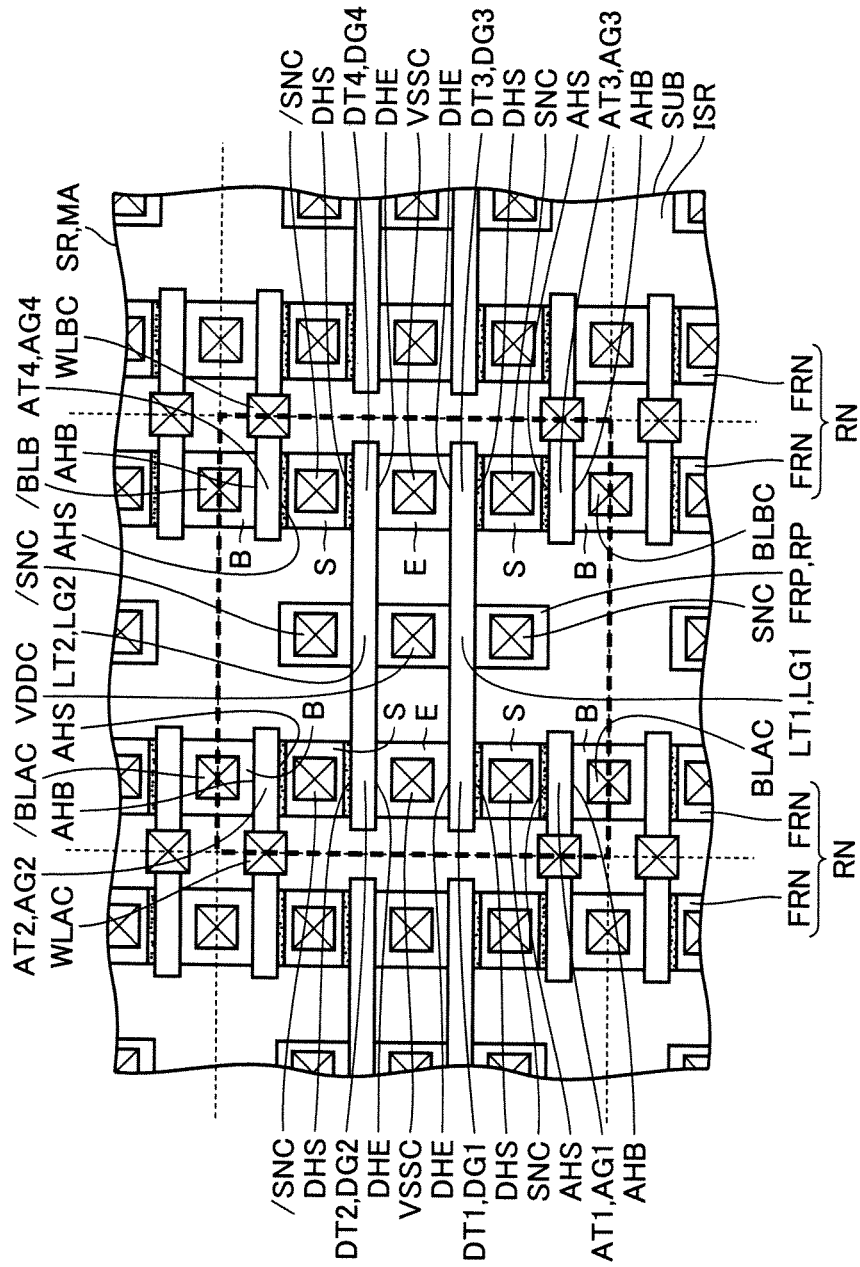
FIG. 83 is a plan view showing an arrangement pattern of SRAM memory cells in a semiconductor device according to a fifth embodiment of the present invention.

The following describes a structure of the SRAM memory cell. FIG. 83 is a plan view showing a layout of the transistors of the memory cells of the SRAM cell array, and contacts connected to the transistors. In this plan view, one SRAM memory cell is constituted of a region surrounded by a dotted line.

On a main surface of a semiconductor substrate SUB, an element isolation region ISR is formed using an element isolation insulation film, thereby defining element formation regions FRN, FRP electrically disconnected from each other. Element formation regions FRN are formed in an NMIS region RN. Element formation regions FRP are formed in a PMIS region RP.

In element formation regions FRN, access transistors AT1, AT2, AT3, AT4 and drive transistors DT1, DT2, DT3, DT4 are formed as n channel type MIS transistors. Meanwhile, in element formation regions FRP, load transistors LT1, LT2 are formed as p channel type MIS transistors.

Element formation region FRN having access transistor AT1 formed therein, element formation region FRN having drive transistor DT1 formed therein, element formation region FRN having drive transistor DT2 formed therein, element formation region FRN having access transistor AT2 formed therein are connected to one another. Element formation region FRN having access transistor AT3 formed therein, element formation region FRN having drive transistor DT3 formed therein, element formation region FRN having drive transistor DT4 formed therein, element formation region FRN having access transistor AT4 formed therein are connected to one another.

Element formation regions FRN having access transistors AT1, AT2 and drive transistors DT1, DT2 formed therein, and element formation regions FRN having access transistors AT3, AT4 and drive transistors DT3, DT4 formed therein are electrically disconnected from each other by element isolation region ISR.

Drive gate electrodes DG1, DG3 of drive transistors DT1, DT3 and load gate electrode LG1 of load transistor LT1 are formed by a common gate electrode (gate structure). Drive transistor DT1 and drive transistor DT3 are connected in parallel. Load gate electrode LG1 is disposed between drive gate electrode DG1 and drive gate electrode DG3.

Drive gate electrodes DG2, DG4 of drive transistor DT2, DT4 and load gate electrode LG2 of load transistor LT2 are formed by a common gate electrode (gate structure). Drive transistor DT2 and drive transistor DT4 are connected in parallel. Load gate electrode LG2 is disposed between drive gate electrode DG2 and drive gate electrode DG4.

Further, on the surface of the semiconductor substrate, there is formed a multilayer interconnection structure (not shown) that connects access transistors AT1 to AT4, drive transistors DT1 to DT3, and load transistors LT1, LT2 so as to correspond to the equivalent circuit.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from each other (see FIG. 83). Next, a step similar to the step shown in FIG. 11 is performed, thereby forming gate structures G to serve as access gate electrodes AG1, AG2, AG3, AG4, drive gate electrodes DG1, DG2, DG3, DG4 and load gate electrodes LG1, LG2, respectively (see FIG. 84). Next, offset spacers are formed on both side surfaces of each gate structure G.

Figure 84:
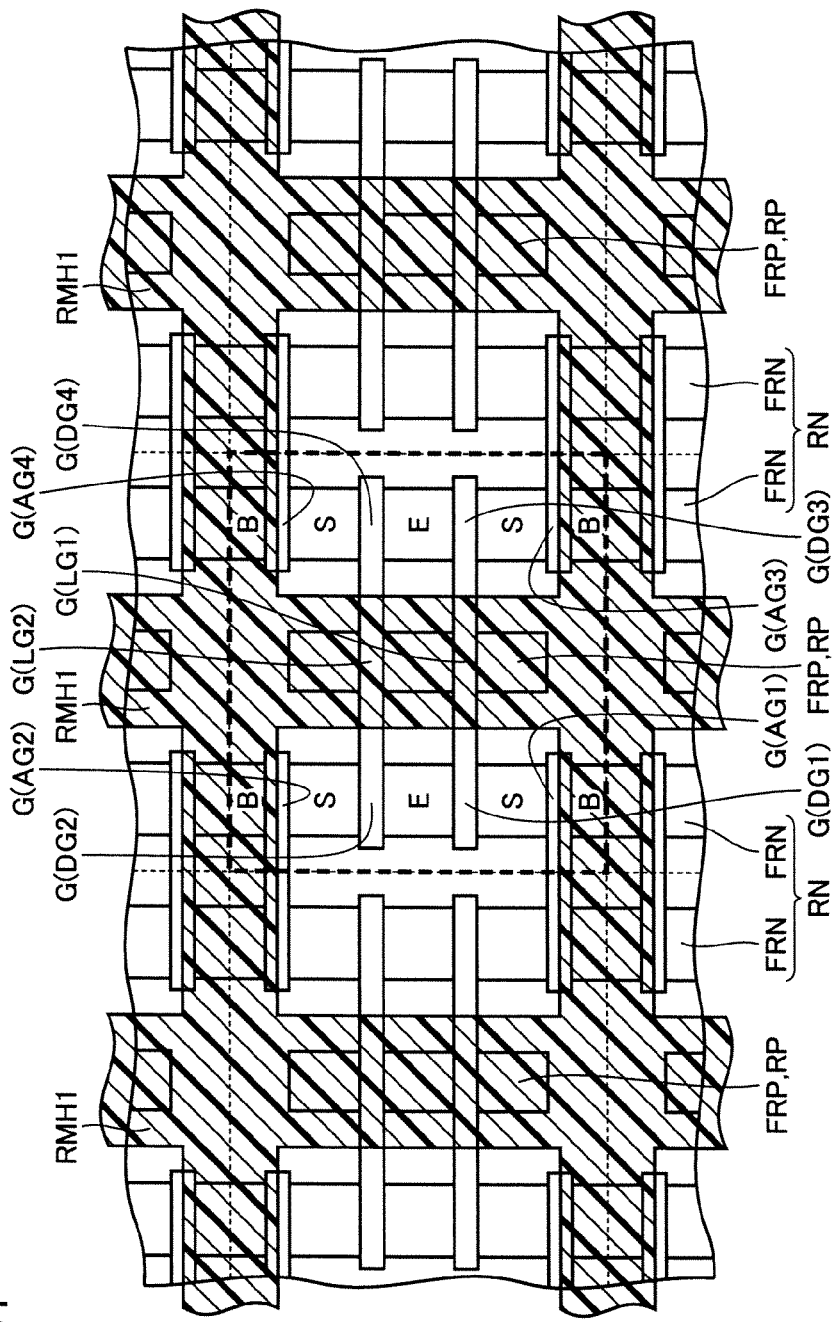
FIG. 84 is a plan view showing one step in a method for manufacturing the semiconductor device in the embodiment.

Next, as shown in FIG. 84, a predetermined photolithography process is performed to form a resist mask RMH1 that is to serve as an implantation mask for forming the halo regions (implantation mask A). Resist mask RMH1 is formed to have an opening pattern exposing: the side surface of gate structure G that is to serve as each of access gate electrodes AG1, AG2 (AG3, AG4), the side surface being positioned at the side of region S in which the source-drain region electrically connected to the storage node is to be formed; region S; gate structure G that is to serve as each of drive gate electrodes DG1, DG2 (DG3, DG4); and region E in which the source-drain region electrically connected to the ground interconnection is to be formed.

On the other hand, resist mask RMH1 is formed to cover: the side surface of gate structure G that is to serve as each of access gate electrodes AG1, AG2 (AG3, AG4), the side surface being positioned at the side of region B in which the source-drain region electrically connected to the bit line is to be formed; and region B. Also, resist mask RMH1 is formed to cover PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation A). It should be noted that in this halo implantation A, the same amount of boron is implanted with the same implantation energy. Thereafter, resist mask RMH1 is removed.

Figure 85:
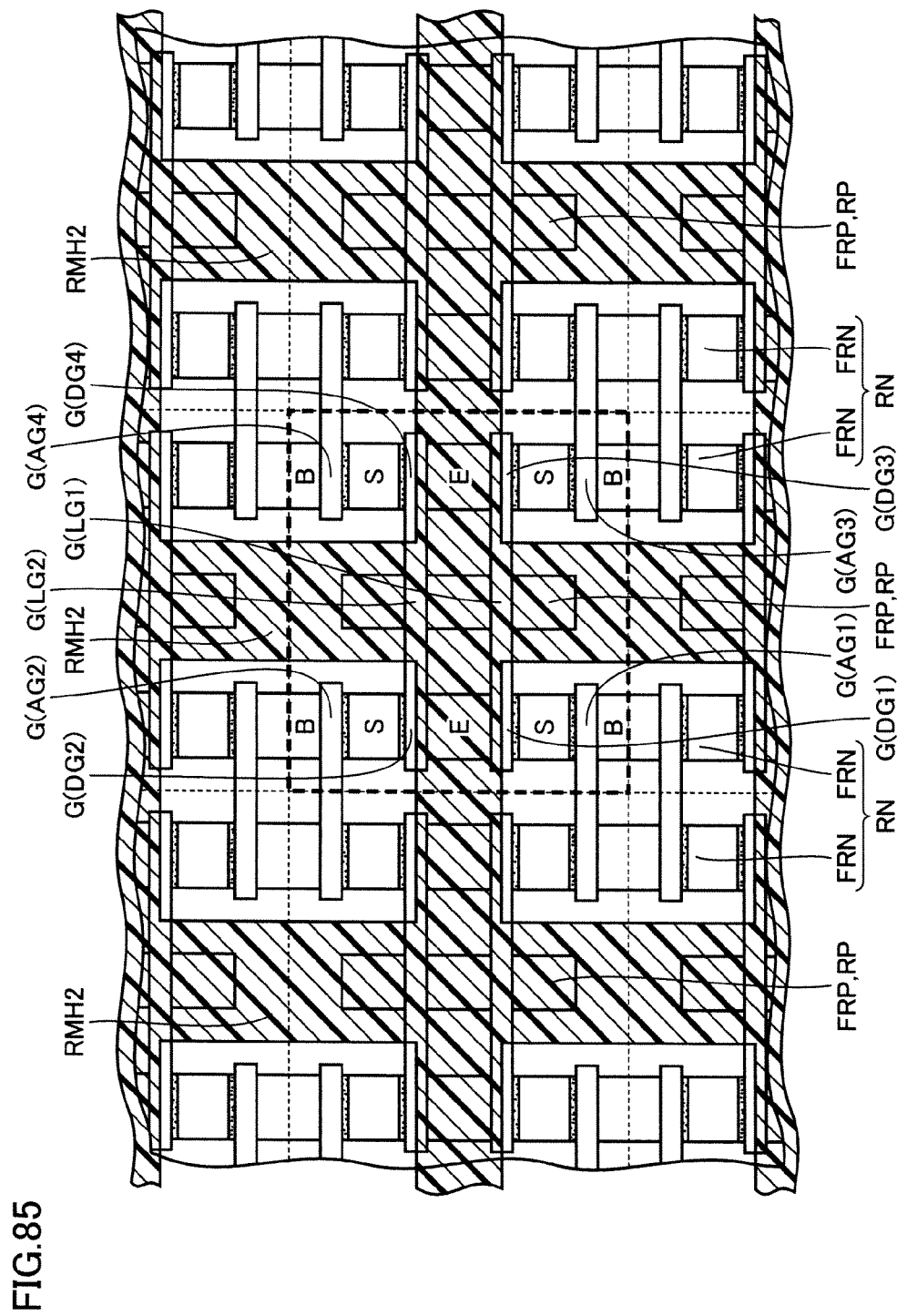
FIG. 85 is a plan view showing a step performed after the step shown in FIG. 84 in the embodiment.

Next, as shown in FIG. 85, a predetermined photolithography process is performed to form a resist mask RMH2 that is to serve as an implantation mask for forming the halo regions (implantation mask B). Resist mask RMH2 is formed to have an opening pattern exposing: gate structure G that is to serve as each of access gate electrodes AG1, AG2 (AG3, AG4); region S in which the source-drain region electrically connected to the storage node is to be formed; region B in which the source-drain region electrically connected to the bit line is to be formed; and the side surface of gate structure G that is to serve as each of drive gate electrodes DG1, DG2 (DG3, DG4), the side surface being positioned at the side of region S in which the source-drain region electrically connected to the storage node is to be formed.

On the other hand, resist mask RMH2 is formed to cover: the side surface of gate structure G that is to serve as each of drive gate electrodes DG1, DG2 (DG3, DG4), the side surface being positioned at the side of region E in which the source-drain region electrically connected to the ground interconnection is to be formed; region E; and element formation region FRP.

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Figure 86:
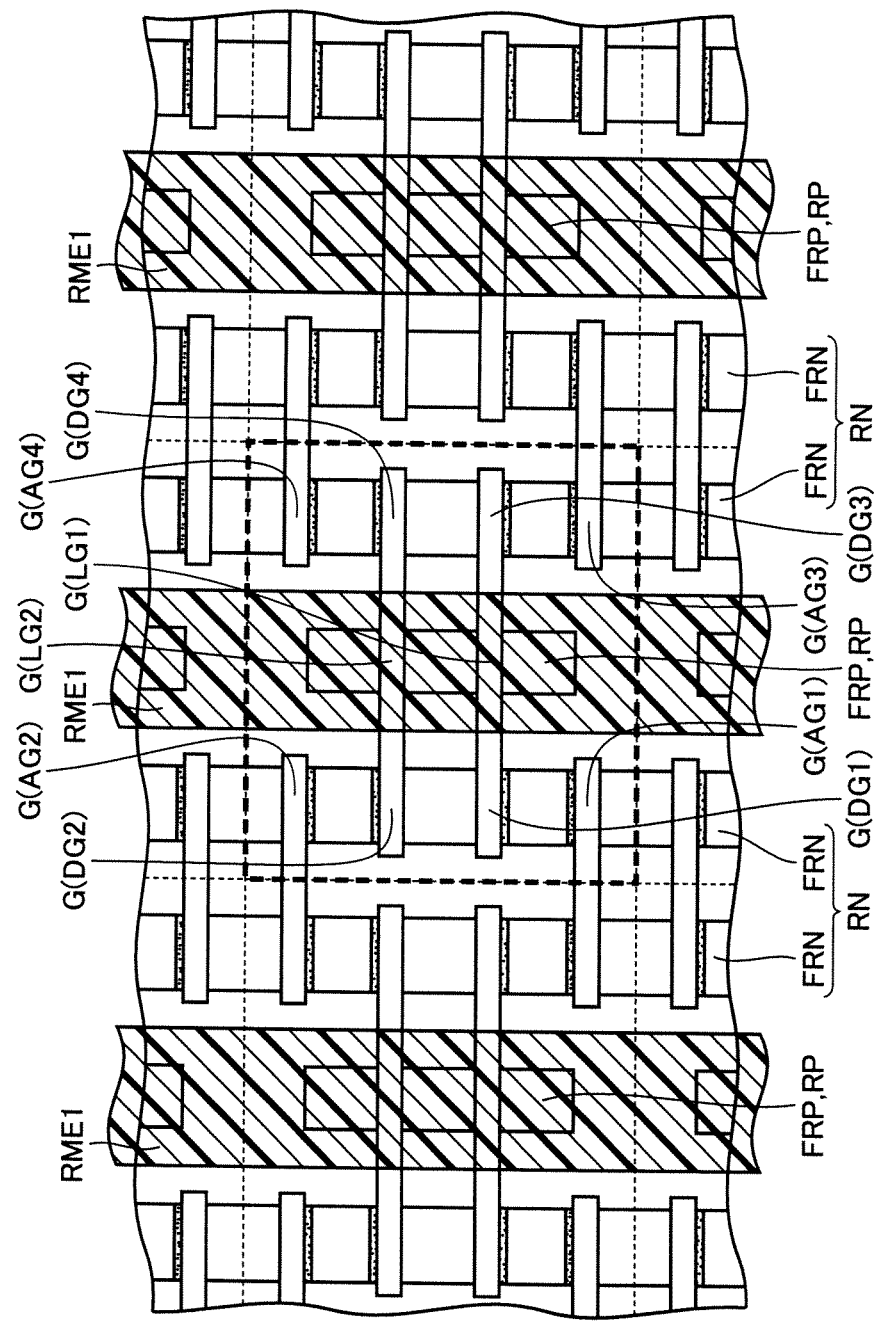
FIG. 86 is a plan view showing a step performed after the step shown in FIG. 85 in the embodiment.

Next, as shown in FIG. 86, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region (not shown) up to a predetermined depth from the surface of the exposed region of p well PW (extension implantation). Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation region FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the steps (first embodiment) shown in FIG. 28 to FIG. 31 are performed to form a first metal interconnection (not shown). Thereafter, the multilayer interconnection structure is formed on the first metal interconnection, thus forming the main portion of the SRAM memory cell.

In access transistor AT1 (AT2) of the present semiconductor device including the dual-port SRAM memory cell, halo region AHS having a relatively high impurity concentration is formed at the storage node SN (/SN) side, whereas halo region AHB having a relatively low impurity concentration is formed at the bit line BLA (/BLA) side. In access transistor AT3 (AT4), halo region AHS having a relatively high impurity concentration is formed at the storage node SN (/SN) side, whereas halo region AHB having a relatively low impurity concentration is formed at the bit line BLB (/BLB) side.

Further, in each of drive transistors DT1, DT3 (DT2, DT4), halo region DHS having a relatively high impurity concentration is formed at the storage node SN (/SN) side, whereas halo region DHE having a relatively low impurity concentration is formed at the ground interconnection VSS side. Moreover, drive transistor DT1 and drive transistor DT3 are connected in parallel, and drive transistor DT2 and drive transistor DT4 are connected in parallel.

In this way, as with the SRAM memory cell of the semiconductor device described in the fourth embodiment, both the read margin and the write margin can be increased. Further, high-speed operation can be attained during reading. Further, as compared with the semiconductor device according to the comparative example, the number of photolithography masks for forming halo regions can be reduced by one.

Sixth Embodiment

Here, the following describes a semiconductor device having a 3-port SRAM memory cell including a read only port.

Figure 87:
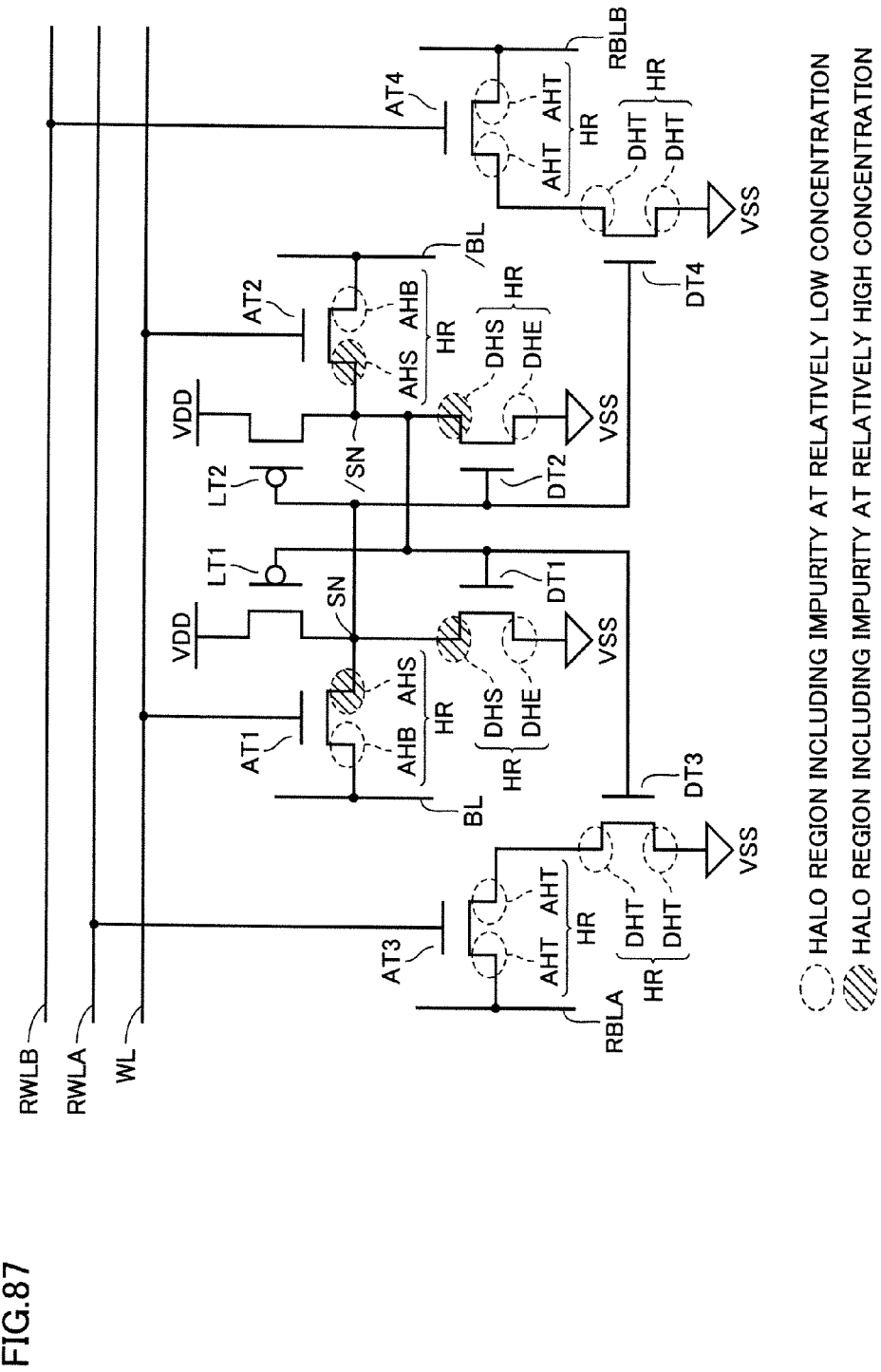
FIG. 87 shows an equivalent circuit of each SRAM memory cell of a semiconductor device in a sixth embodiment of the present invention.

Described first is an equivalent circuit of the SRAM memory cell. As shown in FIG. 87, the 3-port SRAM memory cell is provided with a bit line RBLA and a bit line RBLB as read bit lines. As read word lines, a read word line RWLA and a read word line RWLB are provided.

Access transistor AT3 has a gate connected to read word line RWLA. One of a pair of source-drain regions of access transistor AT3 is connected to bit line RBLA. Access transistor AT4 has a gate connected to read word line RWLB. One of a pair of source-drain regions of access transistor AT4 is connected to bit line RBLB.

Drive transistor DT3 has a gate connected to the gate of drive transistor DT1 and the gate of load transistor LT1. One of a pair of source-drain regions of drive transistor DT3 is connected to the other of the pair of source-drain regions of access transistor AT3. The other of the pair of source-drain regions of drive transistor DT3 is connected to the ground interconnection (VSS).

Drive transistor DT4 has a gate connected to the gate of drive transistor DT2 and the gate of load transistor LT2. One of a pair of source-drain regions of drive transistor DT4 is connected to the other of the pair of source-drain regions of access transistor AT4. The other of the pair of source-drain regions of drive transistor DT4 is connected to the ground interconnection (VSS).

A pair of halo regions AHT, AHT of each of access transistors AT3, AT4 and a pair of halo regions DHT, DHT of each of drive transistors DT3, DT4 are formed to have the same impurity concentration as the impurity concentration of halo regions DHE of the pair of halo regions HR (halo regions DHS, DHE) of each of drive transistors DT1, DT2. It should be noted that configurations apart from this are the same as those of the equivalent circuit of FIG. 3, and therefore the same members are given the same reference characters and are not described repeatedly.

In the read only port, data is read by detecting a change in potential of each of read bit lines RBLA, RBLB when access transistors AT3, AT4 are turned on.

First, in correspondence with charges in storage nodes SN, /SN, one of drive transistors DT3, DT4 is in ON state and the other is in OFF state. When access transistors AT3, AT4 are turned on while they are in such states, in the port in which drive transistor DT3 (DT4) is in ON state, charges precharged on read bit line RBLA (RBLB) are drawn to the ground interconnection through access transistor AT3 (AT4) and drive transistor DT3 (DT4), thereby decreasing the potential of read bit line RBLA (RBLB).

On the other hand, in the portion in which drive transistor DT3 (DT4) is in OFF state, the charges precharged on read bit line RBLA (RBLB) are not drawn, so that the potential of read bit line RBLA (RBLB) is not changed. Thus, data is read by detecting the change in potential of read bit line RBLA (RBLB) precharged.

Figure 88:
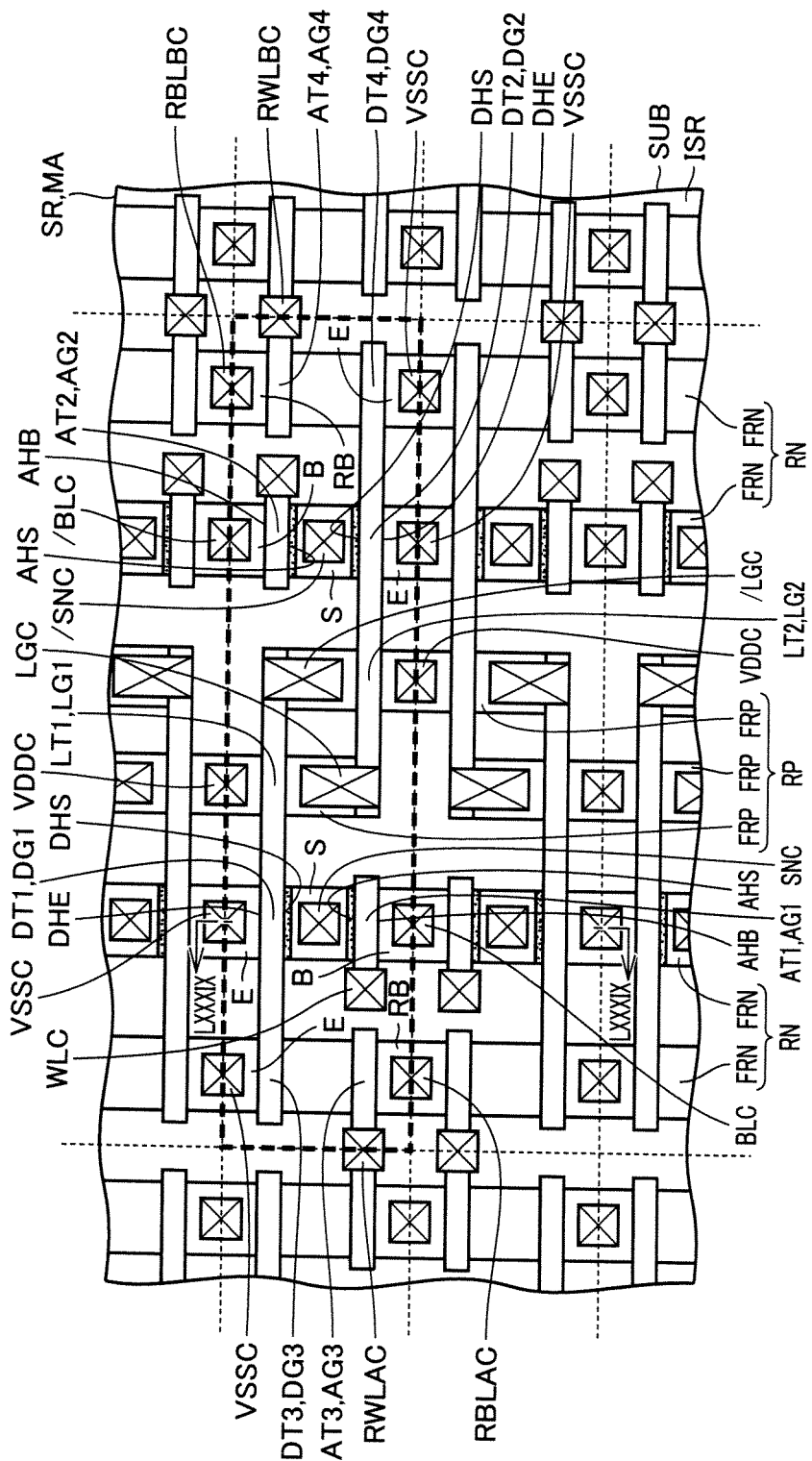
FIG. 88 is a plan view showing an arrangement pattern of the SRAM memory cells in the embodiment.

The following describes a structure of the SRAM memory cell. FIG. 88 is a plan view showing a layout of the transistors of the memory cells of the SRAM cell array, and contacts connected to the transistors. In this plan view, one SRAM memory cell is constituted of a region surrounded by a dotted line.

On a main surface of a semiconductor substrate SUB, an element isolation region ISR is formed using an element isolation insulation film, thereby defining element formation regions FRN, FRP electrically disconnected from each other. Element formation regions FRN are formed in an NMIS region RN. Element formation regions FRP are formed in a PMIS region RP.

In element formation regions FRN, access transistors AT1, AT2, AT3, AT4 and drive transistors DT1, DT2, DT3, DT4 are formed as n channel type MIS transistors. Meanwhile, in element formation regions FRP, load transistors LT1, LT2 are formed as p channel type MIS transistors.

Element formation region FRN having access transistor AT1 formed therein and element formation region FRN having drive transistor DT1 formed therein are connected to each other. Element formation region FRN having access transistor AT3 formed therein and element formation region FRN having drive transistor DT3 formed therein are connected to each other. Element formation regions FRN having access transistor AT1 and drive transistor DT1 formed therein, and element formation regions FRN having access transistor AT3 and drive transistor DT3 formed therein are electrically disconnected from each other by element isolation region ISR.

Element formation region FRN having access transistor AT2 formed therein and element formation region FRN having drive transistor DT2 formed therein are connected to each other. Element formation region FRN having access transistor AT4 formed therein and element formation region FRN having drive transistor DT4 formed therein are connected to each other. Element formation regions FRN having access transistor AT2 and drive transistor DT2 formed therein, and element formation regions FRN having access transistor AT4 and drive transistor DT4 formed therein are electrically disconnected from each other by element isolation region ISR.

Figure 89:
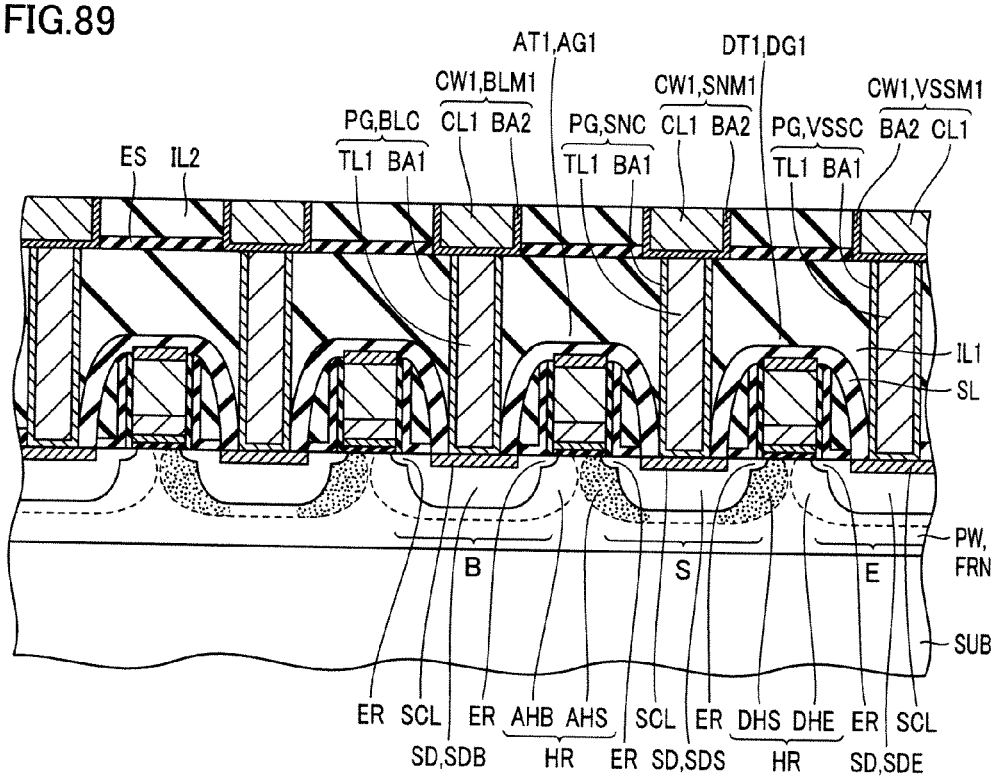
FIG. 89 is a cross sectional view taken along a cross sectional line LXXXIX-LXXXIX of FIG. 88 in the embodiment.

FIG. 89 is a cross sectional view taken along a cross sectional line LXXXIX-LXXXIX extending through access transistor AT1 and drive transistor DT1 of the SRAM memory cell in FIG. 88. The cross sectional structure shown in FIG. 89 is the same as the cross sectional structure shown in FIG. 5. Hence, the same members are given the same reference characters and are not described repeatedly. Above the first metal interconnection shown in FIG. 89, a structure (not shown) corresponding to the equivalent circuit of the SRAM memory cell shown in FIG. 87 is formed by a multilayer metal interconnection and the like.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from each other (see FIG. 88). Next, a step similar to the step shown in FIG. 11 is performed, thereby forming gate structures G to serve as access gate electrodes AG1, AG2, AG3, AG4, drive gate electrodes DG1, DG2, DG3, DG4 and load gate electrodes LG1, LG2, respectively (see FIG. 90). Next, offset spacers are formed on both side surfaces of each gate structure G.

Figure 90:
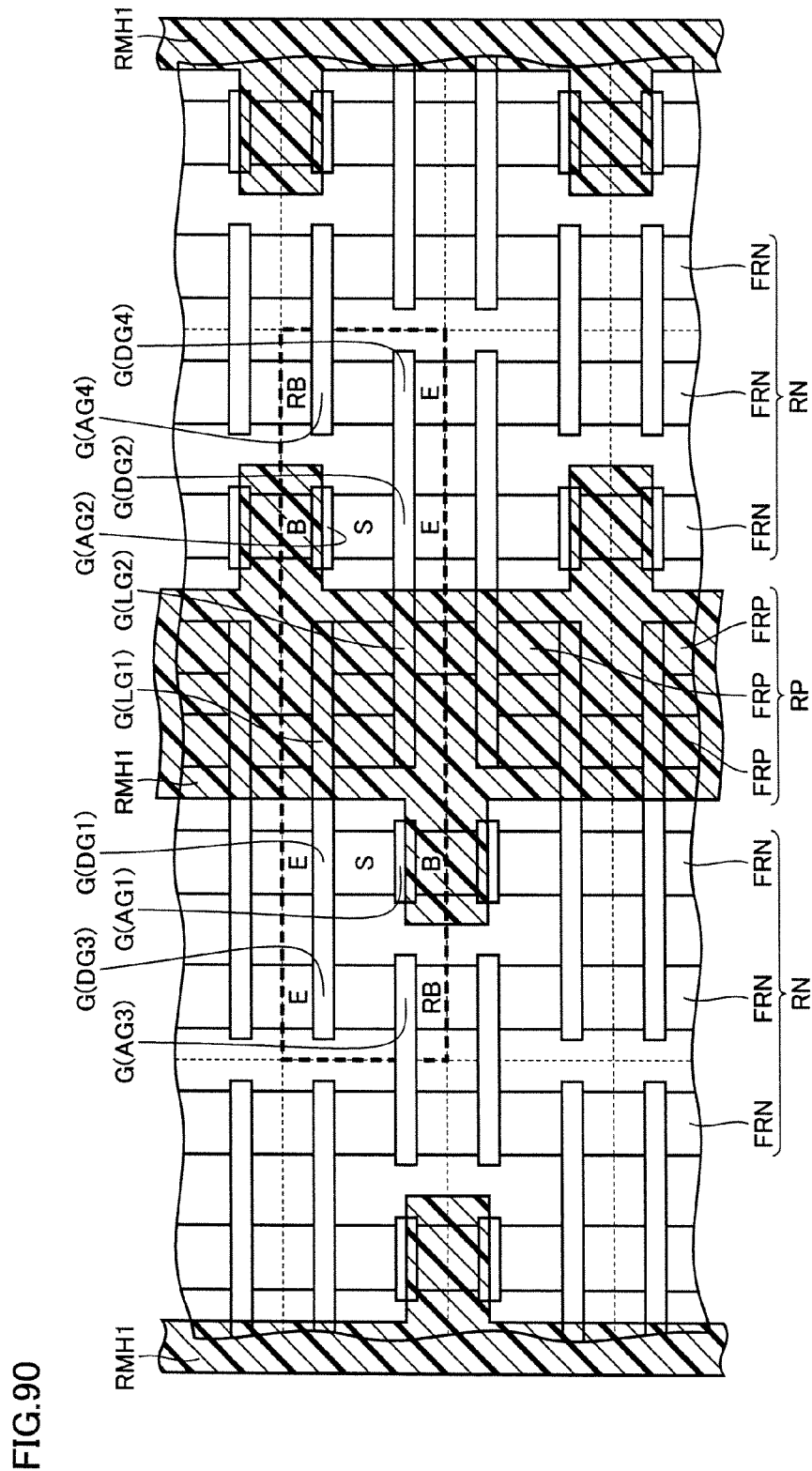
FIG. 90 is a plan view showing one step in a method for manufacturing the semiconductor device in the embodiment.

Next, as shown in FIG. 90, a predetermined photolithography process is performed to form a resist mask RMH1 that is to serve as an implantation mask for forming the halo regions (implantation mask A). Resist mask RMH1 is formed to expose: the side surface of gate structure G that is to serve as each of access gate electrodes AG1, AG2, the side surface being positioned at the side of region S in which the source-drain region electrically connected to the storage node is to be formed; region S; gate structure G that is to serve as each of drive gate electrodes DG1, DG2; and region E in which the source-drain region electrically connected to the ground interconnection is to be formed.

Further, resist mask RMH1 is formed to expose: gate structure G that is to serve as each of access gate electrodes AG3, AG4; region RB in which the source-drain region electrically connected to the read bit line is to be formed; gate structure G that is to serve as each of drive gate electrodes DG3, DG4; region E in which the source-drain region electrically connected to the ground interconnection is to be formed; and a portion of element formation region FRN interposed between gate structure G that is to serve as access gate electrode AG3 (AG4) and gate structure G that is to serve as drive gate electrode DG3 (DG4).

On the other hand, resist mask RMH1 is formed to cover: the side surface of gate structure G that is to serve as each of access gate electrodes AG1, AG2, the side surface being positioned at the side of region B in which the source-drain region electrically connected to the bit line is to be formed; and region B. Also, resist mask RMH1 is formed to cover PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation A). It should be noted that in this halo implantation A, the same amount of boron is implanted with the same implantation energy. Thereafter, resist mask RMH1 is removed.

Figure 91:
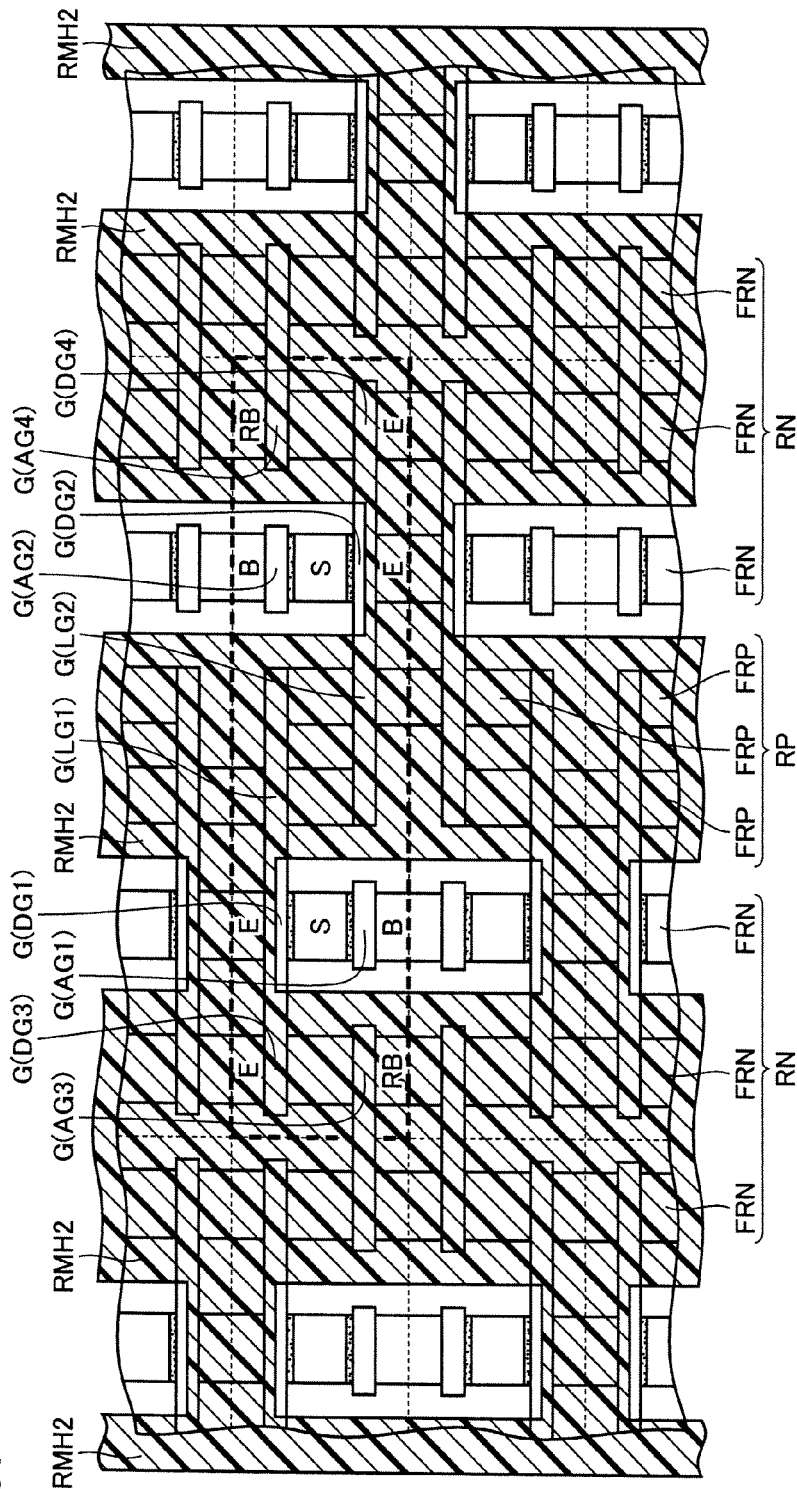
FIG. 91 is a plan view showing a step performed after the step shown in FIG. 90 in the embodiment.

Next, as shown in FIG. 91, a predetermined photolithography process is performed to form a resist mask RMH2 that is to serve as an implantation mask for forming the halo regions (implantation mask B). Resist mask RMH2 is formed to expose: gate structure G that is to serve as each of access gate electrodes AG1, AG2; region S in which the source-drain region electrically connected to the storage node is to be formed; region B in which the source-drain region electrically connected to the bit line is to be formed; and the side surface of gate structure G that is to serve as each of drive gate electrodes DG1, DG2, the side surface being positioned at the side of region S in which the source-drain region electrically connected to the storage node is to be formed.

On the other hand, resist mask RMH2 is formed to cover: the side surface of gate structure G that is to serve as each of drive gate electrode DG1, DG2, the side surface being positioned at the side of region E in which the source-drain region electrically connected to the ground interconnection is to be formed; region E; and element formation region FRP.

Further, resist mask RMH2 is formed to cover: gate structure G that is to serve as each of access gate electrodes AG3, AG4; region RB in which the source-drain region electrically connected to the read bit line is to be formed; gate structure G that is to serve as each of drive gate electrodes DG3, DG4; region E in which the source-drain region electrically connected to the ground interconnection is to be formed; and a portion of element formation region FRN interposed between gate structure G that is to serve as access gate electrode AG3 (AG4) and gate structure G that is to serve as drive gate electrode DG3 (DG4).

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Further, halo region AHT formed in each of access transistors AT3, AT4 and halo region DHT formed in each of drive transistors DG3, DG4 are formed by halo implantation A. The impurity concentration of each of halo regions AHT, DHT becomes the same as the impurity concentration of halo region DHE of each of drive transistors DG1, DG2.

Figure 92:
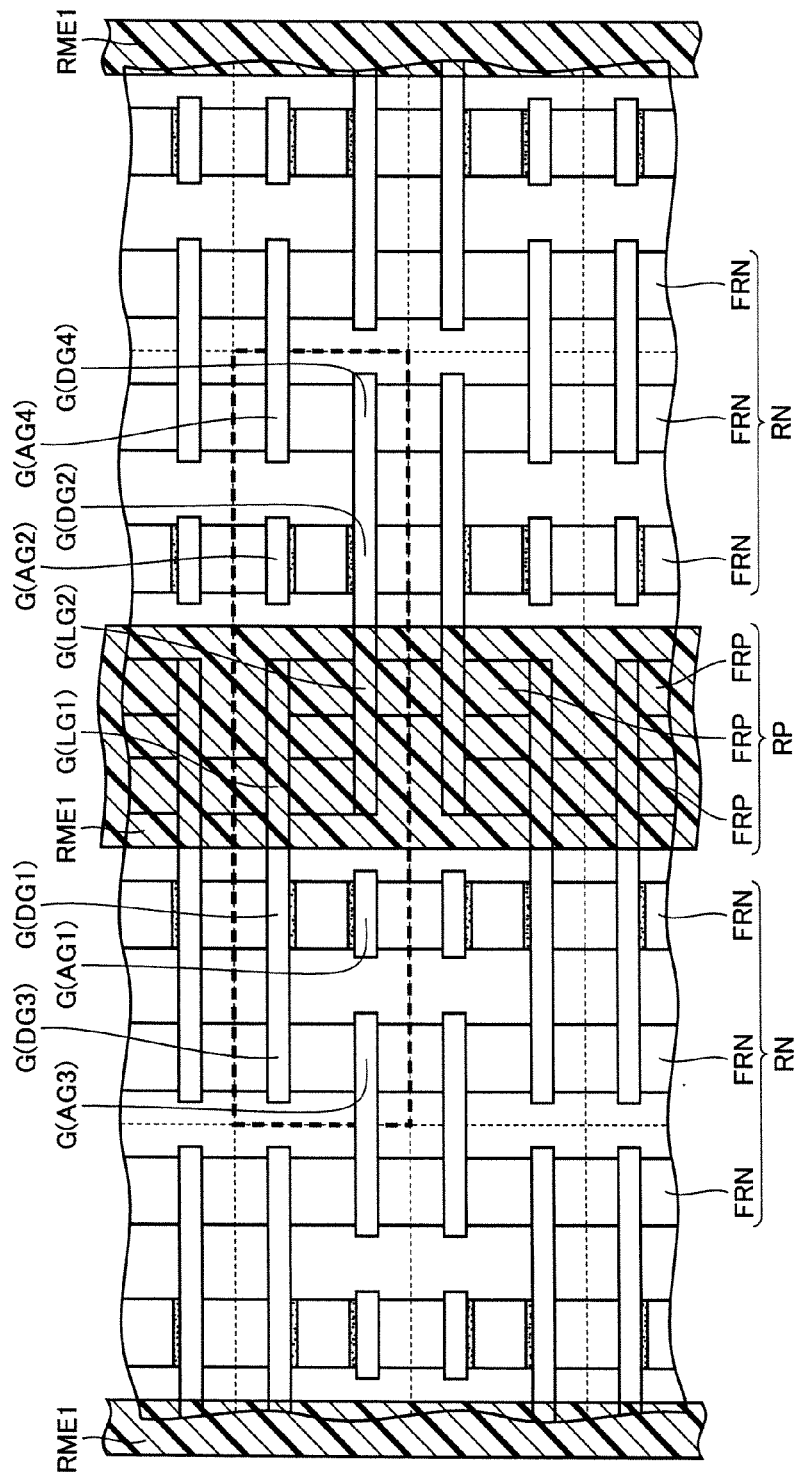
FIG. 92 is a plan view showing a step performed after the step shown in FIG. 91 in the embodiment.

Next, as shown in FIG. 92, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region ER (FIG. 89) up to a predetermined depth from the surface of the exposed region of p well PW (extension implantation).

Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation region FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection as shown in FIG. 89. Thereafter, the multilayer interconnection structure is formed on copper interconnection CW1, thus forming the main portion of the SRAM memory cell.

The semiconductor device including the above-described SRAM memory cell is provided with the read only port. The read only port is constructed of access transistors AT3, AT4 and drive transistors DT3, DT4, which are formed such that the pair of halo regions AHT, AHT of each of access transistors AT3, AT4 and the pair of halo regions DHT, DHT of each of drive transistors DT3, DT4 have the same impurity concentration as the impurity concentration of halo region DHE of the pair of halo regions HR (halo region DHS, DHE) of drive transistors DT1, DT2.

In the present semiconductor device, the impurity concentration of halo region DHE of each of drive transistors DT1, DT2 is set to be lower than the impurity concentration of halo region AHB of each of access transistors AT1, AT2. Hence, the impurity concentration of each of halo regions AHT, DHT in the read port becomes lower than the impurity concentration of halo region AHB. Accordingly, in the read operation by the read only port, read speed can be improved.

Further, in the present semiconductor device, the SRAM can be used as a 2-port SRAM in the case where read word line RWLA and read word line RWLB are formed as a common word line and differential read is performed by read bit line RBLA and read bit line RBLB.

In access transistor AT1 (AT2) of the present semiconductor device, halo region AHS having a relatively high impurity concentration is formed at the storage node SN (/SN) side, whereas halo region AHB having a relatively low impurity concentration is formed at the bit line BL (/BL) side. Further, in each of drive transistors DT1, DT2, halo region DHS having a relatively high impurity concentration is formed at the storage node SN (/SN) side, whereas halo region DHE having a relatively low impurity concentration is formed at the ground interconnection VSS side.

In this way, as with the SRAM memory cell of the semiconductor device described in the first embodiment, both the read margin and the write margin can be increased. Further, high-speed operation can be attained during reading. Further, as compared with the semiconductor device according to the comparative example, the number of photolithography masks for forming halo regions can be reduced by one.

Seventh Embodiment

Here, the following describes another exemplary semiconductor device having a 3-port SRAM memory cell including a read only port.

Figure 93:
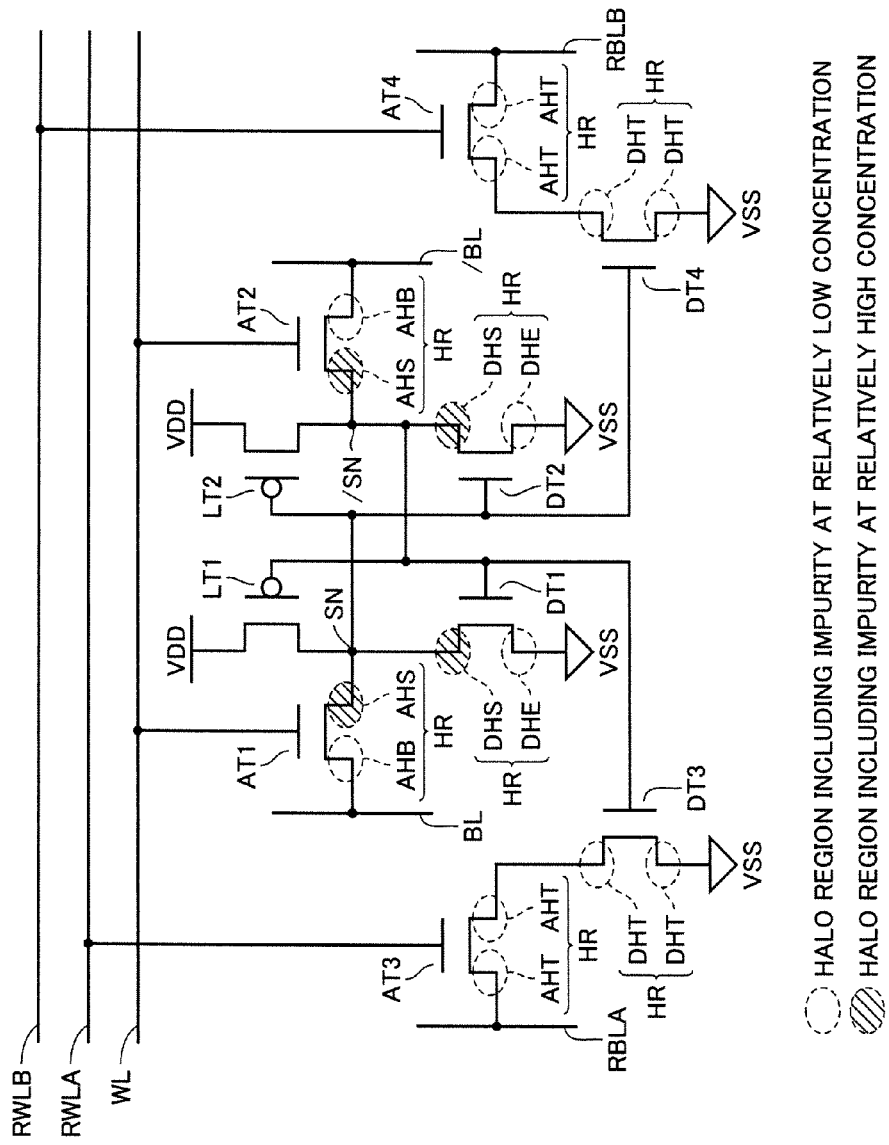
FIG. 93 shows an equivalent circuit of each SRAM memory cell of a semiconductor device in a seventh embodiment of the present invention.

Described first is an equivalent circuit of the SRAM memory cell. As shown in FIG. 93, a pair of halo regions AHT, AHT of each of access transistors AT3, AT4 and a pair of halo regions DHT, DHT of each of drive transistors DT3, DT4 are formed to have the same impurity concentration as the impurity concentration of halo regions AHB of the pair of halo regions HR (halo regions AHS, AHB) of each of access transistors AT1, AT2. It should be noted that configurations apart from this are the same as those of the equivalent circuit of FIG. 87, and therefore the same members are given the same reference characters and are not described repeatedly.

A layout of the transistors of the memory cells of the SRAM cell array and contacts connected to the transistors is the same as the layout shown in FIG. 88. Further, a cross sectional structure taken along a cross sectional line corresponding to the cross sectional line shown in FIG. 88 is the same as the cross sectional structure shown in FIG. 89. Hence, the layout and the cross sectional structure are not described repeatedly.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from each other (see FIG. 94). Next, a step similar to the step shown in FIG. 11 is performed, thereby forming gate structures G to serve as access gate electrodes AG1, AG2, AG3, AG4, drive gate electrodes DG1, DG2, DG3, DG4, and load gate electrodes LG1, LG2, respectively (see FIG. 94). Next, offset spacers are formed on both side surfaces of each gate structure G.

Figure 94:
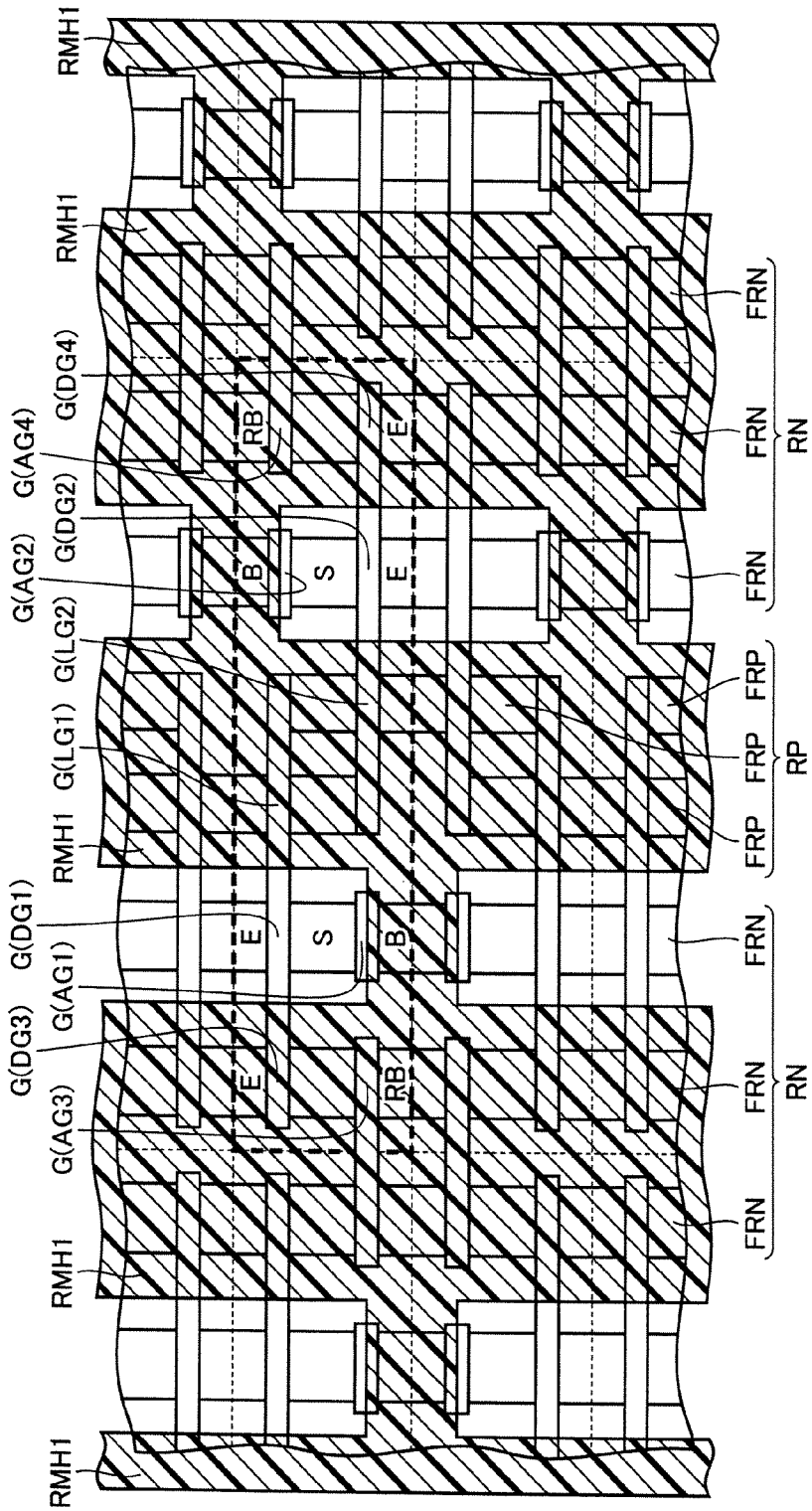
FIG. 94 is a plan view showing one step in a method for manufacturing the semiconductor device in the embodiment.

Next, as shown in FIG. 94, a predetermined photolithography process is performed to form a resist mask RMH1 that is to serve as an implantation mask for forming the halo regions (implantation mask A). Resist mask RMH1 is formed to expose: the side surface of gate structure G that is to serve as each of access gate electrodes AG1, AG2, the side surface being positioned at the side of region S in which the source-drain region electrically connected to the storage node is to be formed; region S; gate structure G that is to serve as each of drive gate electrodes DG1, DG2; and region E in which the source-drain region electrically connected to the ground interconnection is to be formed.

On the other hand, resist mask RMH1 is formed to cover: the side surface of gate structure G that is to serve as each of access gate electrodes AG1, AG2 the side surface being positioned at the side of region B in which the source-drain region electrically connected to the bit line is to be formed; and region B.

Further, resist mask RMH1 is formed to cover: gate structure G that is to serve as each of access gate electrodes AG3, AG4; region RB in which the source-drain region electrically connected to the read bit line is to be formed; gate structure G that is to serve as each of drive gate electrodes DG3, DG4; region E in which the source-drain region electrically connected to the ground interconnection is to be formed; a portion of element formation region FRN interposed between gate structure G that is to serve as access gate electrode AG3 (AG4) and gate structure G that is to serve as drive gate electrode DG3 (DG4); and PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation A). It should be noted that in this halo implantation A, the same amount of boron is implanted with the same implantation energy. Thereafter, resist mask RMH1 is removed.

Figure 95:
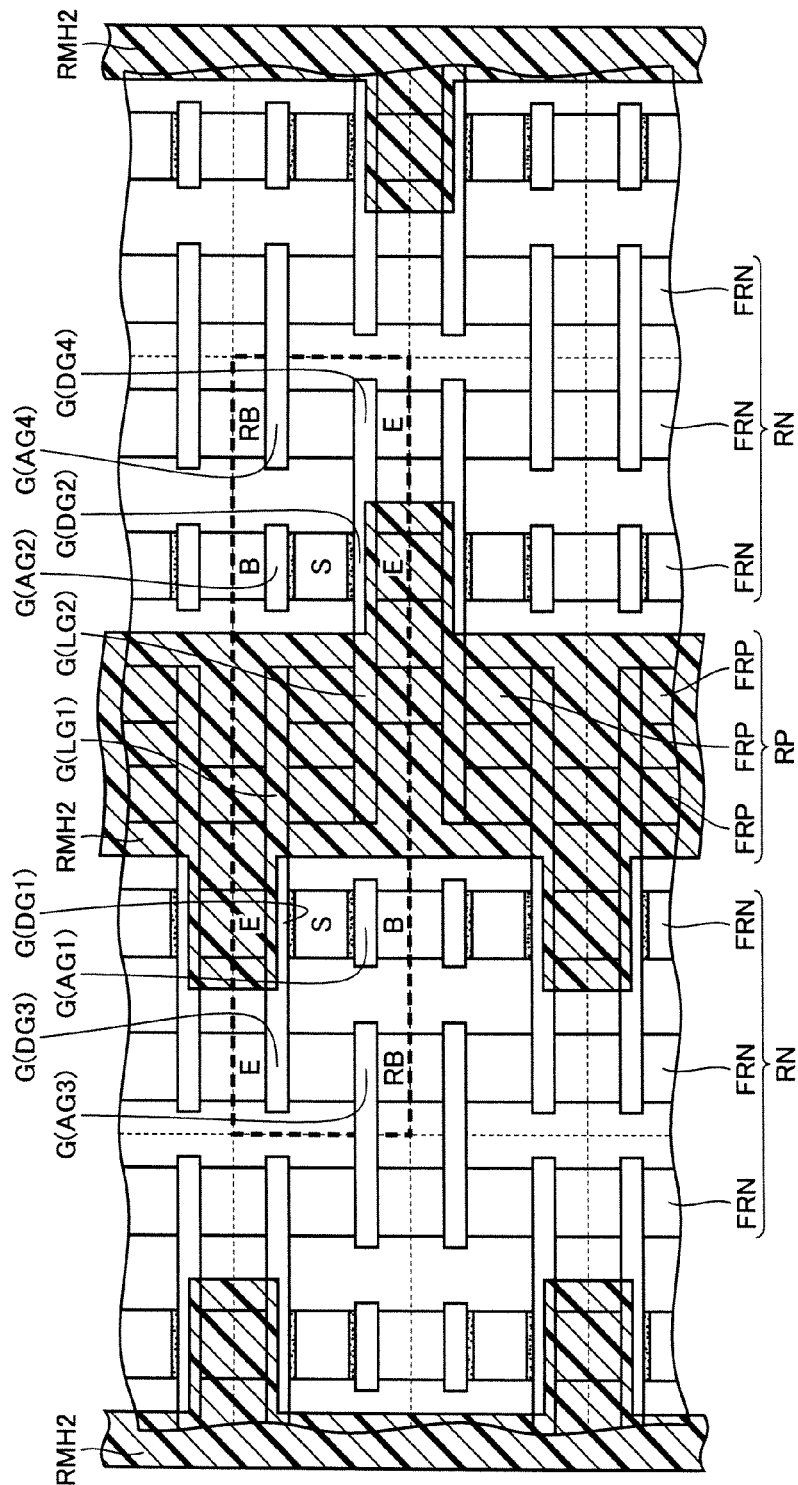
FIG. 95 is a plan view showing a step performed after the step shown in FIG. 94 in the embodiment.

Next, as shown in FIG. 95, a predetermined photolithography process is performed to form a resist mask RMH2 that is to serve as an implantation mask for forming the halo regions (implantation mask B). Resist mask RMH2 is formed to expose: gate structure G that is to serve as each of access gate electrodes AG1, AG2; region S in which the source-drain region electrically connected to the storage node is to be formed; region B in which the source-drain region electrically connected to the bit line is to be formed; and the side surface of gate structure G that is to serve as each of drive gate electrodes DG1, DG2, the side surface being positioned at the side of region S in which the source-drain region electrically connected to the storage node is to be formed.

Further, resist mask RMH2 is formed to expose: gate structure G that is to serve as each of access gate electrodes AG3, AG4; region RB in which the source-drain region electrically connected to the read bit line is to be formed; gate structure G that is to serve as each of drive gate electrodes DG3, DG4; region E in which the source-drain region electrically connected to the ground interconnection is to be formed; and a portion of element formation region FRN interposed between gate structure G that is to serve as access gate electrode AG3 (AG4) and gate structure G that is to serve as drive gate electrode DG3 (DG4).

On the other hand, resist mask RMH2 is formed to cover: the side surface of gate structure G that is to serve as each of drive gate electrode DG1, DG2, the side surface being positioned at the side of region E in which the source-drain region electrically connected to the ground interconnection is to be formed; region E; and element formation region FRP.

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Further, halo region AHT formed in each of access transistors AT3, AT4 and halo region DHT formed in each of drive transistors DG3, DG4 are formed by halo implantation B. The impurity concentration of each of halo regions AHT, DHT becomes the same as the impurity concentration of halo region AHB of each of access transistor AG1, AG2.

Figure 96:
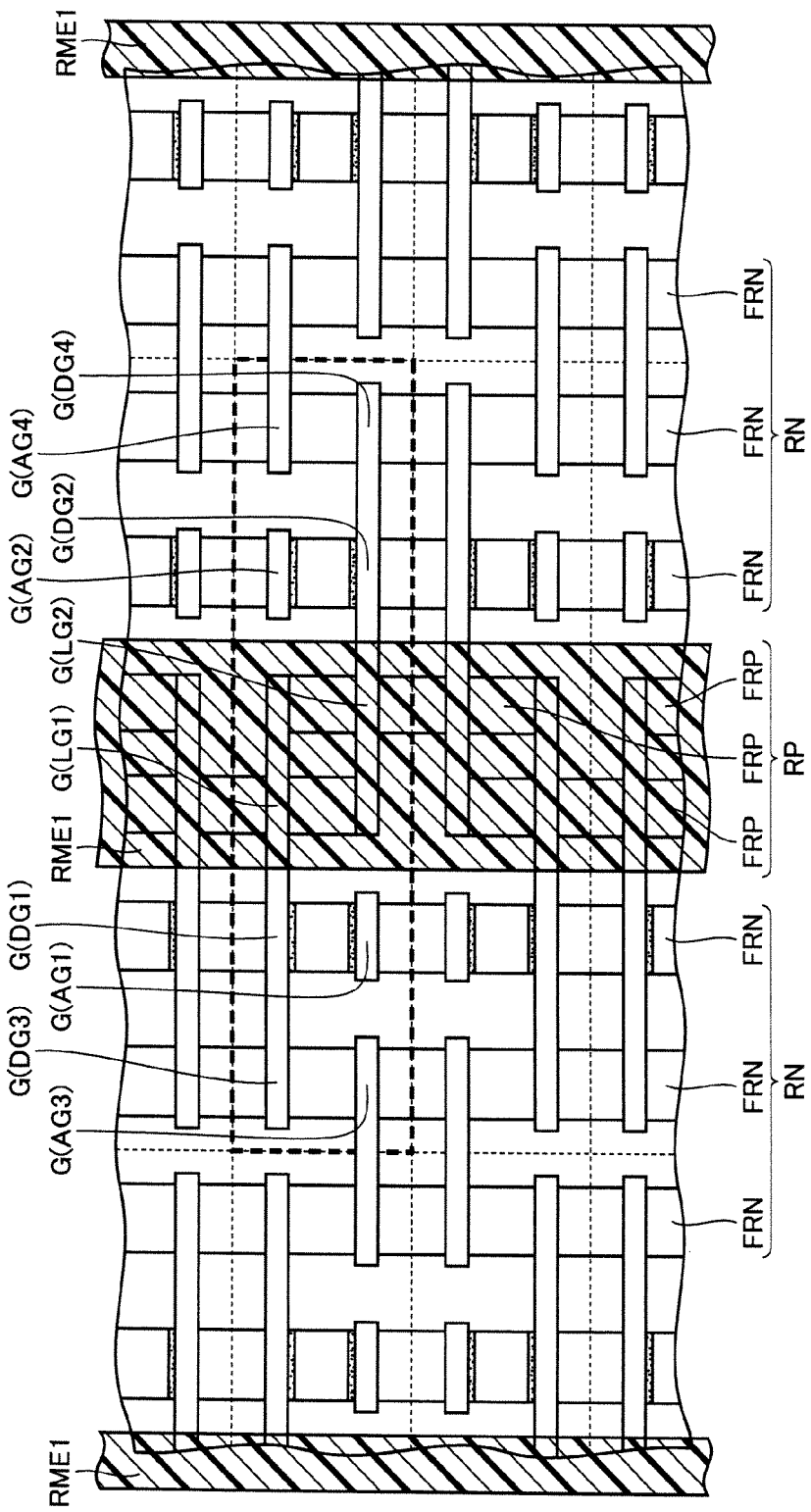
FIG. 96 is a plan view showing a step performed after the step shown in FIG. 95 in the embodiment.

Next, as shown in FIG. 96, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region ER (not shown) up to a predetermined depth from the surface of the exposed region of p well PW (extension implantation). Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation region FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection (see FIG. 89). Thereafter, the multilayer interconnection structure is formed on copper interconnection CW1, thus forming the main portion of the SRAM memory cell.

The semiconductor device including the above-described SRAM memory cell is provided with the read only port. The read only port is constructed of access transistors AT3, AT4 and drive transistors DT3, DT4, which are formed such that the pair of halo regions AHT, AHT of each of access transistors AT3, AT4 and the pair of each of halo regions DHT, DHT of drive transistors DT3, DT4 have the same impurity concentration as the impurity concentration of halo region AHB of the pair of halo regions HR (halo region AHS, AHB) of each of access transistors AT1, AT2.

In the present semiconductor device, the impurity concentration of halo region AHB of each of access transistors AT1, AT2 is set to be higher than the impurity concentration of halo region DHE of each of drive transistors DT1, DT2. Hence, the impurity concentration of each of halo regions AHT, DHT in the read port becomes higher than the impurity concentration of halo region DHE. Accordingly, in the read operation by the read only port, leakage current from each of drive transistors DT3, DT4 can be suppressed during reading.

Further, in the present semiconductor device, the SRAM can be used as a 2-port SRAM in the case where read word line RWLA and read word line RWLB are formed as a common word line and differential read is performed by read bit line RBLA and read bit line RBLB.

Further, in access transistor AT1 (AT2) of the present semiconductor device, halo region AHS having a relatively high impurity concentration is formed at the storage node SN (/SN) side, whereas halo region AHB having a relatively low impurity concentration is formed at the bit line BL (/BL) side. Further, in each of drive transistors DT1, DT2, halo region DHS having a relatively high impurity concentration is formed at the storage node SN (/SN) side, whereas halo region DHE having a relatively low impurity concentration is formed at the ground interconnection VSS side.

In this way, as with the SRAM memory cell of the semiconductor device described in the first embodiment, both the read margin and the write margin can be increased. Further, high-speed operation can be attained during reading. Further, as compared with the semiconductor device according to the comparative example, the number of photolithography masks for forming halo regions can be reduced by one.

Eighth Embodiment

First Example

Here, the following describes a semiconductor device having a 2-port SRAM memory cell including a read only port.

Figure 97:
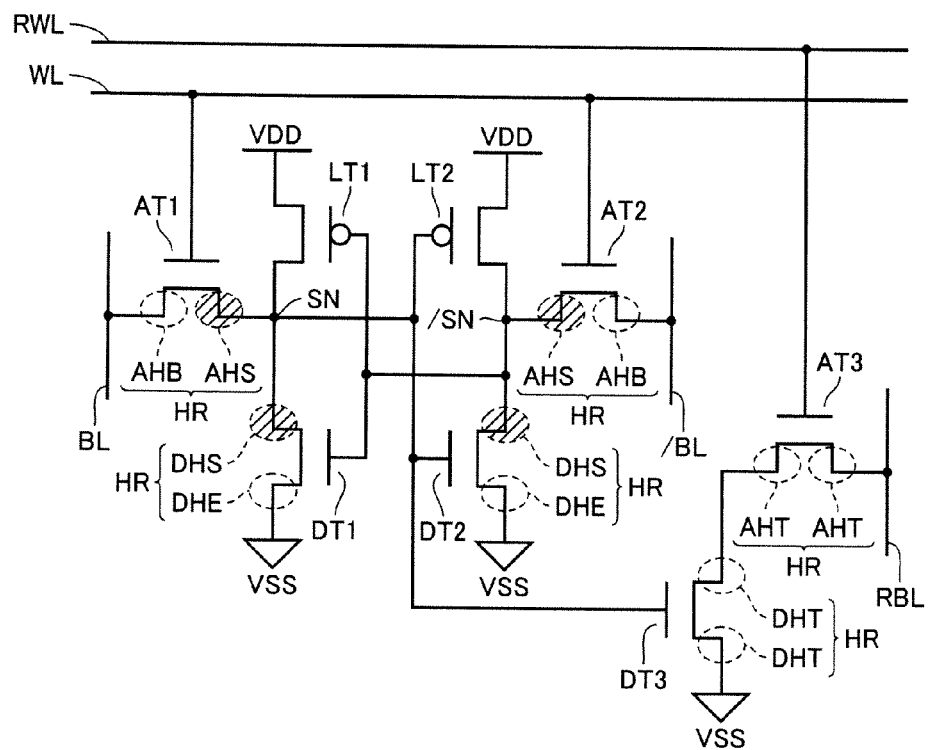
FIG. 97 shows an equivalent circuit of each SRAM memory cell of a semiconductor device in a first example of an eighth embodiment of the present invention.

Described first is an equivalent circuit of the SRAM memory cell. As shown in FIG. 97, the 2-port SRAM memory cell is provided with a bit line RBL as a read bit line, and is provided with a read word line RWL as a read word line. Access transistor AT3 has a gate connected to read word line RWL. One of a pair of source-drain regions of access transistor AT3 is connected to bit line RBL.

Drive transistor DT3 has a gate connected to the gate of drive transistor DT2 and the gate of load transistor LT2. One of a pair of source-drain regions of drive transistor DT3 is connected to the other of the pair of source-drain regions of access transistor AT3. The other of the pair of source-drain regions of drive transistor DT3 is connected to the ground interconnection (VSS).

A pair of halo regions AHT, AHT of access transistor AT3 and a pair of halo regions DHT, DHT of drive transistor DT3 are formed to have the same impurity concentration as the impurity concentration of halo regions DHE of the pair of halo regions HR (halo regions DHS, DHE) of each of drive transistors DT1, DT2. It should be noted that configurations apart from this are the same as those of the equivalent circuit of FIG. 3, and therefore the same members are given the same reference characters and are not described repeatedly.

In the read only port, data is read by detecting a change in potential of each of read bit line RBL when access transistor AT3 is turned on.

Figure 98:
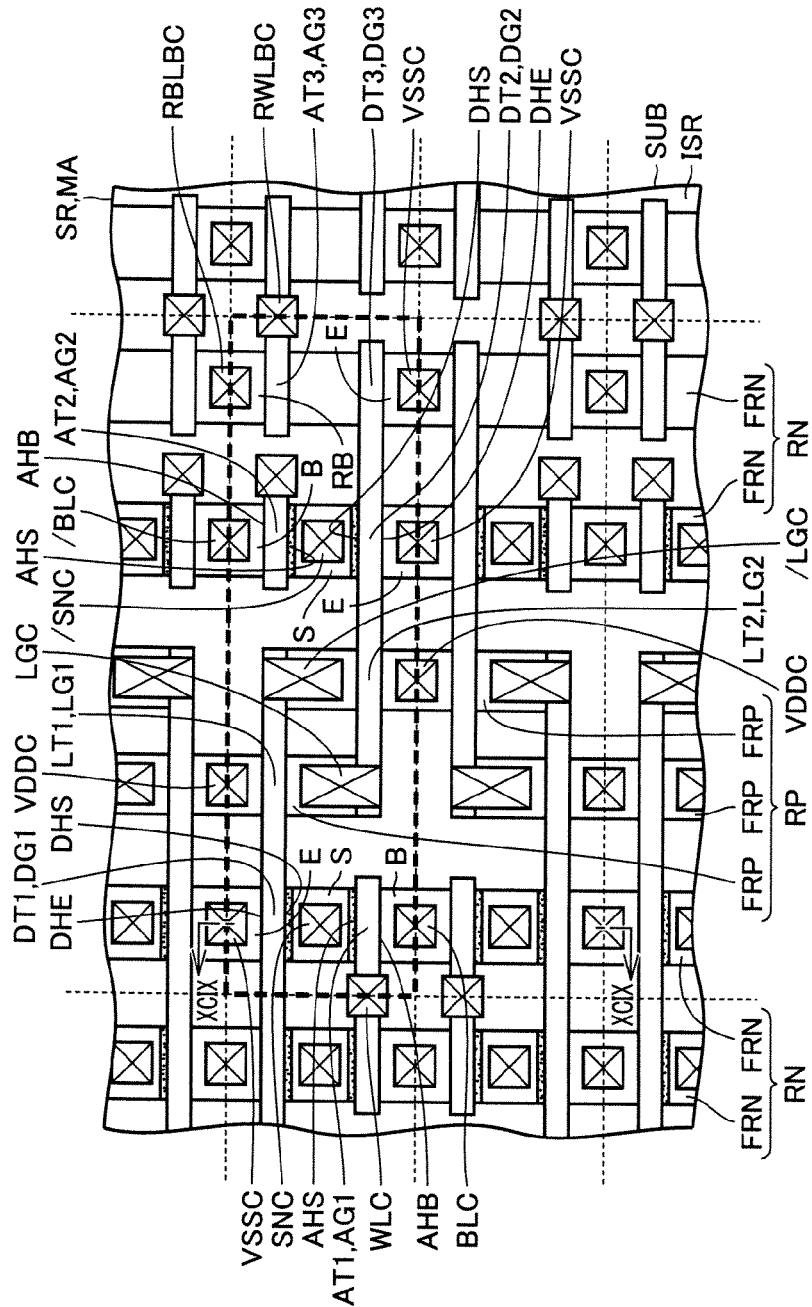
FIG. 98 is a plan view showing an arrangement pattern of the SRAM memory cells in the embodiment.

The following describes a structure of the SRAM memory cell. FIG. 98 is a plan view showing a layout of the transistors of the memory cells of the SRAM cell array, and contacts connected to the transistors. In this plan view, one SRAM memory cell is constituted of a region surrounded by a dotted line.

On a main surface of a semiconductor substrate SUB, an element isolation region ISR is formed using an element isolation insulation film, thereby defining element formation regions FRN, FRP electrically disconnected from each other. Element formation regions FRN are formed in an NMIS region RN. Element formation regions FRP are formed in a PMIS region RP.

In element formation regions FRN, access transistors AT1, AT2, AT3 and drive transistors DT1, DT2, DT3 are formed as n channel type MIS transistors. Meanwhile, in element formation regions FRP, load transistors LT1, LT2 are formed as p channel type MIS transistors.

Element formation region FRN having access transistor AT1 formed therein and element formation region FRN having drive transistor DT1 formed therein are connected to each other. Element formation region FRN having access transistor AT2 formed therein and element formation region FRN having drive transistor DT2 formed therein are connected to each other. Element formation region FRN having access transistor AT3 formed therein and element formation region FRN having drive transistor DT3 formed therein are connected to each other.

Element formation regions FRN having access transistor AT1 and drive transistor DT1 formed therein, element formation regions FRN having access transistor AT2 and drive transistor DT2 formed therein, and element formation regions FRN having access transistor AT3 and drive transistor DT3 formed therein are electrically disconnected from one another by element isolation region ISR.

Figure 99:
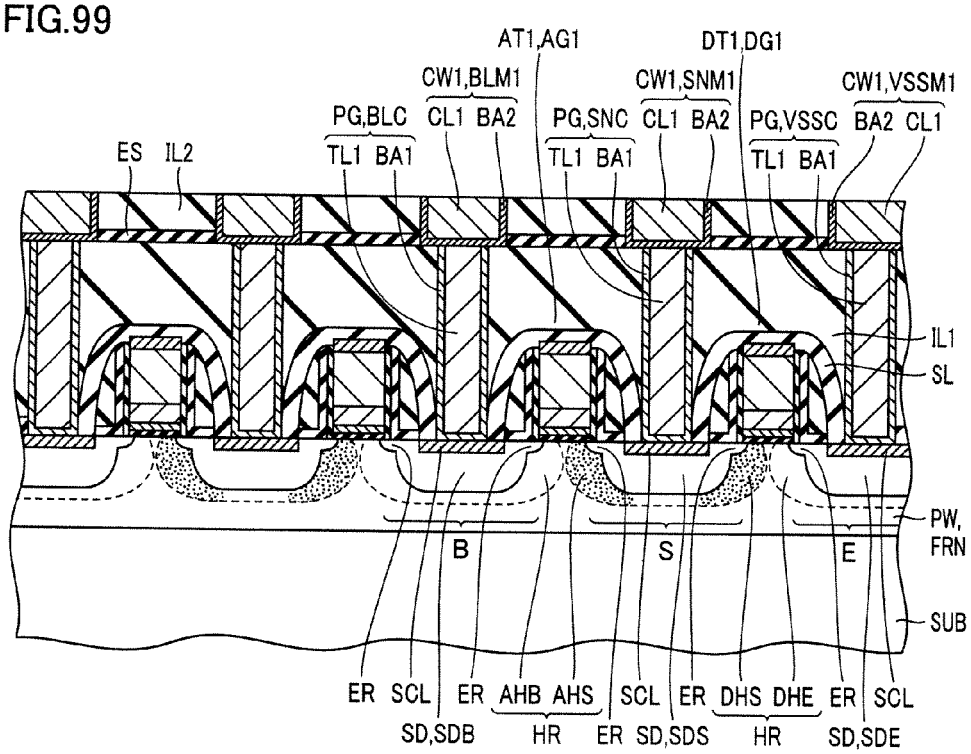
FIG. 99 is a cross sectional view taken along a cross sectional line XCIX-XCIX of FIG. 98 in the embodiment.

FIG. 99 is a cross sectional view taken along a cross sectional line XCIX-XCIX extending through access transistor AT1 and drive transistor DT1 of the SRAM memory cell in FIG. 98. The cross sectional structure shown in FIG. 99 is the same as the cross sectional structure shown in FIG. 5. Hence, the same members are given the same reference characters and are not described repeatedly. Above the first metal interconnection shown in FIG. 99, a structure (not shown) corresponding to the equivalent circuit of the SRAM memory cell shown in FIG. 97 is formed by a multilayer metal interconnection and the like.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from each other (see FIG. 98). Next, a step similar to the step shown in FIG. 11 is performed, thereby forming gate structures G to serve as access gate electrodes AG1, AG2, AG3, AG4, drive gate electrodes DG1, DG2, DG3, DG4 and load gate electrodes LG1, LG2, respectively (see FIG. 100). Next, offset spacers are formed on both side surfaces of each gate structure G.

Figure 100:
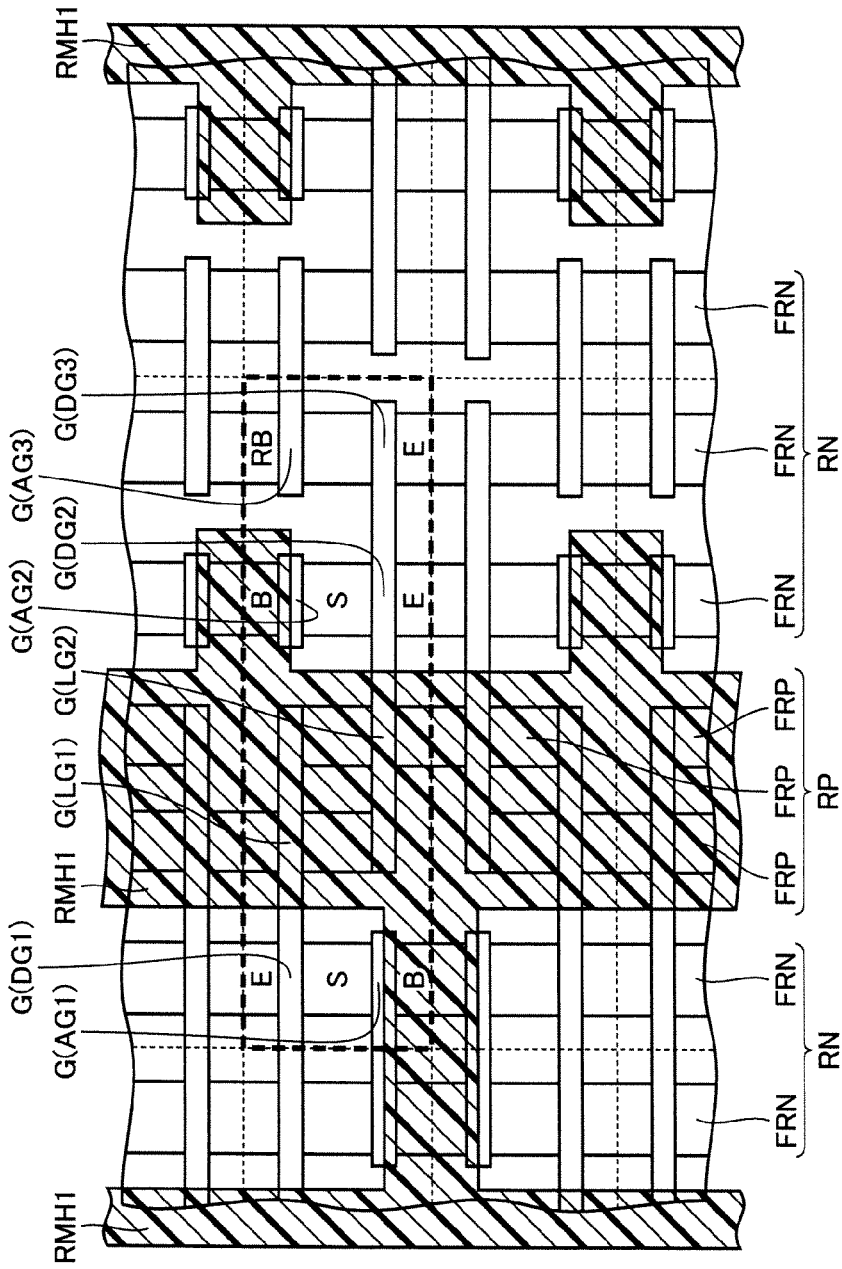
FIG. 100 is a plan view showing one step in a method for manufacturing the semiconductor device in the first example of the embodiment.

Next, as shown in FIG. 100, a predetermined photolithography process is performed to form a resist mask RMH1 that is to serve as an implantation mask for forming the halo regions (implantation mask A). Resist mask RMH1 is formed to expose: the side surface of gate structure G that is to serve as each of access gate electrode AG1, AG2, the side surface being positioned at the side of region S in which the source-drain region electrically connected to the storage node is to be formed; region S; gate structure G that is to serve as each of drive gate electrodes DG1, DG2; and region E in which the source-drain region electrically connected to the ground interconnection is to be formed.

Further, resist mask RMH1 is formed to expose: gate structure G that is to serve as access gate electrode AG3; region RB in which the source-drain region electrically connected to the read bit line is to be formed; gate structure G that is to serve as drive gate electrode DG3; region E in which the source-drain region electrically connected to the ground interconnection is to be formed; and a portion of element formation region FRN interposed between gate structure G that is to serve as access gate electrode AG3 and gate structure G that is to serve as drive gate electrode DG3.

On the other hand, resist mask RMH1 is formed to cover: the side surface of gate structure G that is to serve as each of access gate electrodes AG1, AG2, the side surface being positioned at the side of region B in which the source-drain region electrically connected to the bit line is to be formed; and region B. Also, resist mask RMH1 is formed to cover PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation A). It should be noted that in this halo implantation A, the same amount of boron is implanted with the same implantation energy. Thereafter, resist mask RMH1 is removed.

Figure 101:
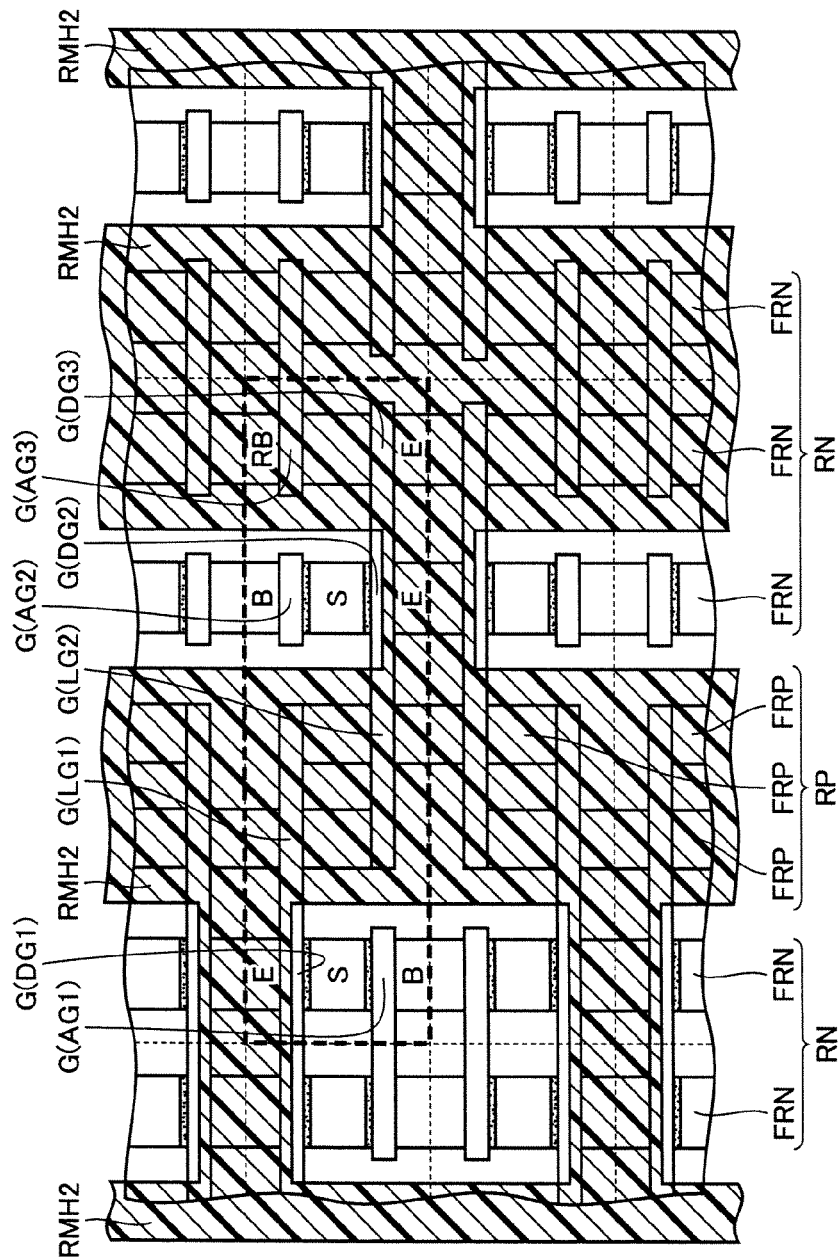
FIG. 101 is a plan view showing a step performed after the step shown in FIG. 100 in the embodiment.

Next, as shown in FIG. 101, a predetermined photolithography process is performed to form a resist mask RMH2 that is to serve as an implantation mask for forming the halo regions (implantation mask B). Resist mask RMH2 is formed to expose: gate structure G that is to serve as each of access gate electrodes AG1, AG2; region S in which the source-drain region electrically connected to the storage node is to be formed; region B in which the source-drain region electrically connected to the bit line is to be formed; and the side surface of gate structure G that is to serve as each of drive gate electrodes DG1, DG2, the side surface being positioned at the side of region S in which the source-drain region electrically connected to the storage node is to be formed.

On the other hand, resist mask RMH2 is formed to cover: the side surface of gate structure G that is to serve as each of drive gate electrodes DG1, DG2, the side surface being positioned at the side of region E in which the source-drain region electrically connected to the ground interconnection is to be formed; region E; and element formation region FRP.

Further, resist mask RMH2 is formed to cover: gate structure G that is to serve as access gate electrode AG3; region RB in which the source-drain region electrically connected to the read bit line is to be formed; gate structure G that is to serve as each of drive gate electrodes DG3; region E in which the source-drain region electrically connected to the ground interconnection is to be formed; and a portion of element formation region FRN interposed between gate structure G that is to serve as access gate electrode AG3 and gate structure G that is to serve as drive gate electrode DG3.

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Further, halo region AHT formed in access transistor AT3 and halo region DHT formed in each of drive transistors DG3 are formed by halo implantation A. The impurity concentration of each of halo regions AHT, DHT becomes the same as the impurity concentration of halo region DHE of each of drive transistors DG1, DG2.

Figure 102:
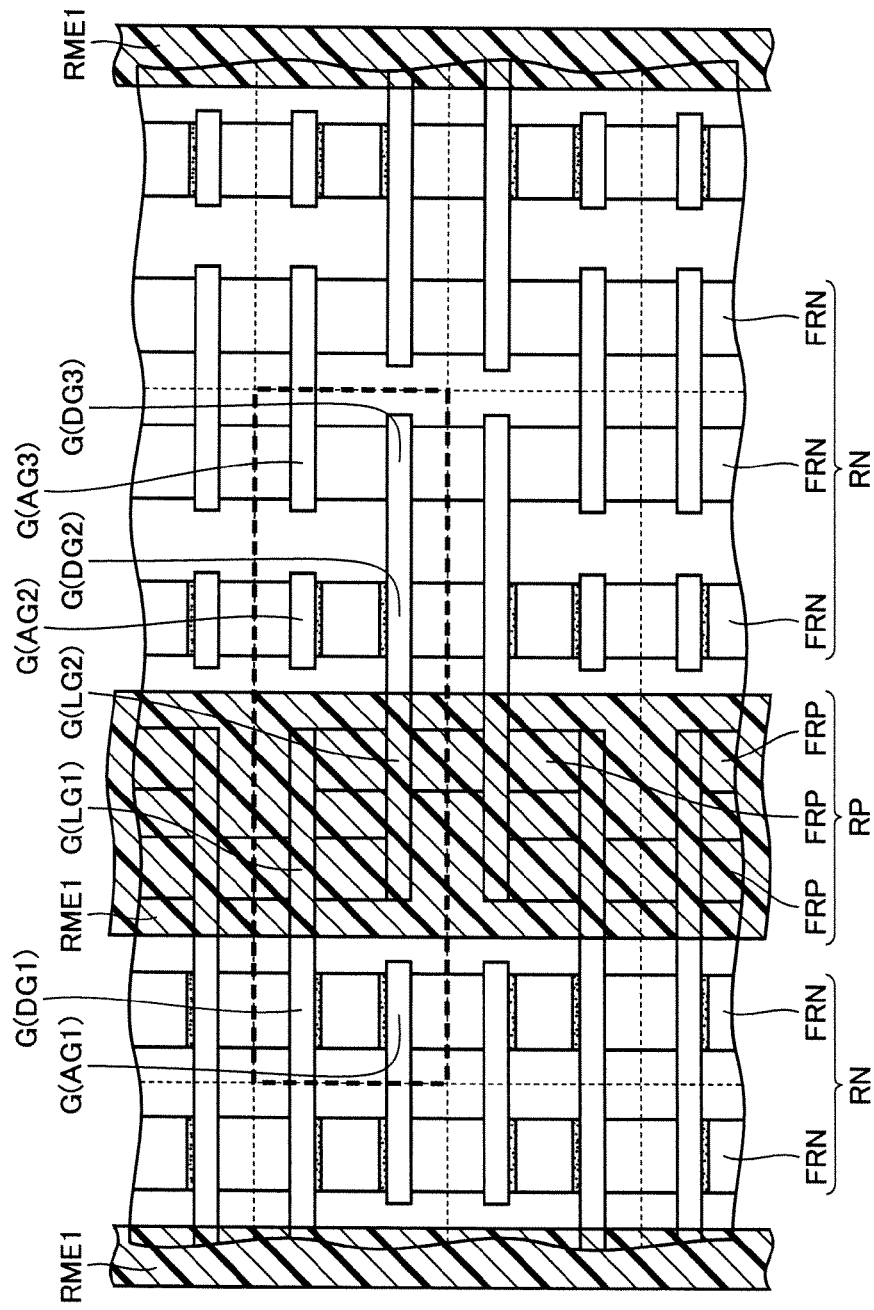
FIG. 102 is a plan view showing a step performed after the step shown in FIG. 101 in the embodiment.

Next, as shown in FIG. 102, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region ER (see FIG. 99) up to a predetermined depth from the surface of the exposed region of p well PW (extension implantation). Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation region FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection as shown in FIG. 99. Thereafter, the multilayer interconnection structure is formed on copper interconnection CW1, thus forming the main portion of the SRAM memory cell.

The semiconductor device including the above-described SRAM memory cell is provided with the read only port. The read only port is constructed of access transistor AT3 and drive transistor DT3, in which halo regions AHT, DHT are set to have impurity concentrations lower than the impurity concentration of halo region AHB. Accordingly, in the read operation by the read only port, read speed can be improved.

Further, in access transistor AT1 (AT2) of the present semiconductor device, halo region AHS having a relatively high impurity concentration is formed at the storage node SN (/SN) side, whereas halo region AHB having a relatively low impurity concentration is formed at the bit line BL (/BL) side. Further, in each of drive transistors DT1, DT2, halo region DHS having a relatively high impurity concentration is formed at the storage node SN (/SN) side, whereas halo region DHE having a relatively low impurity concentration is formed at the ground interconnection VSS side.

In this way, as with the SRAM memory cell of the semiconductor device described in the first embodiment, both the read margin and the write margin can be increased. Further, high-speed operation can be attained during reading. Further, as compared with the semiconductor device according to the comparative example, the number of photolithography masks for forming halo regions can be reduced by one.

Second Example

Here, the following describes another exemplary semiconductor device having a 2-port SRAM memory cell including a read only port.

Figure 103:
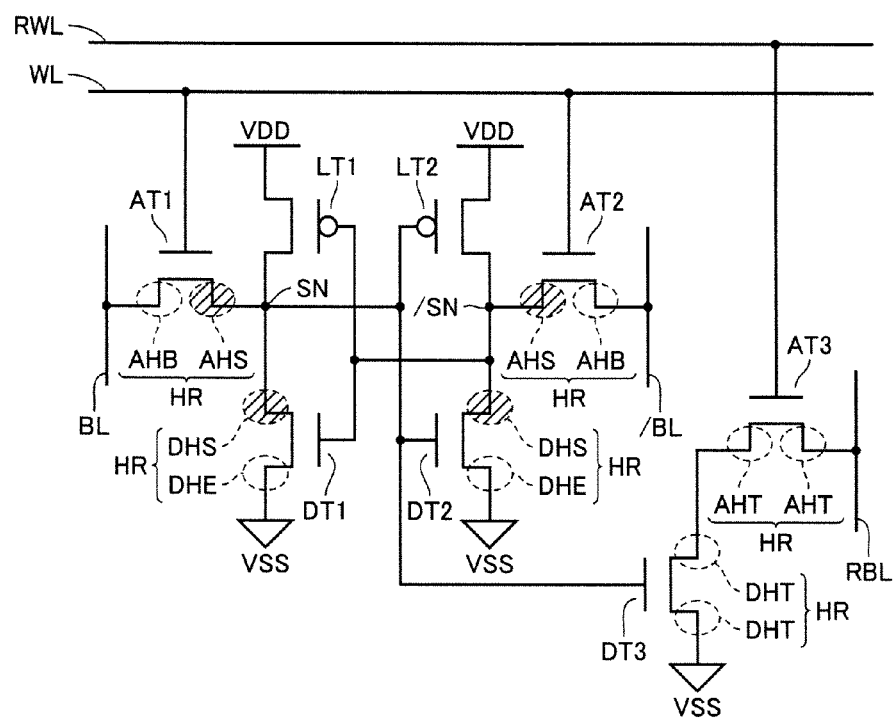
FIG. 103 shows an equivalent circuit of each SRAM memory cell of a semiconductor device in a second example of the eighth embodiment of the present invention.

Described first is an equivalent circuit of the SRAM memory cell. As shown in FIG. 103, a pair of halo regions AHT, AHT of access transistor AT3 and a pair of halo regions DHT, DHT of drive transistor DT3 are formed to have the same impurity concentration as the impurity concentration of halo region AHB of the pair of halo regions HR (halo regions AHS, AHB) of each of access transistors AT1, AT2. It should be noted that configurations apart from this are the same as those of the equivalent circuit of FIG. 97, and therefore the same members are given the same reference characters and are not described repeatedly.

The SRAM memory cell has the same structure as the semiconductor device according to the first example except that the impurity concentration of each of halo region AHT of access transistor AT3 and halo region DHT of drive transistor DT3 is the same as the impurity concentration of halo region AHB of each of access transistors AT1, AT2. Hence, description thereof is not repeated.

Figure 104:
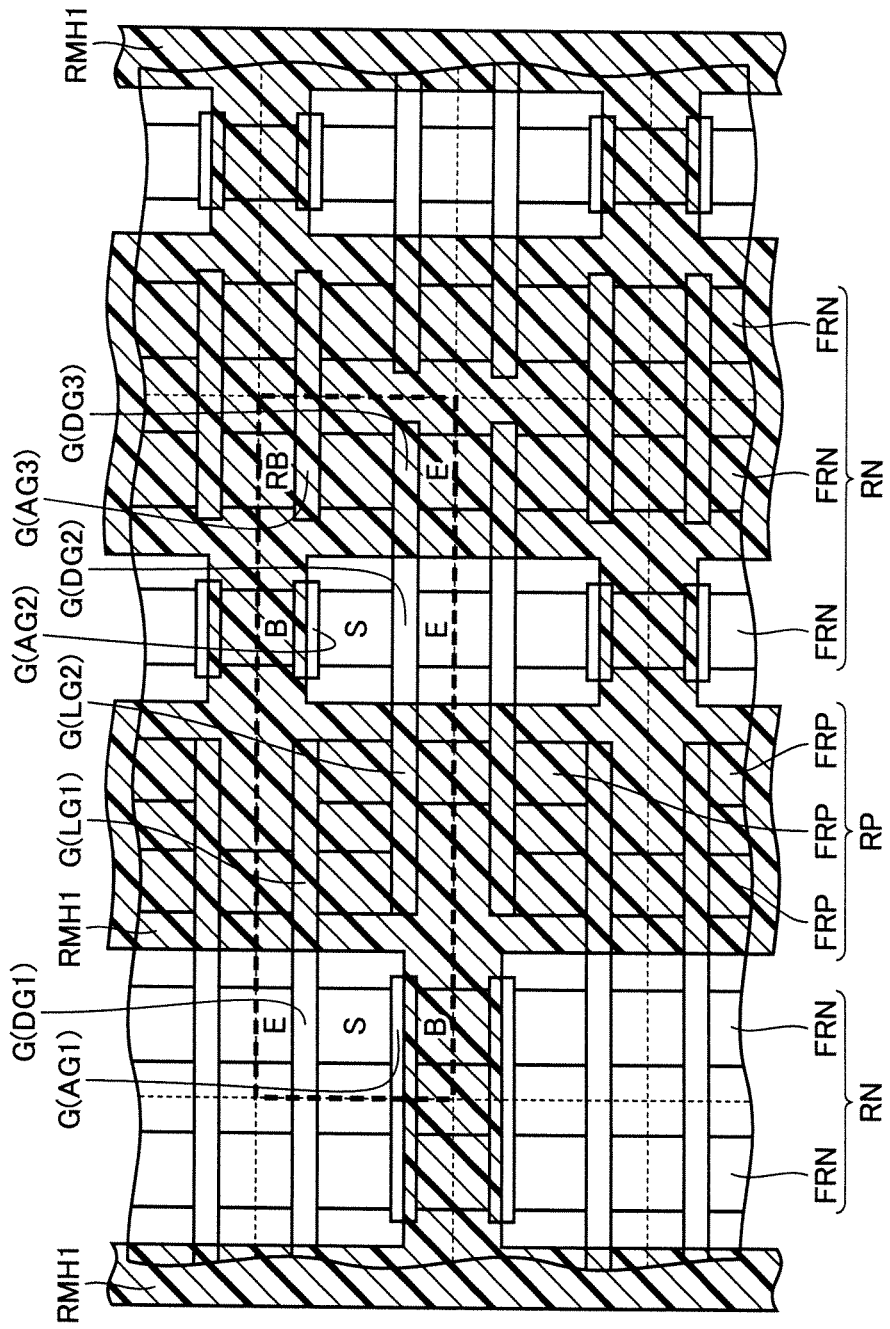
FIG. 104 is a plan view showing one step in a method for manufacturing the semiconductor device in the second example of the embodiment.

The following describes a method for manufacturing the above-described semiconductor device. As with the semiconductor device according to the first example, as shown in FIG. 104, after the formation of gate structure G, a predetermined photolithography process is performed to form a resist mask RMH1 that is to serve as an implantation mask for forming the halo regions (implantation mask A). Resist mask RMH1 is formed to expose: the side surface of gate structure G that is to serve as each of access gate electrodes AG1, AG2, the side surface being positioned at the side of region S in which the source-drain region electrically connected to the storage node is to be formed; region S; gate structure G that is to serve as each of drive gate electrodes DG1, DG2; and region E in which the source-drain region electrically connected to the ground interconnection is to be formed.

On the other hand, resist mask RMH1 is formed to cover: the side surface of gate structure G that is to serve as each of access gate electrodes AG1, AG2, the side surface being positioned at the side of region B in which the source-drain region electrically connected to the bit line is to be formed; and region B.

Further, resist mask RMH1 is formed to cover: gate structure G that is to serve as access gate electrode AG3; region RB in which the source-drain region electrically connected to the read bit line is to be formed; gate structure G that is to serve as each of drive gate electrodes DG3; region E in which the source-drain region electrically connected to the ground interconnection is to be formed; a portion of element formation region FRN interposed between gate structure G that is to serve as access gate electrode AG3 and gate structure G that is to serve as drive gate electrode DG3; and PMIS region RP.

Next, resist mask RMH1 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions of the p well. Next, the same resist mask RMH1 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation A). It should be noted that in this halo implantation A, the same amount of boron is implanted with the same implantation energy. Thereafter, resist mask RMH1 is removed.

Figure 105:
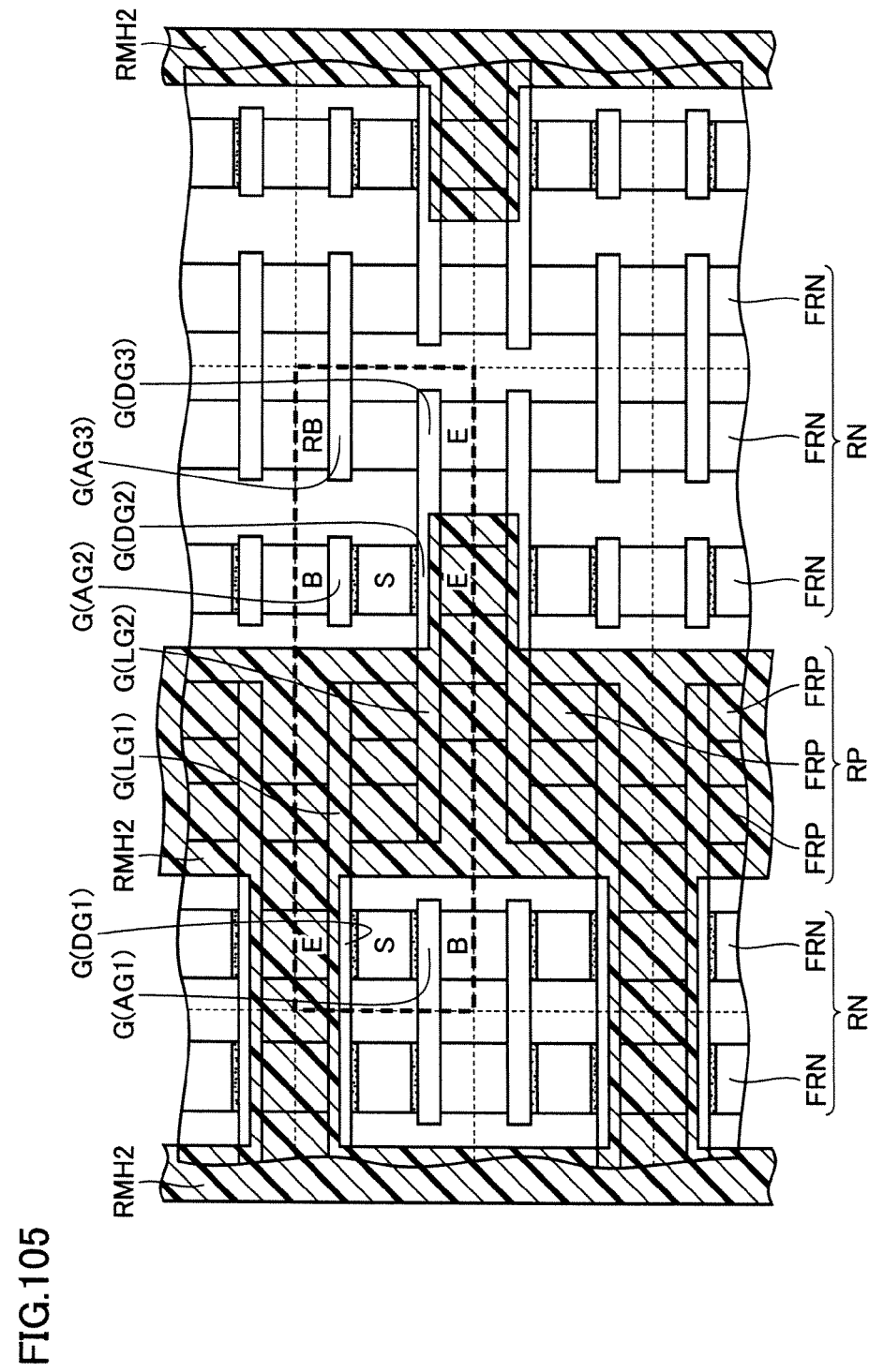
FIG. 105 is a plan view showing a step performed after the step shown in FIG. 104 in the embodiment.

Next, as shown in FIG. 105, a predetermined photolithography process is performed to form a resist mask RMH2 that is to serve as an implantation mask for forming the halo regions (implantation mask B). Resist mask RMH2 is formed to expose: gate structure G that is to serve as each of access gate electrodes AG1, AG2; region S in which the source-drain region electrically connected to the storage node is to be formed; region B in which the source-drain region electrically connected to the bit line is to be formed; and the side surface of gate structure G that is to serve as each of drive gate electrodes DG1, DG2, the side surface being positioned at the side of region S in which the source-drain region electrically connected to the storage node is to be formed.

Further, resist mask RMH2 is formed to expose: gate structure G that is to serve as access gate electrode AG3; region RB in which the source-drain region electrically connected to the read bit line is to be formed; gate structure G that is to serve as drive gate electrode DG3; region E in which the source-drain region electrically connected to the ground interconnection is to be formed; and a portion of element formation region FRN interposed between gate structure G that is to serve as access gate electrode AG3 and gate structure G that is to serve as drive gate electrode DG3.

On the other hand, resist mask RMH2 is formed to cover: the side surface of gate structure G that is to serve as each of drive gate electrodes DG1, DG2 the side surface being positioned at the side of region E in which the source-drain region electrically connected to the ground interconnection is to be formed; region E; and element formation region FRP.

Next, resist mask RMH2 is employed as an implantation mask to implant, for example, boron thereinto at an angle oblique to the direction perpendicular to the main surface of semiconductor substrate SUB, from one side substantially orthogonal to the direction in which gate structure G extends. In this way, p type impurity regions (not shown) are formed in the exposed regions. Next, the same resist mask RMH2 is employed as an implantation mask to implant boron thereinto at an angle oblique to the direction perpendicular to the main surface of semiconductor substrate SUB, from the other side opposite in direction to the one side substantially orthogonal to the direction in which gate structure G extends. In this way, p type impurity regions (not shown) are formed in the exposed regions of the p well (halo implantation B). It should be noted that in this halo implantation B, the same amount of boron is implanted with the same implantation energy.

Here, for halo implantation A and halo implantation B, implantation conditions are set such that the implantation amount in halo implantation B is more than the implantation amount in halo implantation A so as to attain a higher impurity concentration of the halo region (AHB) than the impurity concentration of the halo region (DHE). It should be noted that the implantation amounts in the halo implantations may be any implantation amounts such that the impurity concentration of the halo region (AHB) and the impurity concentration of the halo region (DHE) differ from each other. The implantation conditions may be set such that the implantation amount in halo implantation B is less than the implantation amount in halo implantation A.

Further, halo region AHT formed in access transistor AT3 and halo region DHT formed in drive transistor DG3 are formed by halo implantation B. The impurity concentration of each of halo regions AHT, DHT becomes the same as the impurity concentration of halo region AHB of each of access transistors AG1, AG2.

Figure 106:
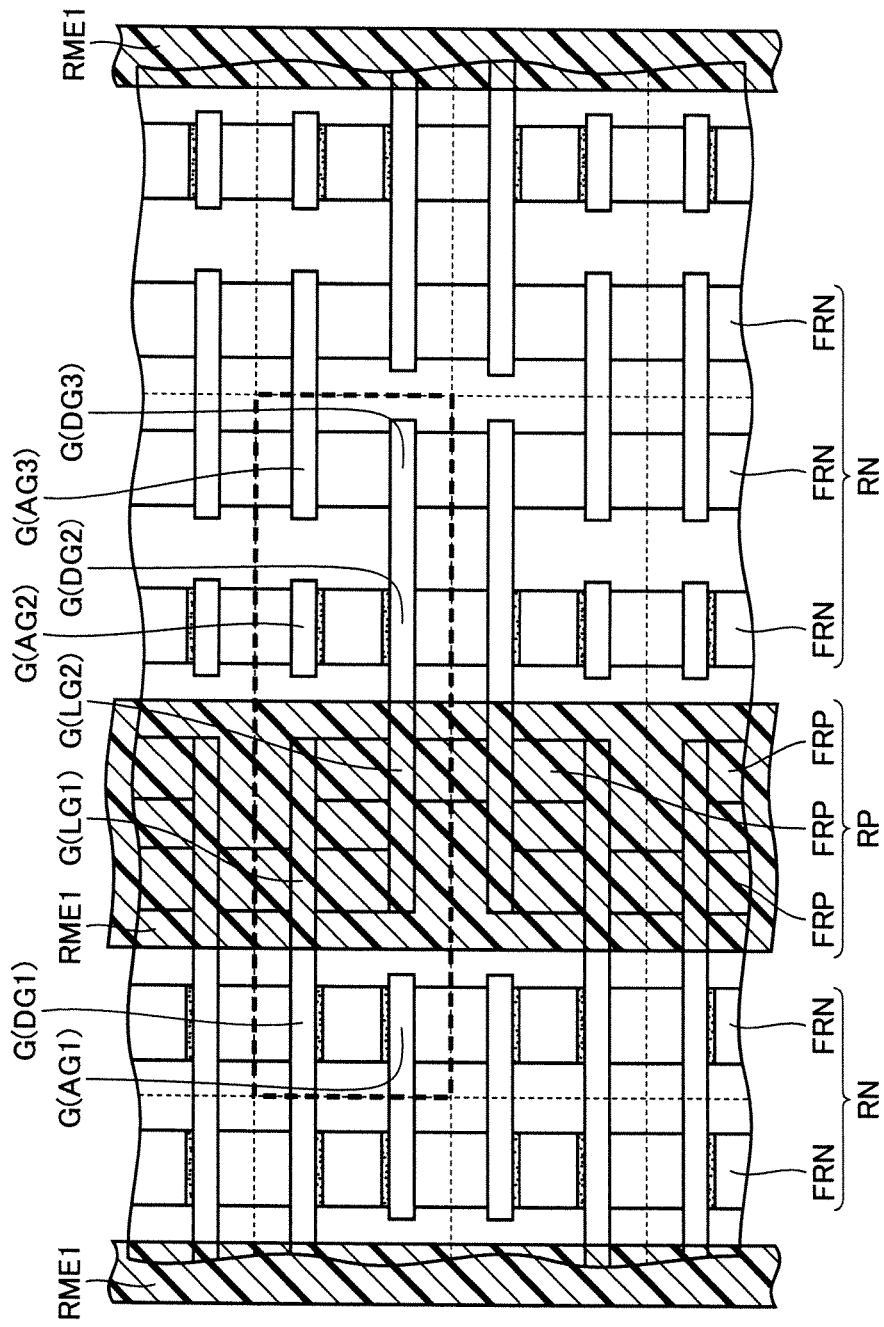
FIG. 106 is a plan view showing a step performed after the step shown in FIG. 105 in the embodiment.

Next, as shown in FIG. 106, a resist mask RME1 is formed to expose NMIS region RN and cover PMIS region RP (implantation mask C). Next, resist mask RME1 is employed as an implantation mask to implant, for example, phosphorus or arsenic into semiconductor substrate SUB in a direction perpendicular to the main surface of semiconductor substrate SUB, thereby forming extension region ER (not shown) up to a predetermined depth from the surface of the exposed region of p well PW (extension implantation). Thereafter, resist mask RME1 is removed. It should be noted that the extension implantation can be performed before halo implantation A and halo implantation B.

Next, a resist mask (not shown) is formed to cover NMIS region RN and expose PMIS region RP (implantation mask D). Next, in the same manner as the step of forming the p type impurity regions, which are to serve as the halo regions, in element formation regions FRN, the resist mask is employed as an implantation mask to implant phosphorus or arsenic into exposed semiconductor substrate SUB in the direction perpendicular to the main surface of semiconductor substrate SUB, thereby forming the halo regions (not shown) in element formation region FRP. Next, boron is implanted into semiconductor substrate SUB in the direction perpendicular to the main surface of semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection (see FIG. 99). Thereafter, the multilayer interconnection structure is formed on copper interconnection CW1, thus forming the main portion of the SRAM memory cell.

The semiconductor device including the above-described SRAM memory cell is provided with the read only port. The read only port is constructed of access transistor AT3 and drive transistor DT3, in which halo regions AHT, DHT are set to have impurity concentrations higher than the impurity concentration of halo region DHE. In this way, in the read operation by the read only port, leakage current from drive transistor DT3 can be suppressed during reading. Further, as with the SRAM memory cell of the semiconductor device according to the first example, both the read margin and the write margin can be increased. Further, high-speed operation can be attained during reading. Further, as compared with the semiconductor device according to the comparative example, the number of photolithography masks for forming halo regions can be reduced by one.

Ninth Embodiment

Figure 107:
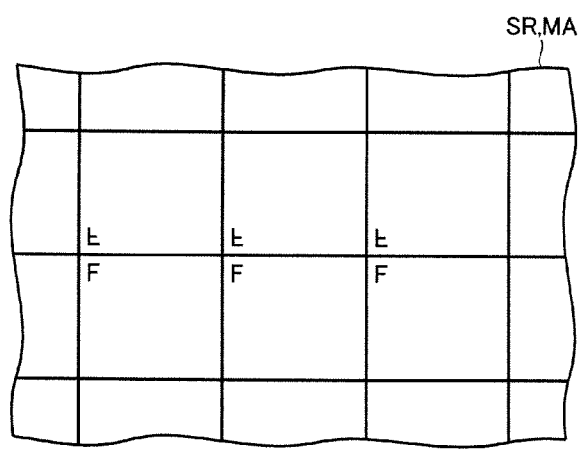
FIG. 107 shows a layout of SRAM memory cells of a semiconductor device in a ninth embodiment of the present invention.

Here, the following describes a semiconductor device including an SRAM memory cell called "vertical type cell". As shown in FIG. 107, SRAM memory cell SR (MA) has a plurality of memory cells arranged on a main surface of a semiconductor substrate in the form of a matrix including a plurality of rows and columns. The SRAM memory cells of the semiconductor device are formed in an arrangement pattern of mirror symmetry (X reversion) with respect to each other.

Figure 108:
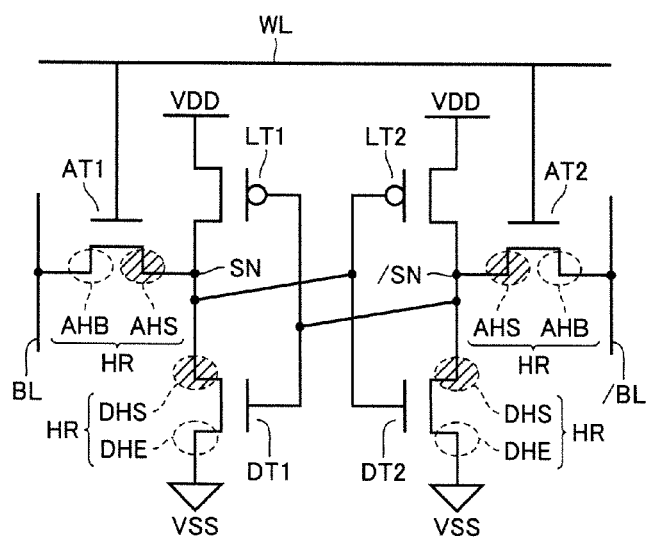
FIG. 108 shows an equivalent circuit of the SRAM memory cell in the embodiment.

The following describes an equivalent circuit of each of the SRAM memory cells. As shown in FIG. 108, the equivalent circuit of the SRAM memory cell is the same as the equivalent circuit shown in FIG. 3, so that the same members are given the same reference characters. A pair of halo regions HR are formed in each of access transistors AT1, AT2. Of the pair of halo regions HR, a halo region AHS, which is at the side connected to storage node SN or /SN, is set to have an impurity concentration higher than that of a halo region AHB, which is at the side connected to bit line BL or /BL. Likewise, a pair of halo regions HR are formed in each of drive transistors DT1, DT2. Of the pair of halo regions HR, a halo region DHS, which is at the side connected to storage node SN or /SN, is set to have an impurity concentration higher than that of a halo region DHE, which is at the side connected to ground interconnection VSS. Further, halo region DHE is set to have an impurity concentration lower than the impurity concentration of halo region AHB.

Figure 109:
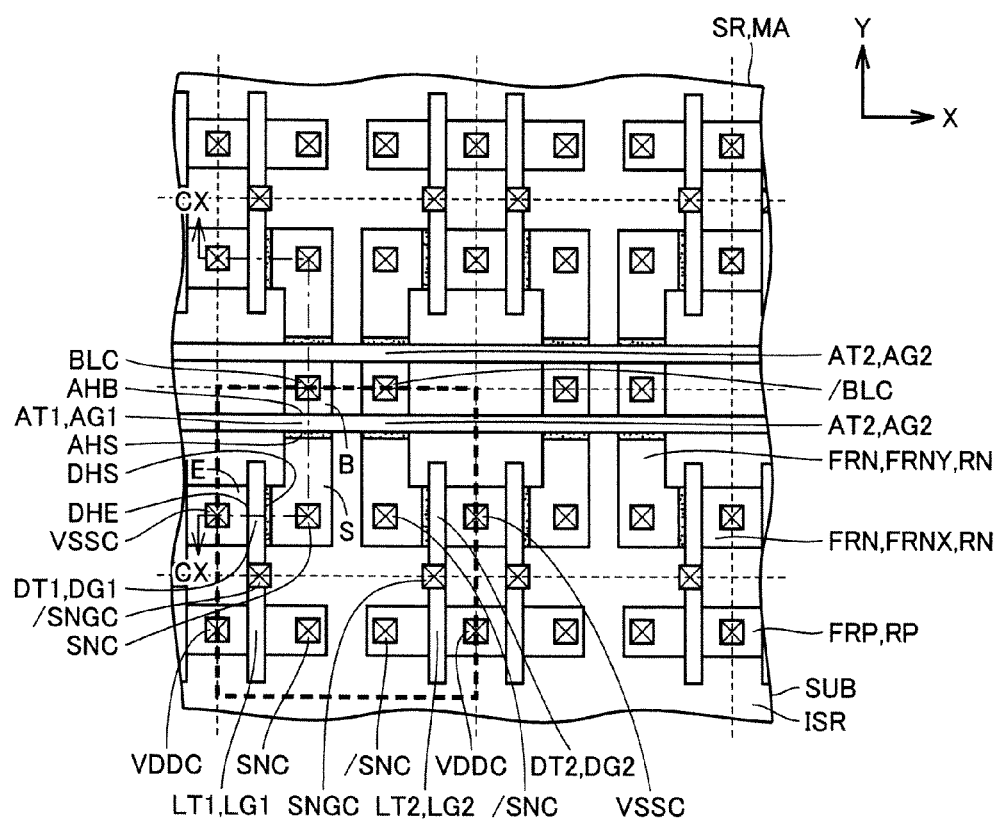
FIG. 109 is a plan view showing an arrangement pattern of the SRAM memory cells in the embodiment.

The following describes a structure of the SRAM memory cell. FIG. 109 is a plan view showing a layout of the transistors of the memory cells of the SRAM cell array, and contacts connected to the transistors. On the main surface of semiconductor substrate SUB, an element isolation region ISR is formed using an element isolation insulation film, thereby defining element formation regions FRN, FRP electrically disconnected from each other. Each of element formation regions FRN is provided with a portion (element formation region FRNX) extending in parallel with the X direction, and a portion (element formation region FRNY) extending in parallel with the Y direction.

In element formation regions FRN, access transistors AT1, AT2 and drive transistors DT1, DT2 are formed as n channel type MIS transistors. Each of access transistors AT1, AT2 is disposed in element formation region FRNY, and each of drive transistors DT1, DT2 is disposed in element formation region FRNX. Each of access gate electrodes AG1, AG2 of access transistors AT1, AT2 is formed to extend across element formation region FRNY in parallel with the X direction. Each of drive gate electrodes DG1, DG2 of drive transistors DT1, DT2 is formed to extend across element formation region FRNX in parallel with the Y direction.

Element formation region FRNY (FRN) having access transistor AT1 formed therein and element formation region FRNX (FRN) having drive transistor D1 formed therein are connected to each other. Element formation region FRNY (FRN) having access transistor AT2 formed therein and element formation region FRNX (FRN) having drive transistor D2 formed therein are connected to each other. Element formation regions FRN having access transistor AT1 and drive transistor D1 formed therein, and element formation regions FRN having access transistor AT2 and drive transistor D2 formed therein are electrically disconnected from each other by element isolation region ISR.

Each of element formation regions FRP extends in parallel with the X direction, and is spaced away from element formation region FRN (FRNX). In element formation regions FRP, load transistors LT1, LT2 are formed as p channel type MIS transistors. Load gate electrodes LG1, LG2 of load transistors LT1, LT2 are formed across element formation regions FRP so as to extend in parallel with the Y direction.

Figure 110:
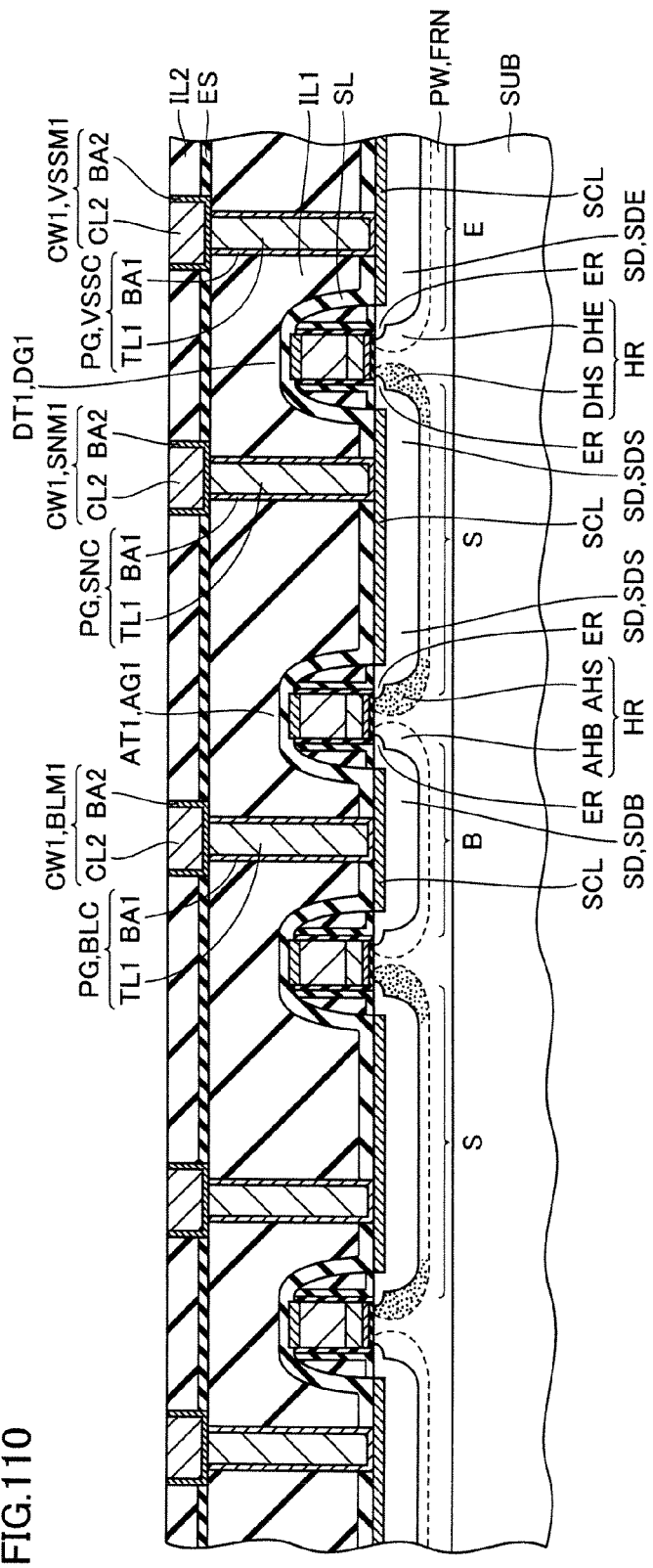
FIG. 110 is a cross sectional view taken along a cross sectional line CX-CX of FIG. 109 in the embodiment.

FIG. 110 is a cross sectional view taken along a cross sectional line CX-CX passing through the gate electrode of drive transistor DT1 and access transistor AT1. As shown in FIG. 110, access gate electrode AG1 of access transistor AT1 is formed above a region interposed between a region S and a region B. In region S, n type source-drain region SDS, which is electrically connected to the storage node (contact SNC), is formed. In region B, n type source-drain region SDB, which is electrically connected to the bit line (contact BLC), is formed.

In a region just below access gate electrode AG1, as p type halo regions HR, halo region AHS is formed adjacent to source-drain region SDS and halo region AHB is formed adjacent to source-drain region SDB.

On the other hand, drive gate electrode DG1 of drive transistor DT1 is formed above a region interposed between a region E and region S. In region E, n type source-drain region SDE, which is electrically connected to the ground interconnection (contact VSSC), is formed. In region S, n type source-drain region SDS, which is electrically connected to the storage node (contact SNC), is formed. In a region just below drive gate electrode DG1, as p type halo regions HR, halo region DHS is formed adjacent to source-drain region SDS and halo region DHE is formed adjacent to source-drain region SDE. It should be noted that the same members as those in the semiconductor device illustrated in FIG. 5 (first embodiment) are given the same reference characters and are not described repeatedly.

Figure 111:
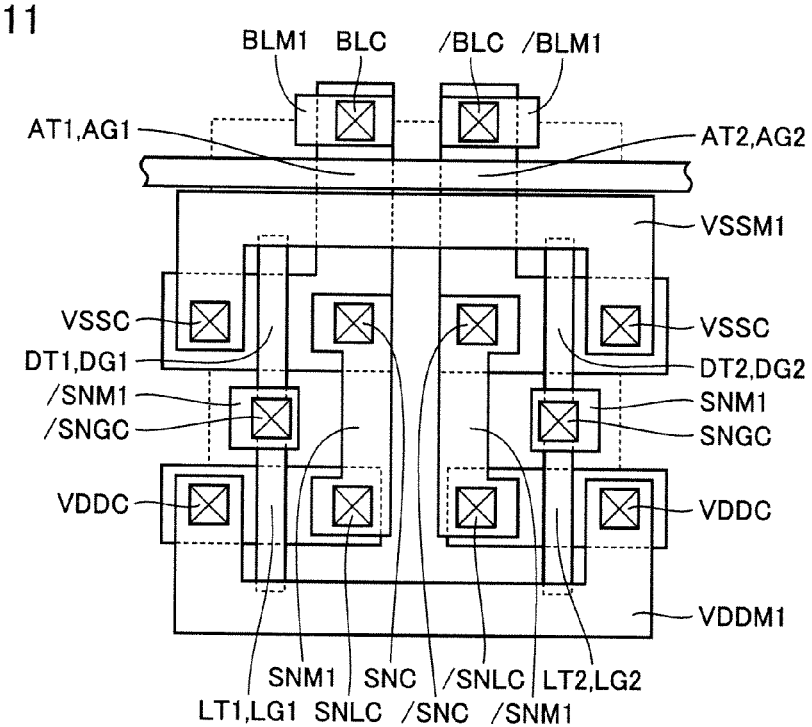
FIG. 111 is a plan view showing a structure of connection between each transistor and a first metal interconnection in the embodiment.
Figure 112:
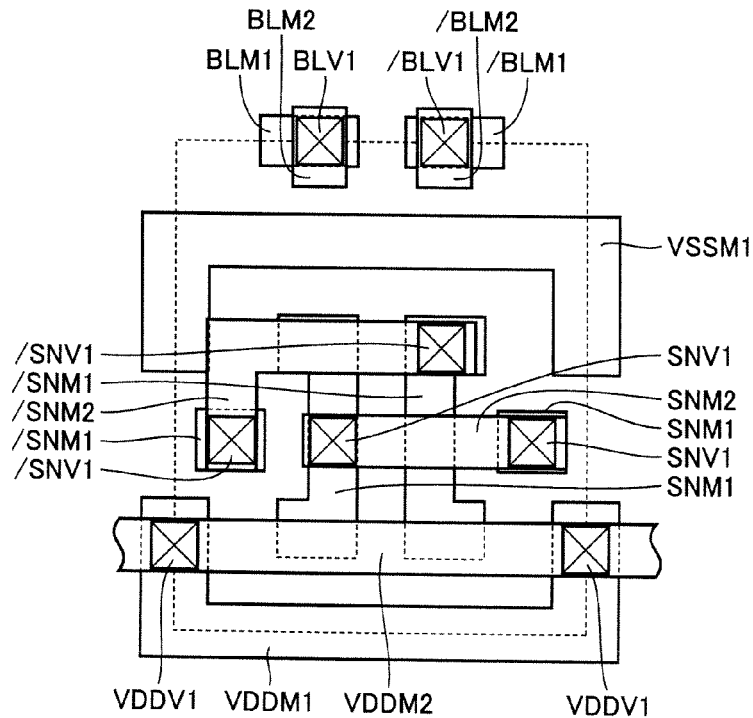
FIG. 112 is a plan view showing a structure of connection between the first metal interconnection and a second metal interconnection in the embodiment.
Figure 113:
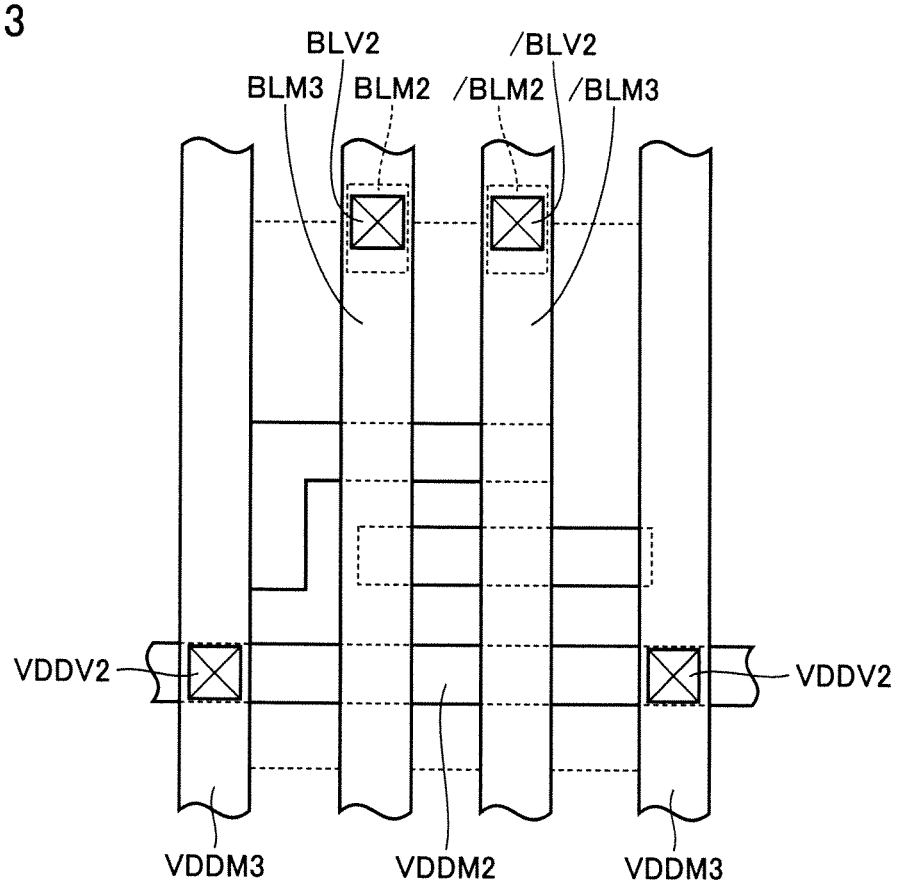
FIG. 113 is a plan view showing a structure of connection between the second metal interconnection and a third metal interconnection in the embodiment.

The following describes a multilayer interconnection structure that electrically connects the transistors. FIG. 111 is a plan view showing a structure of connection between each of the transistors and a first metal interconnection in one memory cell. FIG. 112 is a plan view showing a structure of connection between the first metal interconnection and a second metal interconnection. FIG. 113 is a plan view showing a structure of connection between the second metal interconnection and a third metal interconnection.

One (source-drain region SDB) of the pair of source-drain regions SD of access transistor AT1 is electrically connected to a third metal interconnection BLM3 serving as bit line BL, through contact plug BLC (plug PG), a first metal interconnection BLM1 (copper interconnection CW1), a via BLV1, a second metal interconnection BLM2, and a via BLV2.

The other of the pair of source-drain regions SD of access transistor AT1 (source-drain region SDS) is electrically connected to one of the pair of source-drain regions of load transistor LT1 through contact SNC (plug PG), a first metal interconnection SNM1 (copper interconnection CW1), and a contact SNLC. Further, source-drain region SDS of access transistor AT1 is electrically connected to load gate electrode LG2 of load transistor LT2 and drive gate electrode DG2 of drive transistor DT2 through first metal interconnection SNM1 (copper interconnection CW1), a via SNV1, a second metal interconnection SNM2, a via SNV1, first metal interconnection SNM1, and contact SNGC.

Further, source-drain region SDS of access transistor AT1 is electrically connected to one (source-drain region SDS) of the pair of source-drain regions of drive transistor DT1. Access gate electrode AG1 of access transistor AT1 is formed as a portion of word line WL.

The other (source-drain region SDE) of the pair of source-drain regions of drive transistor DT1 is electrically connected to a first metal interconnection VSSM1 (copper interconnection CW1) serving as the ground interconnection, through contact VSSC (plug PG). The other of the pair of source-drain regions of load transistor LT1 is electrically connected to a third metal interconnection VDDM3 serving as a power supply interconnection, through contact VDDC, a first metal interconnection VDDM1 (copper interconnection CW1), a via VDDV1, a second metal interconnection VDDM2, and a via VDDV2.

The one (source-drain region SDB) of the pair of source-drain regions SD of access transistor AT2 is electrically connected to a third metal interconnection /BLM3 serving as bit line /BL, through a contact plug /BLC (plug /PG), a first metal interconnection /BLM1 (copper interconnection CW1), a via /BLV1, a second metal interconnection /BLM2, and a via /BLV2.

The other (source-drain region SDS) of the pair of source-drain regions SD of access transistor AT2 is electrically connected to one of the pair of source-drain regions of load transistor LT2 through a contact /SNC (plug PG), a first metal interconnection /SNM1 (copper interconnection CW1), and a contact /SNLC. Further, source-drain region SDS of access transistor AT2 is electrically connected to load gate electrode LG1 of load transistor LT1 and drive gate electrode DG1 of drive transistor DT1, through a first metal interconnection /SNM1 (copper interconnection CW1), a via /SNV1, a second metal interconnection /SNM2, a via /SNV1, a first metal interconnection /SNM1, and a contact /SNGC.

Further, source-drain region SDS of access transistor AT2 is electrically connected to one (source-drain region SDS) of the pair of source-drain regions of drive transistor DT2. Access gate electrode AG2 of access transistor AT2 is formed as a portion of word line WL.

The other (source-drain region SDE) of the pair of source-drain regions of drive transistor DT2 is electrically connected to first metal interconnection VSSM1 (copper interconnection CW1) serving as the ground interconnection, through contact VSSC (plug PG). The other of the pair of source-drain regions of load transistor LT2 is electrically connected to third metal interconnection VDDM3 serving as the power supply interconnection, through contact VDDC, first metal interconnection VDDM1 (copper interconnection CW1), via VDDV1, second metal interconnection VDDM2, and via VDDV2.

Figure 114:
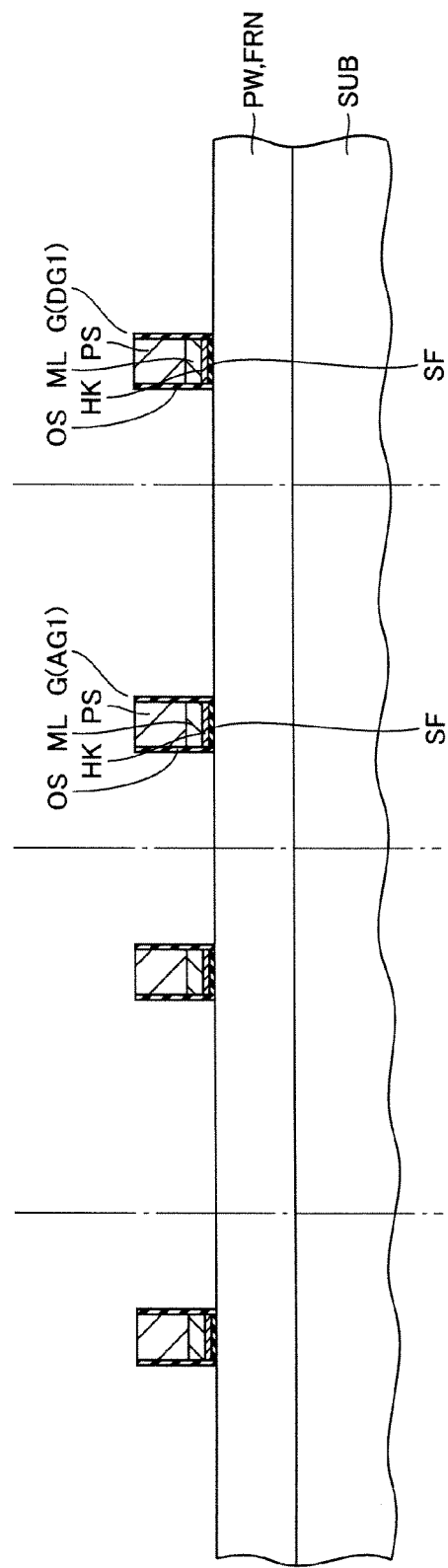
FIG. 114 is a cross sectional view showing one step in a method for manufacturing the semiconductor device in the embodiment.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from one another (see FIG. 109). Next, as shown in FIG. 114, a p well PW is formed in element formation region FRN. Next, a High-k film HK having a predetermined dielectric constant, a metal film ML having a predetermined work function, and a polysilicon film PS are laminated on the surface of semiconductor substrate SUB with an interlayer SF being interposed therebetween, thereby forming a gate structure G to serve as access gate electrode AG1 and a gate structure G to serve as drive gate electrode DG1. Next, a silicon nitride film (not shown) is formed on semiconductor substrate SUB to cover each of gate structures G, for example. Next, the silicon nitride film is anisotropically etched to form offset spacers OS on both the side surfaces of each gate structure G.

Figure 115:
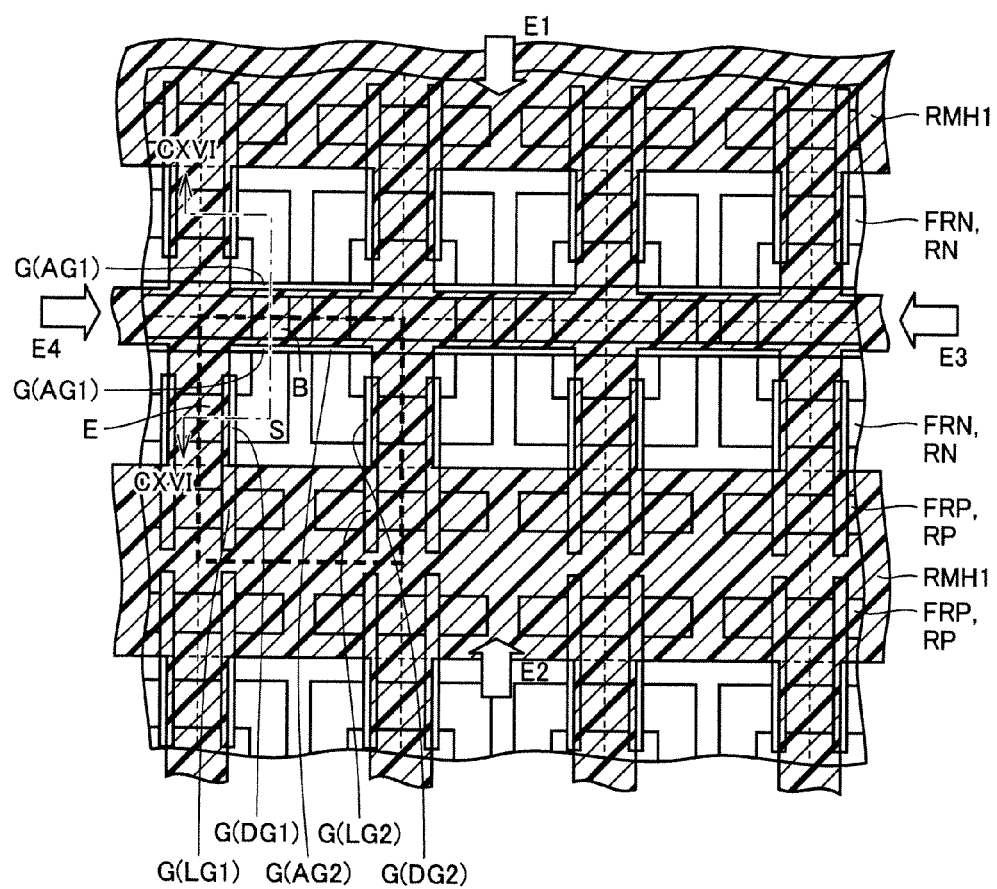
FIG. 115 is a plan view showing a step performed after the step shown in FIG. 114 in the embodiment.

Next, as shown in FIG. 115, a predetermined photolithography process is performed to form a resist mask RMH1 that is to serve as an implantation mask for forming the halo regions (implantation mask A). Resist mask RMH1 is formed to have an opening pattern exposing: the side surface of gate structure G that is to serve as each of access gate electrodes AG1, AG2, the side surface being positioned at the side of region S in which the source-drain region electrically connected to the storage node is to be formed; region S; and the side surface of gate structure G that is to serve as each of drive gate electrodes DG1, DG2, the side surface being positioned at region S side.

Meanwhile, resist mask RMH1 is formed to cover: the side surface of gate structure G that is to serve as each of access gate electrodes AG1, AG2, the side surface being positioned at the side of region B in which the source-drain region electrically connected to the bit line is to be formed; region B; the side surface of gate structure G that is to serve as each of drive gate electrodes DG1, DG2, the side surface being positioned at region E in which the source-drain region electrically connected to the ground interconnection is to be formed; region E; and second element formation region PRP.

Figure 116:
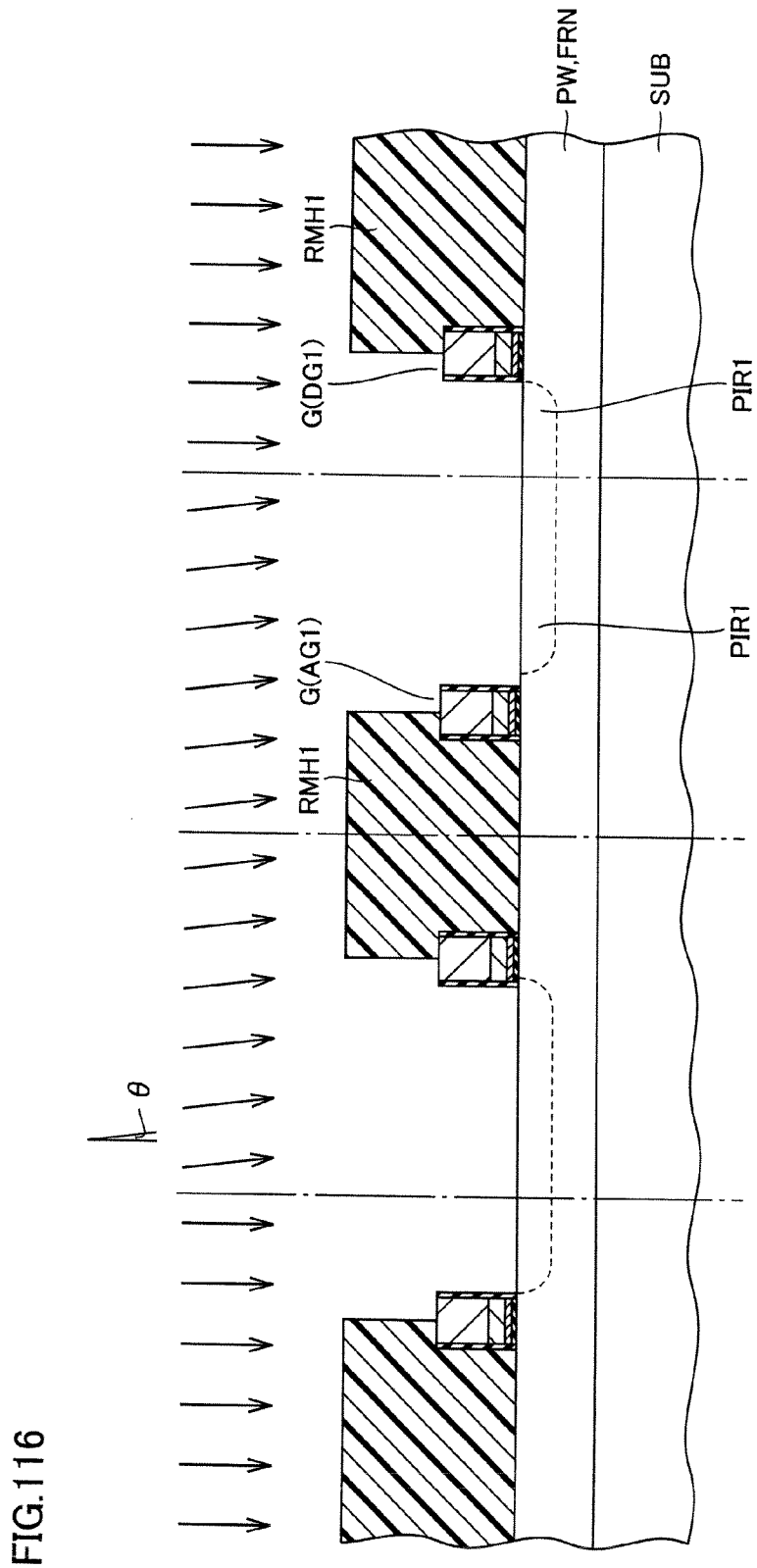
FIG. 116 is a cross sectional view showing a step performed after the step shown in FIG. 115 in the embodiment, and taken along a cross sectional line corresponding to a cross sectional line CXVI-CXVI shown in FIG. 115.

Next, resist mask RMH1 is employed as an implantation mask to implant boron in a predetermined direction (halo implantation A). First, as shown in FIG. 116, resist mask RMH1 is employed as an implantation mask to implant boron thereinto in a direction E1 (see FIG. 115) at an angle oblique ($\theta$=about 7°) to the direction perpendicular to the main surface of semiconductor substrate SUB. In this way, p type impurity regions PIR1 are formed in the exposed regions of p well PW.

Figure 117:
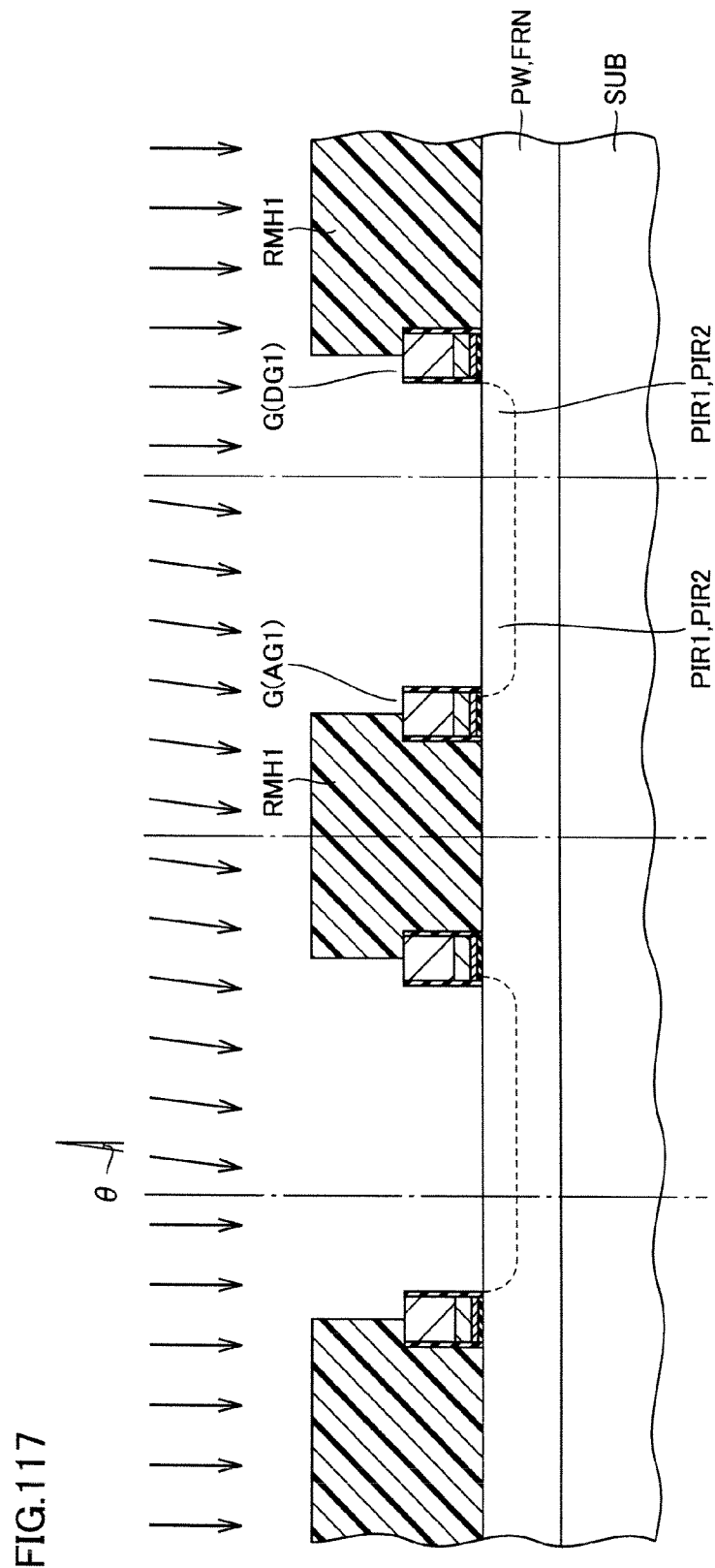
FIG. 117 is a cross sectional view showing a step performed after the step shown in FIG. 116 in the embodiment, and taken along a cross sectional line corresponding to a cross sectional line CXVI-CXVI shown in FIG. 115.

Next, as shown in FIG. 117, resist mask RMH1 is employed as an implantation mask to implant boron thereinto in a direction E2 (see FIG. 115) at an angle oblique ($\theta$=about 7°) to the direction perpendicular to the main surface of semiconductor substrate SUB. In this way, p type impurity regions PIR2 are formed in the exposed regions of p well PW.

Figure 118:
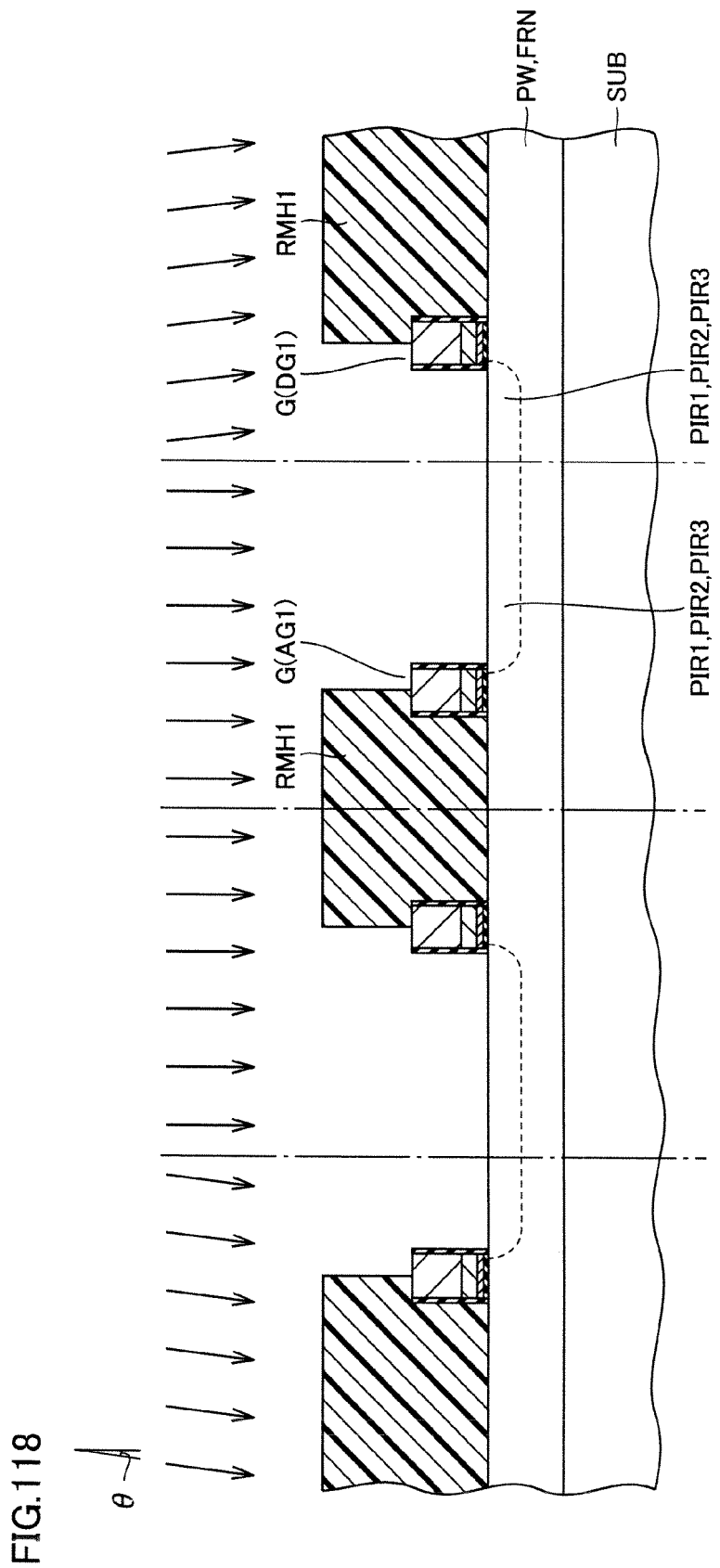
FIG. 118 is a cross sectional view showing a step performed after the step shown in FIG. 117 in the embodiment, and taken along a cross sectional line corresponding to cross sectional line CXVI-CXVI shown in FIG. 115.

Next, as shown in FIG. 118, resist mask RMH1 is employed as an implantation mask to implant boron thereinto in a direction E3 (see FIG. 115) at an angle oblique ($\theta$=about 7°) to the direction perpendicular to the main surface of semiconductor substrate SUB. In this way, p type impurity regions PIR3 are formed in the exposed regions of p well PW.

Figure 119:
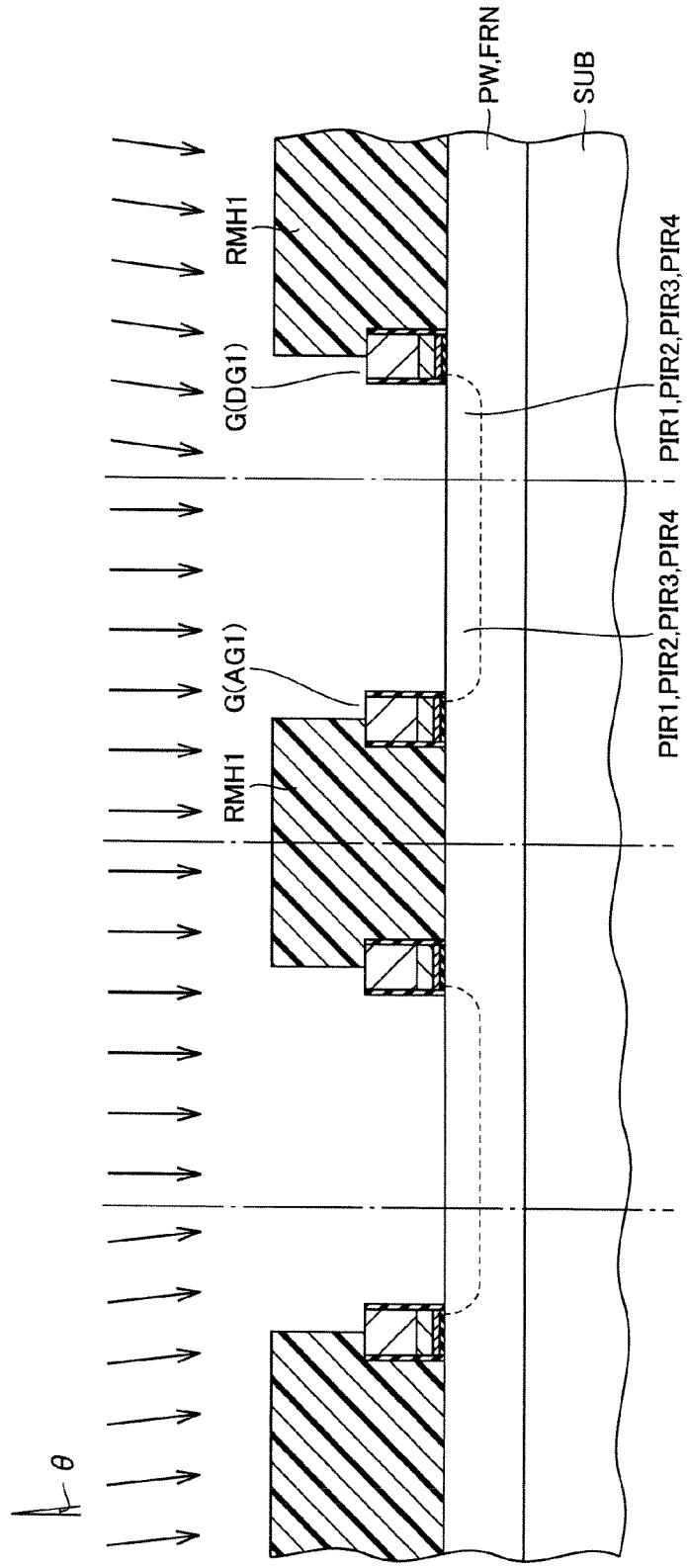
FIG. 119 is a cross sectional view showing a step performed after the step shown in FIG. 118 in the embodiment, and taken along a cross sectional line corresponding to cross sectional line CXVI-CXVI shown in FIG. 115.

Next, as shown in FIG. 119, resist mask RMH1 is employed as an implantation mask to implant boron thereinto in a direction E4 (see FIG. 115) at an angle oblique ($\theta$=about 7°) to the direction perpendicular to the main surface of semiconductor substrate SUB. In this way, p type impurity regions PIR4 are formed in the exposed regions of p well PW. Thereafter, resist mask RMH1 is removed.

Figure 120:
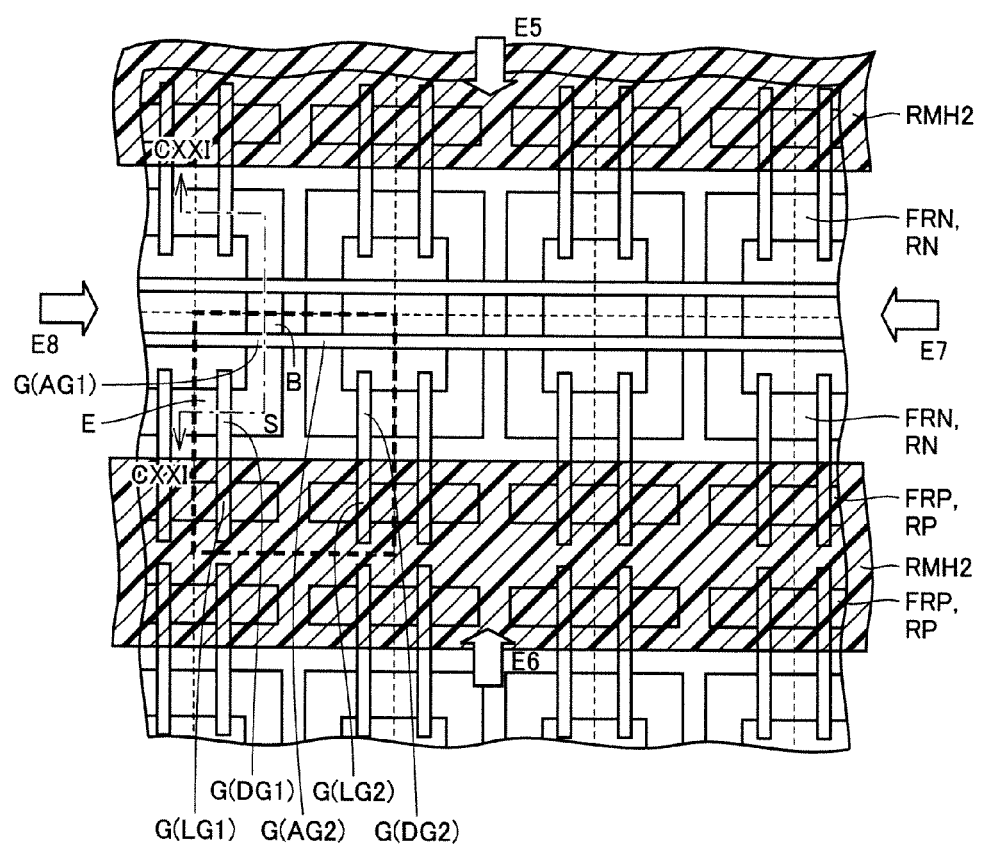

Next, as shown in FIG. 120, a predetermined photolithography process is performed to form a resist mask RMH2 that is to serve as an implantation mask for forming the halo regions (implantation mask B). Resist mask RMH2 is formed to expose NMIS region RN and cover PMIS region RP.

Figure 121:
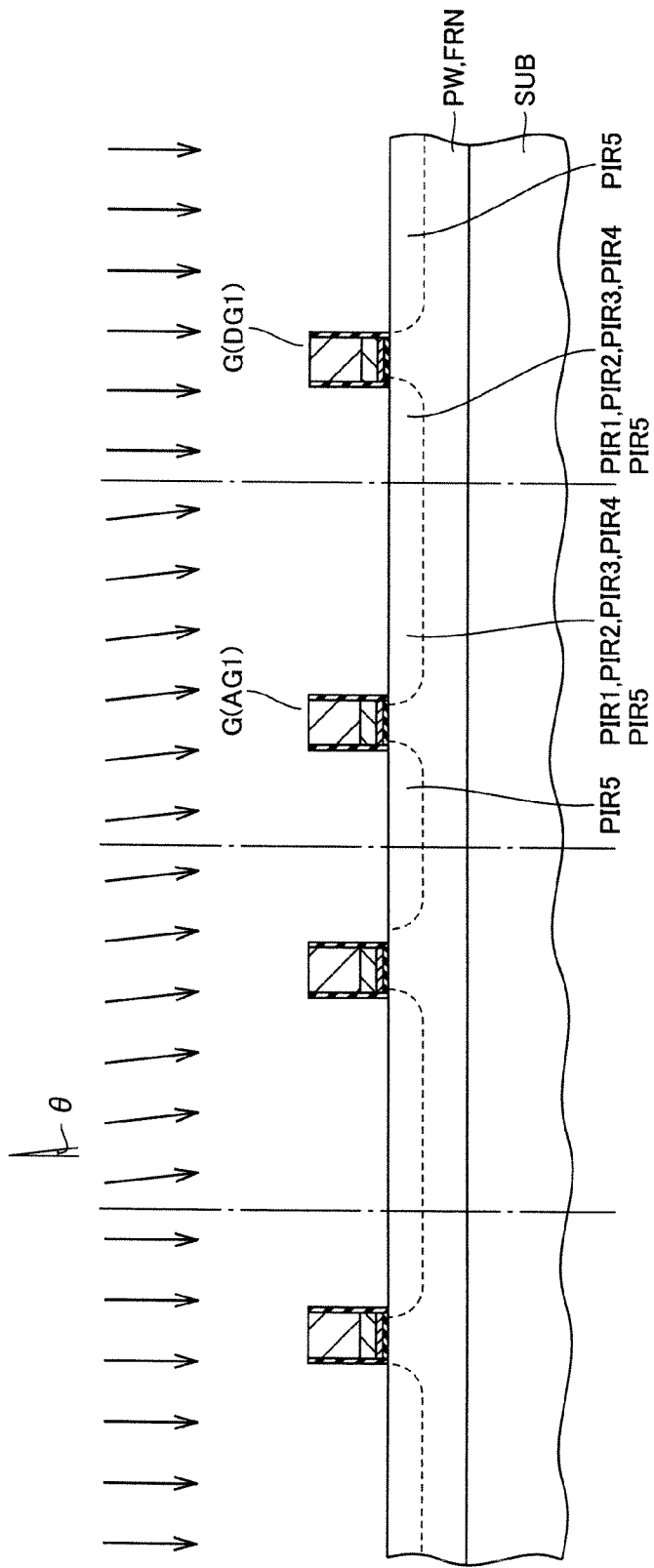

Next, resist mask RMH2 is employed as an implantation mask to implant boron in a predetermined direction (halo implantation B). First, as shown in FIG. 121, resist mask RMH2 is employed as an implantation mask to implant boron thereinto in a direction E5 (see FIG. 120) at an angle oblique ($\theta$=about 7°) to the direction perpendicular to the main surface of semiconductor substrate SUB. In this way, p type impurity regions PIR5 are formed in the exposed regions of p well PW.

Figure 122:
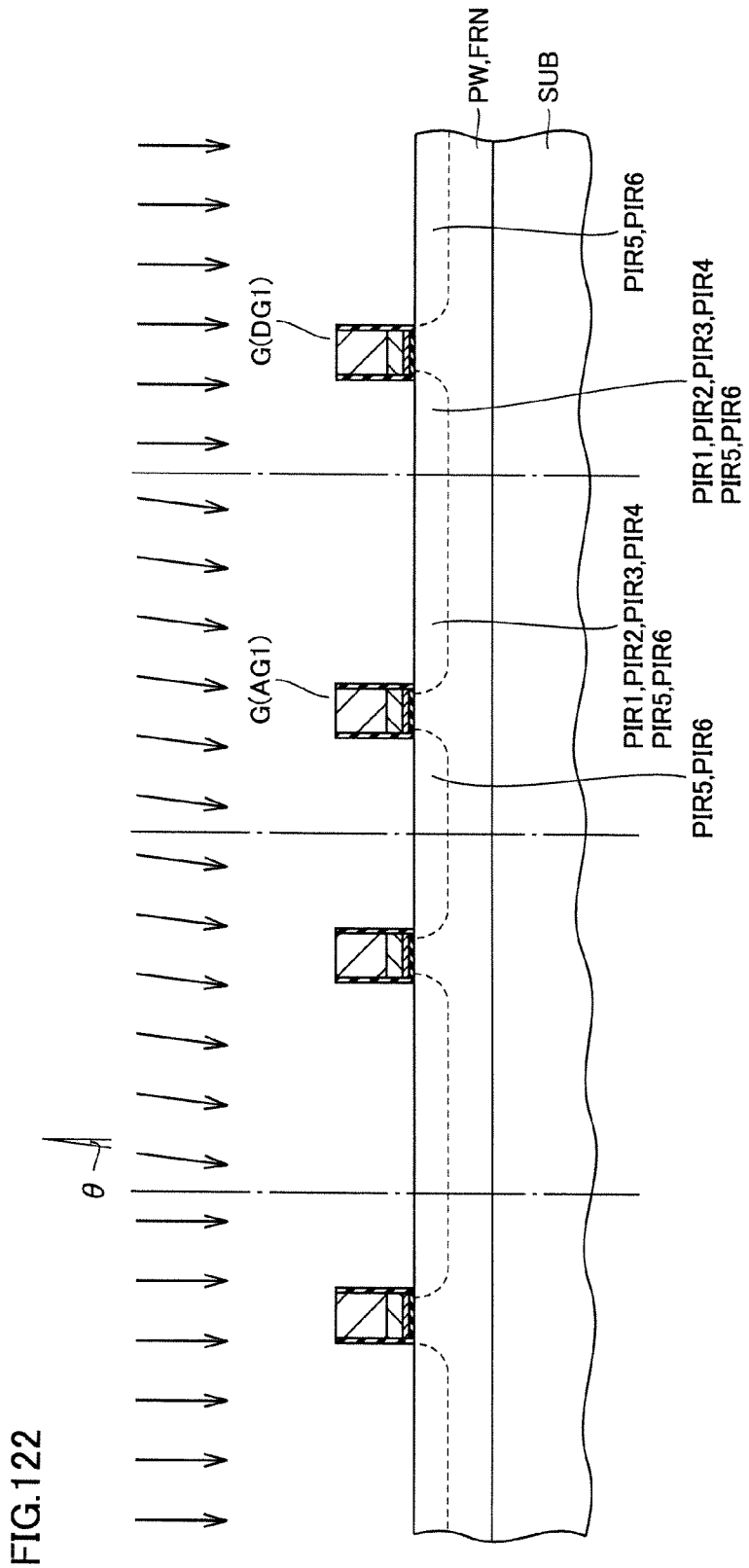

Next, as shown in FIG. 122, resist mask RMH2 is employed as an implantation mask to implant boron thereinto in a direction E6 (see FIG. 120) at an angle oblique ($\theta$=about 7°) to the direction perpendicular to the main surface of semiconductor substrate SUB. In this way, p type impurity regions PIR6 are formed in the exposed regions of p well PW.

Figure 123:
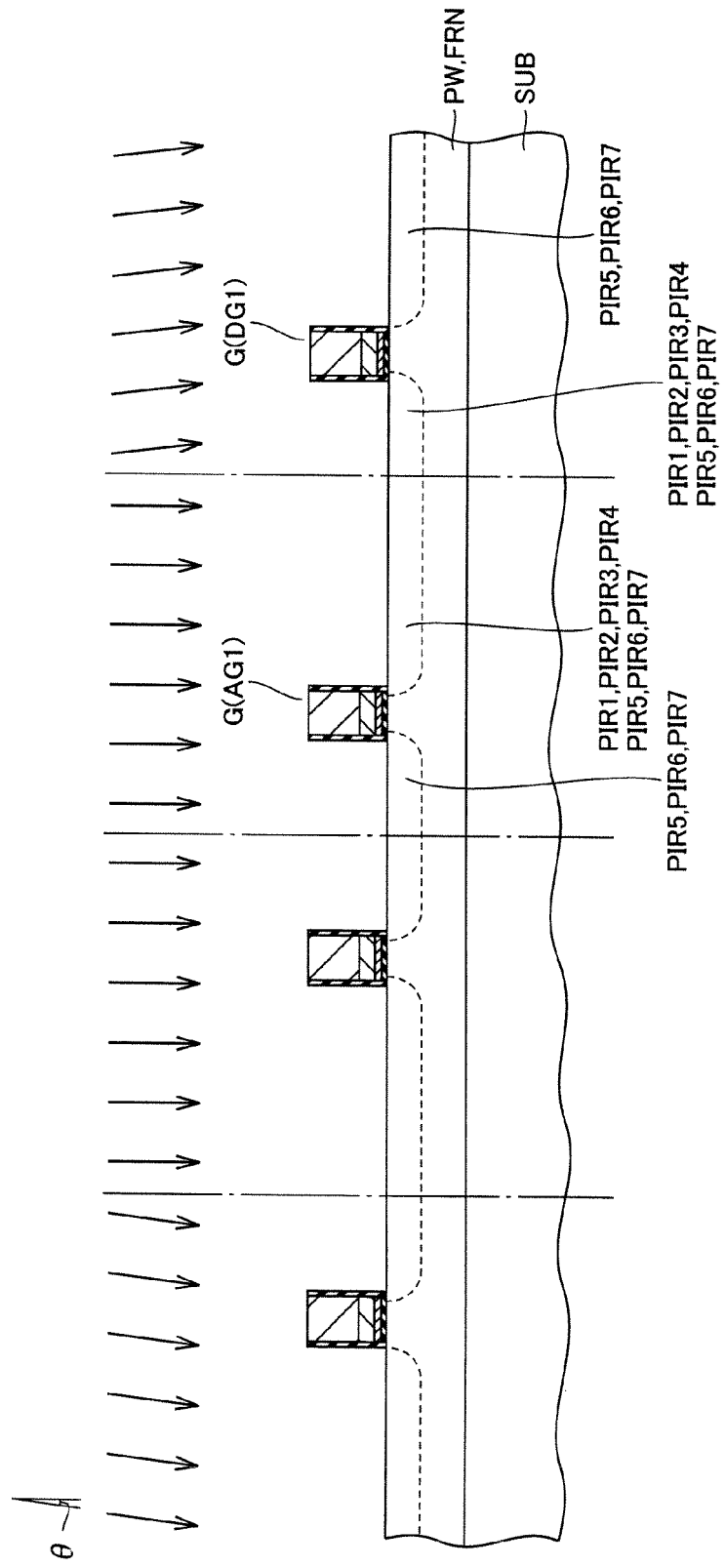

Next, as shown in FIG. 123, resist mask RMH2 is employed as an implantation mask to implant boron thereinto in a direction E7 (see FIG. 120) at an angle oblique ($\theta$=about 7°) to the direction perpendicular to the main surface of semiconductor substrate SUB. In this way, p type impurity regions PIR7 are formed in the exposed regions of p well PW.

Figure 124:
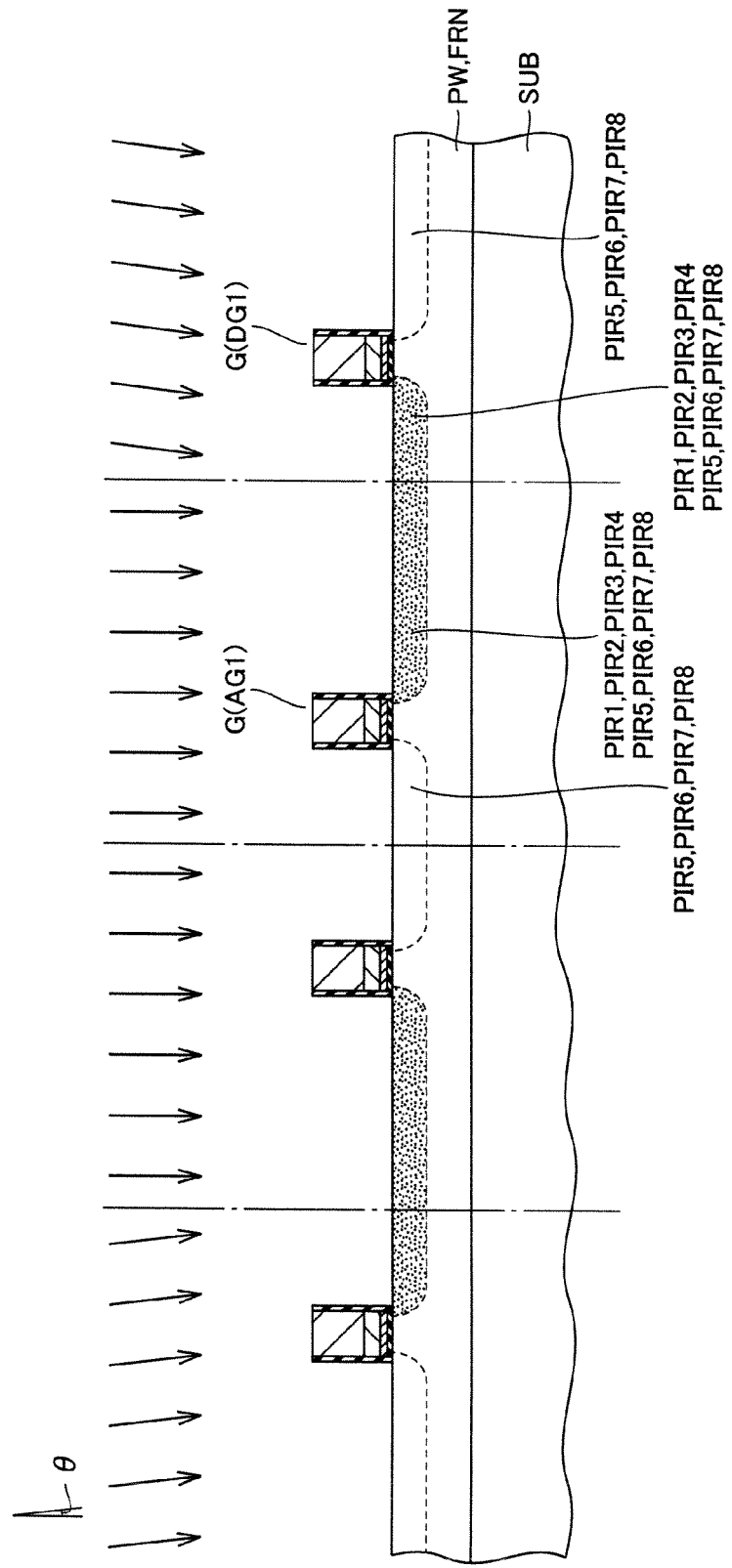

Next, as shown in FIG. 124, resist mask RMH2 is employed as an implantation mask to implant boron thereinto in a direction E8 (see FIG. 120) at an angle oblique ($\theta$=about 7°) to the direction perpendicular to the main surface of semiconductor substrate SUB. In this way, p type impurity regions PIR8 are formed in the exposed regions of p well PW. Portions of p type impurity regions PIR1, PIR2, PIR3, PIR4, PIR5, PIR6, PIR7, PIR8 thus formed will become the halo regions.

Here, the following describes the implantation conditions of the halo implantations. In halo implantation A, the implantations in direction E1 and direction E2 are performed under the same implantation condition (implantation condition A). The implantations in direction E3 and direction E4 are performed under the same implantation condition (implantation condition B). In halo implantation B, the implantations in direction E5 and direction E6 are performed under the same implantation condition (implantation condition C). The implantations in direction E7 and direction E8 are performed under the same implantation condition (implantation condition D).

Halo region AHS of each of access transistors ATE AT2 is formed by the implantation in direction E2 (implantation condition A) and the implantation in direction E6 (implantation condition C). Halo region AHB is formed by the implantation in direction E5 (implantation conditions C). Meanwhile, halo region DHS of each of drive transistors DT1, DT2 is formed by the implantation in direction E3 (implantation condition B) and the implantation in direction E7 (implantation condition D). Halo region DHB is formed by the implantation in direction E8 (implantation conditions D).

In the present semiconductor device, implantation conditions A to D are set such that the impurity concentration of halo region AHS becomes higher than the impurity concentration of halo region AHB, the impurity concentration of halo region DHS becomes higher than the impurity concentration of halo region DHE, the impurity concentration of halo region AHS and the impurity concentration of halo region DHS become the same, and the impurity concentration of halo region DHE becomes lower than the impurity concentration of halo region AHB.

Figure 125:
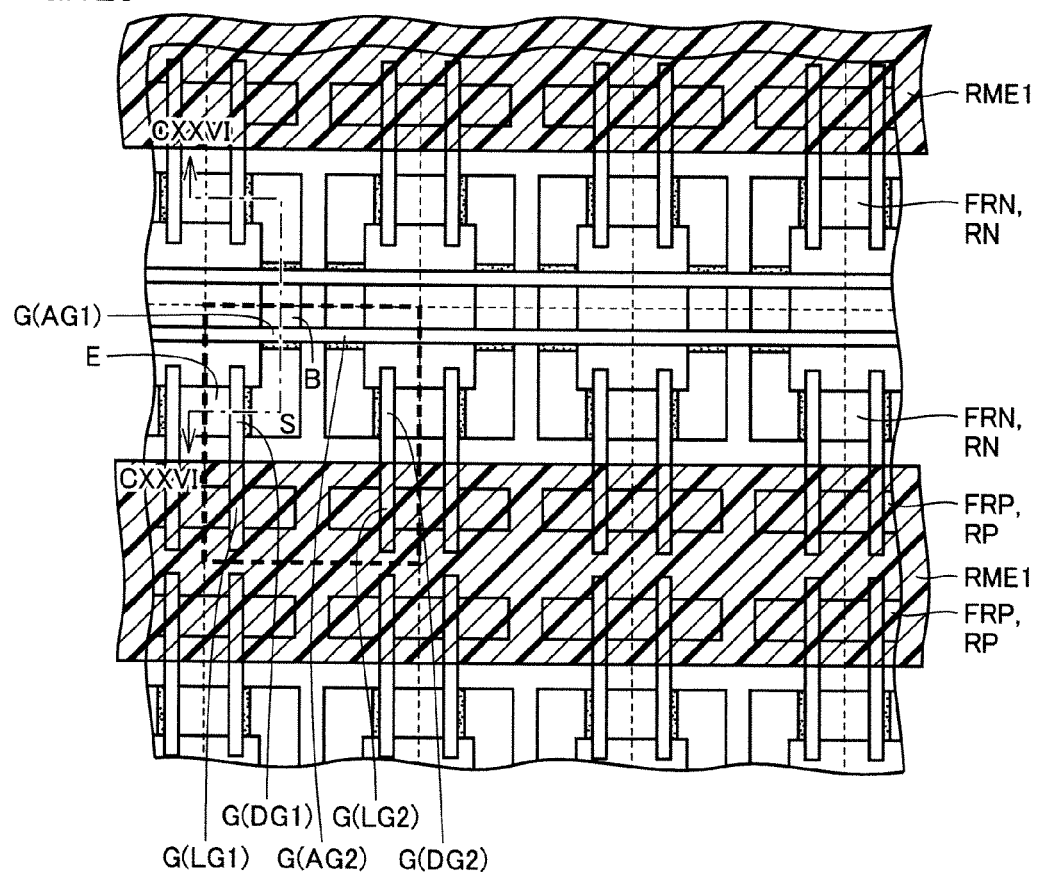
Figure 126:
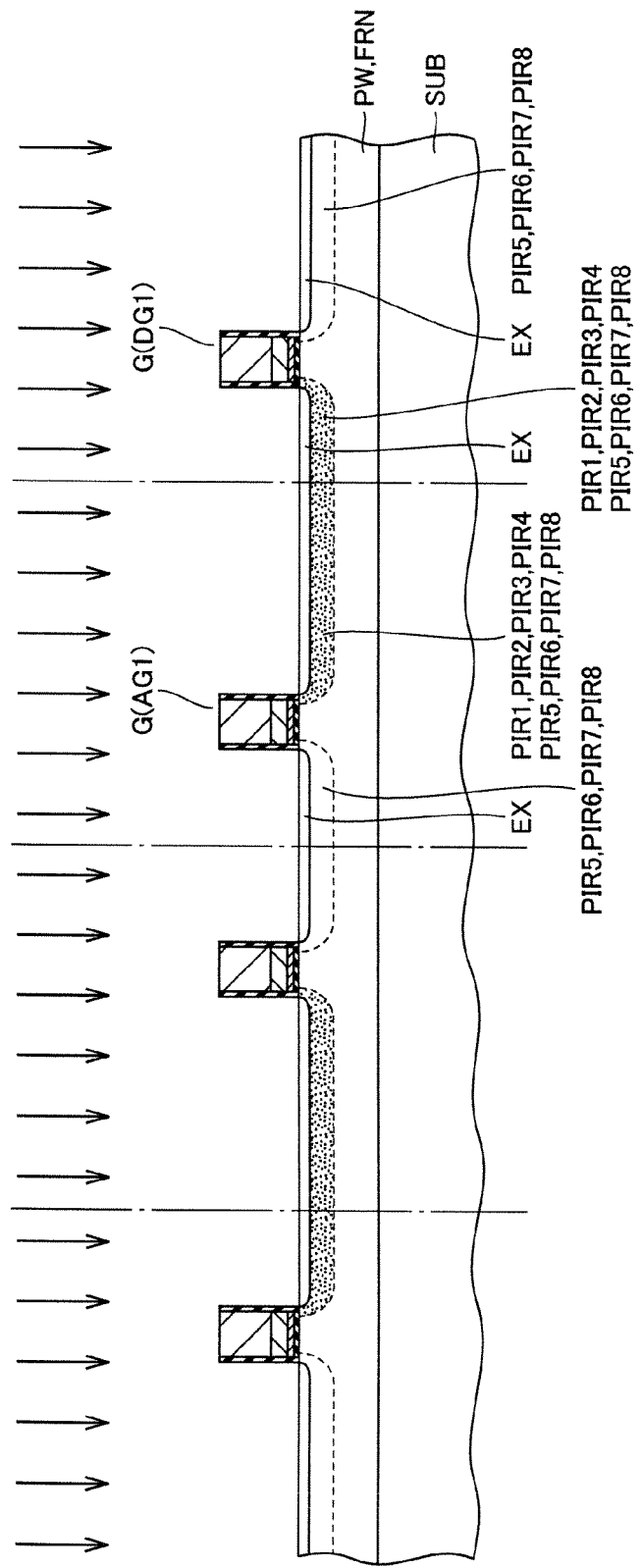

Next, as shown in FIG. 125, without removing resist mask REMH2, resist mask RMH2 (resist mask RME1) is employed as an implantation mask (implantation mask B) to implant phosphorus or the like (extension implantation). As shown in FIG. 126, resist mask RME1 is employed as an implantation mask to implant, for example, phosphorus or arsenic into semiconductor substrate SUB in a direction perpendicular to the main surface of semiconductor substrate SUB, thereby forming extension region ER up to a predetermined depth from the surface of the exposed region of p well PW. Thereafter, resist mask RME1 is removed.

Figure 127:
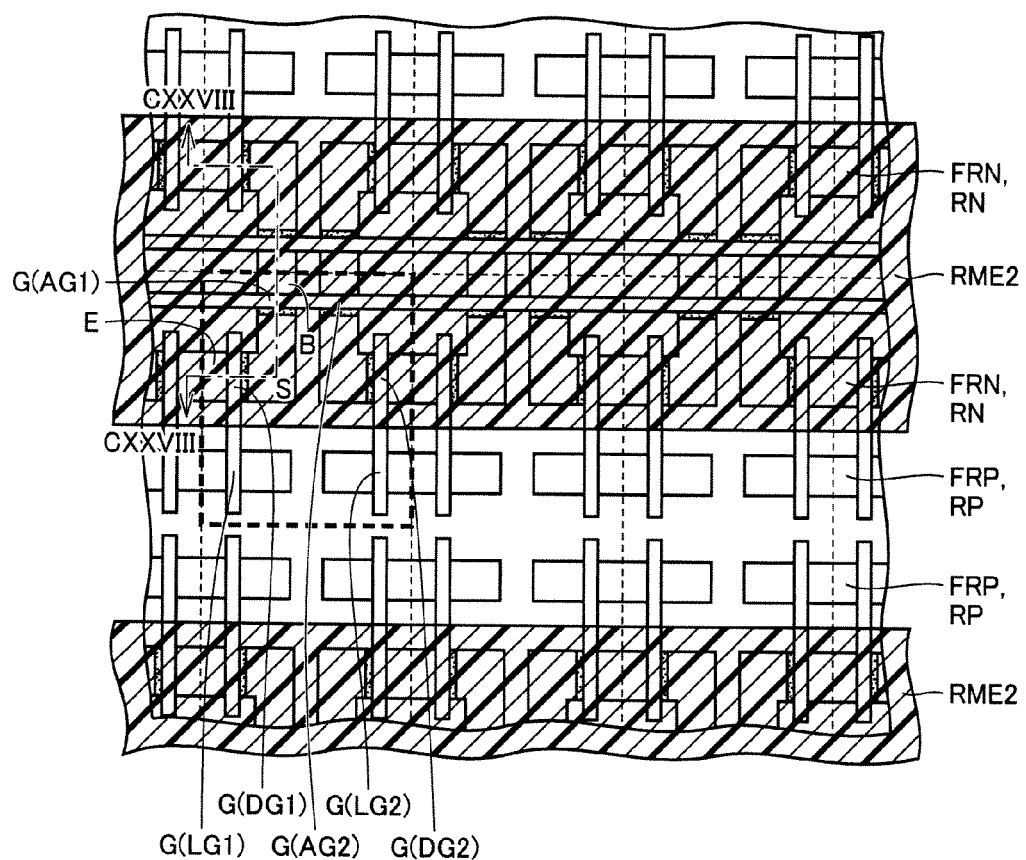

Next, as shown in FIG. 127, a resist mask RME2 is formed to cover NMIS region RN and expose PMIS region RP (implantation mask C). Next, resist mask RME2 is employed as an implantation mask to implant phosphorus or arsenic into semiconductor substrate SUB, thereby forming the halo regions (not shown) in element formation region RP. Next, boron is implanted into semiconductor substrate SUB, thereby forming the extension region (not shown). Thereafter, resist mask RME2 is removed.

Next, in order to cover each of gate structures G (access gate electrode AG1, drive gate electrode DG1, and the like), a silicon oxide film and a silicon nitride film (not shown) are sequentially formed, for example. Next, the silicon oxide film and the silicon nitride film are anisotropically etched, thereby forming side wall spacers SW on the side surfaces of gate structure G (see FIG. 128). Each of side wall spacers SW includes a silicon oxide film SO and a silicon nitride film SNI.

Next, a resist mask (not shown) is formed to expose NMIS region RN and cover PMIS region RP. Next, the resist mask and side wall spacers SW are employed as an implantation mask to implant phosphorus or arsenic into semiconductor substrate SUB, thereby forming source-drain region SD (see FIG. 128) up to a predetermined depth from the exposed surface of p well PW. Thereafter, the resist mask is removed.

Next, a resist mask (not shown) is formed to cover NMIS region RN and expose PMIS region RP. Next, the resist mask is employed as an implantation mask to implant boron into the semiconductor substrate, thereby forming the source-drain region (not shown) up to a predetermined depth from the exposed surface of element formation region FRP. Thereafter, the resist mask is removed.

Figure 128:
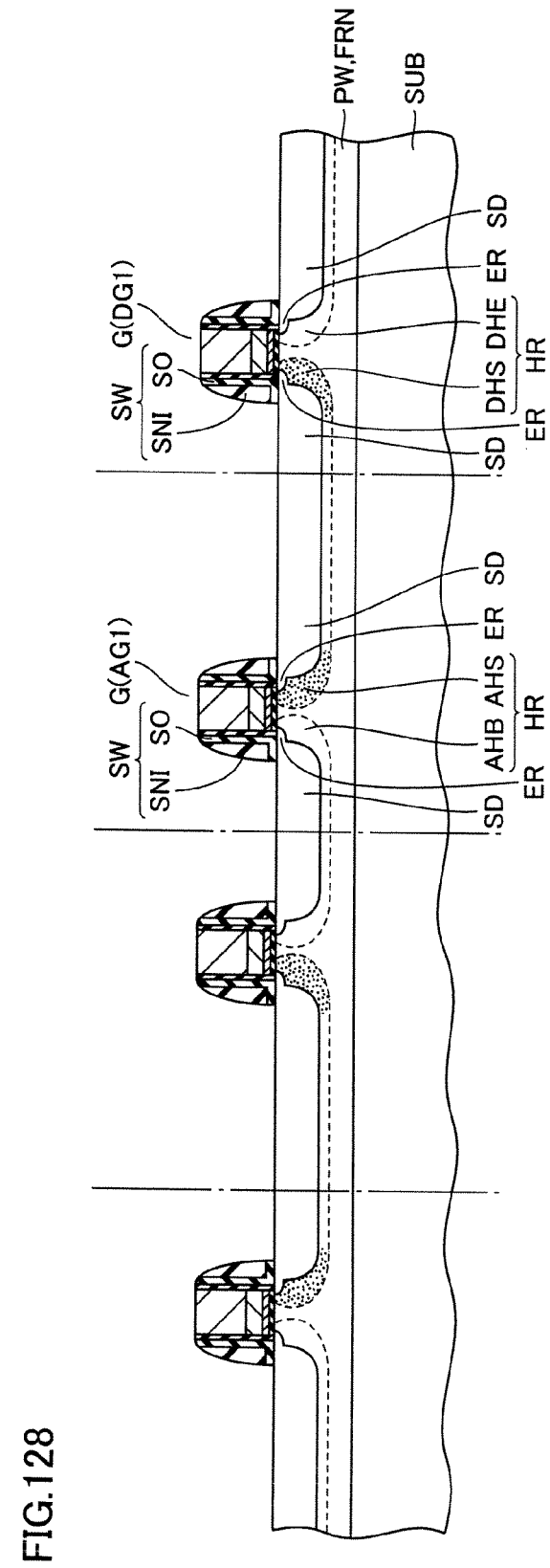

Next, as shown in FIG. 128, a predetermined annealing treatment is provided to thermally diffuse the implanted impurities, thereby activating source-drain regions SD, extension regions ER, and halo regions HR. On this occasion, with the thermal diffusion of the impurities, source-drain regions SD, extension regions ER, and halo regions HR are expanded in the lateral direction and longitudinal (depth) direction.

Figure 129:
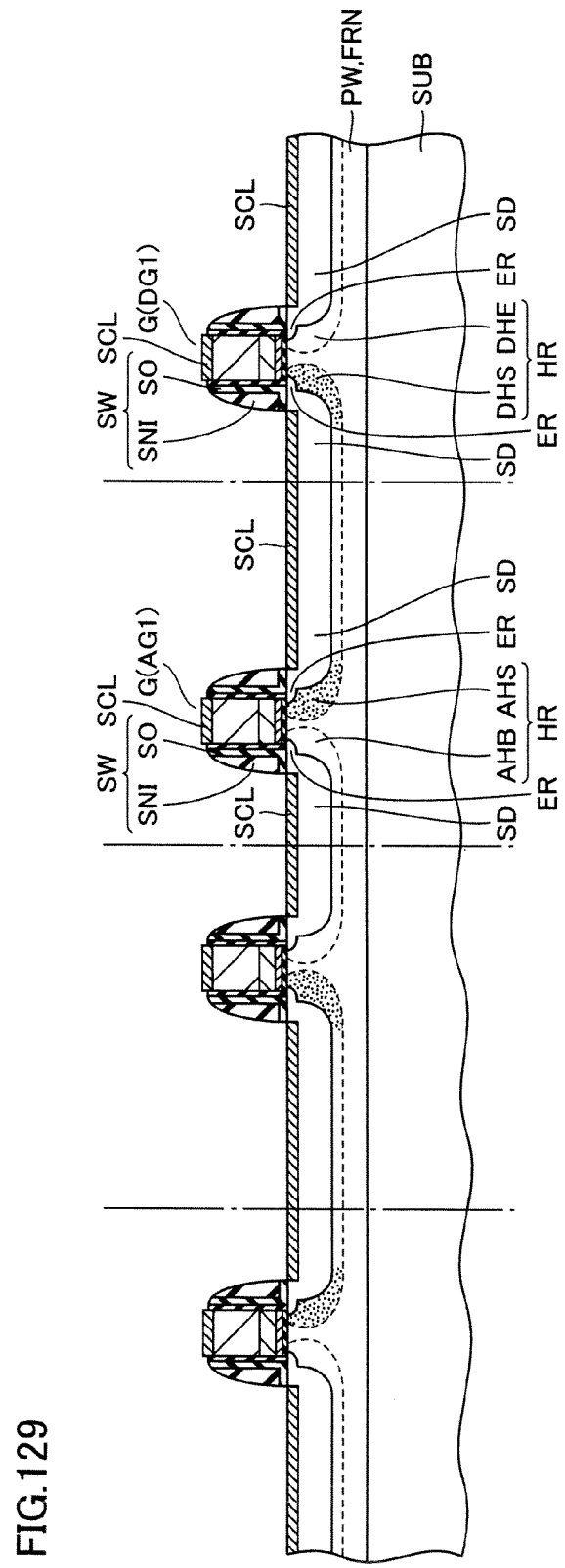
Figure 130:
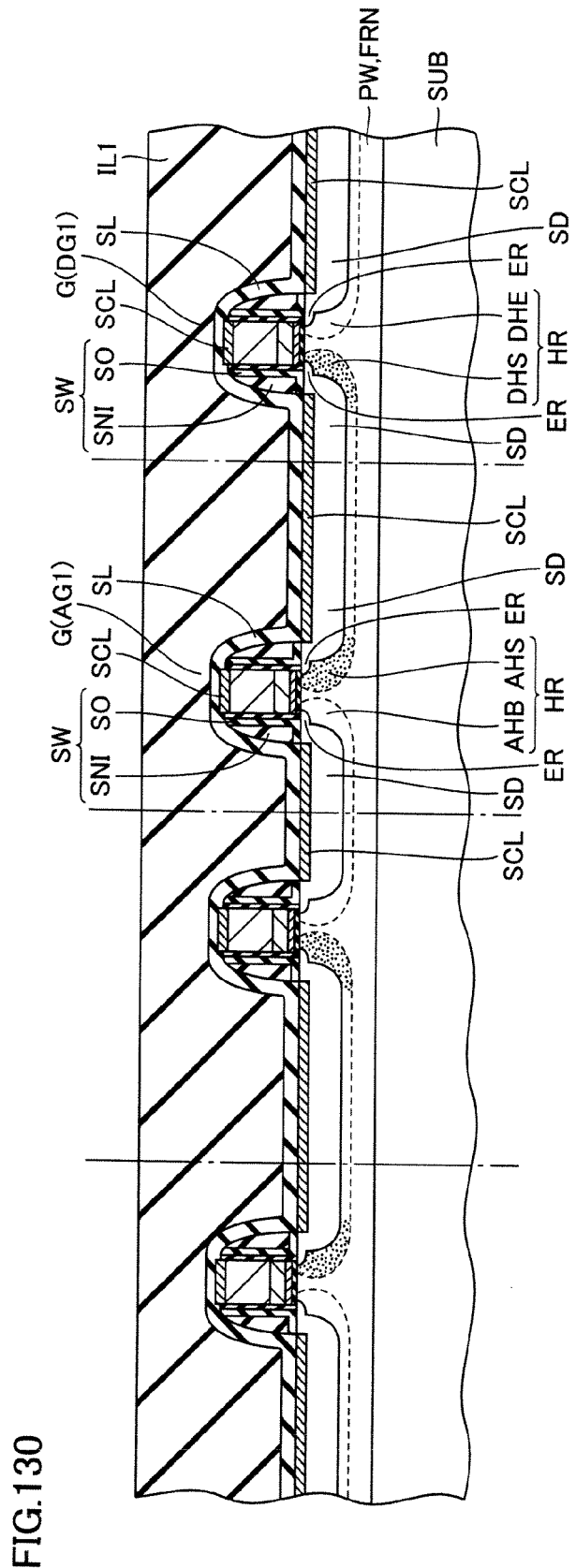

Next, as shown in FIG. 129, a salicide process is performed to form a metal silicide film SCL such as nickel silicide on the surface of each of the polysilicon films such as exposed source-drain region SD, access gate electrode AG1, and drive gate electrode DG1. Next, as shown in FIG. 130, in order to cover access gate electrode AG1 and drive gate electrode DG1, a stress liner film SL such as a silicon nitride film is formed. In order to cover stress liner film SL, an interlayer insulating film IL1 such as TEOS is formed.

Figure 131:
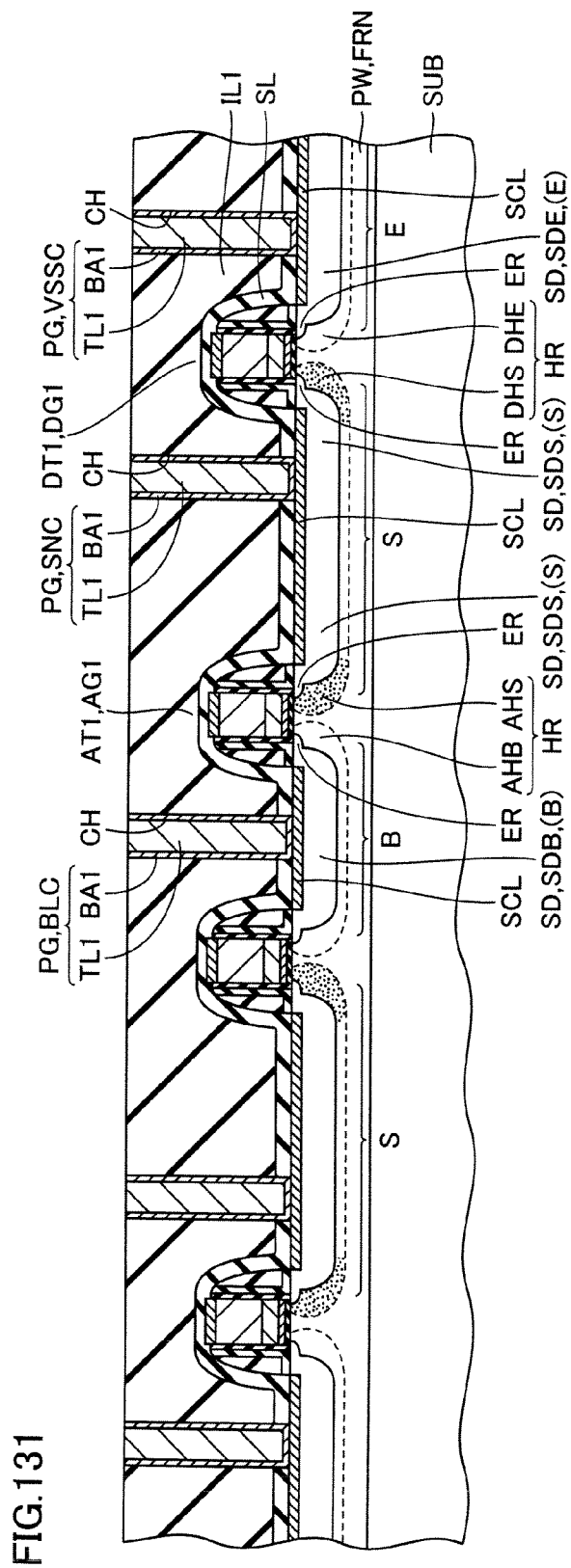

Next, as shown in FIG. 131, interlayer insulating film IL1 is anisotropically etched, thereby forming a contact hole CH exposing metal silicide film SCL. Next, in contact hole CH, plug PG including a barrier metal film BA1 and a tungsten film TL1 is formed.

Next, as shown in FIG. 110, in order to cover plug PG, an etching stopper film ES such as a silicon nitride film and an interlayer insulating film IL2 such as a silicon oxide film are formed. Next, a trench is formed to expose the surface of plug PG. Next, in the trench, copper interconnection CW1 including a barrier metal film BA2 and a copper film CL2 is formed. Copper interconnection CW1 corresponds to the first metal interconnection.

Thereafter, an interlayer insulating film (not shown) is formed to cover copper interconnection CW1. In the interlayer insulating film, vias BLV1, /SNV1, VDDV1, /BLV1, /SNV1, SNV1 (see FIG. 112) are formed using a method similar to the method of forming plug PG. Next, in order to cover vias BLV1, /SNV1, VDDV1, /BLV1, /SNV1, SNV1, an interlayer insulating film (not shown) is formed. In the interlayer insulating film, second metal interconnections BLM2, /SNM2, SNM2, VDDM2 are formed using a method similar to the method of forming copper interconnection CW1.

Next, in order to cover second metal interconnections BLM2, /SNM2, SNM2, VDDM2, an interlayer insulating film (not shown) is formed. In the interlayer insulating film, vias BLV2, /BLV2, VDDV2 (see FIG. 113) are formed using a method similar to the method of forming plug PG. Next, in order to cover vias BLV2, /BLV2, VDDV2, an interlayer insulating film (not shown) is formed. In the interlayer insulating film, third metal interconnections VDDM3, BLM3, /BLM3 (see FIG. 113) are formed using a method similar to the method of forming copper interconnection CW1. In this way, the main portion of the SRAM memory cell is formed.

In access transistor AT1 (AT2) of the present semiconductor device, halo region AHS having a relatively high impurity concentration is formed at the storage node SN (/SN) side, whereas halo region AHB having a relatively low impurity concentration is formed at the bit line BL (/BL) side. Further, in each of drive transistors DT1, DT2, halo region DHS having a relatively high impurity concentration is formed at the storage node SN (/SN) side, whereas halo region DHE having a relatively low impurity concentration is formed at the ground interconnection VSS side.

Hence, as described in the first embodiment, in the read operation, current flowing in access transistor AT1 (AT2) from the bit line BL (/BL) side to the storage node SN (/SN) side can be readily suppressed, and current flowing in drive transistor DT1 (DT2) from the storage node SN (/SN) side to the ground interconnection (VSS) side can be readily increased. Accordingly, the β ratio can be made high, thereby increasing the read margin.

Further, in the write operation, current flowing in access transistor AT1 (AT2) from the storage node SN (/SN) side to the bit line BL (/BL) side can be readily increased. Accordingly, the γ ratio can be made high, thereby increasing the write margin. In this way, in the present semiconductor device, both the read margin and the write margin can be increased.

Further, as illustrated in the first embodiment, the current flowing in each of drive transistors DT1, DT2 is only the current flowing from the storage node side to the ground interconnection side in the read operation. Thus, halo region DHS having a relatively high impurity concentration is formed at the storage node SN (/SN) side and halo region DHE having a relatively low impurity concentration is formed at the ground interconnection (VSS) side, whereby the threshold voltage of each of drive transistors DT1, DT2 can be made relatively low and high-speed operation can be achieved during reading.

Further, in the above-described semiconductor device, halo regions AHB, AHS of access transistors AT1, AT2 and halo regions DHE, DHS of drive transistors DT1, DT2 are formed using resist mask RMH1 (implantation mask A) and resist mask RMH2 (implantation mask B). Further, the halo regions of load transistors LT1, LT2 are formed using the resist mask (implantation mask D). Thus, as compared with the semiconductor device according to the comparative example, the number of photolithography masks for forming halo regions can be reduced by one.

It has been illustrated that in the above-described semiconductor device, the impurity concentration of halo region DHE is lower than the impurity concentration of halo region AHB. Implantation conditions A to D may be set for the impurity concentrations of halo regions DHE, AHB such that the impurity concentration of halo region DHE becomes higher than the impurity concentration of halo region AHB. In this case, as described in the first embodiment, leakage current from each of drive transistors DT1, DT2 can be suppressed.

Further, implantation conditions A to D may be all set to be the same implantation condition such that the impurity concentration of halo region DHE and the impurity concentration of halo region AHB becomes the same impurity concentration. Even in such a case, in each of access transistors AT1, AT2, the impurity concentration of halo region AHS is higher than the impurity concentration of halo region AHB. In each of drive transistors DT1, DT2, the impurity concentration of halo region DHS is higher than the impurity concentration of halo region DHE. In this way, both the read margin and the write margin can be increased.

Tenth Embodiment

Here, the following describes another exemplary semiconductor device including an SRAM memory cell called "vertical type cell".

First, an equivalent circuit of the SRAM memory cell is the same as the above-described equivalent circuit shown in FIG. 108 or FIG. 3. The following describes a structure of the SRAM memory cell. FIG. 132 is a plan view showing a layout of the transistors of the memory cells of the SRAM cell array, and contacts connected to the transistors. One memory cell is constituted of a region surrounded by a dotted line (thick line). On a main surface of a semiconductor substrate SUB, an element isolation region ISR is formed using an element isolation insulation film, thereby defining element formation regions FRN, FRP electrically disconnected from each other. Each of element formation regions FRN is provided with a portion (element formation region FRNX) extending in parallel with the X direction, and a portion (element formation region FRNY) extending in parallel with the Y direction.

In element formation regions FRN, access transistors AT1, AT2 and drive transistors DT1, DT2 are formed as n channel type MIS transistors. Each of access transistors AT1, AT2 is disposed in element formation region FRNY, and each of drive transistors DT1, DT2 is disposed in element formation region FRNX. Access gate electrodes AG1, AG2 of access transistors AT1, AT2 are formed to extend across element formation regions FRNY in parallel with the X direction. Drive gate electrodes DG1, DG2 of drive transistors DT1, DT2 are formed to extend across element formation regions FRNX in parallel with the Y direction.

Element formation region FRNY having access transistor AT1 formed therein, element formation region FRNX having drive transistor D1 formed therein, element formation region FRNX having drive transistor D2 formed therein, element formation region FRNY having access transistor AT2 formed therein are connected to one another. The ground interconnection is electrically connected to a portion (source-drain region) of element formation region FRN between drive gate electrode DG1 of drive transistor DT1 and drive gate electrode DG2 of drive transistor DT2.

Each of element formation regions FRP extends in parallel with the X direction, and is spaced away from element formation region FRN (FRNX). In element formation regions FRP, load transistors LT1, LT2 are formed as p channel type MIS transistors. Load gate electrodes LG1, LG2 of load transistors LT1, LT2 are formed to extend across element formation regions FRP in parallel with the Y direction. The power supply interconnection is electrically connected to a portion (source-drain region) of element formation region FRP between load gate electrode LG1 of load transistor LT1 and load gate electrode LG2 of load transistor LT2.

FIG. 133 is a cross sectional view taken along a cross sectional line CXXXIII-CXXXIII passing through the gate electrode of drive transistor DT1 and access transistor AT1. As shown in FIG. 133, access gate electrode AG1 of access transistor AT1 is formed above a region interposed between a region S and a region B. In region S, n type source-drain region SDS, which is electrically connected to the storage node (contact SNC), is formed. In region B, n type source-drain region SDB, which is electrically connected to the bit line (contact BLC), is formed.

In a region just below access gate electrode AG1, as p type halo regions HR, halo region AHS is formed adjacent to source-drain region SDS and halo region AHB is formed adjacent to source-drain region SDB.

On the other hand, drive gate electrode DG1 of drive transistor DT1 is formed above a region interposed between a region E and region S. In region E, n type source-drain region SDE, which is electrically connected to the ground interconnection (contact VSSC), is formed. In region S, n type source-drain region SDS, which is electrically connected to the storage node (contact SNC), is formed. In a region just below drive gate electrode DG1, as p type halo regions HR, halo region DHS is formed adjacent to source-drain region SDS and halo region DHE is formed adjacent to source-drain region SDE. It should be noted that the same members as those in the semiconductor device illustrated in FIG. 5 (first embodiment) are given the same reference characters and are not described repeatedly.

The following describes a multilayer interconnection structure that electrically connects the transistors. FIG. 134 is a plan view showing a structure of connection between each of the transistors and a first metal interconnection in one memory cell. FIG. 135 is a plan view showing a structure of connection between the first metal interconnection and a second metal interconnection.

One (source-drain region SDB) of the pair of source-drain regions SD of access transistor AT1 is electrically connected to second metal interconnection BLM2 serving as bit line BL, through contact plug BLC (plug PG), a first metal interconnection BLM1, and a via BLV1.

The other (source-drain region SDS) of the pair of source-drain regions SD of access transistor AT1 is electrically connected to one of the pair of source-drain regions of load transistor LT1 through contact SNC (plug PG), a first metal interconnection SNM1 (copper interconnection CW1), and a contact SNLC. Further, source-drain region SDS of access transistor AT1 is electrically connected to load gate electrode LG2 of load transistor LT2 and drive gate electrode DG2 of drive transistor DT2 through first metal interconnection SNM1 (copper interconnection CW1).

Further, source-drain region SDS of access transistor AT1 is electrically connected to one (source-drain region SDS) of the pair of source-drain regions of drive transistor DT1. Access gate electrode AG1 of access transistor AT1 is formed as a portion of word line WL.

The other (source-drain region SDE) of the pair of source-drain regions of drive transistor DT1 is electrically connected to a second metal interconnection VSSM2 serving as the ground interconnection, through contact VSSC (plug PG), a first metal interconnection VSSM1, and a via VSSV1. The other of the pair of source-drain regions of load transistor LT1 is electrically connected to a first metal interconnection VDDM1 (copper interconnection CW1) serving as the power supply interconnection, through a contact VDDC.

One (source-drain region SDB) of the pair of source-drain regions SD of access transistor AT2 is electrically connected to a second metal interconnection /BLM2 serving as bit line /BL, through a contact plug /BLC (plug /PG), a first metal interconnection /BLM1 (copper interconnection CW1), and a via /BLV1.

The other (source-drain region SDS) of the pair of source-drain regions SD of access transistor AT2 is electrically connected to one of the pair of source-drain regions of load transistor LT2 through a contact /SNC (plug PG), a first metal interconnection /SNM1 (copper interconnection CW1), and a contact /SNLC. Further, source-drain region SDS of access transistor AT2 is electrically connected to load gate electrode LG1 of load transistor LT1 and drive gate electrode DG1 of drive transistor DT1 through first metal interconnection /SNM1 (copper interconnection CW1) and a contact /SNGC.

Further, source-drain region SDS of access transistor AT2 is electrically connected to one (source-drain region SDS) of the pair of source-drain regions of drive transistor DT2. Access gate electrode AG2 of access transistor AT2 is formed as a portion of word line WL.

The other (source-drain region SDE) of the pair of source-drain regions of drive transistor DT2 is electrically connected to first metal interconnection VSSM1 (copper interconnection CW1) serving as the ground interconnection, through contact VSSC (plug PG). The other of the pair of source-drain regions of load transistor LT2 is electrically connected to first metal interconnection VDDM1 (copper interconnection CW1) serving as the power supply interconnection, through contact VDDC.

The following describes a method for manufacturing the above-described semiconductor device. First, element isolation region ISR is formed on the main surface of semiconductor substrate SUB using an element isolation insulation film, thereby defining element formation regions FRN, FRP electrically disconnected from each other (see FIG. 132). Next, in element formation region FRN, p well PW (see FIG. 133) is formed. Next, a step similar to the above-described step shown in FIG. 114 is performed, thereby forming gate structures G to serve as access gate electrodes AG1, AG2, drive gate electrodes DG1, DG2, and load gate electrodes LG1, LG2, respectively (see FIG. 136). Next, offset spacers (not shown) are formed on both side surfaces of each gate structure G.

Next, as shown in FIG. 136, a predetermined photolithography process is performed to form a resist mask RMH1 that is to serve as an implantation mask for forming the halo regions (implantation mask A). Resist mask RMH1 is formed to have an opening pattern exposing: the side surface of gate structure G that is to serve as access gate electrode AG1 (AG2), the side surface being positioned at the side of region S in which the source-drain region electrically connected to the storage node is to be formed; the side surface of gate structure G that is to serve as drive gate electrode DG1 (DG2), the side surface being positioned at the region S side; and region S.

On the other hand, resist mask RMH1 is formed to cover: the side surface of gate structure G that is to serve as each of access gate electrodes AG1, AG2, the side surface being positioned at the side of region B in which the source-drain region electrically connected to the bit line is to be formed; and region B. Further, resist mask RMH1 is formed to cover: the side surface of gate structure G that is to serve as each of drive gate electrodes DG1, DG2, the side surface being positioned at the side of region E in which the source-drain region electrically connected to the ground interconnection is to be formed; and region E. Also, resist mask RMH1 is formed to cover PMIS region RP.

Next, resist mask RMH1 is employed as an implantation mask to implant boron in a predetermined direction (halo implantation A). The implantation of boron is performed in the same manner as the implantation of boron in FIG. 115 to FIG. 119 (ninth embodiment).

First, as shown in FIG. 136, resist mask RMH1 is employed as an implantation mask to implant boron in a direction E1 at an angle oblique to the direction perpendicular to the main surface of semiconductor substrate SUB, thereby forming p type impurity regions (not shown) in exposed element formation regions FRN. Next, boron is implanted in a direction E2 at an angle oblique to the direction perpendicular to the main surface of semiconductor substrate SUB, thereby forming p type impurity regions (not shown) in exposed element formation regions FRN.

Next, boron is implanted in a direction E3 at an angle oblique to the direction perpendicular to the main surface of semiconductor substrate SUB, thereby forming p type impurity regions (not shown) in exposed element formation regions FRN. Next, boron is implanted in a direction E4 at an angle oblique to the direction perpendicular to the main surface of semiconductor substrate SUB, thereby forming p type impurity regions (not shown) in exposed element formation regions FRN. Thereafter, resist mask RMH1 is removed.

Next, as shown in FIG. 137, a predetermined photolithography process is performed to form a resist mask RMH2 that is to serve as an implantation mask for forming the halo regions (implantation mask B). Resist mask RMH2 is formed to expose NMIS region RN and cover PMIS region RP.

Next, resist mask RMH2 is employed as an implantation mask to implant boron in a predetermined direction (halo implantation B). The implantation of boron is performed in the same manner as the implantation of boron in FIG. 120 to FIG. 124 (ninth embodiment).

First, as shown in FIG. 137, resist mask RMH2 is employed as an implantation mask to implant boron in a direction E5 at an angle oblique to the direction perpendicular to the main surface of semiconductor substrate SUB, thereby forming p type impurity regions (not shown) in exposed element formation regions FRN. Next, boron is implanted in a direction E6 at an angle oblique to the direction perpendicular to the main surface of semiconductor substrate SUB, thereby forming p type impurity regions (not shown) in exposed element formation regions FRN.

Next, boron is implanted in a direction E7 at an angle oblique to the direction perpendicular to the main surface of semiconductor substrate SUB, thereby forming p type impurity regions (not shown) in exposed element formation regions FRN. Next, boron is implanted in a direction E8 at an angle oblique to the direction perpendicular to the main surface of semiconductor substrate SUB, thereby forming p type impurity regions (not shown) in exposed element formation regions FRN. Portions of the p type impurity regions thus formed will be the halo regions.

Here, the following describes the implantation conditions of the halo implantations. In halo implantation A, the implantations in direction E1 and direction E2 are performed under the same implantation condition (implantation condition A). The implantations in direction E3 and direction E4 are performed under the same implantation condition (implantation condition B). In halo implantation B, the implantations in direction E5 and direction E6 are performed under the same implantation condition (implantation condition C). The implantations in direction E7 and direction E8 are performed under the same implantation condition (implantation condition D).

Halo region AHS of each of access transistors ATE AT2 is formed by the implantation in direction E2 (implantation condition A) and the implantation in direction E6 (implantation condition C). Halo region AHB is formed by the implantation in direction E5 (implantation conditions C). Meanwhile, halo region DHS of each of drive transistors DT1, DT2 is formed by the implantation in direction E3 (implantation condition B) and the implantation in direction E7 (implantation condition D). Halo region DHB is formed by the implantation in direction E8 (implantation conditions D).

In the present semiconductor device, implantation conditions A to D are set such that the impurity concentration of halo region AHS becomes higher than the impurity concentration of halo region AHB, the impurity concentration of halo region DHS becomes higher than the impurity concentration of halo region DHE, the impurity concentration of halo region AHS and the impurity concentration of halo region DHS become the same, and the impurity concentration of halo region DHE becomes lower than the impurity concentration of halo region AHB.

Next, without removing resist mask REMH2, resist mask RMH2 (resist mask RME1) is employed as an implantation mask (implantation mask B) to implant phosphorus or the like (extension implantation). As shown in FIG. 138, resist mask RME1 is employed as an implantation mask to implant, for example, phosphorus or arsenic into semiconductor substrate SUB in the direction perpendicular to the main surface of semiconductor substrate SUB, thereby forming extension region ER up to a predetermined depth from the surface of the exposed region of p well PW (see FIG. 133). Thereafter, resist mask RME1 is removed.

Next, a resist mask (not shown) is formed to cover NMIS region RN and expose PMIS region RP (implantation mask C). Next, the resist mask is employed as an implantation mask to implant phosphorus or arsenic into semiconductor substrate SUB, thereby forming the halo regions (not shown) in element formation region RP. Next, boron is implanted into semiconductor substrate SUB, thereby forming the extension region (not shown). Thereafter, the resist mask is removed.

Next, steps similar to the steps shown in FIG. 128 to FIG. 131 (ninth embodiment) are performed, thereby forming the first metal interconnection (copper interconnection CW1) (see FIG. 133). Thereafter, an interlayer insulating film (not shown) is formed to cover copper interconnection CW1. In the interlayer insulating film, vias BLV1, /BLV1, VSSV1 (see FIG. 135) are formed using a method similar to the method of forming plug PG. Next, in order to cover vias BLV1, /BLV1, VSSV1, an interlayer insulating film (not shown) is formed. In the interlayer insulating film, second metal interconnections BLM2, /BLM2, VSSM2 (see FIG. 135) are formed using a method similar to the method of forming copper interconnection CW1. In this way, the main portion of the SRAM memory cell is formed.

In the present semiconductor device, the transistors of the SRAM memory cell are electrically connected through the first metal interconnection and the second metal interconnection. Accordingly, manufacturing cost can be reduced as compared with an interconnection structure in which transistors are electrically connected through a first metal interconnection, a second metal interconnection, and a third metal interconnection.

Further, in access transistor AT1 (AT2) of the present semiconductor device, halo region AHS having a relatively high impurity concentration is formed at the storage node SN (/SN) side, whereas halo region AHB having a relatively low impurity concentration is formed at the bit line BL (/BL) side. Further, in each of drive transistors DT1, DT2, halo region DHS having a relatively high impurity concentration is formed at the storage node SN (/SN) side, whereas halo region DHE having a relatively low impurity concentration is formed at the ground interconnection VSS side. In this way, as described in the first embodiment, both the read margin and the write margin can be increased.

Further, as described in the first embodiment, halo region DHS having a relatively high impurity concentration is formed at the storage node SN (/SN) side and halo region DHE having a relatively low impurity concentration is formed at the ground interconnection (VSS) side, whereby the threshold voltage of each of drive transistors DT1, DT2 can be made relatively low and high-speed operation can be achieved during reading.

Further, in the above-described semiconductor device, halo regions AHB, AHS of access transistors AT1, AT2 and halo regions DHE, DHS of drive transistors DT1, DT2 are formed using resist mask RMH1 (implantation mask A) and resist mask RMH2 (implantation mask B). Further, the halo regions of load transistors LT1, LT2 are formed using the resist mask (implantation mask C). Thus, as compared with the semiconductor device according to the comparative example, the number of photolithography masks for forming halo regions can be reduced.

It has been illustrated that in the above-described semiconductor device, the impurity concentration of halo region DHE is lower than the impurity concentration of halo region AHB. Implantation conditions A to D may be set for the impurity concentrations of halo regions DHE, AHB such that the impurity concentration of halo region DHE becomes higher than the impurity concentration of halo region AHB. In this case, as described in the first embodiment, leakage current from each of drive transistors DT1, DT2 can be suppressed.

Further, implantation conditions A to D may be all set to be the same implantation condition such that the impurity concentration of halo region DHE and the impurity concentration of halo region AHB become the same impurity concentration. Even in such a case, in each of access transistors AT1, AT2, the impurity concentration of halo region AHS is higher than the impurity concentration of halo region AHB. In each of drive transistors DT1, DT2, the impurity concentration of halo region DHS is higher than the impurity concentration of halo region DHE. In this way, both the read margin and the write margin can be increased.

Eleventh Embodiment

Here, the following describes a semiconductor device including an SRAM memory cell called "vertical type cell".

Described first is an equivalent circuit of the SRAM memory cell. As shown in FIG. 139, in each of access transistors AT1, AT2, halo region AHS, which is at the side connected to storage node SN or /SN 1, of the pair of halo regions HR is set to have an impurity concentration higher than the impurity concentration of halo region AHB, which is at the side connected to bit line BL or /BL.

Of the pair of halo regions HR of each of drive transistors DT1, DT2, halo region DHT, which is at the side connected to storage node SN or /SN, and halo region DHT, which is at the side connected to ground interconnection VSS, are set to have the same impurity concentration. Further, halo region DHT is set to have an impurity concentration lower than the impurity concentration of halo region AHB. It should be noted that configurations apart from this are the same as those of the equivalent circuit of FIG. 3, and therefore the same members are given the same reference characters and are not described repeatedly.

The following describes a structure of the SRAM memory cell. FIG. 140 is a plan view showing a layout of the transistors of the memory cells of the SRAM cell array, and contacts connected to the transistors. One memory cell is constituted of a region surrounded by a dotted line (thick line). As shown in FIG. 140, as the halo regions of drive transistors DT1, DT2, halo regions DHT are formed. It should be noted that configurations apart from this are the same as those of the layout of FIG. 109, and therefore the same members are given the same reference characters and are not described repeatedly.

FIG. 141 is a cross sectional view taken along a cross sectional line CXLI-CXLI passing through the gate electrode of drive transistor DT1 and access transistor AT1. As shown in FIG. 141, in a region just below drive gate electrode DG1, as p type halo regions HR, halo region DHT is formed adjacent to source-drain region SDS and halo region DHT is formed adjacent to source-drain region SDE. It should be noted that configurations apart from this are the same as those of the configuration of FIG. 110, and therefore the same members are given the same reference characters and are not described repeatedly.

The following describes a method for manufacturing the above-described semiconductor device. As with the ninth embodiment, as shown in FIG. 142, after forming gate structures G, a predetermined photolithography process is performed to form a resist mask RMH1 that is to serve as an implantation mask for forming the halo regions (implantation mask A). Resist mask RMH1 is formed to expose: the side surface of gate structure G that is to serve as each of access gate electrodes AG1, AG2, the side surface being positioned at the side of region S in which the source-drain region electrically connected to the storage node is to be formed; region S; gate structure G that is to serve as each of drive gate electrodes DG1, DG2; and region E in which the source-drain region electrically connected to the ground interconnection is to be formed.

On the other hand, resist mask RMH1 is formed to cover: the side surface of gate structure G that is to serve as each of access gate electrodes AG1, AG2, the side surface being positioned at the side of region B in which the source-drain region electrically connected to the bit line is to be formed; region B; and second element formation region FRP.

Next, resist mask RMH1 is employed as an implantation mask to implant boron in a predetermined direction (halo implantation A). As shown in FIG. 142, resist mask RMH1 is employed as an implantation mask to implant boron thereinto in a direction E1, a direction E2, a direction E3, and a direction E4 at an angle oblique (θ=about 7°) to the direction perpendicular to the main surface of semiconductor substrate SUB, thereby forming p type impurity regions (not shown) of exposed regions of p well PW. Thereafter, resist mask RMH1 is removed.

Next, as shown in FIG. 143, a predetermined photolithography process is performed to form a resist mask RMH2 that is to serve as an implantation mask for forming the halo regions (implantation mask B). Resist mask RMH2 is formed to expose: gate structure G that is to serve as each of access gate electrodes AG1, AG2; a portion of region S in which the source-drain region electrically connected to the storage node is to be formed, the portion being positioned in element formation region FRNY; and region B in which the source-drain region electrically connected to the bit line is to be formed.

Meanwhile, resist mask RMH2 is formed to cover: gate structure G that is to serve as each of drive gate electrodes DG1, DG2; region E in which the source-drain region electrically connected to the ground interconnection is to be formed; a portion of region S in which the source-drain region electrically connected to the storage node is to be formed, the portion being positioned at element formation region FRNX; and second element formation region FRP.

Next, resist mask RMH2 is employed as an implantation mask to implant boron in a predetermined direction (halo implantation B). As shown in FIG. 143, resist mask RMH2 is employed as an implantation mask to implant boron in a direction E5, a direction E6, a direction E7, and a direction E8 at an angle oblique (θ=about 7°) to the direction perpendicular to the main surface of semiconductor substrate SUB, thereby forming p type impurity regions (not shown) in the exposed regions of p well PW. Thereafter, resist mask RMH2 is removed. It should be noted that the implantation conditions for directions E1, E2 (implantation condition A), directions E3, E4 (implantation condition B), directions E5, E6 (implantation condition C), and directions E7, E8 (implantation condition D) are set such that halo region DHT and halo region DHT have the same impurity concentration, and the impurity concentration of halo region DHT becomes lower than the impurity concentration of halo region AHB.

Next, as shown in FIG. 144, a predetermined photolithography process is performed to form a resist mask RME1 that is to serve as an implantation mask for forming the halo regions (implantation mask C). Resist mask RME1 is formed to expose NMIS region RN and cover PMIS region RP.

Next, resist mask RME1 is employed as an implantation mask to implant phosphorus or the like (extension implantation). Resist mask RME1 is employed as an implantation mask to implant, for example, phosphorus or arsenic into semiconductor substrate SUB in a direction perpendicular to the main surface of semiconductor substrate SUB, thereby forming extension region ER up to a predetermined depth from the surface of the exposed region of the p well (see FIG. 141). Thereafter, resist mask RME1 is removed.

Next, a resist mask (not shown) is formed to cover NMIS region RN and expose PMIS region RP (implantation mask D). Next, the resist mask is employed as an implantation mask to implant phosphorus or arsenic into semiconductor substrate SUB, thereby forming the halo regions (not shown) in element formation region RP. Next, boron is implanted into semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection (see FIG. 141). Thereafter, the multilayer interconnection structure is formed on copper interconnection CW1, thus forming the main portion of the SRAM memory cell.

In the semiconductor device including the above-described SRAM memory cell, halo region AHB of each of access transistors AT1, AT2 is set to have an impurity concentration higher than the impurity concentration of halo region DHT of each of drive transistors DT1, DT2. In this way, the impurity concentration of halo region DHT becomes lower than the impurity concentration of halo region AHB, thereby improving reading speed in the read operation. Further, both the read margin and the write margin can be increased. Further, as compared with the semiconductor device according to the comparative example, the number of photolithography masks for forming halo regions can be reduced.

Twelfth Embodiment

Here, the following describes another exemplary semiconductor device including an SRAM memory cell called "vertical type cell".

Described first is an equivalent circuit of the SRAM memory cell. As shown in FIG. 145, in each of access transistors AT1, AT2, halo region AHS, which is at the side connected to storage node SN or /SN, of the pair of halo regions HR is set to have an impurity concentration higher than the impurity concentration of halo region AHB, which is at the side connected to bit line BL or /BL.

Further, in each of drive transistors DT1, DT2, halo region DHT, which is at the side connected to storage node SN or /SN, of the pair of halo regions HR and halo region DHT, which is at the side connected to ground interconnection VSS, are set to have the same impurity concentration. Further, halo region DHT is set to have substantially the same impurity concentration as the impurity concentration of halo region AHB. It should be noted that configurations apart from this are the same as those of FIG. 3, and therefore the same members are given the same reference characters and are not described repeatedly.

The following describes a structure of the SRAM memory cell. FIG. 146 is a plan view showing a layout of the transistors of the memory cells of the SRAM cell array, and contacts connected to the transistors. As shown in FIG. 146, as the halo regions of each of drive transistors DT1, DT2, halo regions DHT are formed. It should be noted that configurations apart from this are the same as those of the layout of FIG. 109, and therefore the same members are given the same reference characters and are not described repeatedly.

FIG. 147 is a cross sectional view taken along a cross sectional line CXLVII-CXLVII passing through the gate electrode of drive transistor DT1 and access transistor AT1. As shown in FIG. 147, in a region just below drive gate electrode DG1, as p type halo regions HR, halo region DHT is formed adjacent to source-drain region SDS and halo region DHT is formed adjacent to source-drain region SDE. It should be noted that configurations apart from this are the same as those of the configuration of FIG. 110, and therefore the same members are given the same reference characters and are not described repeatedly.

The following describes a method for manufacturing the above-described semiconductor device. As with the ninth embodiment, as shown in FIG. 148, after the formation of gate structures G, a predetermined photolithography process is performed to form a resist mask RMH1 that is to serve as an implantation mask for forming the halo regions (implantation mask A).

Resist mask RMH1 is formed to expose: the side surface of gate structure G that is to serve as each of access gate electrodes AG1, AG2, the side surface being positioned at the side of region S in which the source-drain region electrically connected to the storage node is to be formed; and a portion of region S, the portion being positioned in element formation region FRNY.

On the other hand, resist mask RMH1 is formed to cover: the side surface of gate structure G that is to serve as each of access gate electrode AG1, AG2, the side surface being positioned at the side of region B in which the source-drain region electrically connected to the bit line is to be formed; region B; and element formation region FRP.

Further, resist mask RMH1 is formed to cover: gate structure G that is to serve as each of drive gate electrodes DG1, DG2; region E in which the source-drain region is to be formed to be connected to the ground interconnection; and a portion of region S, the portion being positioned in element formation region FRNX.

Next, resist mask RMH1 is employed as an implantation mask to implant boron in a predetermined direction (halo implantation A). As shown in FIG. 148, resist mask RMH1 is employed as an implantation mask to implant boron in a direction E1, a direction E2, a direction E3, and a direction E4 at an angle oblique (θ=about 7°) to the direction perpendicular to the main surface of semiconductor substrate SUB, thereby forming p type impurity regions (not shown) in the exposed regions of p well PW. Thereafter, resist mask RMH1 is removed.

Next, as shown in FIG. 149, a predetermined photolithography process is performed to form a resist mask RMH2 that is to serve as an implantation mask for forming the halo regions (implantation mask B). Resist mask RMH2 is formed to expose: gate structure G that is to serve as each of access gate electrodes AG1, AG2; region S in which the source-drain region electrically connected to the storage node is to be formed; and region B in which the source-drain region electrically connected to the bit line is to be formed.

Further, resist mask RMH2 is formed to expose: gate structure G that is to serve as each of drive gate electrodes DG1, DG2; and region E in which the source-drain region electrically connected to the ground interconnection is to be formed. Meanwhile, resist mask RMH2 is formed to cover element formation region FRP.

Next, resist mask RMH2 is employed as an implantation mask to implant boron in a predetermined direction (halo implantation B). As shown in FIG. 149, resist mask RMH2 is employed as an implantation mask to implant boron in a direction E5, a direction E6, a direction E7, and a direction E8 at an angle oblique (θ=about 7°) to the direction perpendicular to the main surface of semiconductor substrate SUB, thereby forming p type impurity regions (not shown) in the exposed regions of p well PW. It should be noted that the implantation conditions for directions E1, E2 (implantation condition A), directions E3, E4 (implantation condition B), directions E5, E6 (implantation condition C), and directions E7, E8 (implantation condition D) are set such that halo region DHT and halo region DHT have the same impurity concentration, and the impurity concentration of halo region DHT and halo region AHB have the same impurity concentration.

Next, without removing resist mask RMH2, resist mask RMH2 (resist mask RME1) is employed as an implantation mask (implantation mask B) to implant phosphorus or the like (extension implantation). As shown in FIG. 150, resist mask RME1 is employed as an implantation mask to implant, for example, phosphorus or arsenic into semiconductor substrate SUB in the direction perpendicular to the main surface of semiconductor substrate SUB, thereby forming extension region ER up to a predetermined depth from the surface of the exposed region of the p well (see FIG. 147). Thereafter, resist mask RME1 is removed.

Next, a resist mask (not shown) is formed to cover NMIS region RN and expose PMIS region RP (implantation mask C). Next, the resist mask is employed as an implantation mask to implant phosphorus or arsenic into semiconductor substrate SUB, thereby forming the halo regions (not shown) in element formation region RP. Next, boron is implanted into semiconductor substrate SUB, thereby forming the extension region (not shown). Thereafter, the resist mask is removed.

Next, steps similar to the steps (first embodiment) shown in FIG. 28 to FIG. 31 are performed, thereby forming copper interconnection CW1 serving as the first metal interconnection (see FIG. 147). Thereafter, a multilayer interconnection structure is formed on copper interconnection CW1, thus forming the main portion of the SRAM memory cell.

In the semiconductor device including the above-described SRAM memory cell, halo region AHB of each of access transistors AT1, AT2 and halo region DHT of each of drive transistors DT1, DT2 are set to have substantially the same impurity concentration. In this way, as compared with a case where the impurity concentration of halo region DHT is lower than the impurity concentration of halo region AHB, leakage current can be suppressed during the read operation. Further, both the read margin and the write margin can be increased. Further, as compared with the semiconductor device according to the comparative example, the number of photolithography masks for forming halo regions can be reduced.

The embodiments disclosed herein are illustrative and non-restrictive. The scope of the present invention is defined by the terms of the claims, rather than the embodiments described above, and is intended to include any modifications within the scope and meaning equivalent to the terms of the claims.

INDUSTRIAL APPLICABILITY

The present invention is effectively employed for a semiconductor device including an SRAM memory cell.

REFERENCE SIGNS LIST

SUB: semiconductor substrate; ISR: element isolation region; FRN: element formation region; FRP: element formation region; RN: NMIS region; RP: PMIS region; AT1, AT2, AT3, AT4: access transistor; DT1, DT2, DT3, DT4: drive transistor; LT1, LT2: load transistor; PW: P well; SF: interlayer; HK: High-k film; ML: metal film; PS: polysilicon film; AG1, AG2, AG3, AG4: access gate electrode; DG1, DG2, DG3, DG4: drive gate electrode; LG1, LG2: load gate electrode; G: gate structure; OS: offset spacers; ER: extension region; SD, SDS, SDB, SDE: source-drain region; HR, AHB, AHS, DHS, DHE, DHT: halo region; SW: side wall spacer; SCL: metal silicide film; SL: stress liner film; IL1: interlayer insulating film; CH: contact hole; BA1: barrier metal film; TL1: tungsten film; PG: plug; ES: etching stopper film; IL2: interlayer insulating film; BA2: barrier metal film; CL1: copper film; CW1: copper interconnection; WLC, VSSC, SNC, BLC, VDDC, LGC, /LGC, VDDC, /BLC, /SNC, VSSC, WLC: contact; WLP, VSSP, SNP, BLP, VDDP, LGP, /LGP, VDDP, /BLP, /SNP, VSSP, WLP: plug; WLM1, VSSM1, SNM1, BLM1, VDDM1, SNM1, /SNM1, VDDM1, /BLM1, /SNM1, VSSM1, WLM1: first metal interconnection; WLV1, VSSV1, BLV1, VDDV1, VDDV1, /BLV1, VSSV1, WLV1: first via; WLM2, VSSM2, BLM2, VDDM2, VDDM2, /BLM2, VSSM2, WLM2: second metal interconnection; WLV2, VSSV2, VSSV2, WLV2: second via; WLM3, VSSM3: third metal interconnection; SCD: semiconductor device; SR: SRAM unit; MA: SRAM memory cell array; MA1, MA2: SRAM memory cell; XD: X decoder; YD: Y decoder; SA: sense amplifier; WD: write driver; MC: main control circuit; LC: logic circuit; IO: IO region.

The invention claimed is:

1. A semiconductor device having a static random access memory, comprising:
   a storage node including a first storage node and a second storage node storing data;
   a pair of bit lines sending/receiving data;
   a ground interconnection to which a ground potential is applied;
   a first element formation region and a second element formation region, each of which is defined by an element isolation insulation film in a predetermined region of a main surface of a semiconductor substrate;
   an access transistor formed in said first element formation region and including a first source-drain region and a second source-drain region that are spaced away from each other and have first conductivity type, said access transistor including an access gate electrode positioned above a region interposed between said first source-drain region and said second source-drain region; and
   a drive transistor formed in said first element formation region and including a third source-drain region and a fourth source-drain region that are spaced away from each other and have the first conductivity type, said drive transistor including a drive gate electrode positioned above a region interposed between said third source-drain region and said fourth source-drain region,
   said access transistor including
      a first halo region having a first impurity concentration and second conductivity type, said first halo region being formed in a region just below said access gate electrode so as to be adjacent to said first source-drain region electrically connected to a predetermined bit line of said pair of bit lines, and
      a second halo region having a second impurity concentration and the second conductivity type, said second halo region being formed in the region just below said access gate electrode so as to be adjacent to said second source-drain region electrically connected to said storage node,
   said drive transistor including
      a third halo region having a third impurity concentration and the second conductivity type, said third halo region being formed in a region just below said drive gate electrode so as to be adjacent to said third source-drain region electrically connected to said storage node, and
      a fourth halo region having a fourth impurity concentration and the second conductivity type, said fourth halo region being formed in the region just below said drive gate electrode so as to be adjacent to said fourth source-drain region electrically connected to said ground interconnection,
   said second impurity concentration being higher than said first impurity concentration,
   said third impurity concentration being higher than said fourth impurity concentration,
   said first impurity concentration and said fourth impurity concentration being set to be different impurity concentrations.

2. The semiconductor device according to claim 1, wherein said second source-drain region and said third source-drain region are formed in said first element formation region as a common source-drain region.

3. The semiconductor device according to claim 2, wherein
   said common source-drain region is formed to be bent, and
   said access gate electrode is disposed in a first direction, and said drive gate electrode is disposed in a second direction crossing said first direction.

4. A semiconductor device having a static random access memory, comprising:
   a storage node including a first storage node and a second storage node storing data;
   a first pair of bit lines and a second pair of bit lines both sending/receiving data;
   a ground interconnection to which a ground potential is applied;
   a first element formation region and a second element formation region, each of which is defined by an element isolation insulation film in a predetermined region of a main surface of a semiconductor substrate;
   a first access transistor formed in said first element formation region and including a first source-drain region and a second source-drain region that are spaced away from each other and have first conductivity type, said first access transistor including a first access gate electrode positioned above a region interposed between said first source-drain region and said second source-drain region;
   a drive transistor formed in said first element formation region and including a third source-drain region and a fourth source-drain region that are spaced away from each other and have the first conductivity type, said drive transistor including a drive gate electrode positioned above a region interposed between said third source-drain region and said fourth source-drain region; and
   a second access transistor formed in said first element formation region and including a fifth source-drain region and a sixth source-drain region that are spaced away from each other and have the first conductivity type, said second access transistor including a second access gate electrode positioned above a region interposed between said fifth source-drain region and said sixth source-drain region,
   said first access transistor including
      a first halo region having a first impurity concentration and second conductivity type, said first halo region being formed in a region just below said first access gate electrode so as to be adjacent to said first source-drain region electrically connected to a predetermined bit line of said first pair of bit lines, and
a second halo region having a second impurity concentration and the second conductivity type, said second halo region being formed in the region just below said first access gate electrode so as to be adjacent to said second source-drain region electrically connected to said storage node, said drive transistor including
a third halo region having a third impurity concentration and the second conductivity type, said third halo region being formed in a region just below said drive gate electrode so as to be adjacent to said third source-drain region electrically connected to said storage node, and
a fourth halo region having a fourth impurity concentration and the second conductivity type, said fourth halo region being formed in the region just below said drive gate electrode so as to be adjacent to said fourth source-drain region electrically connected to said ground interconnection, said second access transistor including
a fifth halo region having a fifth impurity concentration and the second conductivity type, said fifth halo region being formed in a region just below said second access gate electrode so as to be adjacent to said fifth source-drain region electrically connected to a predetermined bit line of said second pair of bit lines, and
a sixth halo region having a sixth impurity concentration and the second conductivity type, said sixth halo region being formed in the region just below said second access gate electrode so as to be adjacent to said sixth source-drain region electrically connected to said storage node, said second impurity concentration being higher than said first impurity concentration,
said third impurity concentration being higher than said fourth impurity concentration,
said first impurity concentration and said fourth impurity concentration being set to be different impurity concentrations,
said fifth impurity concentration being set to be lower than said sixth impurity concentration.

5. The semiconductor device according to claim 4, wherein
said first element formation region includes a first portion, a second portion, and a third portion, each of which is defined by said element isolation insulation film,
said first access transistor is formed in said first portion,
said drive transistor is formed in said second portion, and
said second access transistor is formed in said third portion.

6. The semiconductor device according to claim 4, wherein in said first element formation region, said second source-drain region, said third source-drain region, and said sixth source-drain region are formed as a common source-drain region.

7. The semiconductor device according to claim 4, wherein
said first element formation region includes a first portion and a second portion, each of which is defined by said element isolation insulation film,
said first access transistor is formed in said first portion,
said drive transistor and said second access transistor are formed in said second portion, and
said third source-drain region and said sixth source-drain region are formed as a common source-drain region.

8. A semiconductor device having a static random access memory, comprising:
a storage node including a first storage node and a second storage node storing data;
a first pair of bit lines and a second pair of bit lines both sending/receiving data;
a ground interconnection to which a ground potential is applied;
a first element formation region and a second element formation region, each of which is defined by an element isolation insulation film in a predetermined region of a main surface of a semiconductor substrate;
a first access transistor formed in said first element formation region and including a first source-drain region and a second source-drain region that are spaced away from each other and have first conductivity type, said first access transistor including a first access gate electrode positioned above a region interposed between said first source-drain region and said second source-drain region;
a first drive transistor formed in said first element formation region and including a third source-drain region and a fourth source-drain region that are spaced away from each other and have the first conductivity type, said first drive transistor including a first drive gate electrode positioned above a region interposed between said third source-drain region and said fourth source-drain region;
a second access transistor formed in said first element formation region and including a fifth source-drain region and a sixth source-drain region that are spaced away from each other and have the first conductivity type, said second access transistor including a second access gate electrode positioned above a region interposed between said fifth source-drain region and said sixth source-drain region; and
a second drive transistor formed in said first element formation region and including a seventh source-drain region and an eighth source-drain region that are spaced away from each other and have the first conductivity type, said second drive transistor including a second drive gate electrode positioned above a region interposed between said seventh source-drain region and said eighth source-drain region, said first access transistor including
a first halo region having a first impurity concentration and second conductivity type, said first halo region being formed in a region just below said first access gate electrode so as to be adjacent to said first source-drain region electrically connected to a predetermined bit line of said first pair of bit lines, and
a second halo region having a second impurity concentration and the second conductivity type, said second halo region being formed in the region just below said first access gate electrode so as to be adjacent to said second source-drain region electrically connected to said storage node, said first drive transistor including
a third halo region having a third impurity concentration and the second conductivity type, said third halo region being formed in a region just below said first drive gate electrode so as to be adjacent to said third source-drain region electrically connected to said storage node, and a fourth halo region having a fourth impurity concentration and the second conductivity type, said fourth halo region being formed in the region just below said first drive gate electrode so as to be adjacent to said fourth source-drain region electrically connected to said ground interconnection, said second access transistor including a fifth halo region having a fifth impurity concentration and the second conductivity type, said fifth halo region being formed in a region just below said second access gate electrode so as to be adjacent to said fifth source-drain region electrically connected to a predetermined bit line of said second pair of bit lines, and a sixth halo region having a sixth impurity concentration and the second conductivity type, said sixth halo region being formed in the region just below said second access gate electrode so as to be adjacent to said sixth source-drain region electrically connected to said storage node, said second drive transistor including a seventh halo region having a seventh impurity concentration and the second conductivity type, said seventh halo region being formed in a region just below said second drive gate electrode so as to be adjacent to said seventh source-drain region electrically connected to said storage node, and an eighth halo region having an eighth impurity concentration and the second conductivity type, said eighth halo region being formed in the region just below said second drive gate electrode so as to be adjacent to said eighth source-drain region electrically connected to said ground interconnection, said second impurity concentration being higher than said first impurity concentration, said third impurity concentration being higher than said fourth impurity concentration, said first impurity concentration and said fourth impurity concentration being set to be different impurity concentrations, said fifth impurity concentration being lower than said sixth impurity concentration, said seventh impurity concentration being set to be higher than said eighth impurity concentration.

9. The semiconductor device according to claim 8, wherein said first element formation region includes a first portion and a second portion, each of which is defined by said element isolation insulation film, said first access transistor and said first drive transistor are formed in said first portion, and said second source-drain region and said third source-drain region are configured as a common source-drain region, and said second access transistor and said second drive transistor are formed in said second portion, and said sixth source-drain region and said seventh source-drain region are configured as a common source-drain region.

10. The semiconductor device according to claim 1, wherein the first impurity concentration is higher than the fourth impurity concentration.

* * * * *